United States Patent
Il

(10) Patent No.: US 9,966,557 B2
(45) Date of Patent: May 8, 2018

(54) TRANSLUCENT ELECTRODE, AND ELECTRONIC DEVICE

(71) Applicant: Konica Minolta, Inc., Tokyo (JP)

(72) Inventor: Hiromoto Il, Tokyo (JP)

(73) Assignee: KONICA MINOLTA, INC., Tokyo (JP)

( * ) Notice: Subject to any disclaimer, the term of this patent is extended or adjusted under 35 U.S.C. 154(b) by 0 days. days.

(21) Appl. No.: 14/441,394

(22) PCT Filed: Oct. 10, 2013

(86) PCT No.: PCT/JP2013/077649
§ 371 (c)(1),
(2) Date: May 7, 2015

(87) PCT Pub. No.: WO2014/077063
PCT Pub. Date: May 22, 2014

(65) Prior Publication Data
US 2015/0303398 A1    Oct. 22, 2015

(30) Foreign Application Priority Data
Nov. 16, 2012  (JP) .................. 2012-252655

(51) Int. Cl.
*H01L 51/52* (2006.01)
*H01L 51/44* (2006.01)

(52) U.S. Cl.
CPC ........ *H01L 51/5215* (2013.01); *H01L 51/442* (2013.01); *H01L 51/5234* (2013.01); *Y02E 10/549* (2013.01)

(58) Field of Classification Search
CPC ............... H01L 51/442; H01L 51/5215; H01L 51/5234; Y02E 10/549
See application file for complete search history.

(56) References Cited

U.S. PATENT DOCUMENTS 3,037,138 A * 5/1962 Motson .................. H05B 33/10
                                                              313/502
5,239,406 A * 8/1993 Lynam ..................... B32B 17/10
                                                              296/215

(Continued)

FOREIGN PATENT DOCUMENTS

CN      101179114 A      5/2008
JP      2002046208 A     2/2002
(Continued)

OTHER PUBLICATIONS

Office Action dated Mar. 30, 2016; Application No./Pat. No. 201380059191.2; Applicant: Konica Minolta, Inc.; English translation of Office Action dated Mar. 30, 2016; total of 17 pages.

(Continued)

*Primary Examiner* — Caridad Everhart
*Assistant Examiner* — Ankush Singal
(74) *Attorney, Agent, or Firm* — Lucas & Mercanti, LLP

(57) ABSTRACT

To constitute a translucent electrode including a base layer having a surface in which surface roughness (Ra) is 2 or less and elastic modulus is 20 GPa or more, and an electrically conductive layer that is provided on the surface side of the base layer and that contains silver as the principal component.

8 Claims, 5 Drawing Sheets

(56) References Cited

U.S. PATENT DOCUMENTS

| | | | |
|---|---|---|---|
| 8,348,474 B1* | 1/2013 | Livesay | G02B 27/0994 362/310 |
| 2005/0093042 A1* | 5/2005 | Nakazawa | H01L 21/02126 257/295 |
| 2007/0087488 A1* | 4/2007 | Moriwaka | H01L 21/2026 438/149 |
| 2008/0203908 A1* | 8/2008 | Hasegawa | H01L 51/5265 313/504 |
| 2010/0225229 A1* | 9/2010 | Hosoda | B82Y 20/00 313/504 |
| 2011/0057920 A1 | 3/2011 | Matsuura et al. | |
| 2011/0278616 A1* | 11/2011 | Washizu | H05B 33/10 257/98 |
| 2012/0012183 A1* | 1/2012 | Luo | H01L 51/4246 136/263 |
| 2012/0107733 A1* | 5/2012 | Hayashi | B82Y 10/00 430/5 |
| 2012/0153486 A1* | 6/2012 | Kuramoto | H01L 21/187 257/762 |
| 2012/0282458 A1* | 11/2012 | Takeda | C03C 17/3411 428/331 |

FOREIGN PATENT DOCUMENTS

| | | |
|---|---|---|
| JP | 2002216950 A | 8/2002 |
| JP | 2005093318 A | 4/2005 |
| JP | 2008171637 A | 7/2008 |
| JP | 2009151963 A | 7/2009 |
| JP | 2010198921 A | 9/2010 |
| JP | 2011068124 A | 4/2011 |
| JP | 2011077028 A | 4/2011 |
| JP | 2012084307 A | 4/2012 |
| JP | 2012084353 A | 4/2012 |
| WO | 2010001831 A1 | 1/2010 |

OTHER PUBLICATIONS

International Search Report dated Jan. 7, 2014 for PCT/JP2013/077649 and English translation.
Notification of Reasons for Refusal dated Jun. 13, 2017 from corresponding Japanese Patent Application No. 2014-546909 and English translation; Total of 15 pages.

* cited by examiner

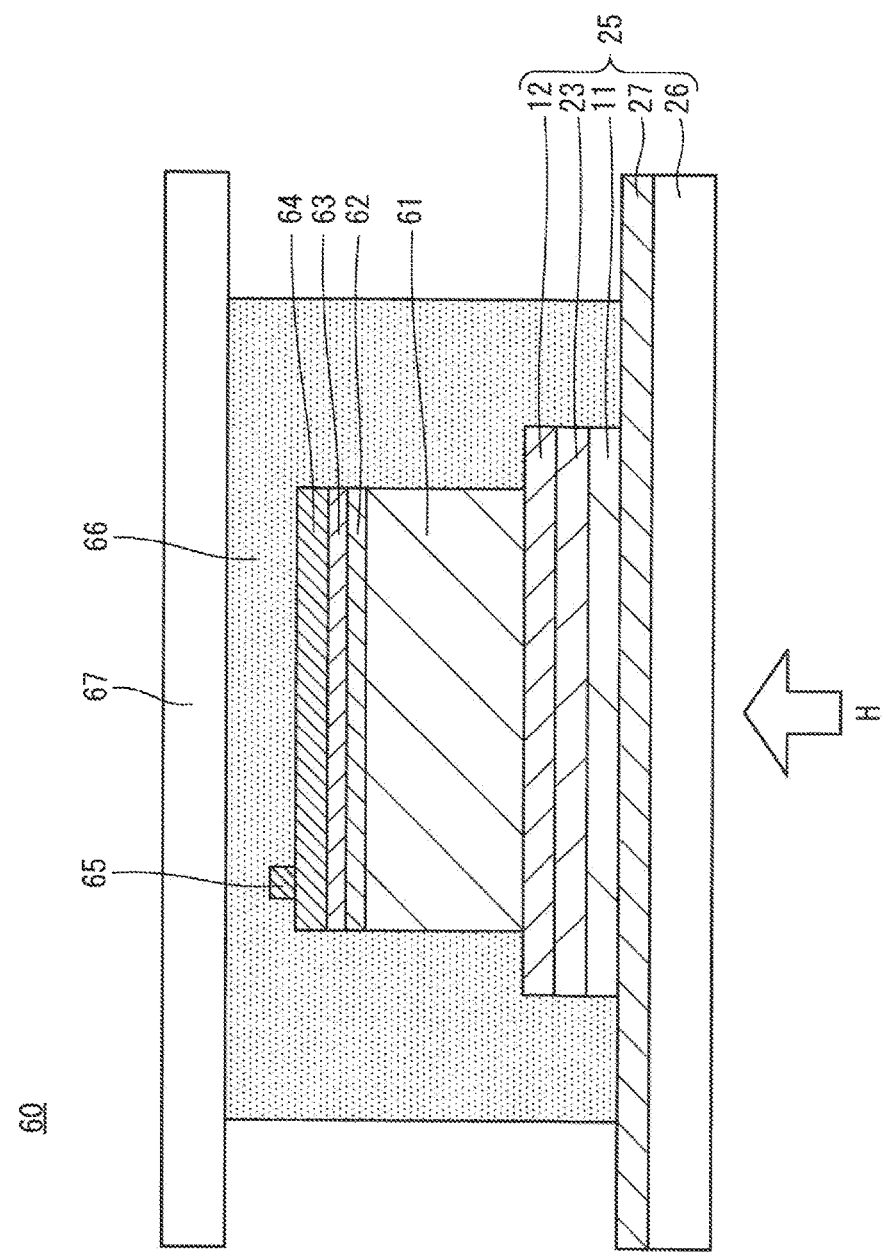

TRANSLUCENT ELECTRODE, AND ELECTRONIC DEVICE

CROSS REFERENCE TO RELATED APPLICATION

This Application is a 371 of PCT/JP2013/077649 filed on Oct. 10, 2013 which, in turn, claimed the priority of Japanese Patent Application No. JP2012-252655 filed on Nov. 16, 2012, both applications are incorporated herein by reference.

TECHNICAL FIELD

The present invention relates to a translucent electrode, and an electronic device using the translucent electrode.

BACKGROUND ART

Electronic devices such as an organic electroluminescent element (so-called an organic EL element) utilizing electroluminescence of an organic material (hereinafter, described as EL) and an organic photoelectric conversion element have a configuration in which an organic material layer or a photoelectric conversion layer is sandwiched between two electrodes. In the organic EL element, emitted light generated in the organic material layer (a light-emitting layer) passes through the electrode and is taken out to the outside. In addition, in the organic photoelectric conversion element, light from the outside passes through the electrode and is taken into the photoelectric conversion layer. Therefore, in these electronic devices, it is necessary that at least one out of two electrodes is constituted of a translucent electrode.

On the other hand, as a form of thin-type/light-weight organic EL element, a solid sealing is known (for example, refer to Patent Literature 1 and Patent Literature 2). In the solid sealing, there are pressurization/heating processes, and thus an unevenness of the electrode has a large influence on leak characteristics. Therefore, a particularly smooth translucent electrode becomes necessary.

In response to such a request, a technology of using an ITO electrode on a flexible base material and further obtaining a smooth surface of an electrode by using a polishing tape is disclosed (for example, refer to Patent Literature 3). However, in the method, a smoothening process by the polishing tape becomes troublesome, and the productivity becomes a problem. Additionally, the ITO on the flexible base material exhibits insufficient properties as an electrode because of a restriction on conditions of film formation.

As a means of improving properties of an electrode, a technology of using a thin Ag layer as an electrode is disclosed (for example, refer to Patent Literature 4). Although the Ag layer is formed at a temperature lower than that of ITO and excellent in anode properties, since the thickness is as small as 30 nm or less and Ag is a flexible metal, and thus the Ag layer is apt to be affected by pressurization/heating at the time of solid sealing, and there exists a problem of maintaining smoothness of the electrode.

A technology of smoothening a barrier surface on a flexible base material as a smooth electrode base layer (for example, refer to Patent Literature 5) is known in order to solve such a problem. In Patent Literature 5, a technology of smoothening a surface depending on CVD conditions in forming an evaporation barrier film is disclosed. However, a layer formed by the CVD method as the method has an insufficient smoothness due to the principle of a CVD method, and greatly receives an influence of pressurization/heating at the time of solid sealing to thereby deteriorate leak characteristics. As described above, in a vapor evaporation method such as a CVD method, film formation is carried out by deposits, and thus it is difficult to obtain conditions that satisfy the smoothness of a thin Ag electrode, capable of withstanding a solid sealing process.

On the other hand, a technology of smoothing the barrier surface by an inorganic-organic hybrid polymer is disclosed (for example, refer to Patent Literature 6). According to the method, although the smoothening by a film becomes reliably possible, the polymer of a smooth protecting layer deforms locally due to heating/pressurizing in the solid sealing and the smoothness of the electrode cannot be maintained.

CITATION LIST

Patent Literature

PTL 1: Japanese Patent Application Laid-open Publication No. 2002-216950
PTL 2: International Publication Pamphlet No. 2010/001831
PTL 3: Japanese Patent Application Laid-open Publication No. 2005-93318
PTL 4: Japanese Patent Application Laid-open Publication No. 2009-151963
PTL 5: Japanese Patent Application Laid-open Publication No. 2012-084353
PTL 6: Japanese Patent Application Laid-open Publication No. 2002-046208.

SUMMARY OF INVENTION

Technical Problem

As described above, in electronic devices provided with a translucent electrode, smoothness for the surface of a translucent electrode is required in order to improve properties.

In order to solve the above-described problem, in the present invention, the smoothing of a translucent electrode is made possible, and an electronic device capable of enhancing properties by using the translucent electrode is provided.

Solution to Problem

The translucent electrode of the present invention includes abase layer with a surface having a surface roughness (Ra) of 2 or less and an elastic modulus of 20 GPa or more; and an electrically conductive layer that is provided on the surface side of the base layer and contains silver as a principal component.

Furthermore, the electronic device of the present invention includes the above-described translucent electrode.

According to the translucent electrode of the present invention, when the translucent electrode is subjected to solid sealing, an electrode projection of the electrically conductive layer is flattened in accordance with the smooth surface of the base layer by including the smooth base layer having the surface roughness (Ra) of 2 or less and the elastic modulus of 20 GPa or more and the electrically conductive layer having Ag as the principal component. As described above, properties of the electronic device is enhanced by smoothing the electrically conductive layer.

Advantageous Effects of Invention

According to the present invention, a translucent electrode capable of enhancing properties, and an electronic device can be provided.

BRIEF DESCRIPTION OF DRAWINGS

FIG. 10 is a drawing showing a schematic configuration of an organic photoelectric conversion element in a seventh embodiment.

DESCRIPTION OF EMBODIMENTS

Hereinafter, embodiments of the present invention will be explained based on the drawings in order shown below.
1. Translucent electrode (a first embodiment)
2. Translucent electrode (a second embodiment)
3. Translucent electrode (a third embodiment)
4. Organic electroluminescent element (a fourth embodiment: bottom emission type)
5. Organic electroluminescent element (a fifth embodiment: reverse laminate configuration)
6. Lighting device (a sixth embodiment)
7. Organic photoelectric conversion element (a seventh embodiment)

<1. Translucent electrode (the first embodiment)>

Hereinafter, specific embodiments of the translucent electrode of the present invention will be explained.

Figure 1:
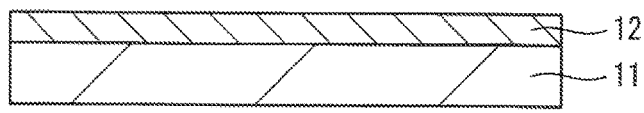
FIG. 1 is a drawing showing a schematic configuration of the translucent electrode in a first embodiment.

In FIG. 1, a schematic configuration view (a cross-sectional view) of the translucent electrode in the first embodiment of the present invention is shown. As shown in FIG. 1, a translucent electrode 10 includes a base layer 11 and an electrically conductive layer 12. The electrically conductive layer 12 is formed on one surface of the base layer 11.

Hereinafter, as to the translucent electrode 10 of the example, a detailed configuration will be explained in order of the base layer 11 and the electrically conductive layer 12. Note that, in the translucent electrode 10 of the example, translucency means that light transmittance at a wavelength of 550 nm is 50% or more.

In the base layer 11 constituting the translucent electrode 10, the elastic modulus on the side on which the electrically conductive layer 12 is formed is 20 GPa or more, and the surface roughness (arithmetic average roughness: Ra) is 2 or less. Examples of the base layer 11 having a surface whose elastic modulus is 20 GPa or more and surface roughness Ra is 2 or less can include glass, a polysilazane-modified layer and the like, but are not limited to these.

[Glass]

Examples of the glasses include silica glass, soda lime silica glass, lead glass, borosilicate glass, alkali-free glass, and the like. From the viewpoint of a close adhesive characteristic to the laminated structure of the translucent electrode 10, durability and smoothness, a physical treatment such as polishing may be given as necessary, or a film made of an inorganic material or an organic material, or a hybrid film obtained by combining these coating films may be formed on the surface of these glass materials.

[Polysilazane-modified layer]

A polysilazane-modified layer is a layer formed by subjecting a coated film of a polysilazane-containing liquid to a modification treatment. The modified layer is mainly formed of a silicon oxide or a silicon oxynitride compound.

A method for forming the polysilazane-modified layer include a method for forming a layer containing a silicon oxide or a silicon oxynitride compound, by performing a modification treatment after coating at least one coating liquid containing a polysilazane compound on a base material.

As to the supply of a silicon oxide or a silicon oxynitride compound for forming the polysilazane-modified layer of a silicon oxide or a silicon oxynitride compound, the coating on the surface of the base material rather than the supply as gas like in a CVD (Chemical Vapor deposition) method makes it possible to form a more uniform and smooth layer. In the case of a CVD method and the like, it is known that unnecessary foreign substances referred to as a particle are generated in the gas phase, at the same time as the process of the vapor deposition of a raw material having an increased reactivity in the gas phase on the surface of the base material. As the result of the accumulation of these generated particles, the smoothness of the surface deteriorates. In the coating method, the suppression of the generation of these particles becomes possible by not allowing raw materials to exist in a gas-phase reaction space. Consequently, a smooth surface can be formed through the use of the coating method.

(Coated Film of Polysilazane-Containing Liquid)

The coated film of a polysilazane-containing liquid is formed by coating a coating liquid containing a polysilazane compound on the base material at least in one layer.

As a coating method, any appropriate method may be employed. Specific examples include a spin coat method, a roll coat method, a flow coat method, an ink jet method, a spray coat method, a print method, a dip coat method, a casting film formation method, a bar coat method, a gravure printing method etc. The thickness of the application may be set appropriately corresponding to an object. For example, the coating thickness may be set so that the thickness after drying is preferably approximately 1 nm to 100 μm, more preferably approximately 10 nm to 10 μm, and most preferably approximately 10 nm to 1 μm.

"Polysilazane" is a polymer having a silicon-nitrogen bond, and is a ceramic precursor inorganic polymer such as $SiO_2$, $Si_3N_4$ and an intermediate solid solution $SiO_xN_y$ of both the substances, made of Si—N, Si—H, N—H and the like. The polysilazane is represented by a general formula (I) below.

[Chem. 1]

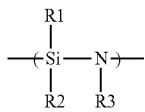

General formula (I)

In order to perform the coating so as not to damage the film base material, one that is made into a ceramic at comparatively low temperatures and degenerates into silica is preferable as described in Japanese Patent Application Laid-open Publication No. 08-112879.

In the formula, R1, R2 and R3 each represent independently a hydrogen atom, an alkyl group, an alkenyl group, a cycloalkyl group, an aryl group, an alkylsilyl group, an alkylamimo group, an alkoxy group or the like.

From the viewpoint of denseness of a barrier film to be obtained, perhydropolysilazane in which all of R1, R2 and R3 are hydrogen atoms is particularly preferable.

On the other hand, organopolysilazane in which a part of the hydrogen portion to be bonded to Si thereof is substituted by an alkyl group or the like has the advantage that the generation of crack is suppressed even when (an average) film thickness is made larger, because adhesiveness to the base material of the base is improved by having an alkyl group such as a methyl group and toughness can be given to a ceramic film based on hard and brittle polysilazane. The perhydropolysilazane or organopolysilazane may be selected, or these can be used in mixture, depending on use applications.

The perhydropolysilazane is supposed to have a structure in which a linear structure and a ring structure with 6- and 8-membered ring as the center exist. The molecular weight thereof is approximately 600 to 2000 (in terms of polystyrene) in number average molecular weight (Mn), and the perhydropolysilazane is a liquid or solid material and differs depending on the molecular weight. These are available in the market in a solution state dissolved in an organic solvent, and a commercially available product can be used as is, as a polysilazane-containing coating liquid.

Other examples of polysilazane changing into ceramic at low temperatures include siliconalkoxide-added polysilazane obtained by causing polysilazane represented by the general formula (I) to react with siliconalkoxide (Japanese Patent Application Laid-Open Publication No. 05-238827), glycidol-added polysilazane obtained by causing the polysilazane to react with glycidol (for example, Japanese Patent Application Laid-Open Publication No. 06-122852), alcohol-added polysilazane obtained by causing the polysilazane to react with alcohol (Japanese Patent Application Laid-Open Publication No. 06-240208), metal carboxylate-added polysilazane obtained by causing the polysilazane to react with metal carboxylate (Japanese Patent Application Laid-Open Publication No. 06-299118), acetylacetonate complex-added polysilazane obtained by causing the polysilazane to react with acetylacetonate complex containing a metal (Japanese Patent Application Laid-Open Publication No. 06-306329), metal-fine-particle-added polysilazane obtained by adding metal fine particles (Japanese Patent Application Laid-Open Publication No. 07-196986) and the like.

Organic solvents that can be used for preparing a liquid containing polysilazane include, specifically, hydrocarbon solvents such as aliphatic hydrocarbon, alicyclic hydrocarbon and aromatic hydrocarbon, halogenated hydrocarbon solvents, and ethers such as aliphatic ether and alicyclic ether. Specifically, there are hydrocarbons such as pentane, hexane, cyclohexane, toluene, xylene, Solvesso and terpene, halogenated hydrocarbons such as methylene chloride and trichloroethane, ethers such as dibutyl ether, dioxane and tetrahydrofuran. These solvents are selected in accordance with an object such as the solubility of polysilazane, vapor deposition rate or the like, and a plurality of solvents may be mixed. Note that an alcohol-based and water-containing solvent are not preferable because of reacting easily with polysilazane.

The concentration of polysilazane in the polysilazane-containing coating liquid is approximately 0.2 to 35% by mass, although the concentration differs depending on an intended silica film thickness or a pot life of the coating liquid.

The organic polysilazane may be a derivative in which a part of the hydrogen portions that is bonded to Si thereof are substituted by an alkyl group or the like. The adhesiveness to an underlying base material is improved by having an alkyl group, particularly, a methyl group with the smallest molecular weight, toughness can be imparted to a hard and brittle silica film, and the generation of a crack is suppressed even when the film thickness is made larger.

A catalyst of amine or metal can also be added in order to accelerate the conversion to a silicon oxide compound. Specifically, AQUAMICA NAX120-20, NN110, NN310, NN320, NL110A, NL120A, NL150A, NP110, NP140, SP140 and the like, all of which are manufactured by AZ ELECTRONIC MATERIALS, are included.

(Process for Forming Polysilazane-Containing Layer)

Moisture is preferably to be removed from the coated film of a polysilazane-containing liquid before the modification treatment or during the treatment. Therefore, the process is preferably separated into a first process for the purpose of removing the solvent in the polysilazane-containing layer and a subsequent second process for the purpose of removing the moisture in the polysilazane-containing layer.

In the first process, drying conditions for mainly removing the solvent can appropriately be determined by a method of a thermal treatment, and the conditions of removing the moisture at this time are also acceptable. A thermal treatment temperature is preferably high from the viewpoint of a rapid treatment, but temperature and treatment time are determined in consideration of a thermal damage to a resin base material. For example, when a PET base material having the glass transition temperature (Tg) of 70° C. is used as the resin base material, the thermal treatment temperature can be set to be 200° C. or less. The treatment time is preferably set so that the solvent is to be removed, and in a short time so as to reduce a thermal damage to the base material, and when the thermal treatment temperature is 200° C. or less, the treatment time can be set within 30 minutes.

The second process is a process for removing the moister in the polysilazane-containing layer, and an aspect of being maintained in a low humidity environment is preferable as a method for removing the moisture. The humidity in the low humidity environment changes depending on temperatures and thus, regarding the relationship between the temperature and humidity, a preferable form is shown based on the specification of the dew-point temperature. A preferable dew-point temperature is 4 degrees or less (temperature 25 degree/humidity 25%), a more preferable dew-point temperature is −8 degrees or less (temperature 25 degree/humidity 10%), and a further more preferable dew-point temperature is −31 degrees or less (temperature 25 degree/humidity 1%), and the time to be maintained changes appropriately depending on the thickness of the polysilazane-containing layer. Under conditions in which the thickness of the polysilazane-containing layer is 1 µm or less, a preferable dew-point temperature is −8 degrees or less and the time to be maintained is 5 minutes or more. In addition, reduced-pressure drying may be performed so that the moisture is easily removed. The pressure in the reduced-pressure drying can be selected from ordinary pressure to 0.1 MPa.

As to preferable conditions in the second process relative to the conditions in the first process, for example, when the solvent is removed at a temperature of 60 to 150° C. for a treatment time of 1 minute to 30 minutes in the first process, conditions for removing the moisture in which a dew point of 4 degrees or less and a treatment time of 5 minutes to 120 minutes can be selected in the second process. The classification of the first process and the second process can be distinguished based on the change in the dew point, and the classification can be carried out by the change in the difference of dew points of process environments by 10 degrees or more.

It is preferable that the polysilazane-containing layer is subjected to a modification treatment, even after the removal of the moisture in the second process, while maintaining the state.

(Moisture Content of Polysilazane-Containing Layer)

The moisture quantity contained in the polysilazane-containing layer can be detected in accordance with a following analytical method.

Headspace gas chromatography/mass spectrometry
Apparatus: HP6890GC/HP5973MSD
Oven: 40° C. (2 min), after that, temperature is raised to 150° C. at a rate of 10° C./min
Column: DB-624 (0.25 mmid×30 m)
Injection port: 230° C.
Detector: SIM m/z=18
HS condition: 190° C., 30 min The moisture content in the polysilazane-containing layer is defined as a value obtained by dividing the moisture quantity obtained by the above-described analytical method by the volume of the polysilazane-containing layer, and the content is preferably 0.1% or less in a state where the moisture has been removed in the second process. Further preferable moisture content is 0.01% or less (detection limit or less).

A dehydration reaction of polysilazane having transformed to silanol is accelerated due to the removal of the moisture before the modification treatment or during the modification.

(Modification Treatment)

A known method based on the conversion reaction of polysilazane can be selected as the modification treatment. High temperatures of 450° C. or more is required for the production of a silicon oxide film or a silicon oxynitride film by a substitution reaction of a silazane compound, and adaptation is difficult in the case of flexible substrates such as plastic. Conversion reactions using plasma, ozone or ultraviolet rays capable of a conversion reaction at lower temperatures are preferable for the adaptation for a plastic substrate.

(Plasma Treatment)

A known method can be used for a plasma treatment as the modification treatment, and an atmospheric pressure plasma treatment is preferable. In the case of the atmospheric pressure plasma treatment, nitrogen gas and/or atoms in Group XVIII in the periodic table, specifically, helium, neon, argon, krypton, xenon, radon or the like is used as a discharge gas. Among these, nitrogen, helium and argon is used preferably, and in particular, nitrogen is low in cost and preferable.

As an example of the plasma treatment, the atmospheric pressure plasma treatment will be explained. Specifically, the atmospheric pressure plasma is one, as described in International Publication No. WO 2007/026545, in which two or more electric fields of different frequencies are formed in a discharge space, and an electric field in which a first radio frequency electric field and a second radio frequency electric field are superposed is preferably formed.

In the atmospheric pressure plasma treatment, a frequency $\omega 2$ of the second radio frequency electric field is higher than a frequency $\omega 1$ of the first radio frequency electric field, the relationship among an intensity V1 of the first radio frequency electric field, an intensity V2 of the second radio frequency electric field and an intensity IV of an discharge starting electric field satisfies $$V1 \geq IV > V2 \text{ or } V1 > IV \geq V2$$

and the output density of the second radio frequency electric field is 1 W/cm² or more.

For example, even in the case of discharge gas having a high discharge starting electric field intensity such as nitrogen gas, it is possible to start discharge, to maintain a plasma state with high density and stability, and to form a thin film of high performance, by adopting such discharge conditions.

According to the above measurement, when setting nitrogen gas as a discharge gas, the discharge starting electric field intensity IV (½Vp−p) is approximately 3.7 kV/mm, and accordingly, in the above-described relationship, it is possible to excite the nitrogen gas and to make the nitrogen gas into a plasma state, by applying a first applied electric field intensity as V1≥3.7 kV/mm.

Here, as to the frequency of a first power source, 200 kHz or less can be used preferably. In addition, as to the waveform of the electric field, both a continuous wave and a pulse wave are usable. The lower limit is desirably approximately 1 kHz.

On the other hand, as the frequency of a second power source, 800 kHz or more can be used preferably. A higher frequency of the second power source gives a higher plasma density to thereby give a dense and high-quality thin film. The upper limit is desirably approximately.

The formation of radio frequency electric fields from two power sources is necessary for starting discharge of a discharge gas having a high discharge starting electric field intensity by the first radio frequency electric field, and the plasma density can be made high and a dense and high-quality thin film can be formed by a high frequency and high output density of the second radio frequency electric field.

(Ultraviolet Ray Irradiation Treatment)

A treatment by ultraviolet ray irradiation is also preferable as a method of the modification treatment. Ozone and active oxygen atoms generated by ultraviolet ray (the same meaning as ultraviolet light) has a high oxidation capability, and a silicon oxide film or a silicon oxynitride film having high denseness and insulation performance at low temperatures can be produced.

By the ultraviolet ray irradiation, the base material is heated, and $O_2$ and $H_2O$, an ultraviolet ray absorber and polysilazane itself contributing to ceramic formation (silica conversion) are excited and activated, and thus excitation of polysilazane accelerates the ceramic formation of polysilazane and a ceramic film to be obtained becomes further dense. The ultraviolet ray irradiation is performed effectively at any time only as long as the irradiation is performed after the formation of a coated film.

The method according to the present embodiment may be used in any commonly used ultraviolet ray generation apparatus.

Note that, in the present example, "ultraviolet ray" generally means an electromagnetic wave having a wavelength of 10 to 400 nm, and in the case of the ultraviolet ray irradiation treatment except for a vacuum ultraviolet ray (10 to 200 nm) treatment to be described later, preferably ultraviolet rays of 210 to 350 nm are used.

In the ultraviolet ray irradiation, an irradiation intensity and irradiation time are set within a range not damaging the base material holding a coated film to be irradiated.

When taking, as an example, the case where a plastic film is used as the base material, it is possible to set the distance between the base material-lamp so that the intensity on the base material surface becomes 20 to 300 mW/cm$^2$, preferably 50 to 200 mW/cm$^2$ for 0.1 sec to 10 min by, for example, using a lamp of 2 kW (80 W/cm×25 cm), and to perform the irradiation for 0.1 sec to 10 min.

Generally, when the base material temperature at the time of the ultraviolet ray irradiation treatment becomes 150° C. or more, damage of the base material such as the deformation or strength degradation of the base material is carried out in the case of a plastic film or the like.

However, in the case of a film having high heat resistance such as polyimide and a substrate of metal or the like, a treatment at higher temperatures is possible. Accordingly, there is no general upper limit on the base material temperature at the time of the ultraviolet ray irradiation, and a person skilled in the art can suitably set the base material temperature depending on kinds of the base materials. Furthermore, an ultraviolet ray irradiation atmosphere is not particularly limited and the ultraviolet ray irradiation may be performed in the air.

Examples of generation methods of the ultraviolet ray include metal halide lamp, high-pressure mercury vapor lamp, low-pressure mercury vapor lamp, xenon arc lamp, carbon arc lamp, excimer lamp (single wavelength of 172 nm, 222 nm, 308 nm, for example, manufactured by Ushio, Inc.), UV lasers, and the like, but the generation methods are not particularly limited. Furthermore, in irradiating a polysilazane coated film with the generated ultraviolet ray, the coated film is desirably irradiated with the ultraviolet ray from a generation source, reflected from a reflection plate, also in order to achieve uniform irradiation for improving the efficiency.

The ultraviolet ray irradiation is applicable to both a batch treatment and a continuous treatment, and an appropriate selection is possible depending on shapes of coated base materials. For example, in the case of a batch treatment, a base material having a polysilazane-coated film on the surface (for example, silicon wafer) can be treated with a burning furnace provided with the ultraviolet ray generation source. The ultraviolet ray burning furnace itself is generally known, and for example, one manufactured by EYE GRAPHICS CO., LTD. can be used. Furthermore, when a base material having a polysilazane-coated film on the surface is in a shape of long film, the formation into ceramic can be performed by a drying zone provided with such ultraviolet ray generation source as described above continuously irradiating the long film with ultraviolet rays while conveying the long film. A time period necessary for the ultraviolet ray irradiation is generally from 0.1 sec to 10 min, preferably 0.5 sec to 3 min, although the time period depends on a base material to be coated, a composition or concentration of the coating composition.

(Vacuum Ultraviolet Ray Irradiation Treatment; Excimer Irradiation Treatment)

A treatment by vacuum ultraviolet ray irradiation is included as a further preferable method of modification treatment in the present embodiment. The treatment by vacuum ultraviolet ray irradiation is a method in which, through the use of an optical energy of 100 to 200 nm lager than the inter-atomic bonding strength in a silazane compound, preferably, through the use of an energy of light having a wavelength of 100 to 180 nm, a silicon oxide film is formed at relatively low temperatures by advancing an oxidation reaction by active oxygen or ozone while directly cutting the bonding of atoms by an action only of photons referred to as a photon process.

An inert gas excimer lamp is preferably used as a vacuum ultraviolet light source necessary for this.

1. What is excimer emission

Since atoms of inert gases such as Xe, Kr, Ar and Ne are not chemically bonded not to forma molecule, they are referred to as an inert gas. However, atoms of an inert gas having obtained an energy by discharge or the like (excited atom) can be bonded to another atom to thereby form a molecule. When an inert gas is xenon, the reaction is as follows:

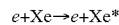

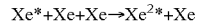

and when Xe$_2$* being an excited excimer molecule transitions to the ground state, it emits excimer light of 172 nm. The characteristics of an excimer lamp include having a high efficiency because the emission is concentrated on one wavelength and light other than required light is almost not emitted.

Furthermore, since no excessive light is emitted, the temperature of an object can be kept low. Moreover, since no time is required for starting and re-starting, instantaneous lighting and blinking are possible.

A method of using dielectric barrier discharge is known in order to obtain excimer emission. The dielectric barrier discharge is discharge referred to as micro discharge that is generated in the gas space, by providing a gas space between both electrodes via a dielectric substance (transparent quartz in the case of an excimer lamp) and applying a high-frequency high voltage of several 10 kHz to the electrode, and that is like very thin thunder. When the streamer of the micro discharge reaches a tube wall (dielectric substance), charges accumulate on the surface of the dielectric substance, and thus the micro discharge is extinguished. In this way, the dielectric barrier discharge is discharge in which the micro discharge spreads over the whole of the tube wall and repeats the generation and extinction. Therefore, flickering of the light that can be recognized with the naked eye arises. Additionally, since streamer at a very high temperature reaches locally and directly the tube wall, deterioration of the tube wall may be accelerated.

Electrodeless electric field discharge is also possible in addition to the dielectric barrier discharge, as a method for effectively obtaining excimer emission. The electrodeless electric field discharge is one based on capacitive coupling and is referred to as RF discharge as a byname. Basically, the same lamp and electrode and the arrangement thereof as those in the dielectric barrier discharge are acceptable, and radio frequency to be applied to both electrodes is lit at several MHz. In the electrodeless electric field discharge, since spatially and temporally uniform discharge is obtained as described above, a lamp free of flickering of light and has a long life time can be obtained.

In the case of the dielectric barrier discharge, since the micro discharge is generated only between electrodes, an outside electrode covers the whole outer surface and has to be one that allows light to pass through for the purpose of extracting the light to the outside, in order to generate discharge in the whole discharge space. For that purpose, an electrode obtained by forming a thin metal into a net-like shape is used. Since a wire as thin as possible is used for the electrode so as not to shield light, the electrode is easily damaged by ozone and the like generated by vacuum ultraviolet light, in an oxygen atmosphere.

In order to prevent this, there is generated the necessity of setting the circumference of the lamp, namely, the inside of the irradiation apparatus to be an atmosphere of inert gas such as nitrogen and of providing a window of synthesized quartz to extract irradiation right.

The window of synthesized quartz is not only an expensive consumable article, but also generates loss of light.

Since a double cylindrical type lamp has an outer diameter of approximately 25 mm, the difference in distances to an irradiation surface between directly below a lamp axis and a lamp side surface cannot be neglected and a large difference in illuminance arises. Accordingly, even if lamps are aligned in close contact, uniform illuminance distribution cannot be obtained. When an irradiation apparatus provided with a window of synthesized quartz is used, the distance in an oxygen atmosphere can be made uniform and uniform illuminance distribution is obtained.

When the electrodeless electric field discharge is used, the outside electrode is not required to be in a net shape. Glow discharge spreads over the whole discharge space only by providing the outside electrode on a part of the lamp outer surface. An electrode usually formed of an aluminum block and doubling also as a reflection plate of light is used as the outside electrode on the rear face of the lamp. However, since the lamp outer diameter is large as in the case for the dielectric barrier discharge, synthesized quartz becomes necessary in order to make the illumination distribution uniform.

The greatest feature of a thin tube excimer lamp is a simple structure thereof. The structure is only such that both ends of a quartz tube are closed and gas for performing excimer emission is sealed inside. Accordingly, a very inexpensive light source can be provided.

In the double cylindrical type lamp, since processing of connecting and closing the both ends of inner and outer tubes has been performed, the lamp tends to be damaged in handling or transportation as compared with the thin tube lamp. Furthermore, the outer diameter of the tube of the thin tube lamp is approximately 6 to 12 mm, and when the tube is too thick, a high voltage is required for the starting.

The form of discharge can be used for both the dielectric barrier discharge and the electrodeless electric field discharge. As to the shape of the electrode, the plane to be in contact with a lamp may be flat, but when the shape is made in accordance with a curved plane of the lamp, discharge is made more stable since the lamp can be firmly fixed firmly and the electrode closely adheres to the lamp. In addition, when the curved surface is made into a mirror surface by using aluminum, the curved surface also serves as a reflection plate of light.

A xenon excimer lamp emits an ultraviolet ray having a short wavelength of 172 nm at a single wavelength, and is excellent in emission efficiency. Since the light represents a large absorption coefficient for oxygen, the light can generate radical oxygen atom species or ozone with a small amount of oxygen. Furthermore, it is known that the energy of light of short wavelength of 172 nm that dissociates the bonding of an organic material has high performance. The modification of the polysilazane-containing layer can be realized in a short period of time, by the active oxygen or ozone, and a high energy of the ultraviolet ray irradiation. Accordingly, as compared with a low-pressure mercury vapor lamp that emits wavelengths of 185 nm and 254 nm, and plasma cleaning, it is made possible to shorten a process time along high throughput, reduce the area of facilities, and to irradiate an organic material, a plastic substrate and the like which are susceptible to damage by heat.

The excimer lamp has high light generation efficiency and can be lit by inputting low electric power. Furthermore, the excimer lamp is characterized in that light of a long wavelength that is a cause of temperature rise by light is not emitted, and since irradiation with energy having a single wavelength in an ultraviolet ray region is performed, the increase in the surface temperature of an irradiation object is suppressed. Therefore, the excimer lamp is suitable for a flexible film material such as PET that is considered to be susceptible to the influence of heat.

(Smoothness: Surface Roughness Ra)

The surface roughness (Ra) of the surface of the base layer 11 is 2 nm or less, further preferably 1 nm or less. As the result of the surface roughness being within the range, in using the base layer as a resin base material for the organic photoelectric conversion element, a light transmission efficiency is enhanced by a smooth film surface having a little unevenness and an energy conversion efficiency is enhanced by the reduction of a leak current between electrodes, which is preferable. The surface roughness (Ra) of the base layer 11 can be measured by the following method.

(Method for Measuring Surface Roughness; AFM Measurement)

The surface roughness is calculated from a cross-section curve of unevenness continuously measured using a detector having a sensing pin with a minimum tip radius by AFM (atomic force microscope), for example, using DI3100 manufactured by Digital Instruments, is measured many times within a zone of several tens μm in the measurement direction with a sensing pin having a minimum tip radius, and is a roughness related to the amplitude of fine unevenness.

(Elastic Modulus)

It is necessary that the elastic modulus of the surface on which the electrically conductive layer 12 of the base layer 11 is to be formed is 20 GPa or more.

When the polysilazane-modified layer is used as the base layer 11, it is necessary that the elastic modulus of the surface on the modification treatment side is 20 GPa or more.

The polysilazane-modified layer has different elastic moduli between the modification-treated front surface side and the opposite side, and the modification-treated surface side has a higher elastic modulus. In the case of the polysilazane-modified layer, the modified surface of the polysilazane-coated film has an elastic modulus of approximately 20 to 35 GPa. In an unmodified polysilazane coated film, the elastic modulus is approximately 5 to 12 GPa. Furthermore, in the polysilazane-modified layer, the elastic modulus of the modified surface is high, and the elastic modulus lowers as going from the surface in the thickness direction. At least, the elastic modulus of 20 GPa or more is acceptable on the surface on the side on which the electrically conductive layer 12 is formed.

Therefore, it is necessary that the polysilazane-modified layer has the elastic modulus of the treated surface of 20 GPa or more after the modification treatment. In addition, the electrically conductive layer 12 is formed on the modification-treated surface. Additionally, the glass generally used as the base material has the elastic modulus of the surface of 40 GPa or more. Accordingly, the formation of the electrically conductive layer 12 on the glass surface is possible.

(Method for Measuring Elastic Modulus: Nano Indentation)

The elastic modulus of the base layer 11 can be obtained by a conventionally known elastic modulus measurement method, for example, the elastic modulus can be measured by a measurement method under conditions of applying a constant strain at a constant frequency (Hz) through the use of Vibron DDV-2 manufactured by ORIENTEC, by a measurement method based on a measured value obtained by changing an applying strain at a constant frequency after forming the base layer 11 on a transparent base material, through the use of RSA-II (manufactured by Leometrix) as a measurement apparatus, or by a nano indenter applying a nano indention method, for example, by a nano indenter (Nano Indenter TMXP/DCM) manufactured by MTS System.

From the viewpoint of capable of measuring the elastic modulus of an extremely thin base layer 11 with high accuracy, a method of measuring and obtaining the elastic modulus by a nano indenter is preferable.

Here, the "nano indention method" is a method in which, after application of a load to the base layer 11 by pressing an indenter of a trigonal pyramid having a tip radius of approximately 0.1 to 1 µm with an ultra-minute load, the load was removed by returning the indenter, an obtained load-displacement curve was drawn, and the elastic modulus (Reduced modulus) was measured from a load weight and thrust depth obtained from the load-displacement curve. In the nano indention method, a measurement can be performed with high accuracy of 0.01 nm as a displacement resolving power, by using a head assembly of an ultra-low load, for example, the maximum load of 20 mN and a load resolving power of 1 nN.

In particular, as to the base layer 11 having different elastic moduli in the cross-sectional direction, a method of pressing an intender of an ultra-minute trigonal pyramid compared with the cross-sectional part and then measuring elastic moduli on the base material side and the opposite side at the cross-sectional part, is preferable, and in the case, a nano indenter operable in a scanning electron microscope has been developed from the viewpoint of enhancing the accuracy, and the modulus can be obtained by application of these.

[Electrically Conductive Layer]

The electrically conductive layer 12 is a layer constituted of silver as the principal component, and is a layer constituted using silver or an alloy containing silver as the principal component and formed adjacent to a nitrogen-containing layer 23. Examples of methods for forming such electrically conductive layer 12 includes methods of using a wet process such as a coating method, an ink jet method, a coating method, or a dip method; methods using a dry process such as vapor deposition methods (resistance heating, EB method, etc.), a sputtering method, or a CVD method; and the like. Among them, the vapor deposition method is applied preferably. Furthermore, the electrically conductive layer 12 is characterized by having sufficient conducting properties because of being formed on the nitrogen-containing layer 23 even if no high temperature annealing treatment etc. after the formation are not given, but as necessary, it may be one having been subjected to a high temperature annealing treatment etc.

Examples of alloys containing silver (Ag) as the principal component for constituting the electrically conductive layer 12 include silver magnesium (AgMg), silver copper (AgCu), silver palladium (AgPd), silver palladium copper (AgPdCu), silver indium (AgIn) etc.

Such electrically conductive layer 12 as described below may have a configuration in which a layer of silver or an alloy containing silver as the principal component is laminated while dividing into a plurality of layers as necessary.

Furthermore, the electrically conductive layer 12 preferably has a thickness within a range of 4 to 12 nm. In the case of a thickness of 12 nm or less, an absorption component and a reflection component of the layer are held low and the light transmittance of the transparent barrier film is maintained, which is preferable. Furthermore, as the result that the thickness is not less than 4 nm, the conductivity of the layer is secured.

Note that, in the translucent electrode 10 of the laminated structure made of the base layer 11 and the electrically conductive layer 12 as described below, the upper portion of the electrically conductive layer 12 may be covered with a protective film, or may be laminated with another conductive layer. In this case, the protective film and the conductive layer preferably have light permeability so as not to damage the light permeability of the translucent electrode 10. Furthermore, a configuration, in which a layer in accordance with necessity is provided also in the lower part of the electrically conductive layer 12, that is, between the base layer 11 and the electrically conductive layer 12, is acceptable.

<2. Translucent electrode (second embodiment)>

Figure 2:
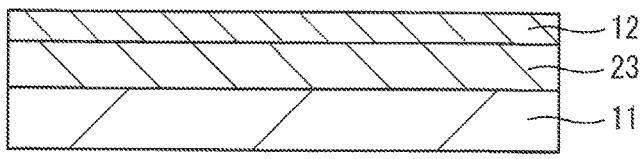
FIG. 2 is a drawing showing a schematic configuration of the translucent electrode in a second embodiment.

Next, a second embodiment of the translucent electrode will be explained. In FIG. 2, a schematic configuration view (a cross-sectional view) of the translucent electrode in the second embodiment is shown. A translucent electrode 20 in the second embodiment shown in FIG. 2 differs only in being provided with a nitrogen-containing layer 23 from the translucent electrode 10 in the first embodiment shown in FIG. 1. Hereinafter, repeated detailed explanations of constituent components the same as those in the first embodiment will be omitted, and the configuration of the translucent electrode 20 in the second embodiment will be explained.

As shown in FIG. 2, the translucent electrode 20 is provided with the base layer 11, the nitrogen-containing layer 23 and the electrically conductive layer 12. The base layer and the electrically conductive layer 12 have the configuration the same as those in the above-described first embodiment. Furthermore, in the translucent electrode 20, the nitrogen-containing layer is provided between the base layer 11 and the electrically conductive layer 12. Namely, the electrically conductive layer 12 is formed adjacent to one surface of the nitrogen-containing layer 23.

[Nitrogen-Containing Layer]

The nitrogen-containing layer 23 is formed adjacent to the electrically conductive layer 12 and is a layer sandwiched between the base layer 11 and the electrically conductive layer 12.

As the result of the formation of the nitrogen-containing layer 23 adjacent to the electrically conductive layer 12, diffusion distance of silver atoms at the surface of the nitrogen-containing layer is reduced due to the interaction between silver being the principal component of the electrically conductive layer 12 and a compound containing a nitrogen atom constituting the nitrogen-containing layer 23, and thus aggregation of the silver is suppressed. Therefore, generally, a thin silver layer that tends to be easily isolated in an island shape as the result of the growth by a nuclear growth-type (Volumer-Weber: VW type) is formed by the growth of a single layer growth type (Frank-van der Merwe: FM type). Accordingly, the electrically conductive layer 12 having a uniform thickness, although the thickness is small, can be obtained by forming the electrically conductive layer 12 containing silver as the principal component in contact with the nitrogen-containing layer 23.

The nitrogen-containing layer 23 preferably has the thickness of 5 nm or less. This is because a smaller thickness of the nitrogen-containing layer 23, that is, a smaller distance between the base layer 11 and the electrically conductive layer gives higher light transmittance of the translucent electrode 20. Note that the thickness of the nitrogen-containing layer 23 is set to be a thickness that does not prevent the FM type growth of the electrically conductive layer 12 formed on the nitrogen-containing layer 23, that is, to be approximately a thickness of the extent that the nitrogen-containing layer 23 is formed not in an island shape but as a continuous layer covering the base layer 11.

Furthermore, the nitrogen-containing layer 23 is a layer provided adjacent to the electrically conductive layer 12, and is constituted using a compound containing a nitrogen atom (N). An unshared electron pair of a nitrogen atom that is bonded stably to silver being the main material for constituting the electrically conductive layer 12 in the compound containing a nitrogen atom is referred to as an "effective unshared electron pair." Additionally, the compound constituting the nitrogen-containing layer 23 is characterized in that the content ratio of the effective unshared electron pair" is within a prescribed range.

Here, the "effective unshared electron pair" is defined as an unshared electron pair that is not involved in aromaticity and is not coordinated to a metal, among unshared electron pairs of a nitrogen atom contained in a compound. The aromaticity means an unsaturated ring structure in which atoms having a π electron are laid in a ring shape, and the aromaticity follows the so-called "Huckel's rule" which requires a condition in which the number of electrons contained in the it electron system on the ring is "4n+2" (n=0, or a natural number).

The "effective unshared electron pair" is selected based on whether or not the unshared electron pair of a nitrogen atom is involved in the aromaticity irrespective of whether or not the nitrogen atom itself including the unshared electron pair is a hetero atom constituting the aromatic ring. For example, even if a certain nitrogen atom is a hetero atom constituting an aromatic ring, when the nitrogen atom has an unshared electron pair that is not involved in the aromaticity, the unshared electron pair is an "effective unshared electron pair." In contrast, even in the case where a certain nitrogen atom is not a hetero atom constituting an aromatic ring, if all the unshared electron pairs of the nitrogen atom are involved in the aromaticity, the unshared electron pairs of the nitrogen atom are not the "effective unshared electron pair." Note that, in respective compounds, the number of the "effective unshared electron pair" n coincides with the number of the nitrogen atoms having the "effective unshared electron pair."

In the present embodiment, the number n of the "effective unshared electron pair" relative to the molecular weight M of such a compound is defined as, for example, an effective unshared electron pair content ratio [n/M]. The nitrogen-containing layer 23 is characterized by being constituted using a compound that is selected so that the [n/M] is $2.0 \times 10^{-3} \leq [n/M]$. Furthermore, the nitrogen-containing layer 23 is more preferable when the effective unshared electron pair content ratio [n/M] defined as described above is within the range of $3.9 \times 10^{-3} \leq [n/M]$. The above-described effect of suppressing the aggregation of silver constituting the electrically conductive layer is obtained by constituting the nitrogen-containing layer using a compound in which the effective unshared electron pair content ratio $[n/M] \geq 2.0 \times 10^{-3}$.

Furthermore, it is sufficient that the nitrogen-containing layer 23 is constituted using a compound whose effective unshared electron pair content ratio [n/M] is within the above-described prescribed range, that the layer is also constituted only of such a compound, or that the layer is constituted mixing such a compound and another compound for use. Another compound may or may not contain a nitrogen atom, and furthermore, the effective unshared electron pair content ratio [n/M] may not be within the prescribed range.

When the nitrogen-containing layer 23 is constituted using a plurality of compounds, for example, the molecular weight M of the mixed compound obtained by mixing these compounds is obtained based on the mixing ratio of the compounds. Additionally, an average value of the effective unshared electron pair content ratio [n/M] is obtained from the total number n of "effective unshared electron pairs" relative to the molecular weight M. The value is preferably within the prescribed range. Namely, the effective unshared electron pair content ratio [n/M] of the nitrogen-containing layer 23 itself is preferably within the prescribed range.

Note that, in the case where the nitrogen-containing layer 23 is constituted using a plurality of compounds and has a configuration different in the mixing ratio (content ratio) of compounds in the thickness direction, it is sufficient that the effective unshared electron pair content ratio [n/M] in the surface layer of the nitrogen-containing layer 23 on the side in contact with the electrically conductive layer 12 is within the prescribed range.

[Compound-1]

Hereinafter, specific examples of compounds (No. 1 to No. 40), which satisfy that the effective unshared electron pair content ratio [n/M] is $2.0 \times 10^{-3} \leq [n/M]$, will be shown as compounds constituting the nitrogen-containing layer 23. In respective compounds of No. 1 to No. 40, ○ is given to a nitrogen atom having the "effective unshared electron pair." In addition, in the Table 1 below, molecular weights M of these compounds of No. 1 to No. 40, numbers n of the "effective unshared electron pair," and effective unshared electron pair content ratios [n/M] are shown. In copper phthalocyanine of a compound 33 below, unshared electron pairs not coordinated to the copper, among unshared electron pairs of a nitrogen atom, are counted as the effective unshared electron pair.

[Chem. 2]
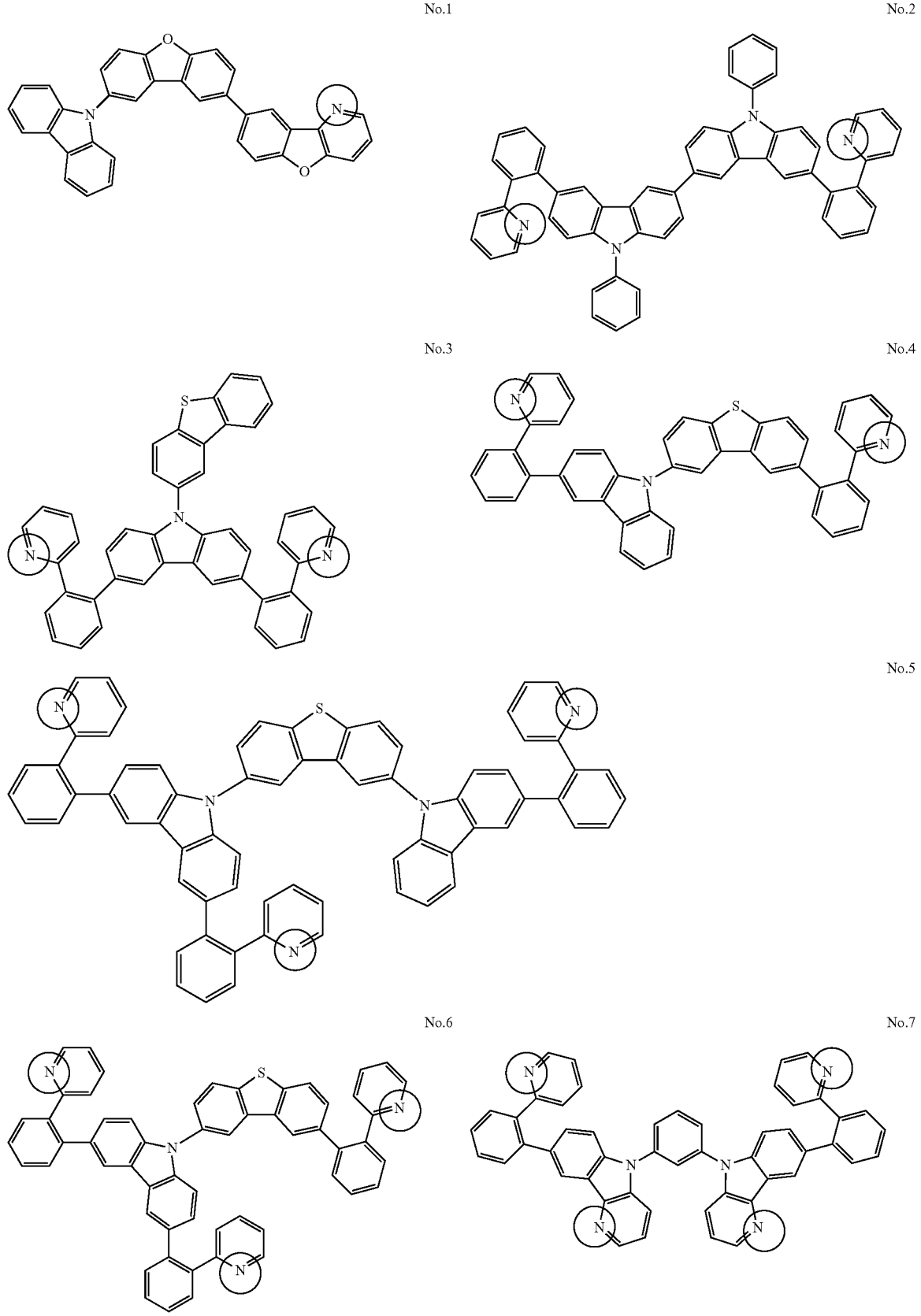

-continued
[Chem. 3]
No.8
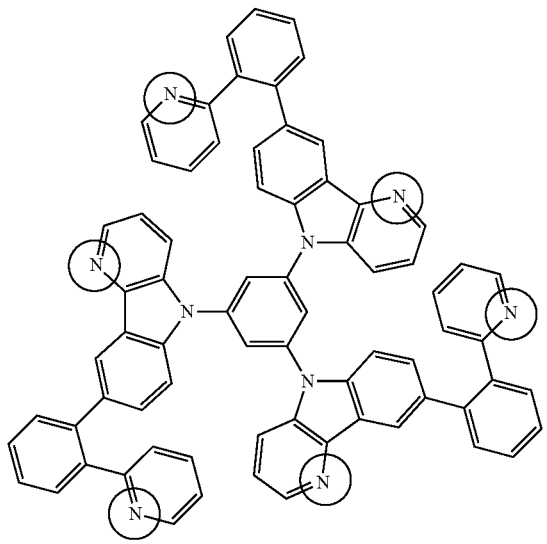
No.9
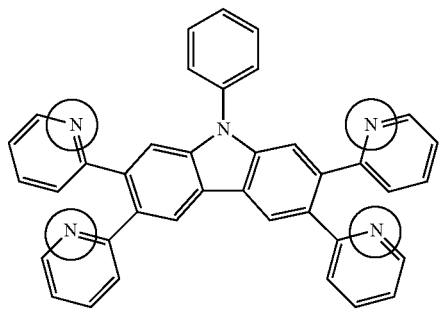
No.10
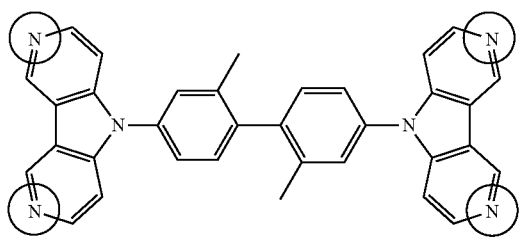
No.11
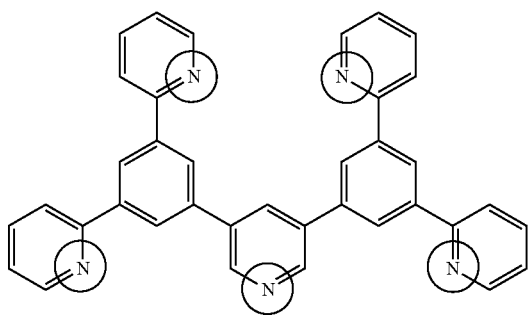
No.12
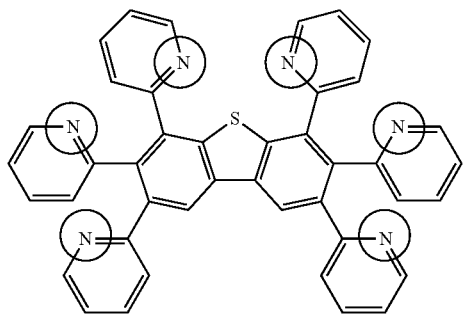
No.13
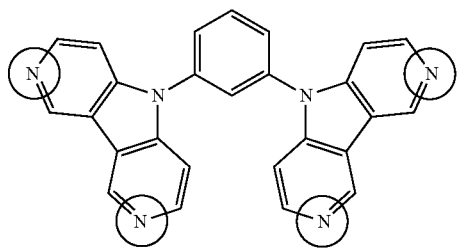
No.14
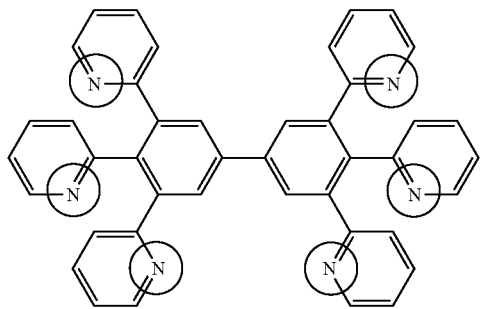
No.15
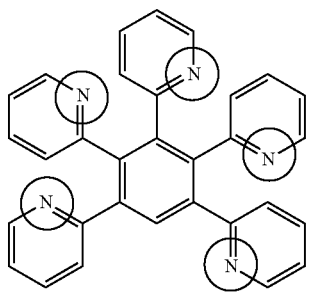

-continued
No.16
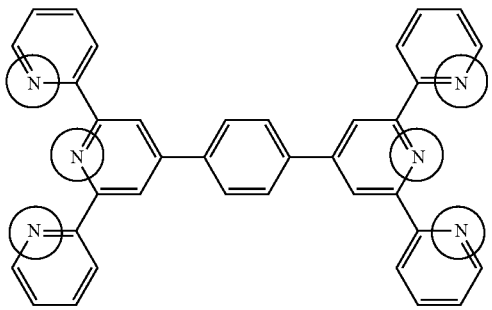
[Chem. 4]
No.17
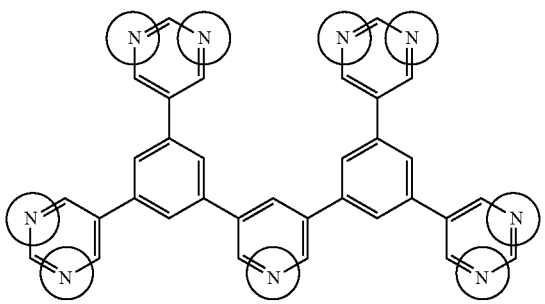
No.18
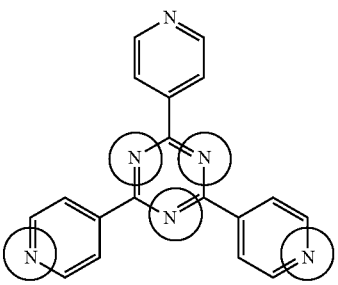
No.19
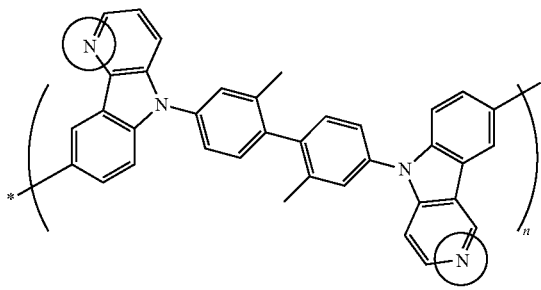
No.20
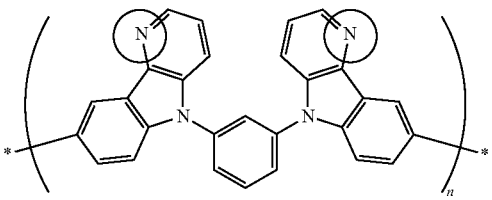
No.21
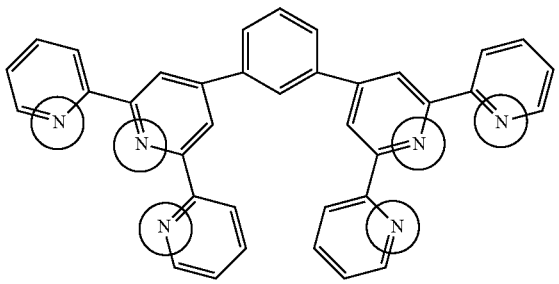
No.22
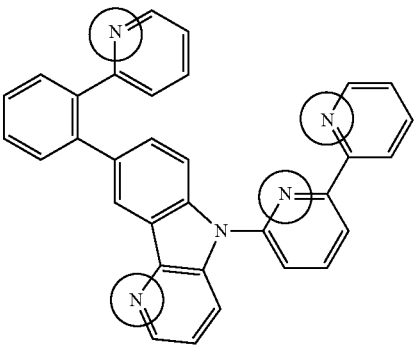
No.23
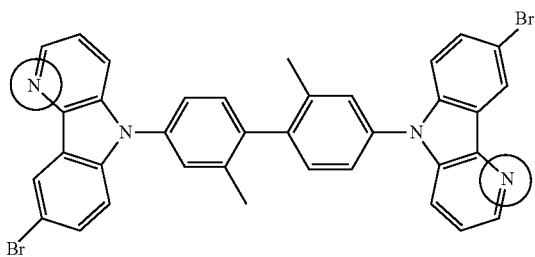

-continued
No.24
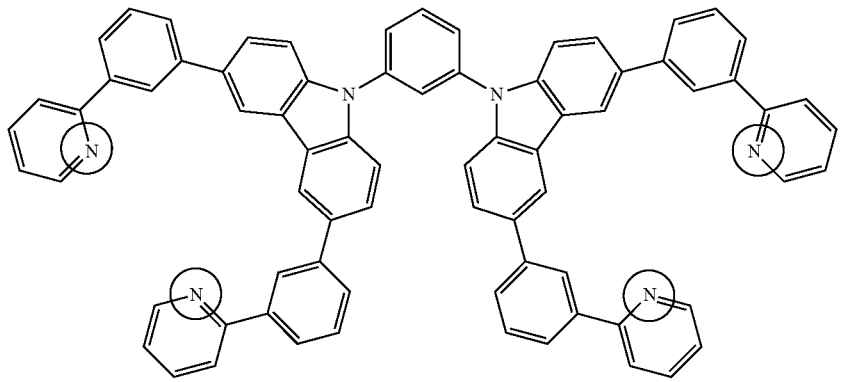
No.25
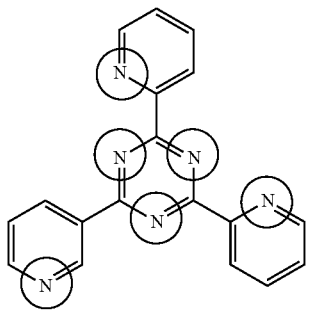
[Chem. 5]
No.26
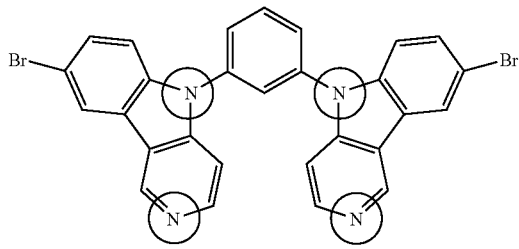
No.27
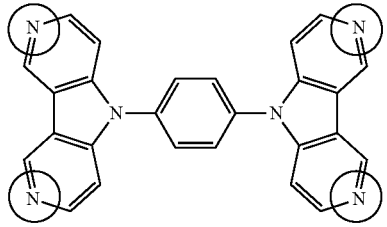
No.28
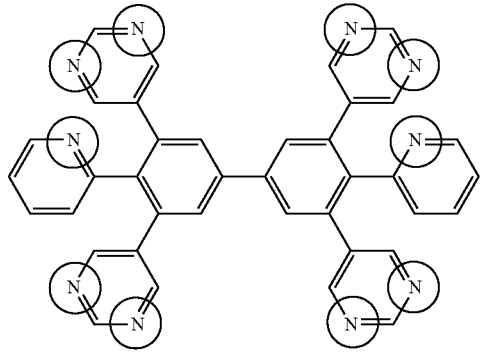

-continued
No.29
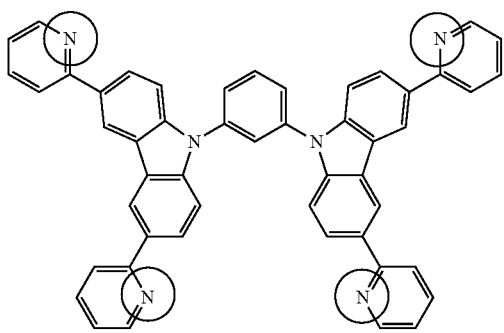
No.30
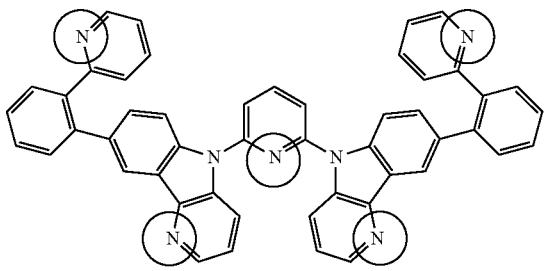
No.31
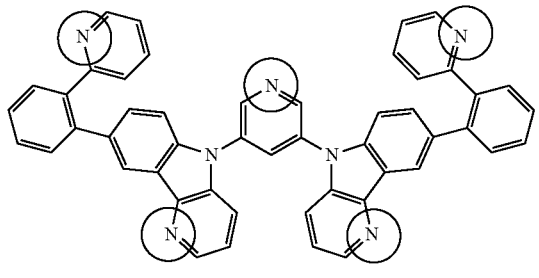
No.32
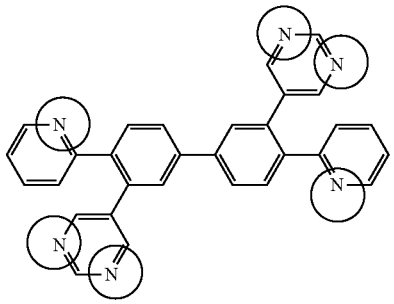
No.33
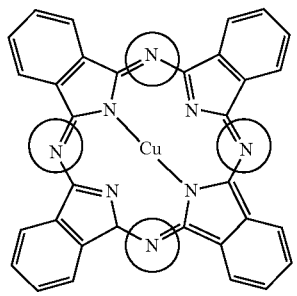
No.34
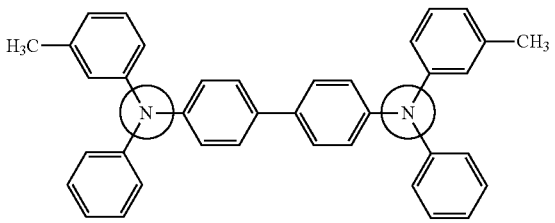
No.35
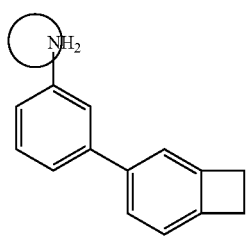

[Chem. 6]

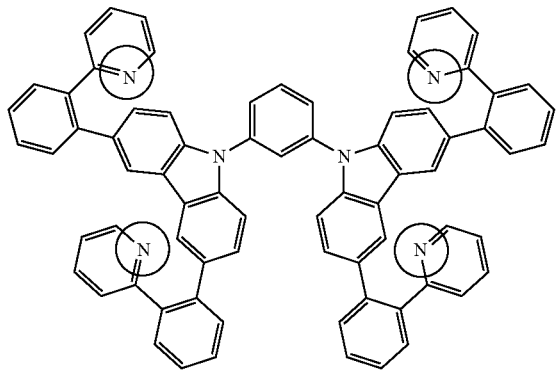

No.36

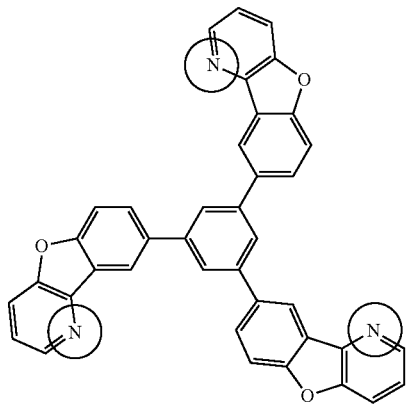

No.37

TABLE 1

| COMPOUND | NUMBER OF EFFECTIVE UNSHARED ELECTRON PAIRS (n) | MOLECULAR WEIGHT [M] | [n/M] | RELEVANT GENERAL FORMULA |
|---|---|---|---|---|
| No. 1 | 1 | 500.55 | 2.0E−03 | |
| No. 2 | 2 | 790.95 | 2.5E−03 | |
| No. 3 | 2 | 655.81 | 3.0E−03 | |
| No. 4 | 2 | 655.81 | 3.0E−03 | |
| No. 5 | 3 | 974.18 | 3.1E−03 | (2) |
| No. 6 | 3 | 808.99 | 3.7E−03 | |
| No. 7 | 4 | 716.83 | 5.6E−03 | (1), (2) |
| No. 8 | 6 | 1036.19 | 5.8E−03 | (1), (4) |
| No. 9 | 4 | 551.64 | 7.3E−03 | |
| No. 10 | 4 | 516.60 | 7.7E−03 | (1), (3) |
| No. 11 | 5 | 539.63 | 9.3E−03 | |
| No. 12 | 6 | 646.76 | 9.3E−03 | (5) |
| No. 13 | 4 | 412.45 | 9.7E−03 | (1), (3) |
| No. 14 | 6 | 616.71 | 9.7E−03 | (5) |
| No. 15 | 5 | 463.53 | 1.1E−02 | (2) |
| No. 16 | 6 | 540.62 | 1.1E−02 | (6) |
| No. 17 | 9 | 543.58 | 1.7E−02 | |
| No. 18 | 6 | 312.33 | 1.9E−02 | |
| No. 19 | 2 | 512.60 | 3.9E−03 | (1) |
| No. 20 | 2 | 408.45 | 4.9E−03 | (1) |
| No. 21 | 6 | 540.62 | 1.1E−02 | (6) |
| No. 22 | 4 | 475.54 | 8.4E−03 | (1) |
| No. 23 | 2 | 672.41 | 3.0E−03 | (1) |
| No. 24 | 4 | 1021.21 | 3.9E−03 | |
| No. 25 | 6 | 312.33 | 1.9E−02 | (6) |
| No. 26 | 4 | 568.26 | 7.0E−03 | (1) |
| No. 27 | 4 | 412.45 | 9.7E−03 | (1), (3) |
| No. 28 | 10 | 620.66 | 1.6E−02 | (5) |
| No. 29 | 4 | 716.83 | 5.6E−03 | |
| No. 30 | 5 | 717.82 | 7.0E−03 | (1), (2) |
| No. 31 | 5 | 717.82 | 7.0E−03 | (1), (2) |
| No. 32 | 6 | 464.52 | 1.3E−02 | |
| No. 33 | 4 | 576.10 | 6.9E−03 | |
| No. 34 | 2 | 516.67 | 3.9E−03 | |
| No. 35 | 1 | 195.26 | 5.1E−03 | |
| No. 36 | 4 | 1021.21 | 3.9E−03 | (2) |
| No. 37 | 3 | 579.60 | 5.2E−03 | |
| No. 38 | 4 | 538.64 | 7.4E−03 | |
| No. 39 | 3 | 537.65 | 5.6E−03 | |
| No. 40 | 2 | 332.40 | 6.0E−03 | |

In the above Table 1, when those exemplified compounds are also involved in the general formulae (1) to (6) which represent other compounds explained herein below, the corresponding general formulae are indicated.

[Compound-2]

In addition, as the compound constituting the nitrogen-containing layer 23, other than the above compound having the effective unshared electron pair content [n/M] of the above-described predetermined range, compounds having properties to be required for each of the electronic devices to which the transparent electrode 20 provided with the nitrogen-containing layer 23 is applied are used. For example, in case where the transparent electrode 20 is used as an electrode of an organic electroluminescent element, the following compounds represented by the general formulae (1) to (6) are used as the compound constituting the nitrogen-containing layer 23 from the viewpoints of film formation and electron transport property.

Among these compounds represented by the general formulae (1) to (6), a compound which falls within the above-described range of the effective unshared electron pair content [n/M] is included, and such a compound can be used alone as the compound constituting the nitrogen-containing layer 23 (See Table 1). On the other hand, if a compound represented by the general formulae (1) to (6) does not fall within the above-described range of the effective unshared electron pair content [n/M], the compound can be used as the compound constituting the nitrogen-containing layer 23 by mixing with the compound having the above-described range of the effective unshared electron pair content [n/M].

[Chem. 7]

General formula (1)

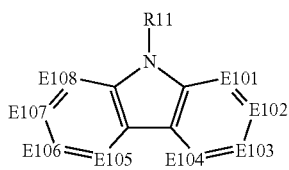

In the general formula (1), E101 to E108 each represent —C(R12)= or —N=; and at least one of E101 to E108 is —N=. In addition, the above-described R11 in the general formula (1) and the above-described R12 represent hydrogen atom or a substituent.

Examples of the substituent include an alkyl group (for example, methyl group, ethyl group, propyl group, isopropyl group, tert-butyl group, pentyl group, hexyl group, octyl group, dodecyl group, tridecyl group, tetradecyl group, pentadecyl group and the like), a cycloalkyl group (for example, cyclopentyl group, cyclohexyl group and the like), an alkenyl group (for example, vinyl group, allyl group and the like), an alkynyl group (for example, ethynyl group, propargyl group and the like), an aromatic hydrocarbon group (also referred to as an aromatic carbon ring group, an aryl group or the like, for example; phenyl group, p-chlorophenyl group, mesityl group, tolyl group, xylyl group, naphthyl group, anthryl group, azulenyl group, acenaphthenyl group, fluorenyl group, phenanthryl group, indenyl group, pyrenyl group, biphenyryl group and the like), an aromatic heterocyclic ring group (for example, furyl group, thienyl group, pyridyl group, pyridazinyl group, pyrimidinyl group, pyrazinyl group, triazinyl group, imidazolyl group, pyrazolyl group, thiazolyl group, quinazolinyl group, carbazolyl group, carbolinyl group, diazacarbazolyl group (a group in which a certain carbon atom constituting the carboline ring of the carbolinyl group is substituted with a nitrogen atom), phtharazinyl group and the like), a ring group (for example, pyrrolidyl group, imidazolidyl group, morpholyl group, oxazolidyl group and the like), an alkoxy group (for example, methoxy group, ethoxy group, propyloxy group, pentyloxy group, hexyloxy group, octyloxy group, dodecyloxy group and the like), a cycloalkoxy group (for example, cyclopentyloxy group, cyclohexyloxy group and the like), an aryloxy group (for example, phenoxy group, naphthyloxy group and the like), an alkylthio group (for example, methylthio group, ethylthio group, propylthio group, pentylthio group, hexylthio group, octylthio group, dodecylthio group and the like), a cycloalkylthio group (for example, cyclopentylthio group, cyclohexylthio group and the like), an arylthio group (for example, phenylthio group, naphthylthio group and the like), an alkoxycarbonyl group (for example, methyloxycarbonyl group, ethyloxycarbonyl group, butyloxycarbonyl group, octyloxycarbonyl group, dodecyloxycarbonyl group and the like), an aryloxycarbonyl group (for example, phenyloxycarbonyl group, naphthyloxycarbonyl group and the like), a sulfamoyl group (for example, aminosulfonyl group, methylaminosulfonyl group, dimethylaminosulfonyl group, butylaminosulfonyl group, hexylaminosulfonyl group, cyclohexylaminosulfonyl group, octylaminosulfonyl group, dodecylaminosulfonyl group, phenylaminosulfonyl group, naphthylaminosulfonyl group, 2-pyridylaminosulfonyl group and the like), an acyl group (for example, acetyl group, ethylcarbonyl group, propylcarbonyl group, pentylcarbonyl group, cyclohexylcarbonyl group, octylcarbonyl group, 2-ethylhexylcarbonyl group, dodecylcarbonyl group, phenylcarbonyl group, naphthylcarbonyl group, pyridylcarbonyl group and the like), an acyloxy group (for example, acetyloxy group, ethylcarbonyloxy group, butylcarbonyloxy group, octylcarbonyloxy group, dodecylcarbonyloxy group, phenylcarbonyloxy group and the like), an amido group (for example, methylcarbonylamino group, ethylcarbonylamino group, dimethylcarbonylamino group, propylcarbonylamino group, pentylcarbonylamino group, cyclohexylcarbonylamino group, 2-ethylhexylcarbonylamino group, octylcarbonylamino group, dodecylcarbonylamino group, phenylcarbonylamino group, naphthylcarbonylamino group and the like), a carbamoyl group (for example, aminocarbonyl group, methylaminocarbonyl group, dimethylaminocarbonyl group, propylaminocarbonyl group, pentylaminocarbonyl group, cyclohexylaminocarbonyl group, octylaminocarbonyl group, 2-ethylhexylaminocarbonyl group, dodecylaminocarbonyl group, phenylaminocarbonyl group, naphthylaminocarbonyl group, 2-pyridylaminocarbonyl group and the like), an ureido group (for example, methylureido group, ethylureido group, pentylureido group, cyclohexylureido group, octylureido group, dodecylureido group, phenylureido group, naphthylureido group, 2-pyridylaminoureido group and the like), a sulfinyl group (for example, methylsulfinyl group, ethylsulfinyl group, butylsulfinyl group, cyclohexylsulfinyl group, 2-ethylhexylsulfinyl group, dodecylsulfinyl group, phenylsulfinyl group, naphthylsulfinyl group, 2-pyridylsulfinyl group and the like), an alkylsulfonyl group (for example, methylsulfonyl group, ethylsulfonyl group, butylsulfonyl group, cyclohexylsulfonyl group, 2-ethylhexylsulfonyl group, dodecylsulfonyl group and the like), an arylsulfonyl group or a heteroarylsulfonyl group (for example, phenylsulfonyl group, naphthylsulfonyl group, 2-pyridylsulfonyl group and the like), an amino group (for example, amino group, ethylamino group, dimethylamino group, butylamino group, cyclopentylamino group, 2-ethylhexylamino group, dodecylamino group, anilino group, naphthylamino group, 2-pyridylamino group, piperidyl group (also referred to as piperidinyl group), 2,2,6,6-tetramethylpiperidinyl group and the like), a halogen atom (for example, fluorine atom, chlorine atom, bromine atom and the like), a fluorinated hydrocarbon group (for example, fluoromethyl group, trifluoromethyl group, pentafluoroethyl group, pentafluorophenyl group and the like), cyano group, nitro group, hydroxyl group, mercapto group, a silyl group (for example, trimethylsilyl group, triisopropylsilyl group, triphenylsilyl group, phenyldiethylsilyl group and the like), a phosphate group (for example, dihexylphosphoryl group and the like), a phosphite group (for example, diphenylphosphinyl group and the like), phosphono group, and the like.

Some of these substituents may further be substituted by the above-described substituent. In addition, two or more of these substituents may bind to each other to form a ring.

[Chem. 8]

General formula (2)

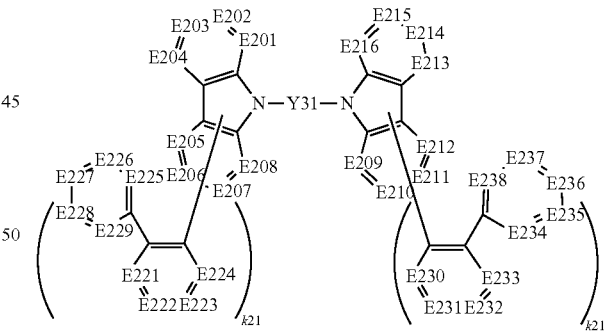

The general formula (2) is also one embodiment of the general formula (1). In the general formula (2), Y21 represents a divalent linking group of an arylene group, a heteroarylene group or a combination thereof. E201 to E216 and E221 to E238 each represent —C(R21)= or —N=, and the R21 represents hydrogen atom or a substituent. However, at least one of E221 to E229 and at least one of E230 to E238 represent —N=. k21 and k22 represent an integer of 0 to 4, and k21+k22 is an integer of 2 or more.

In the general formula (2), examples of an arylene group represented by Y21 include, for example, o-phenylene group, p-phenylene group, naphthalenediyl group, anthracenediyl group, naphthacenediyl group, pyrenediyl group, naphthylnaphthalenediyl group, biphenyldiyl group (for example, [1,1'-biphenyl]-4,4'-diyl group, 3,3'-biphenyldiyl group, 3,6-biphenyldiyl group and the like), terphenyldiyl group, quaterphenyldiyl group, quinquephenyldiyl group, sexiphenyldiyl group, septiphenyldiyl group, octiphenyldiyl group, nobiphenyldiyl group, deciphenyldiyl group and the like.

Furthermore, in the general formula (2), examples of a heteroarylene group represented by Y21 include, for example, a divalent group derived from a group consisting of carbazole ring, carboline ring, diazacarbazole ring (also referred to as monoazacarboline ring, and indicating a ring structure in which one carbon atom constituting the carboline ring is substituted with a nitrogen atom), triazole ring, pyrrole ring, pyridine ring, pyrazine ring, quinoxaline ring, thiophene ring, oxadiazole ring, dibenzofuran ring, dibenzothiophene ring, indole ring and the like.

As a preferable divalent linking group which is an arylene group, a heteroarylene group or a combination thereof represented by Y21 contain, among the heteroarylene groups, preferable is a group which is derived from a condensed aromatic heterocyclic ring formed by condensing three or more rings, and as the group derived from the condensed aromatic heterocyclic ring formed by condensing three or more rings, preferable is a group derived from dibenzofuran ring or a group derived from dibenzothiophene ring.

In the general formula (2), when the R21 of —C(R21)═ each represented by E201 to E216, E221 to E238 is a substituent, as examples of its substituent, the substituent exemplified as R11, R12 of the general formula (1) are applied in the same way.

In the general formula (2), it is preferable that six or more of E201 to E208 and six or more of E209 to E216 each represent —C(R21)═.

In the general formula (2), it is preferable that at least one of E225 to E229 and at least one of E234 to E238 represent —N═.

Furthermore, in the general formula (2), it is preferable that at least one of E225 to E229 and at least one of E234 to E238 represent —N═.

In the general formula (2), preferable aspect is that E221 to E224 and E230 to E233 each represent —C(R21)═.

Moreover, in the compound represented by the general formula (2), it is preferable that E203 represents —C(R21)═, and R21 represents a linking moiety, and furthermore it is also preferable that E211 represents —C(R21)═, and R21 represents a linking moiety.

Furthermore, it is preferable that E225 and E234 represent —N═, and it is preferable that E221 to E224 and E230 to E233 each represent —C(R21)═.

[Chem. 9]

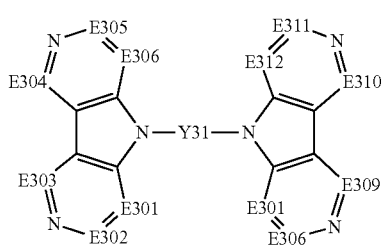

General formula (3)

The general formula (3) is also one embodiment of the general formula (1). In the general formula (3), E301 to E312 each represent —C(R31)═, and the R31 represents hydrogen atom or a substituent. Y31 represents a divalent linking group of an arylene group, a heteroarylene group or combination thereof.

In the above-described general formula (3), when the R31 of —C(R31)═ each represented by E301 to E312 is a substituent, as examples of its substituent, the substituent exemplified as R11, R12 of the general formula (1) are applied in the same way.

In addition, in the general formula (3), a preferable aspect of the divalent linking group of an arylene group, a heteroarylene group or combination thereof represented by Y31, is the same as that in Y21 of the general formula (2).

[Chem. 10]

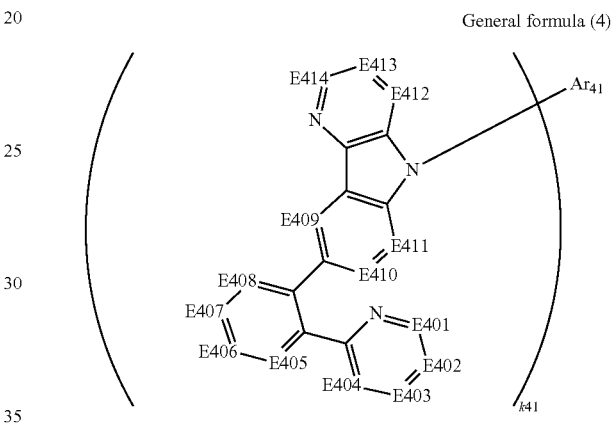

General formula (4)

The general formula (4) is also one embodiment of the general formula (1). In the above-described the general formula (4), E401 to E414 each represent —C(R41)═, and the R41 represents hydrogen atom or a substituent. In addition, Ar41 represents a substituted or un-substituted aromatic hydrocarbon ring or aromatic heterocyclic ring. Furthermore, k41 represents an integer of 3 or more.

In the above-described general formula (4), when the R41 of —C(R41)═ each represented by E401 to E414 is a substituent, as examples of its substituent, the substituent exemplified as R11, R12 of the general formula (1) are applied in the same way.

In the general formula (4), when Ar41 represents an aromatic hydrocarbon ring, examples of the aromatic hydrocarbon ring include benzene ring, biphenyl ring, naphthalene ring, azulene ring, anthracene ring, phenanthrene ring, pyrene ring, chrysene ring, naphthacene ring, triphenylene ring, o-terphenyl ring, m-terphenyl ring, p-terphenyl ring, acenaphthene ring, coronene ring, fluorene ring, fluoranthrene ring, naphthacene ring, pentacene ring, perylene ring, pentaphene ring, picene ring, pyrene ring, pyranthrene ring, anthranthrene ring, and the like. Furthermore, these rings may also have a substituent represented by R11, R12 of the general formula (1).

In the general formula (4), when Ar41 represents an aromatic heterocyclic ring, examples of the aromatic heterocyclic ring include furan ring, thiophene ring, oxazole ring, pyrrole ring, pyridine ring, pyridazine ring, pyrimidine ring, pyrazine ring, triazine ring, benzimidazole ring, oxadiazole ring, triazole ring, imidazole ring, pyrazole ring, triazole ring, indole ring, benzimidazole ring, benzothiazole ring, benzoxazole ring, quinoxaline ring, quinazoline ring, phthalazine ring, carbazole ring, azacarbazole ring, and the like. Note that the azacarbazole ring represents a ring in which one or more carbon atoms of the benzene ring constituting the carbazole ring has been substituted by a nitrogen atom. Furthermore, these rings may also have a substituent represented by R11, R12 of the general formula (1).

[Chem. 11]

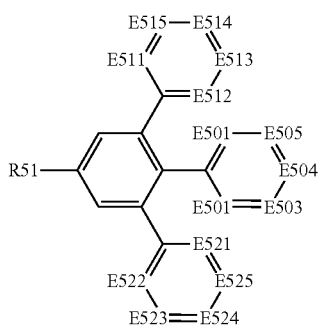

General formula (5)

In the above-described general formula (5), R51 represents a substituent, E501, E502, E511 to E515, E512 to E525 each represent —C(R52)= or —N=, E503 to E505 each represent —C(R52)=, R52 represents hydrogen atom (H) or a substituent, at least one of E501 and E502 is —N=, at least one of E511 to E515 is —N=, and at least one of E521 to E525 is —N=.

In the above-described general formula (5), when the R51 represents a substituent, as examples of the substituent, the substituent exemplified as R11, R12 of the general formula (1) are applied in the same way.

[Chem. 12]

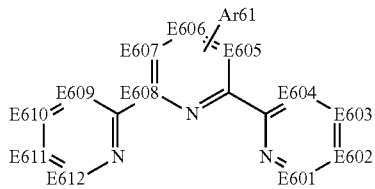

General formula (6)

In the above-described general formula (6), E601 to E612 each represent —C(R61)= or —N=, R61 represents hydrogen atom or a substituent. Ar61 represents a substituted or un-substituted aromatic hydrocarbon ring or aromatic heterocyclic ring.

In the above-described general formula (6), when the R61 of —C(R61)=each represented by E601 to E612 is a substituent, as examples of its substituent, the substituent exemplified as R11, R12 of the general formula (1) are applied in the same way.

In addition, in the general formula (6), the substituted or un-substituted aromatic hydrocarbon ring or aromatic heterocyclic ring represented by Ar61 is the same as that in Ar41 of the general formula (4).

[Compound-3]

In addition, as the other compound constituting the nitrogen-containing layer 23, other than the above compounds represented by the general formulae (1) to (6), there are compounds 1 to 118 exemplified in the followings. These compounds are materials having electron transport property or electron injection property. Accordingly, the transparent electrode 20 in which the nitrogen-containing layer 23 is constituted using such a compound is suitable to a transparent electrode in the organic electroluminescent element, and the nitrogen-containing layer 23 can be used as an electron transport layer or an electron injection layer in the organic electroluminescent element. Note that, among these compounds 1 to 118, a compound which falls within the above-described range of the effective unshared electron pair content [n/M] is included, and such a compound can be used alone as the compound constituting the nitrogen-containing layer 23. Furthermore, in the compounds 1 to 118, there are compounds which are applicable to the above-described general formulae (1) to (6).

[Chem. 13]

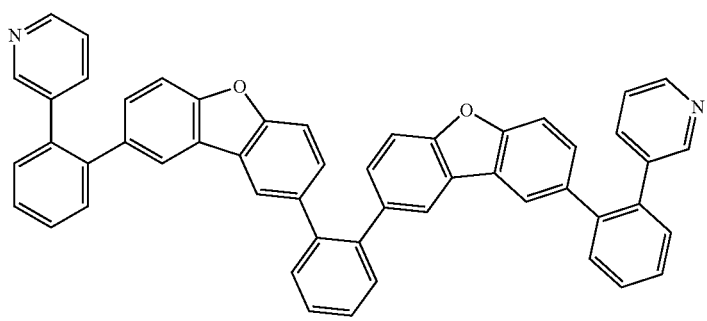

1

-continued
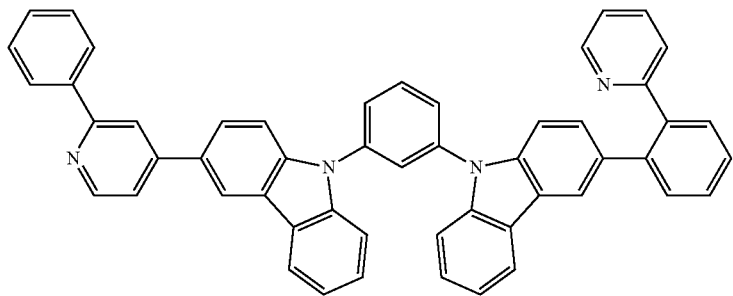
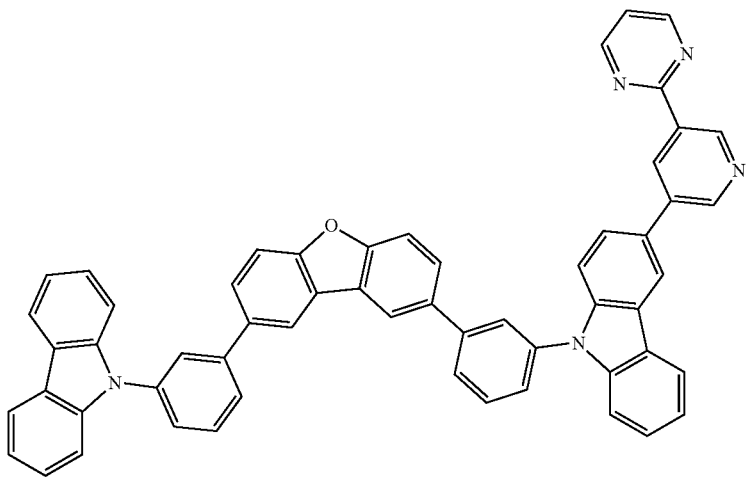
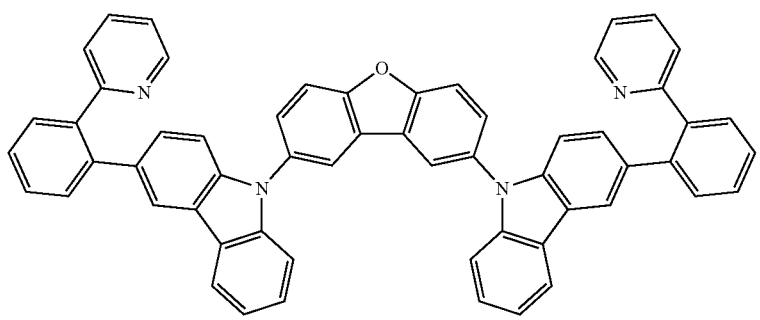
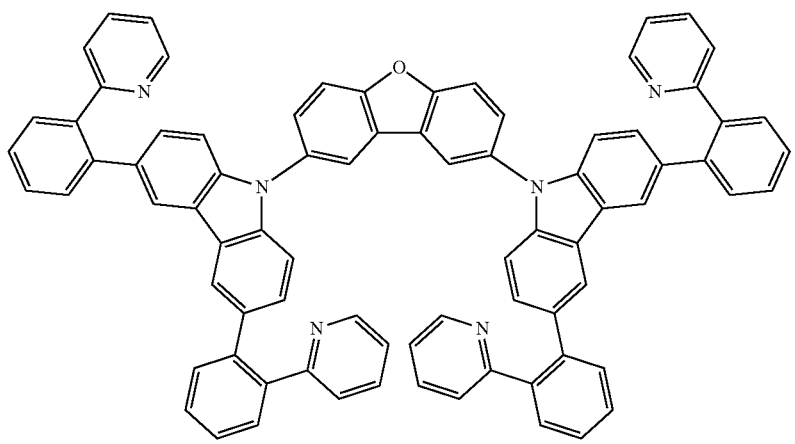

-continued
[Chem. 14]
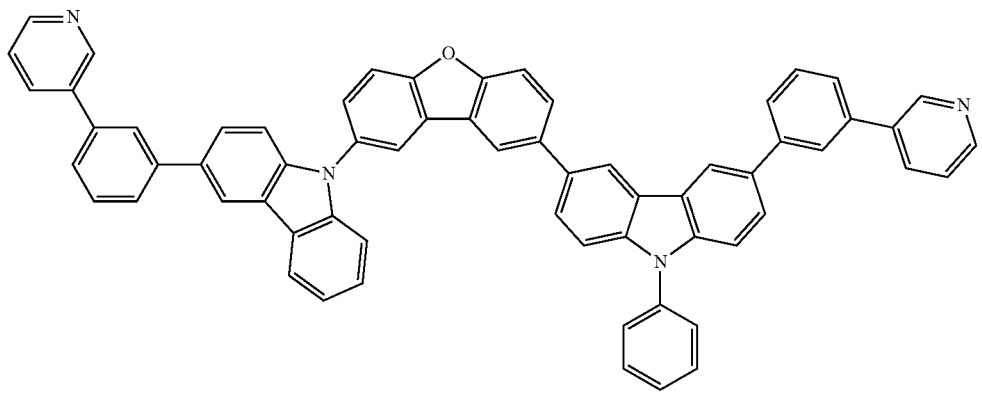
6
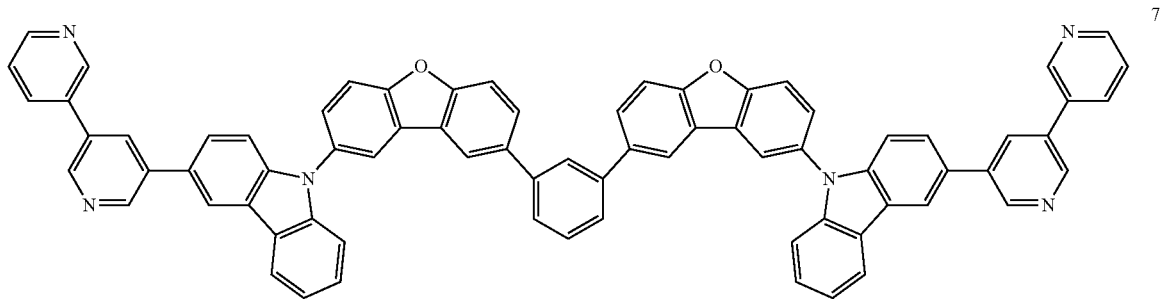
7
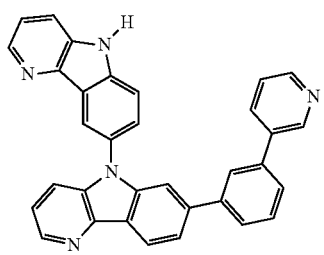
8
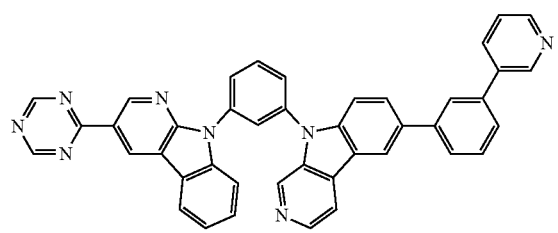
9
[Chem. 15]
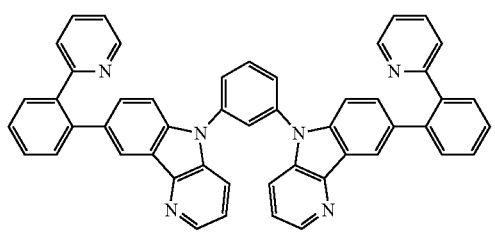
10
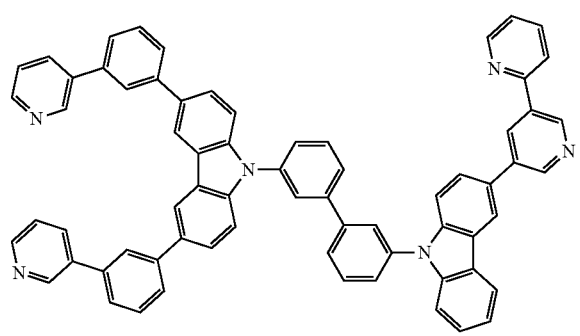
11
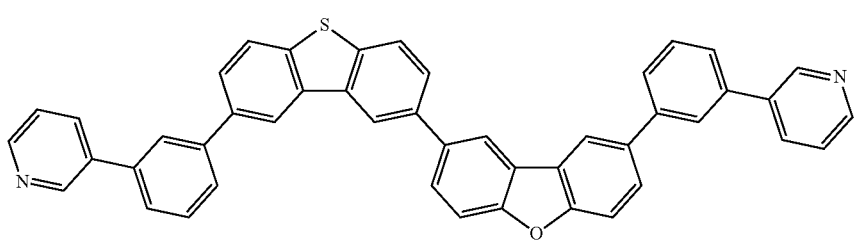
12

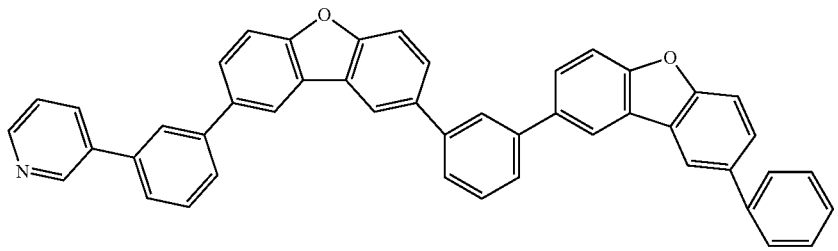
13
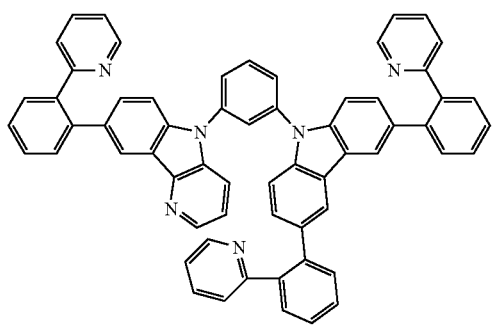
14
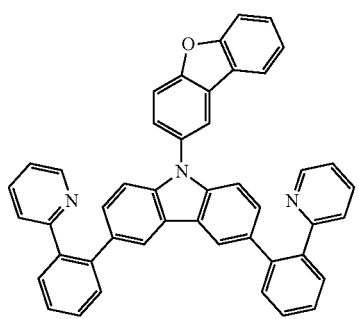
15
[Chem. 16]
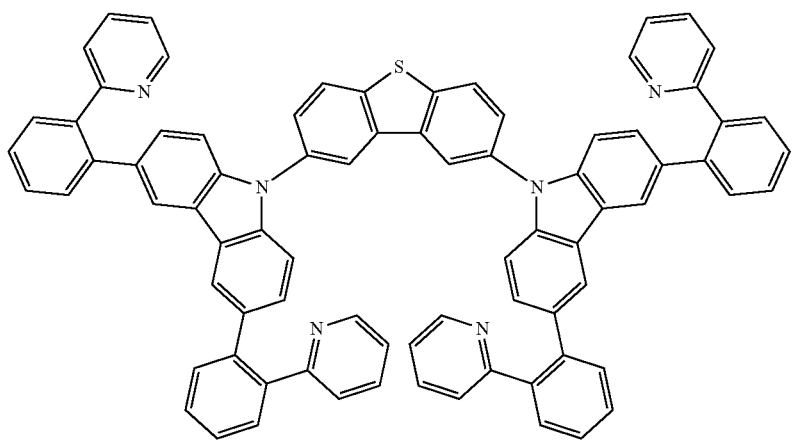
16
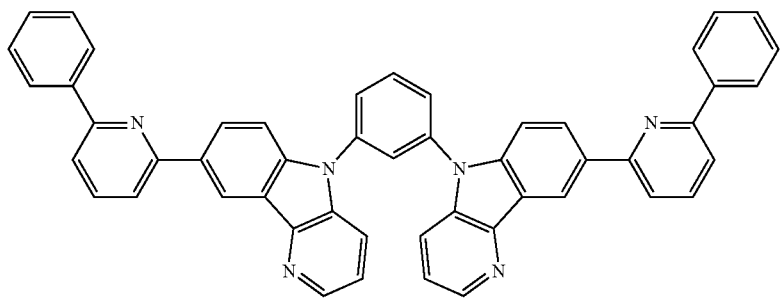
17

-continued
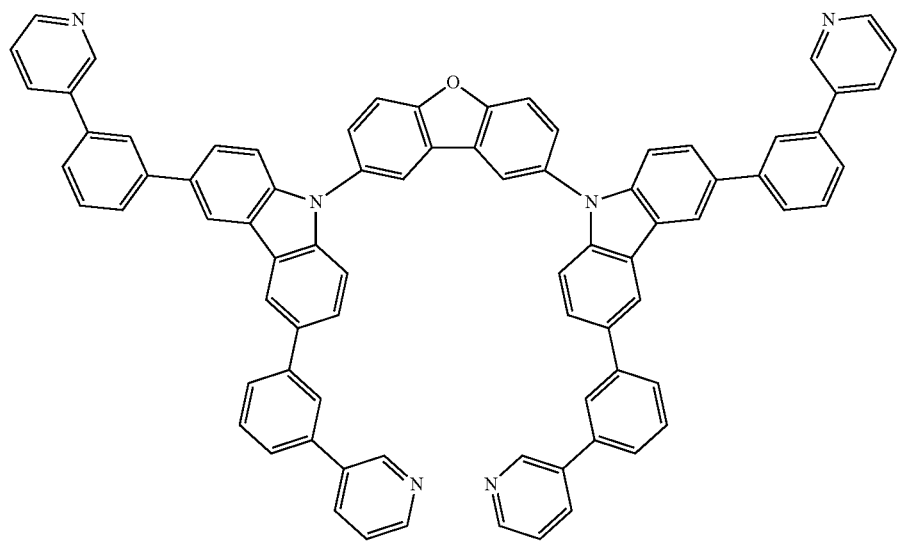
18
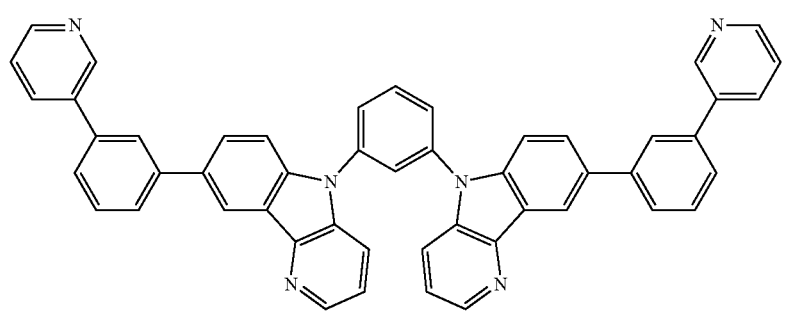
19
[Chem. 17]
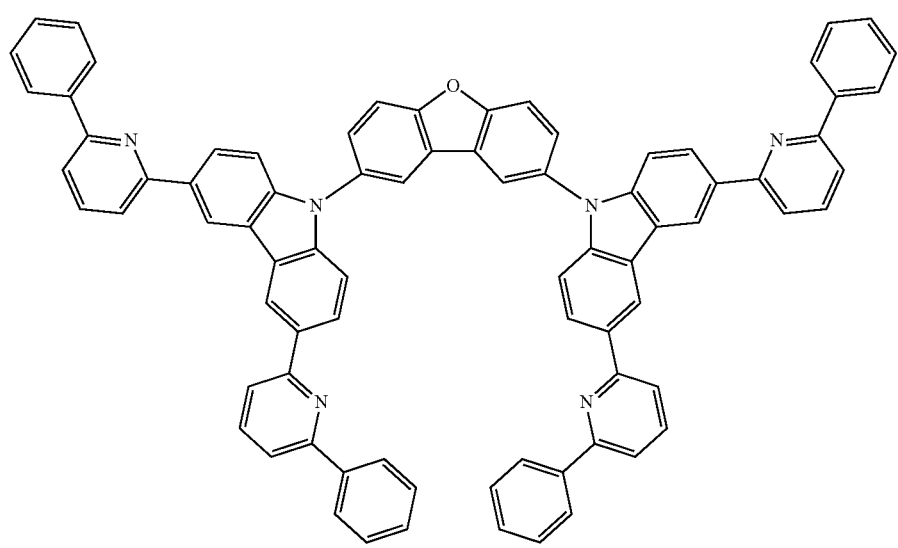
20

21
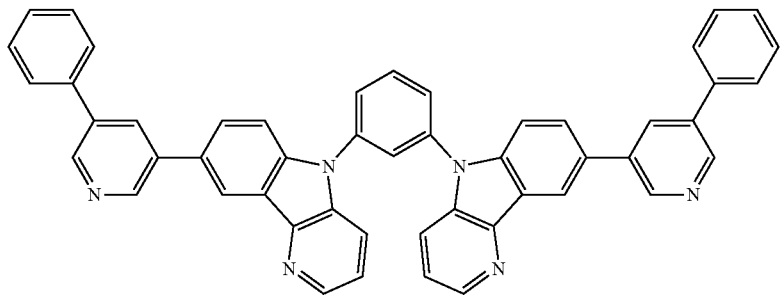
22
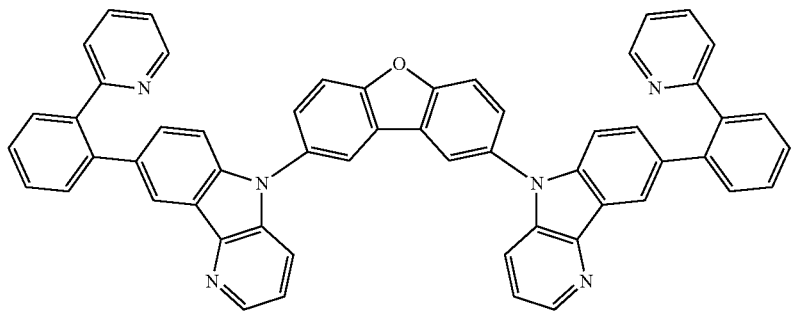
23
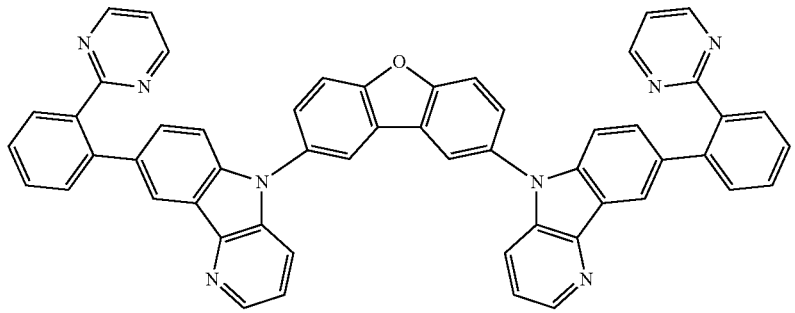
[Chem. 18]
24
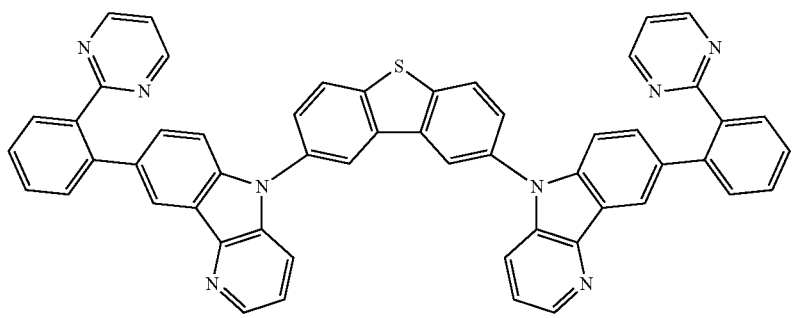
25
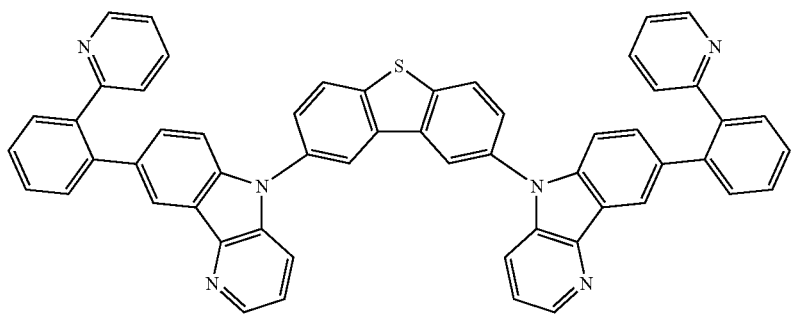

-continued
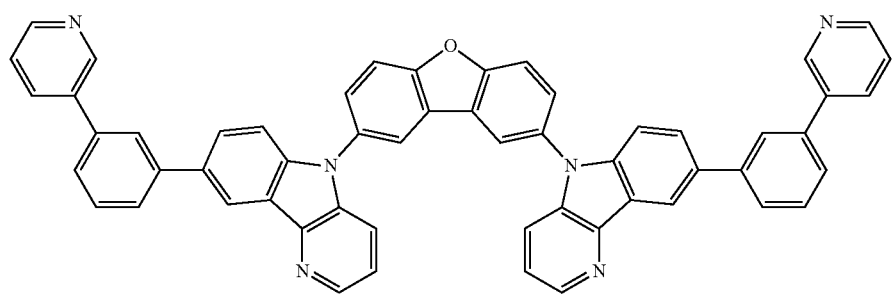
26
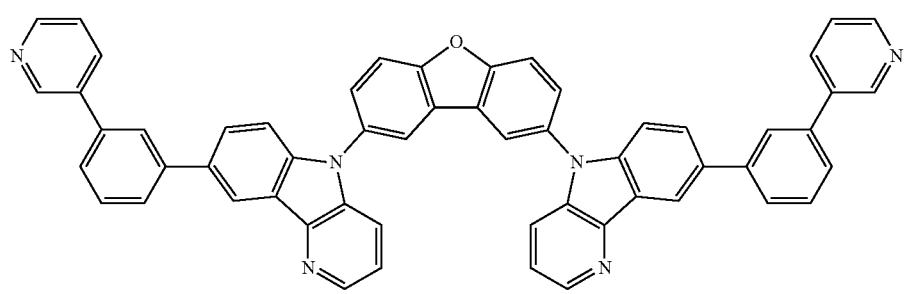
27
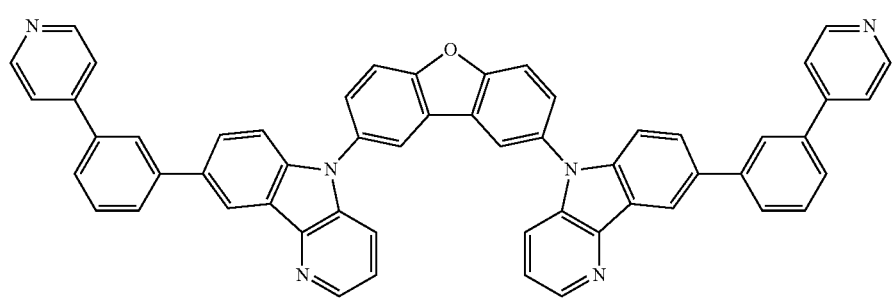
28
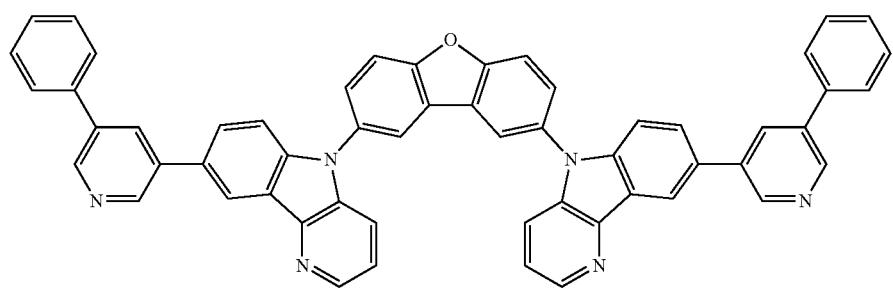
29
[Chem. 19]
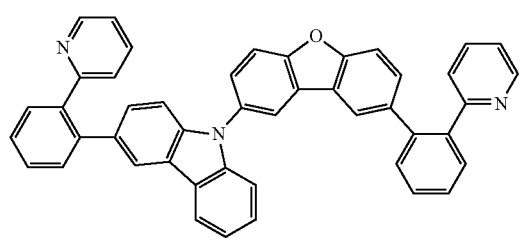
30
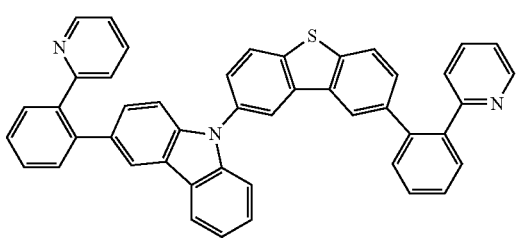
31

-continued
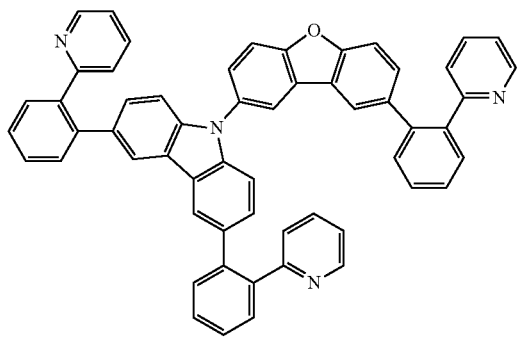
32
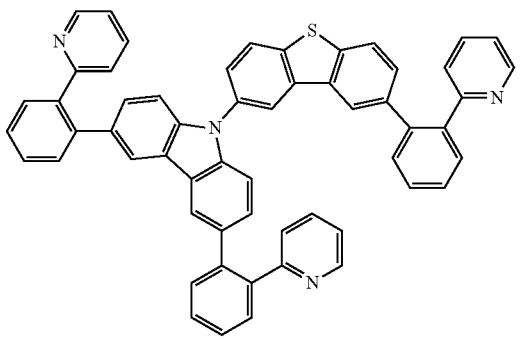
33
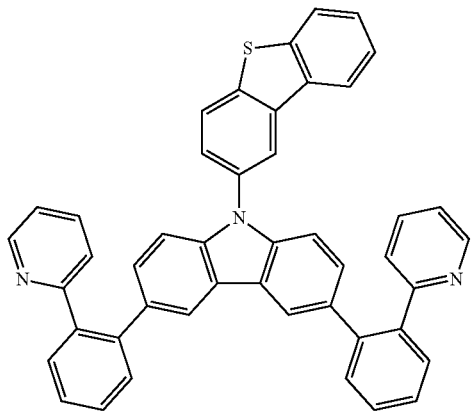
34
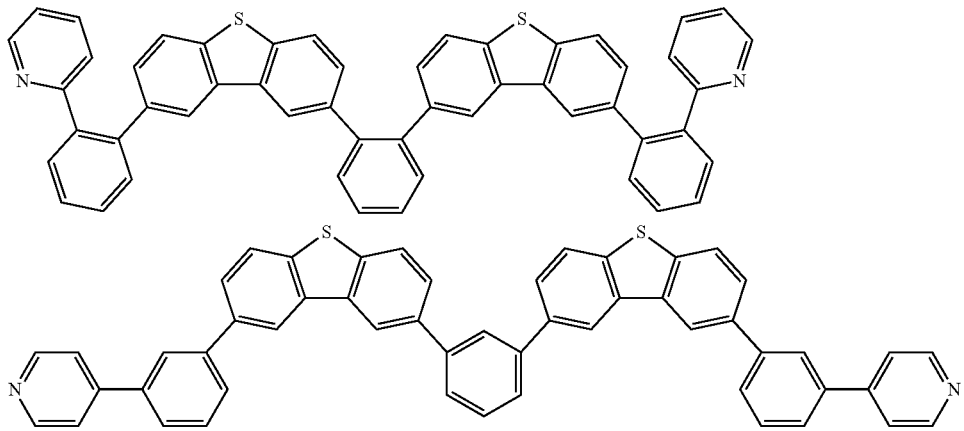
35
[Chem. 20]
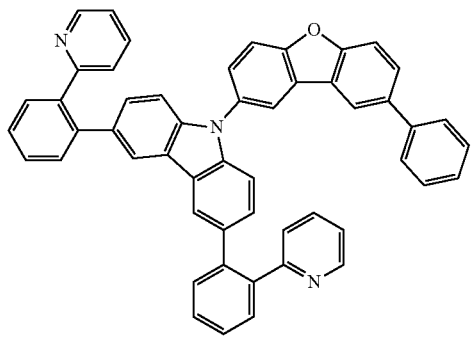
37
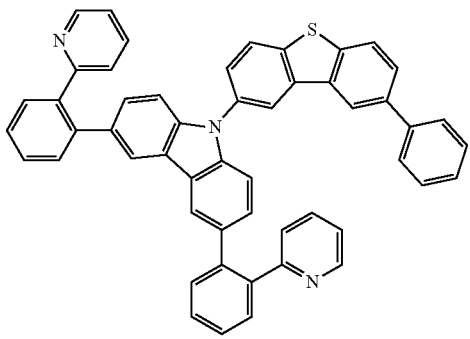
38

-continued
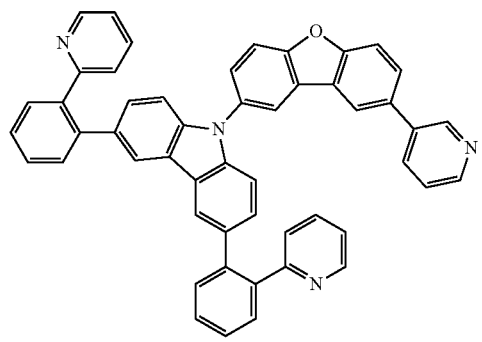
39
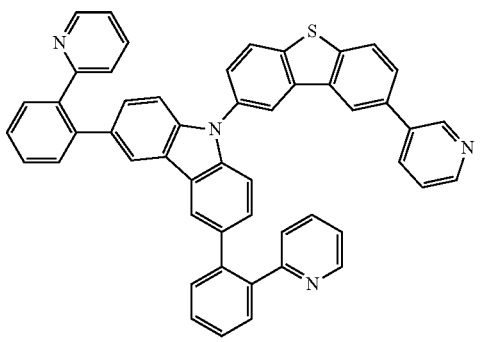
40
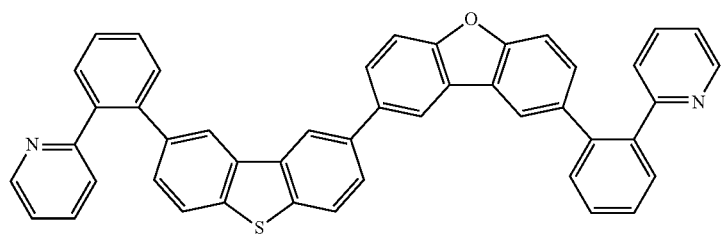
41
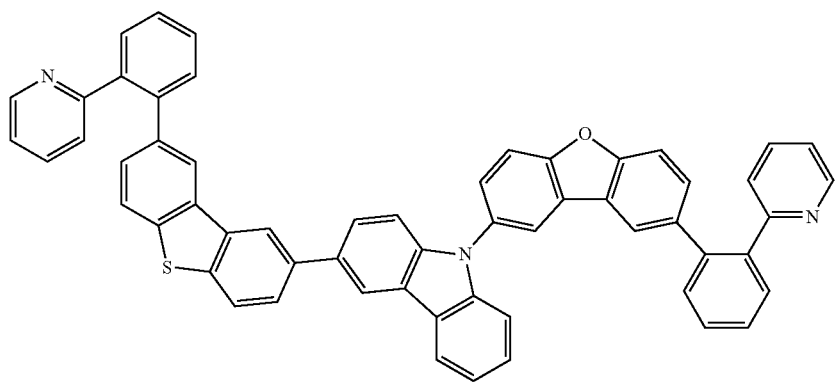
42
[Chem. 21]
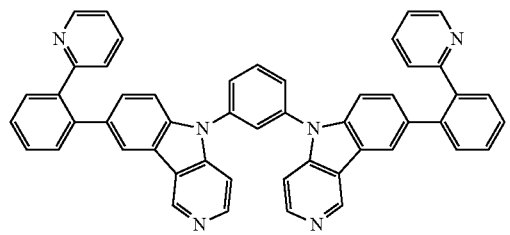
43
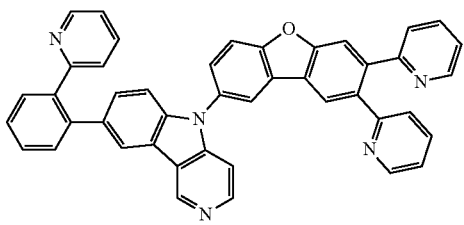
44
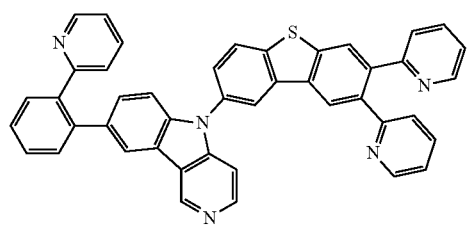
45
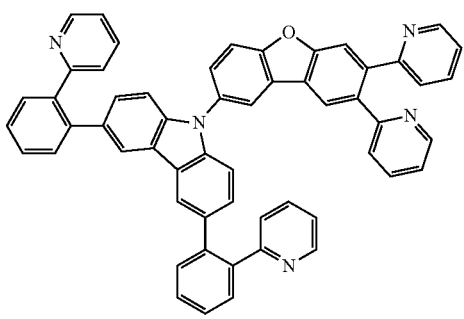
46

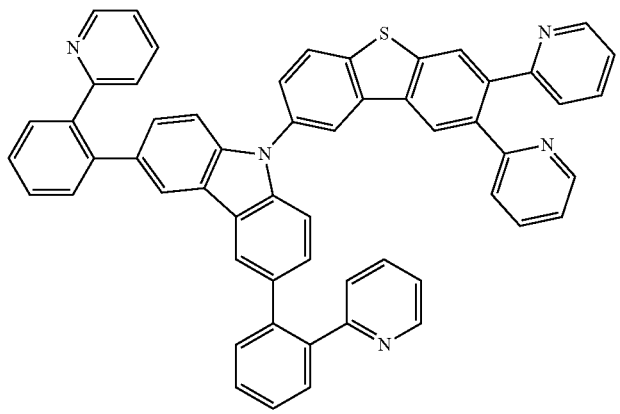
47
[Chem. 22]
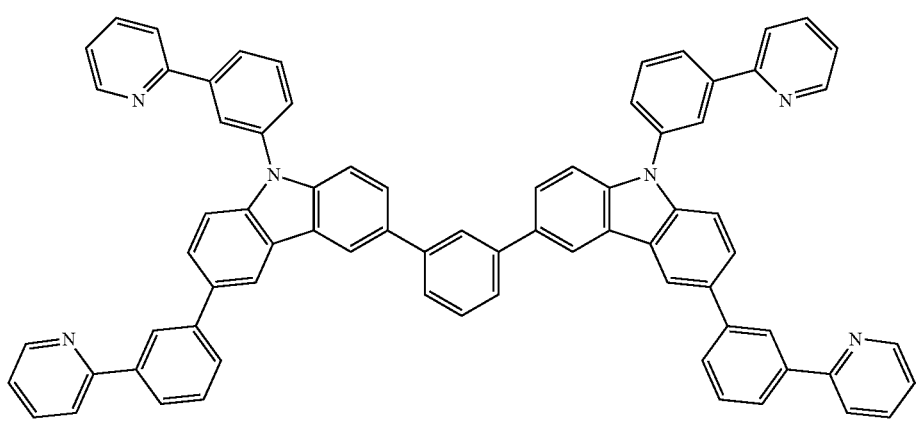
48
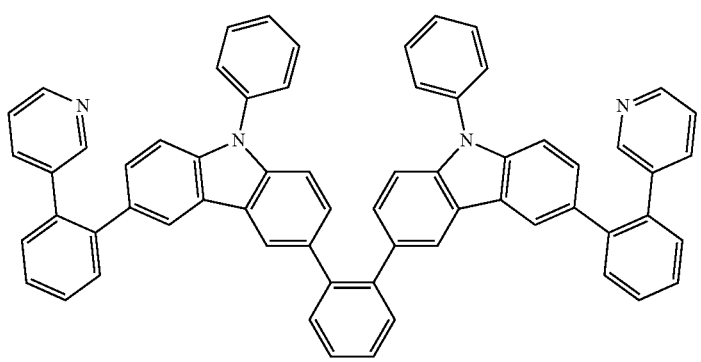
49
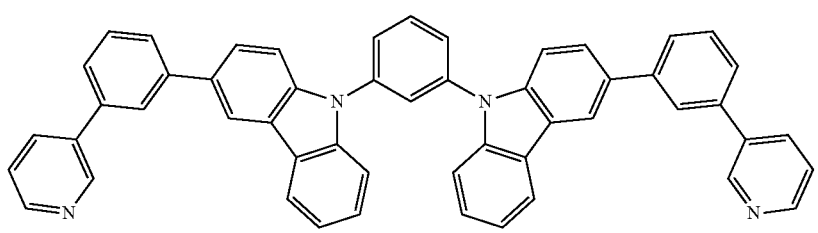
50

-continued
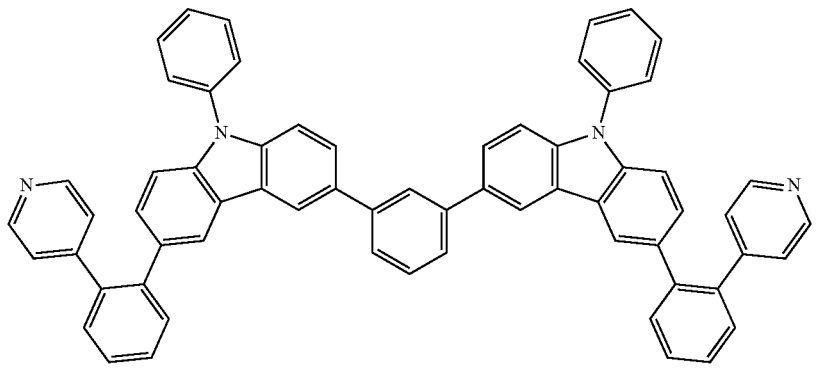
51
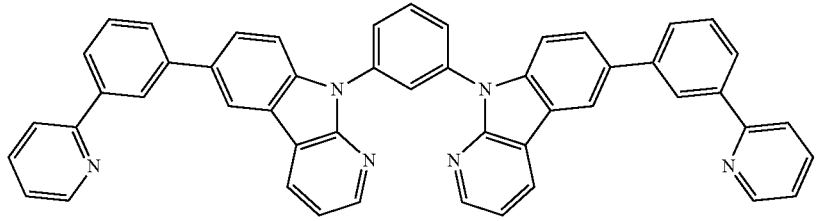
52
[Chem. 23]
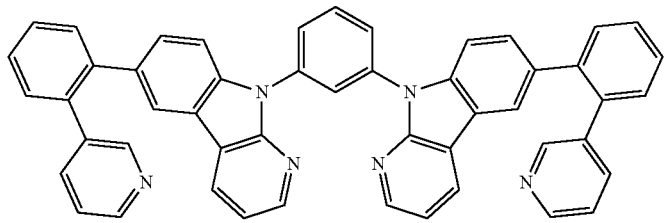
53
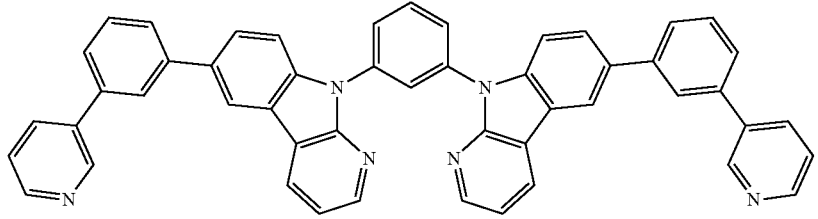
54
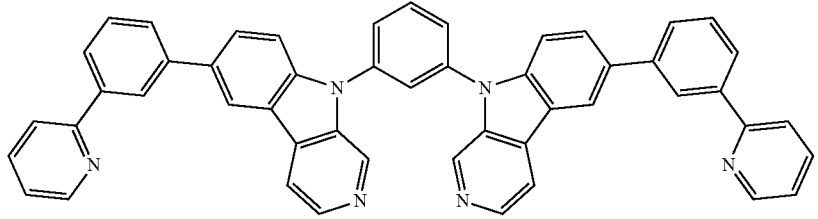
55
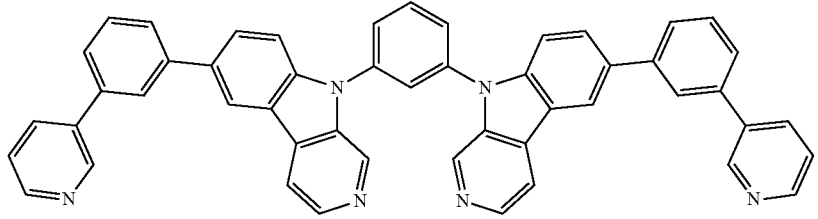
56

57
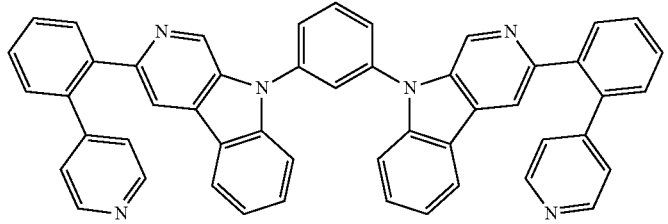
58
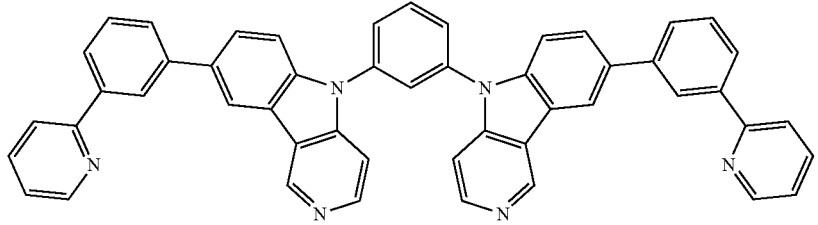
[Chem. 24]
59
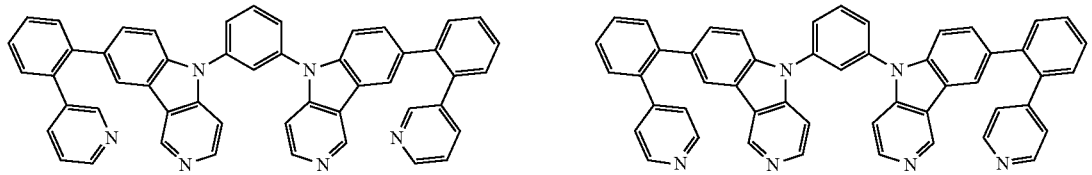
60
61
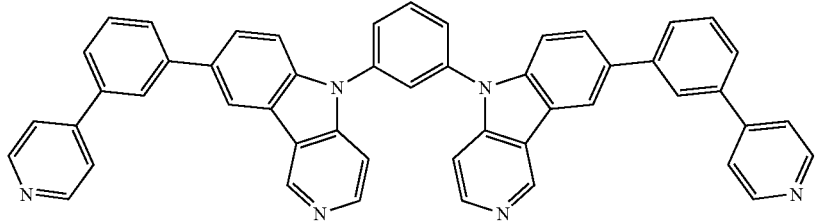
62
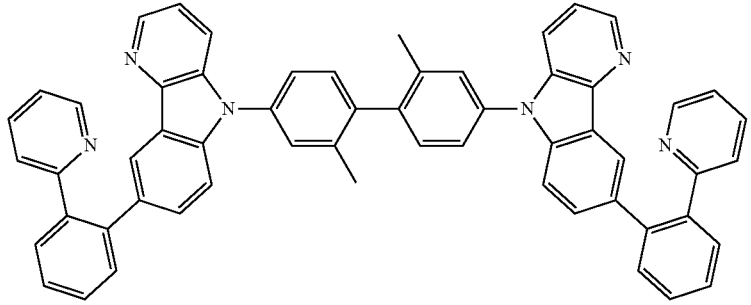
63
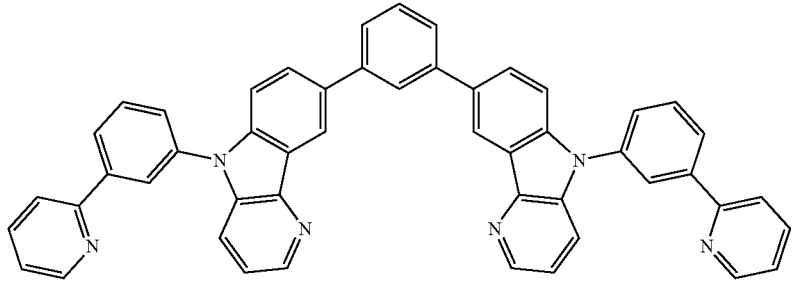

64
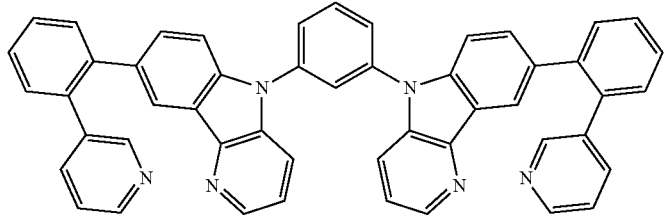
[Chem. 25]
65
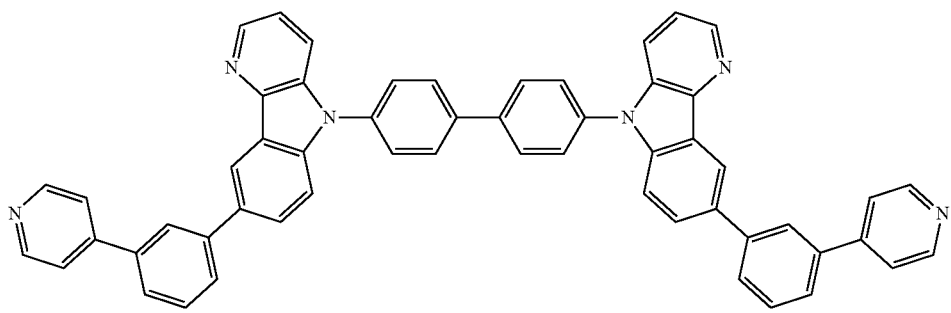
66
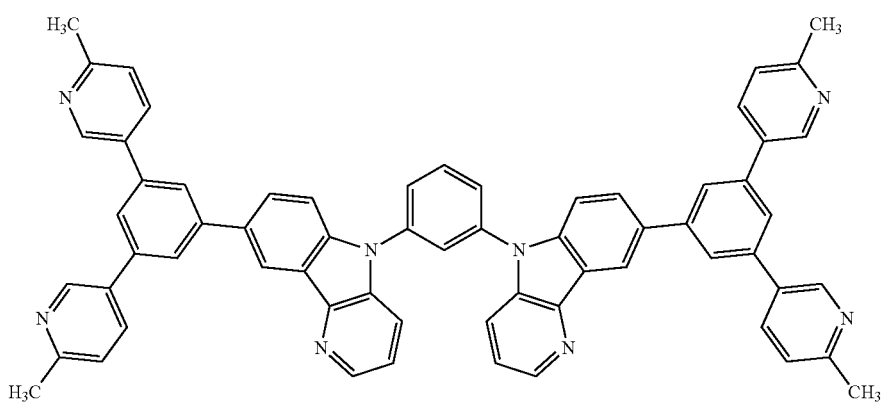
67
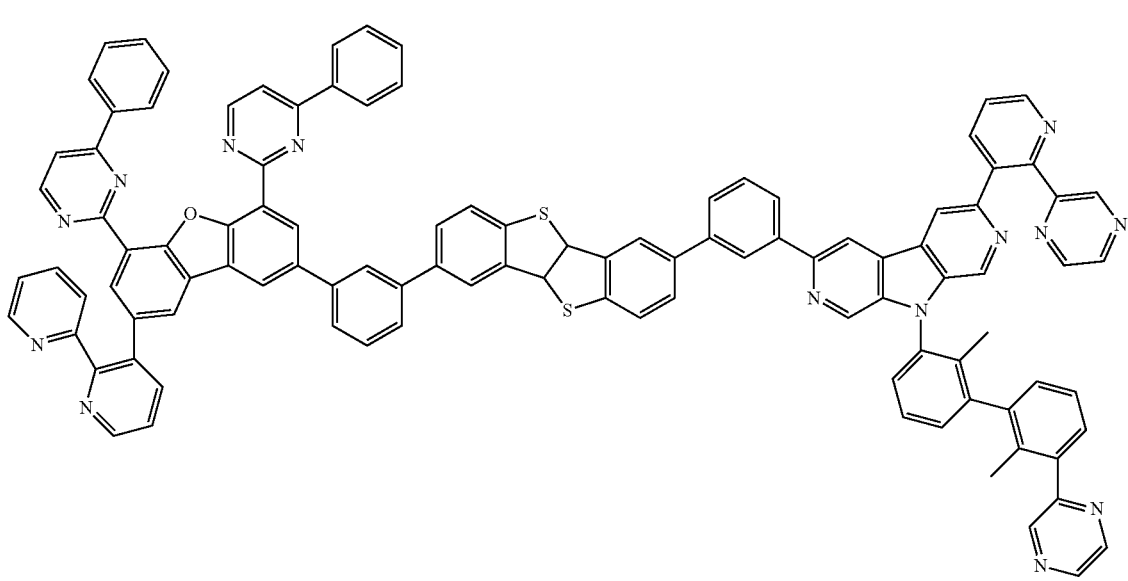

-continued
68
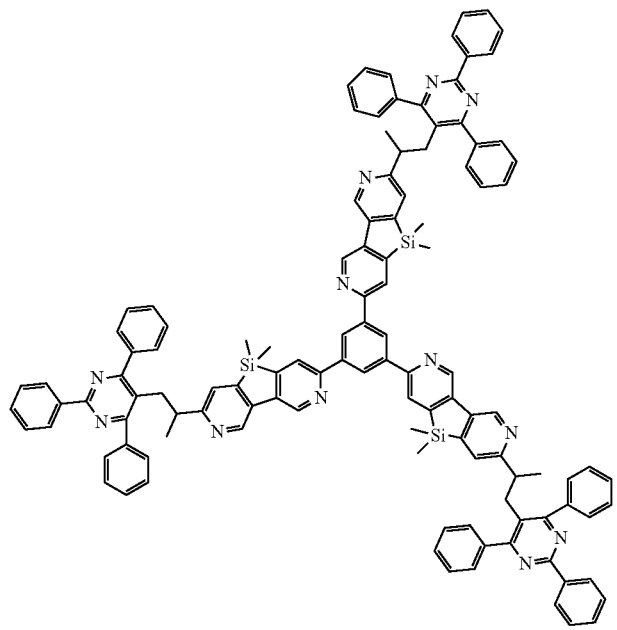
69
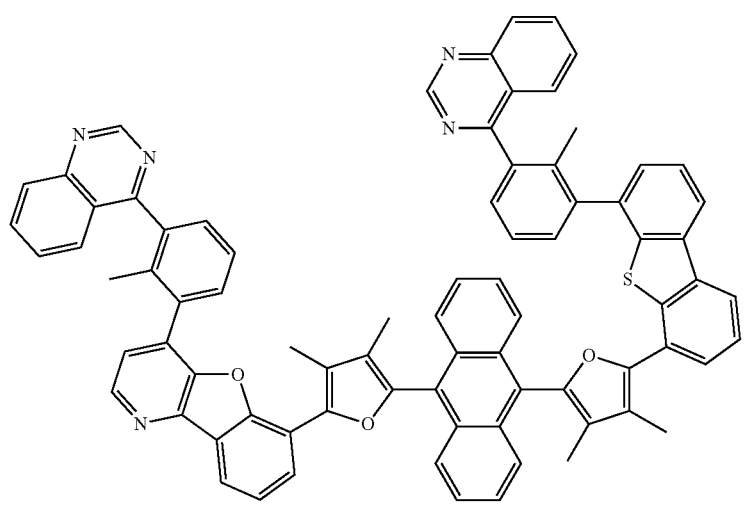
70
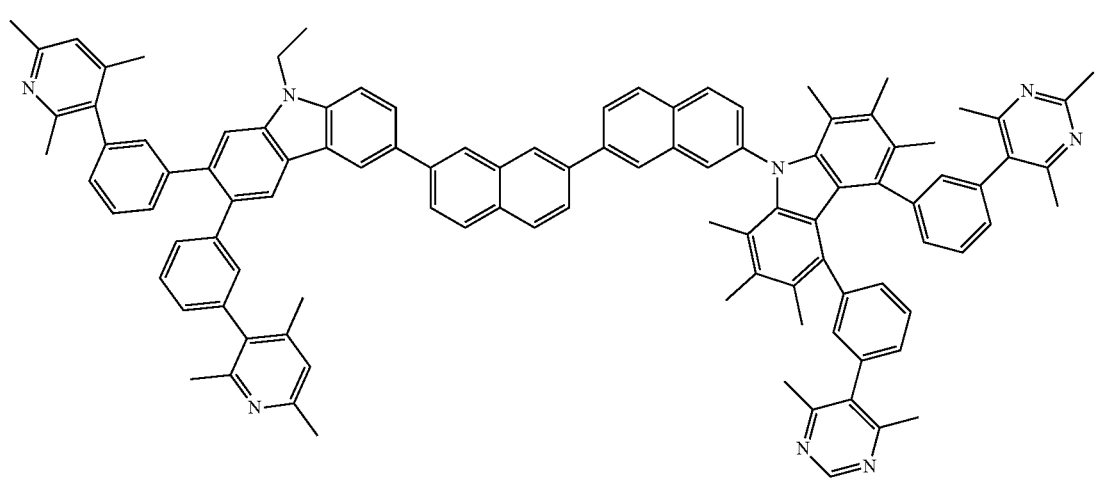

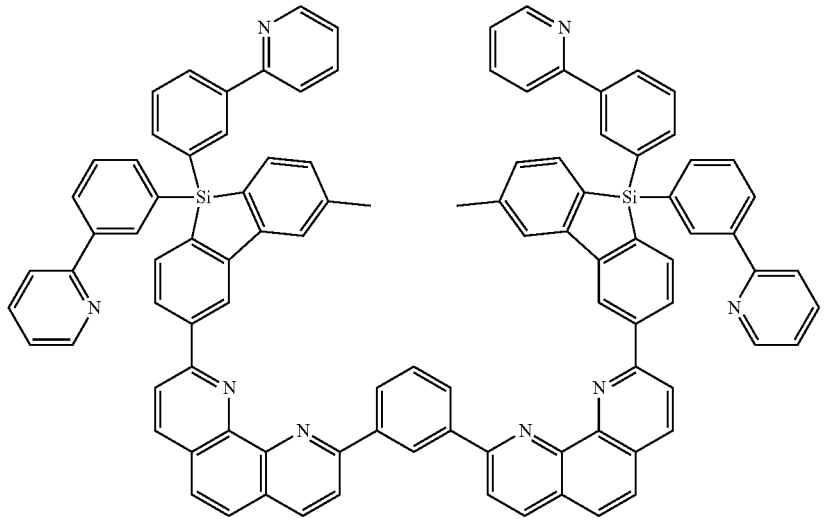
71
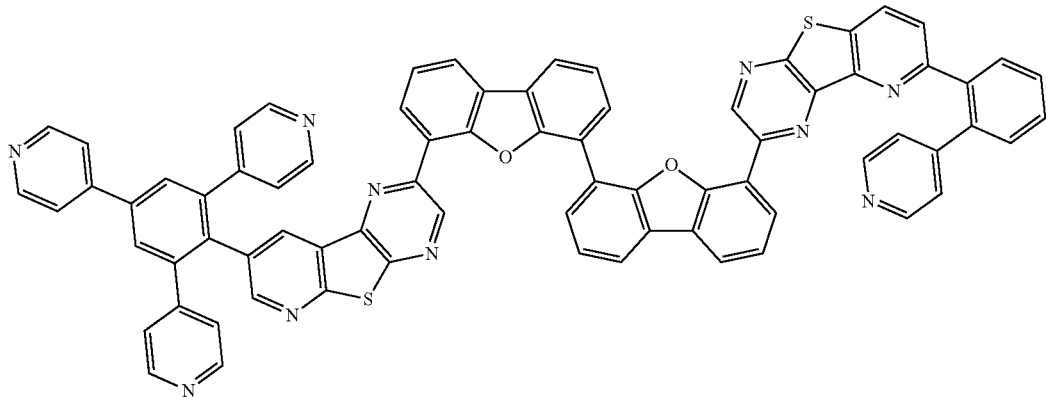
72
[Chem. 28]
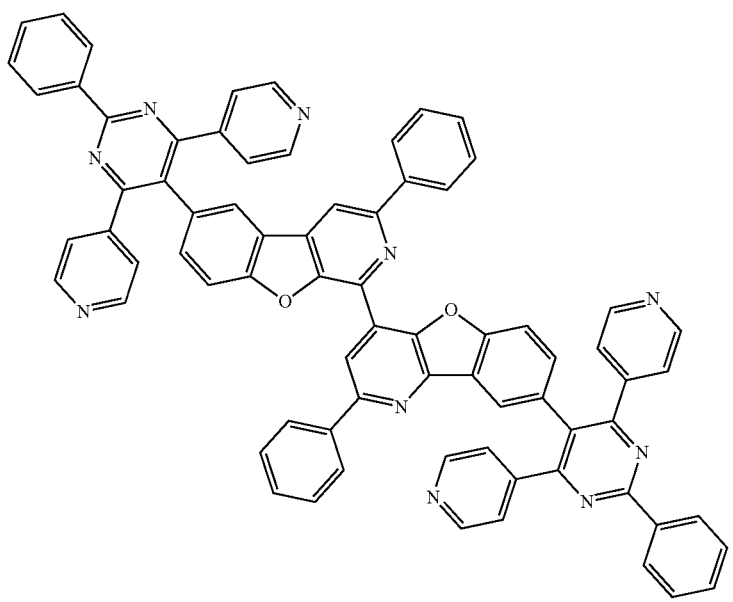
73

-continued
74
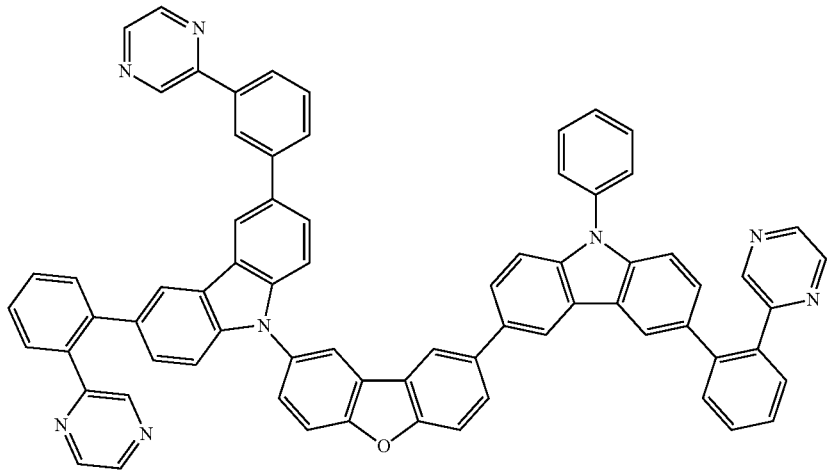
75
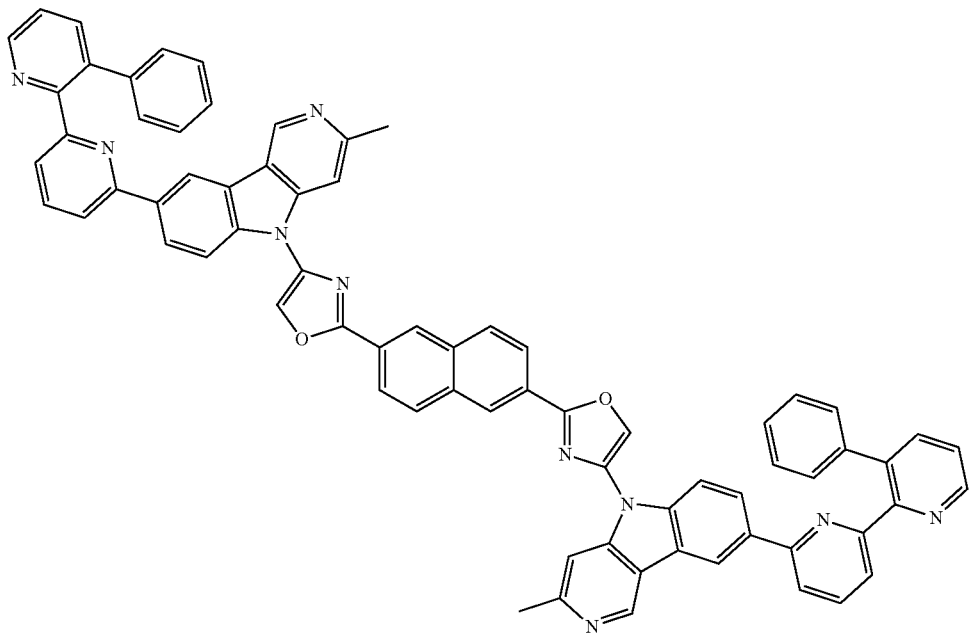

[Chem. 29]
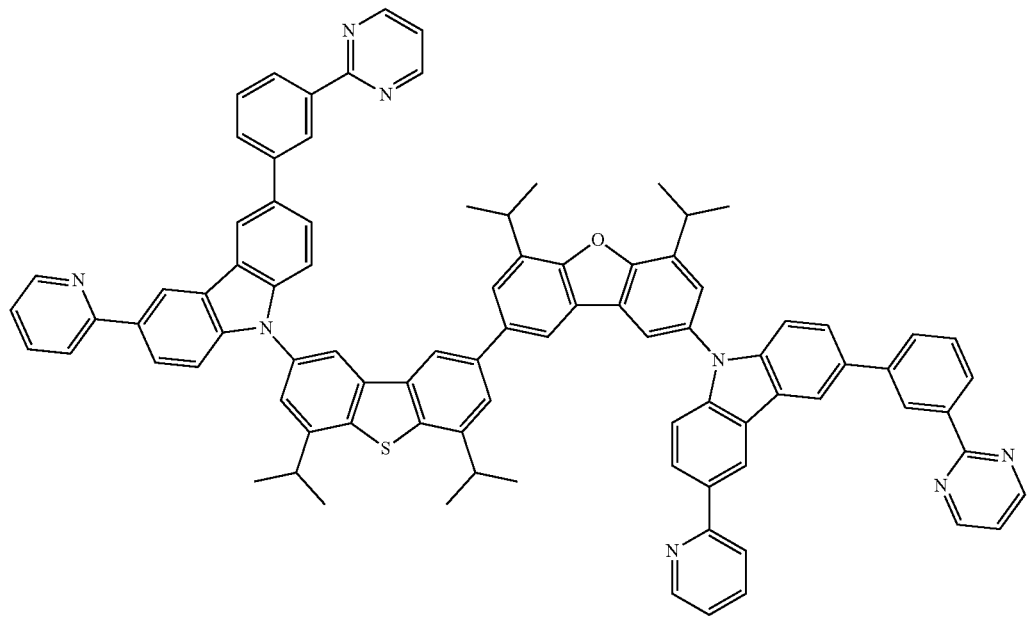
76
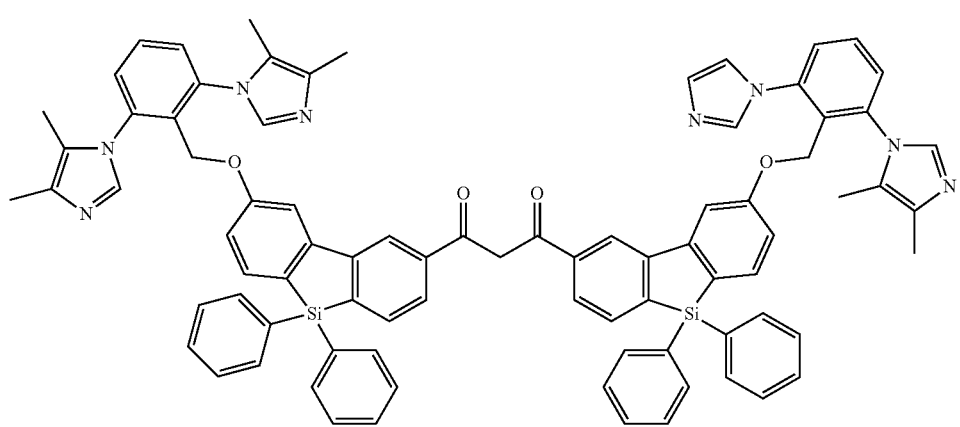
77

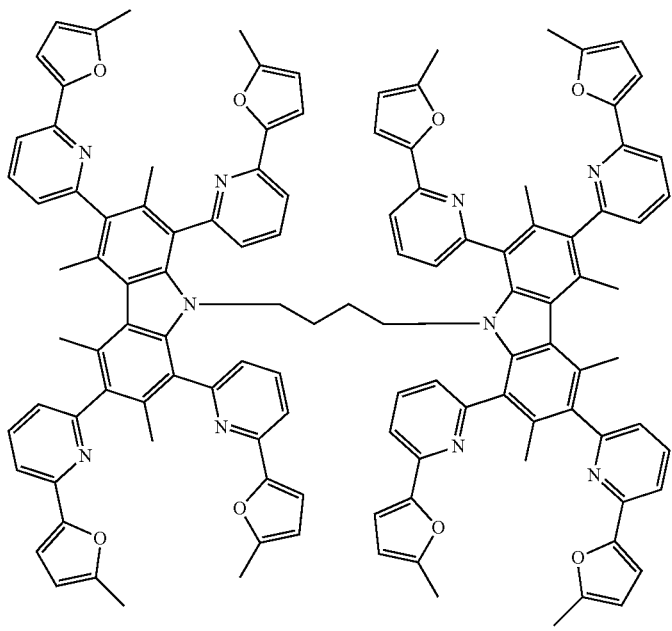
78
[Chem. 30]
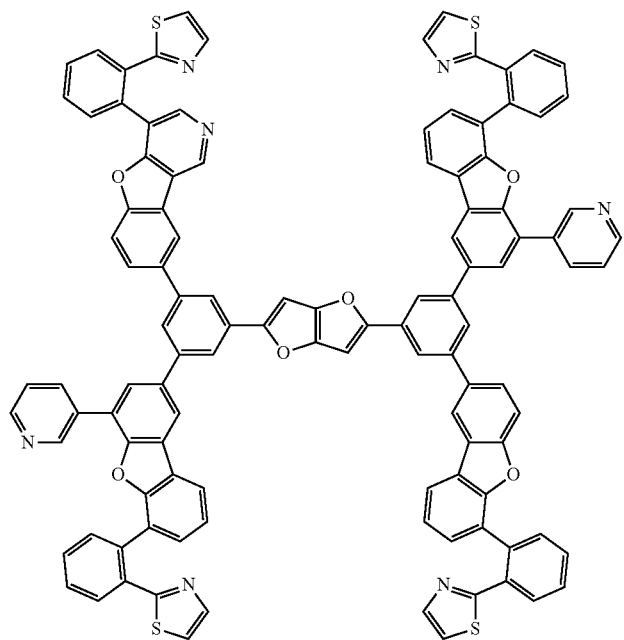
79

80
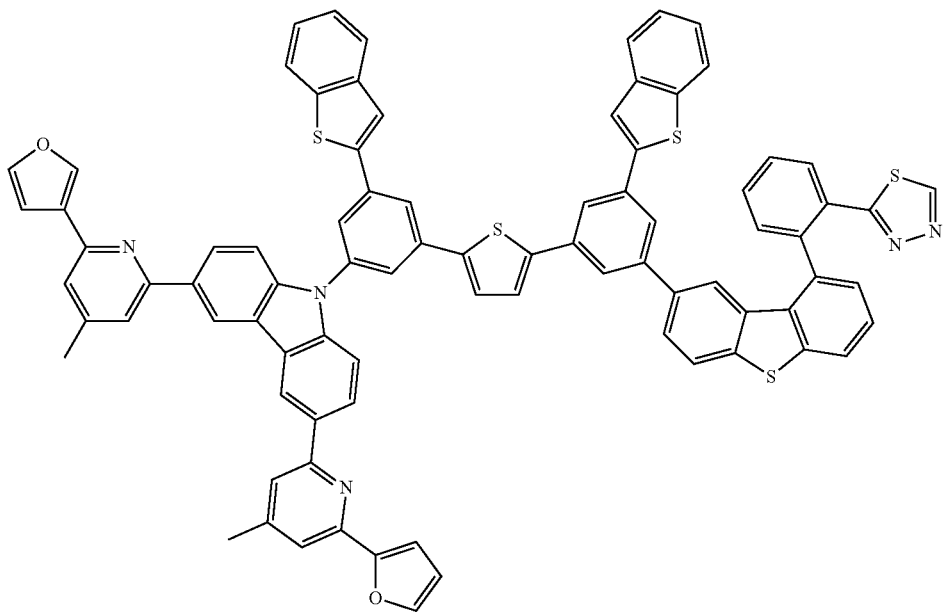
[Chem. 31]
81
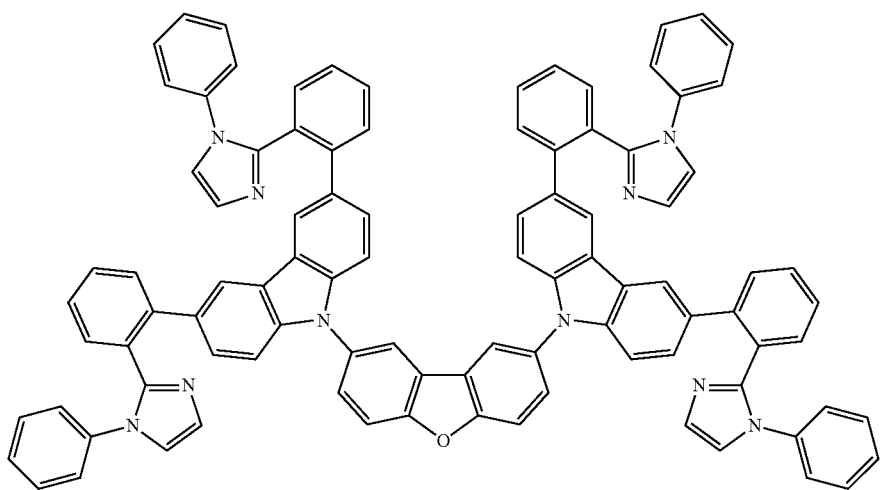
82
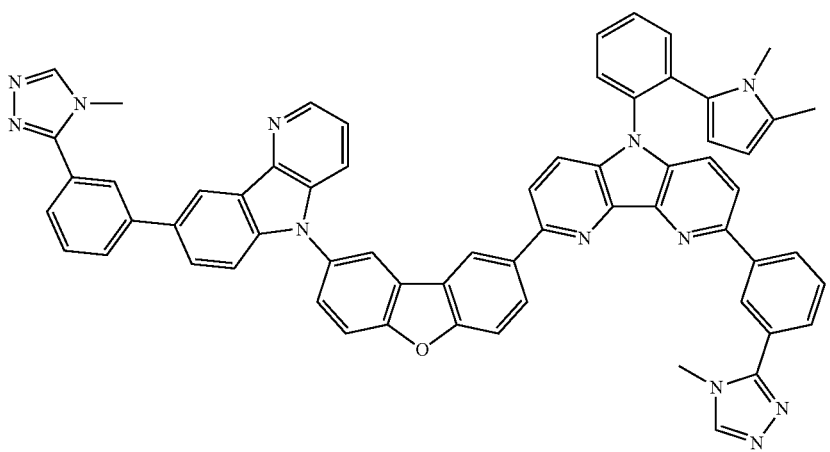

83
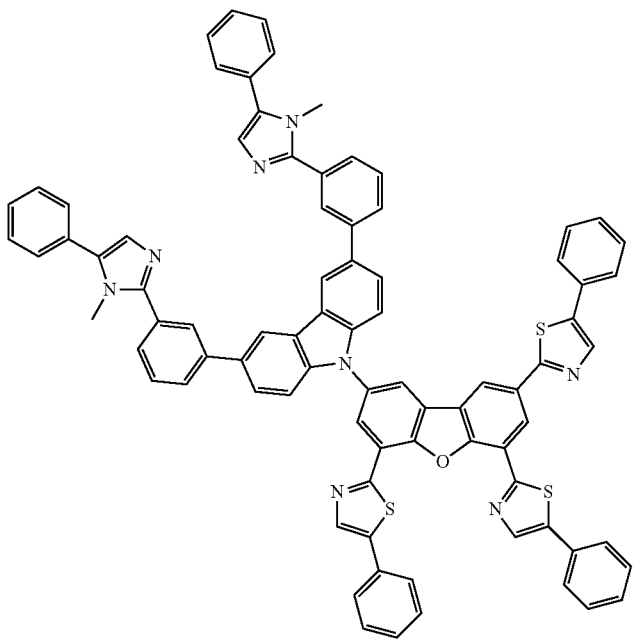
[Chem. 32]
84
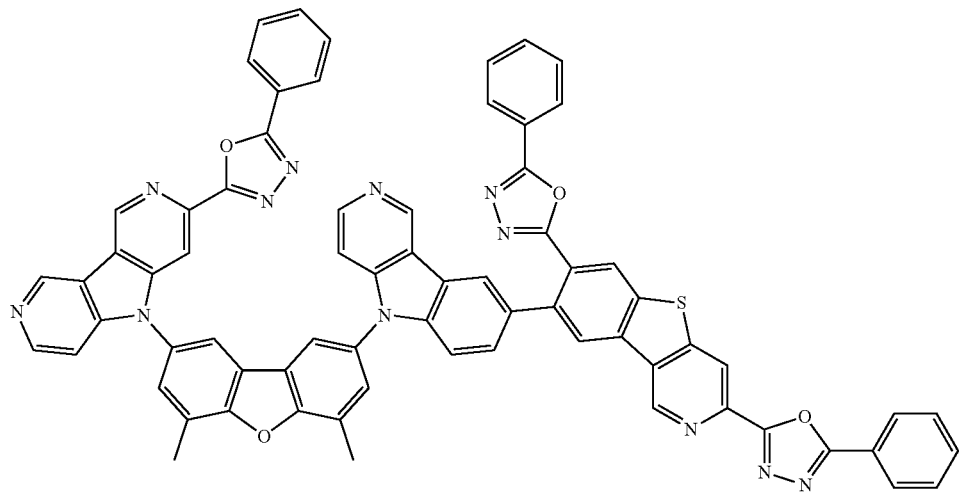

85
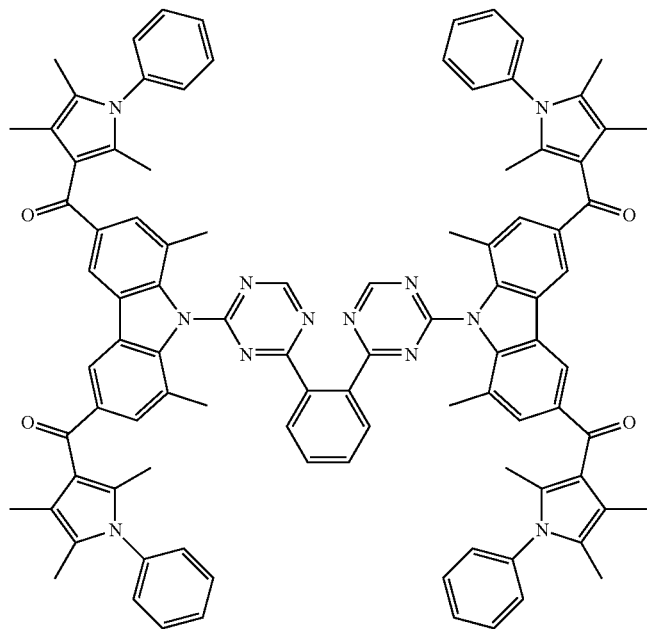
[Chem. 33]
86
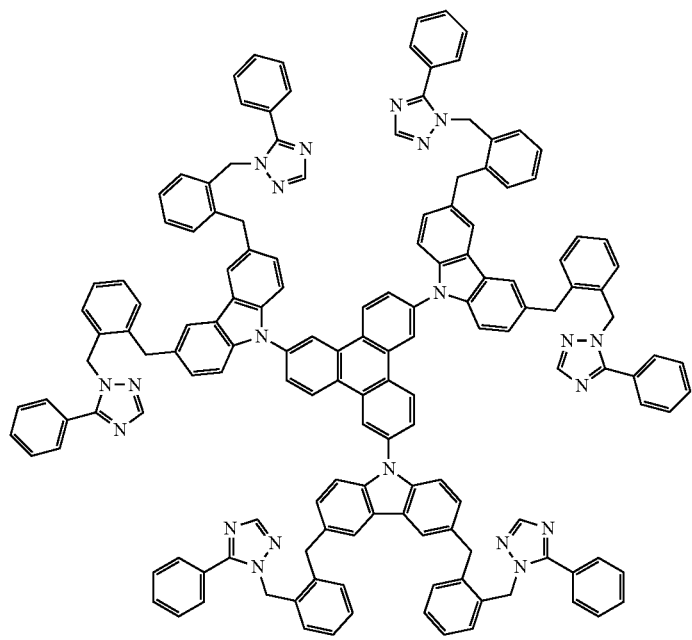

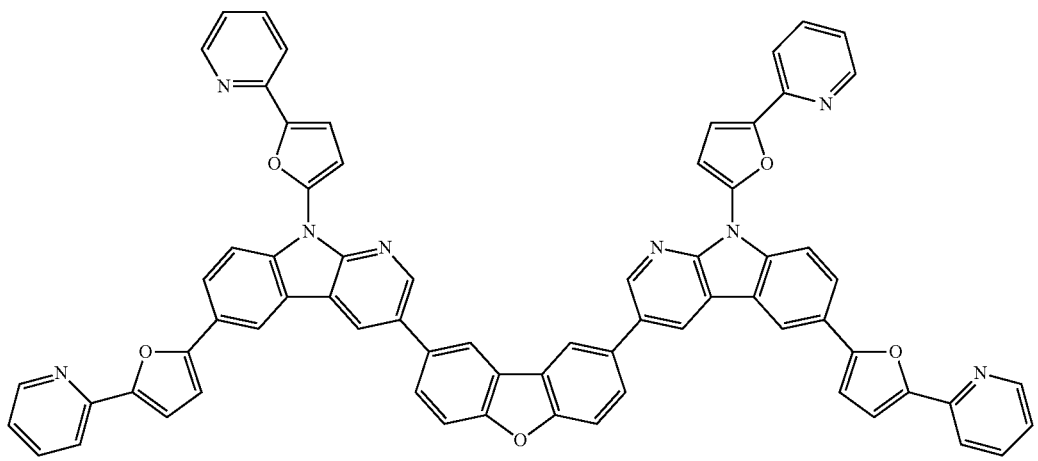
87
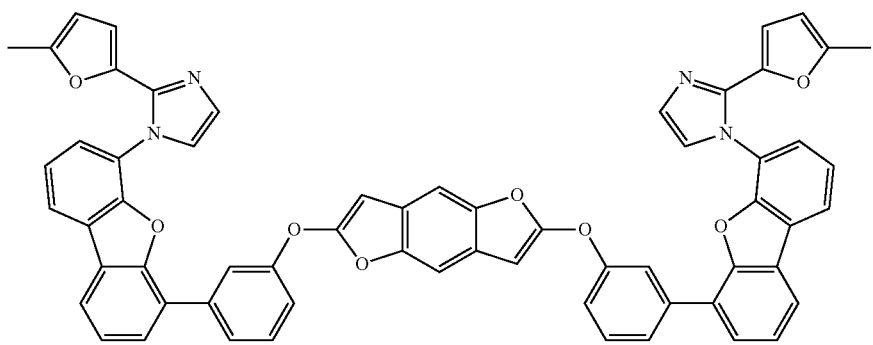
88
[Chem. 34]
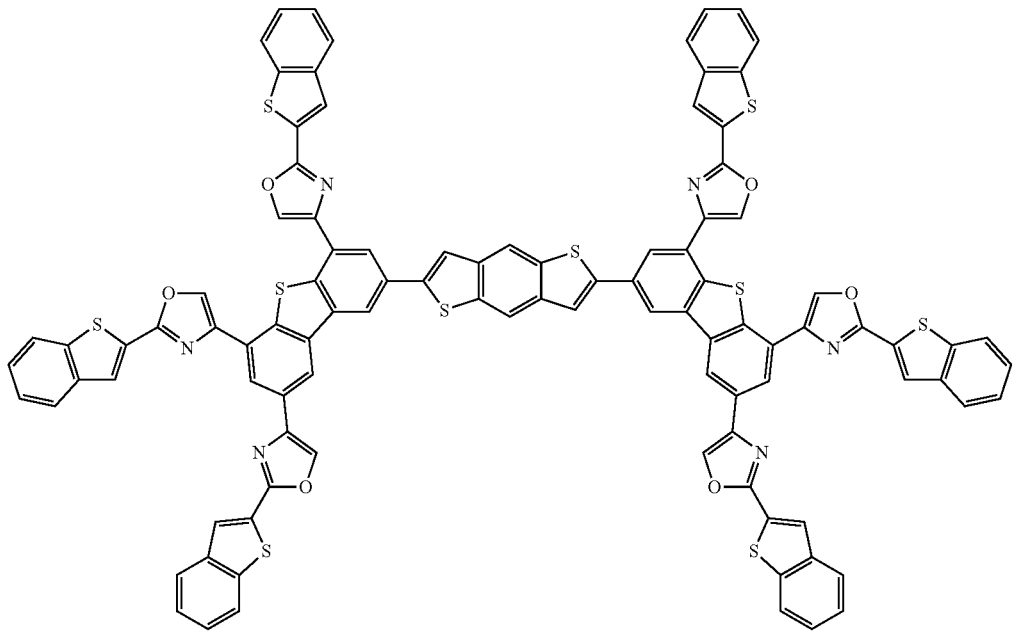
89

-continued
90
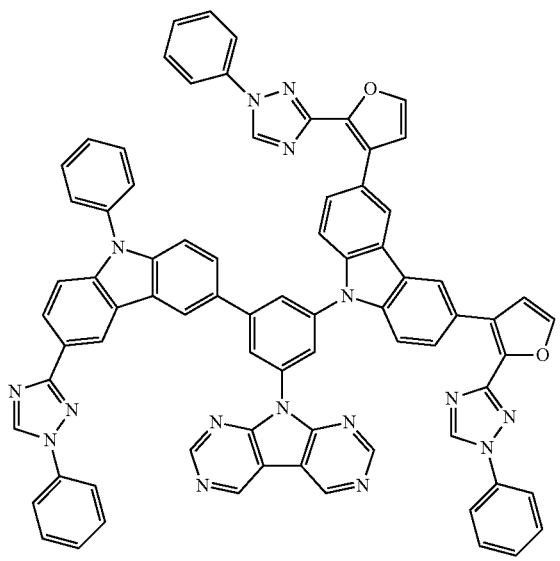
91
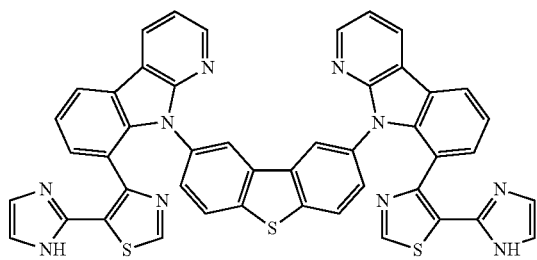
[Chem. 35]
92
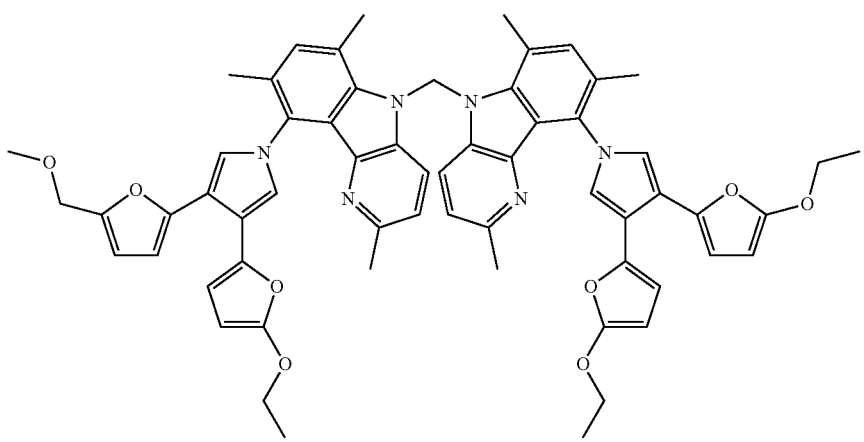
93
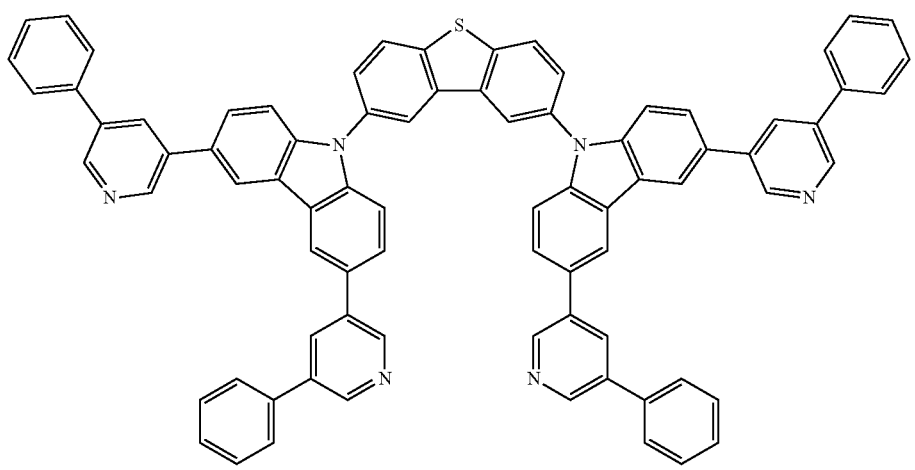

94
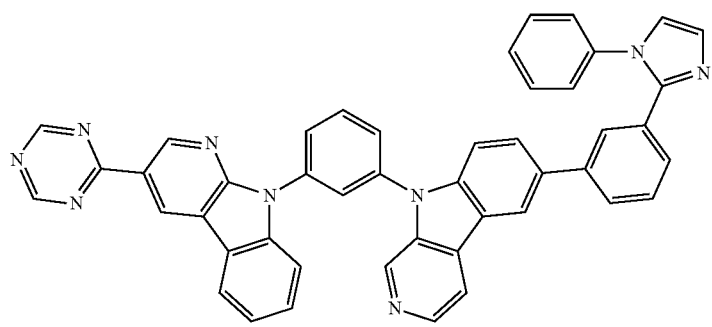
95
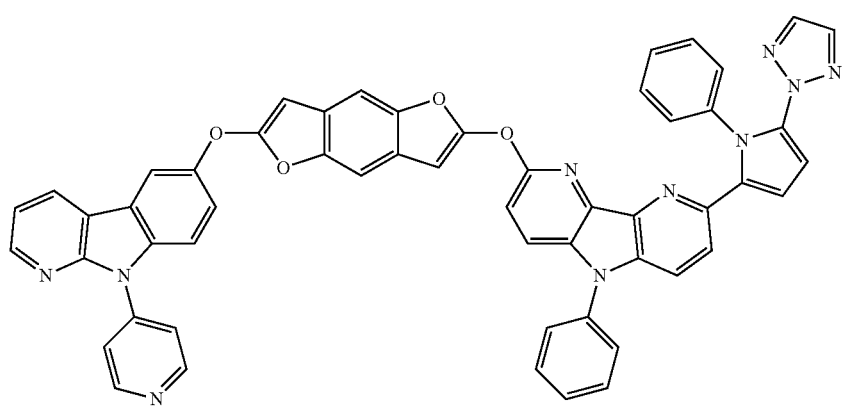
[Chem. 36]
96
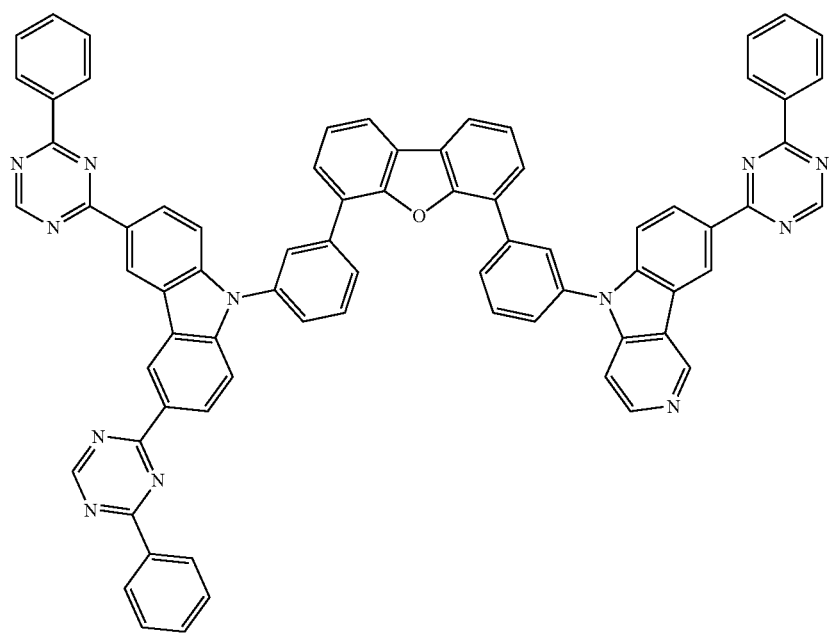

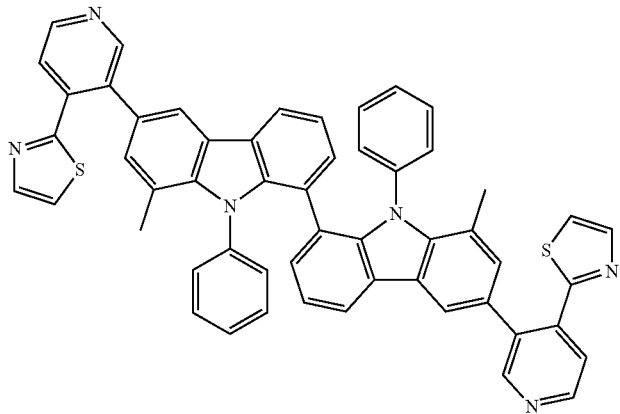
97
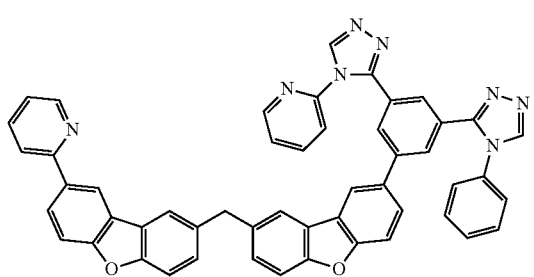
98
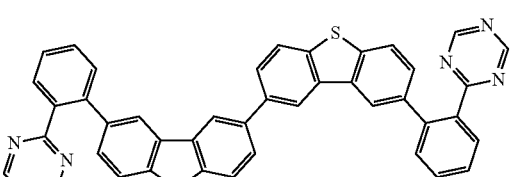
99
[Chem. 37]
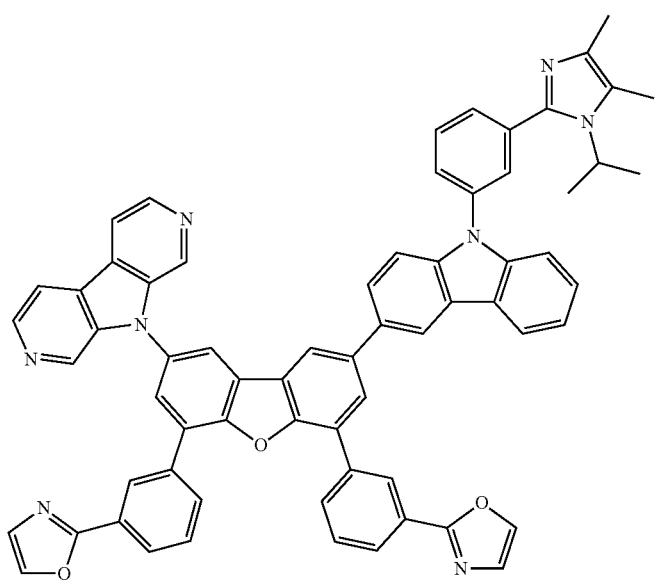
100

101
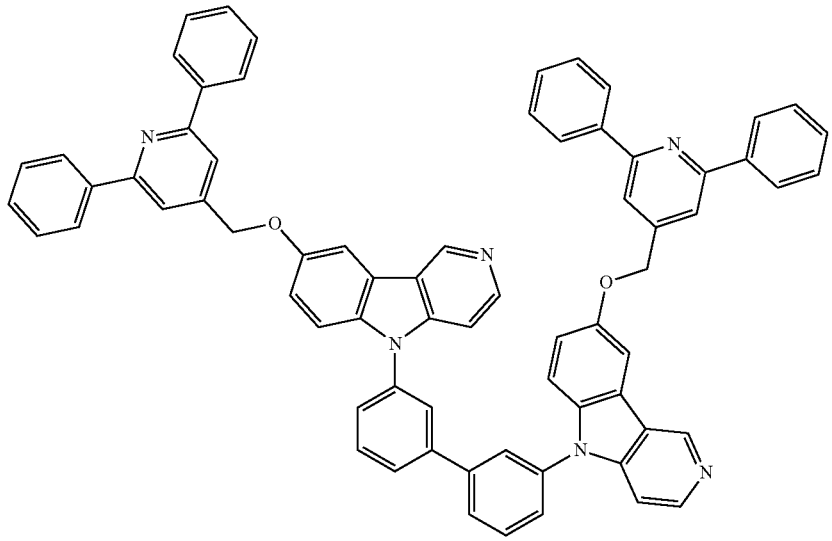
102
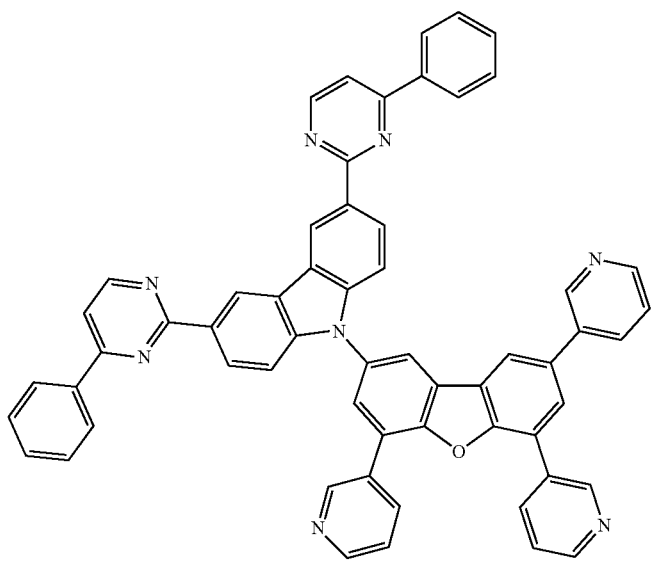
[Chem. 38]
103
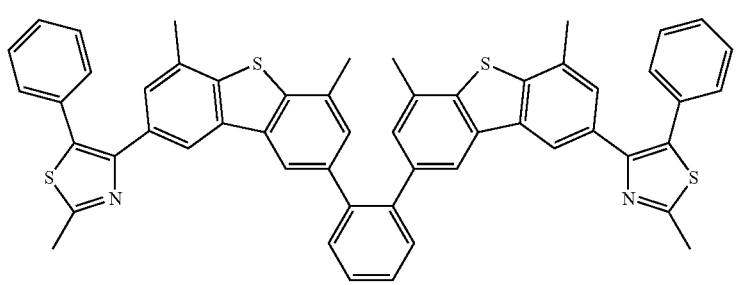

-continued
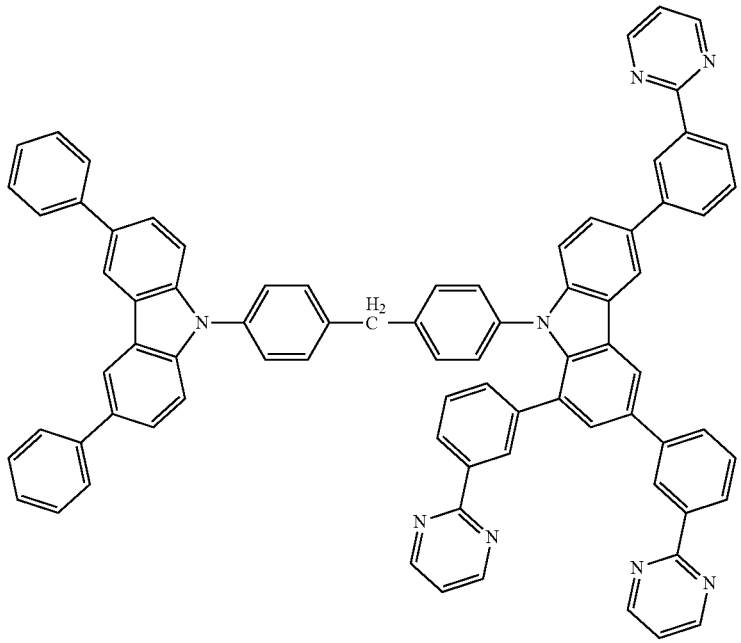
104
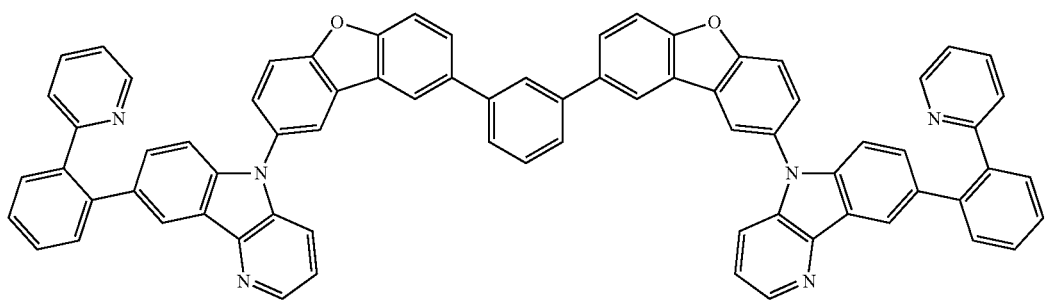
105
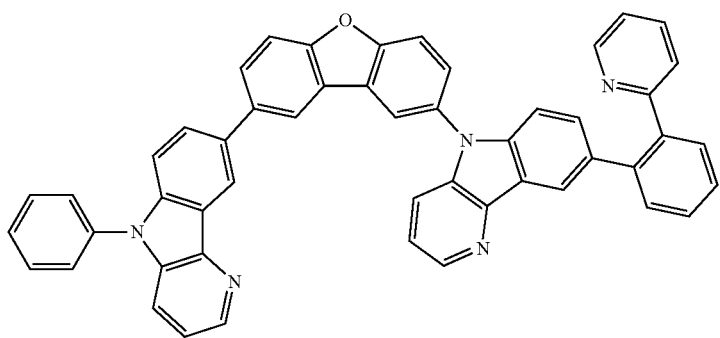
106

[Chem. 39]
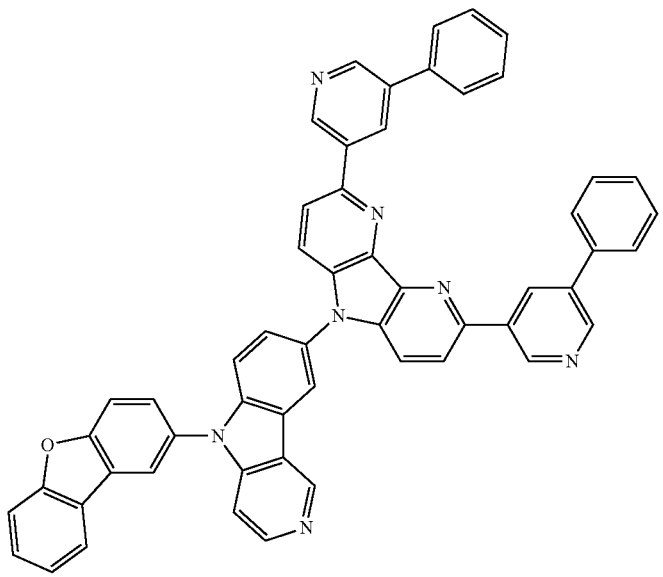
107
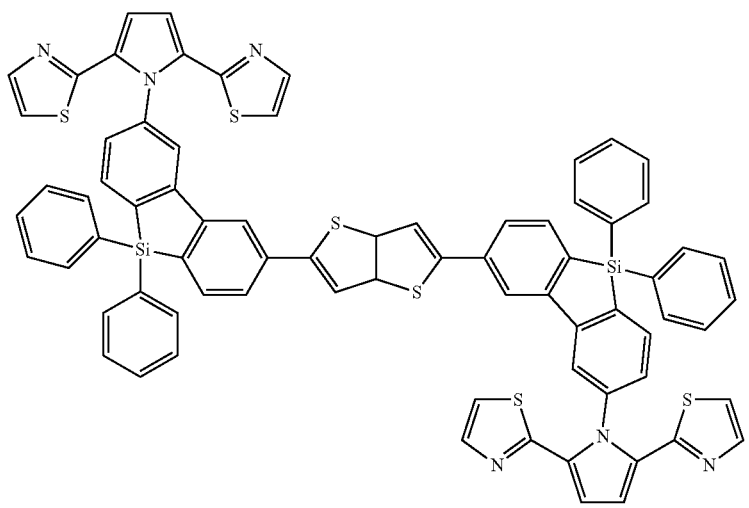
108
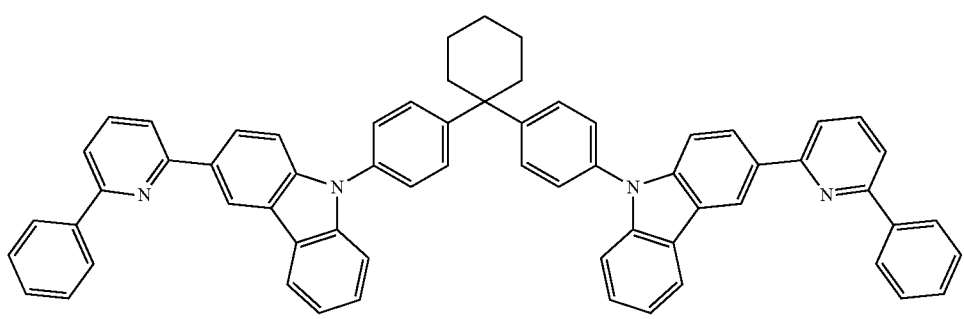
109

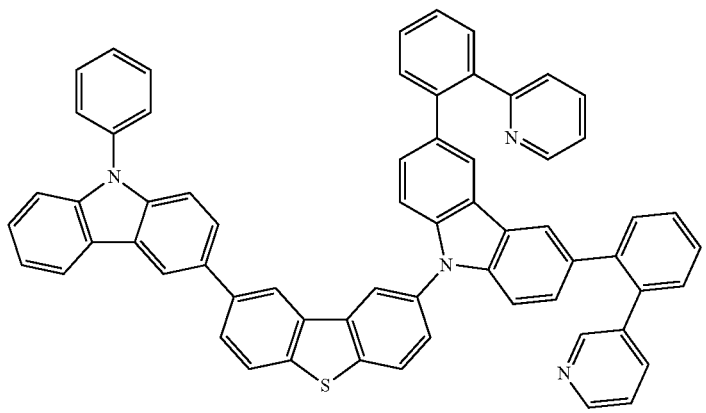
110
[Chem. 40]
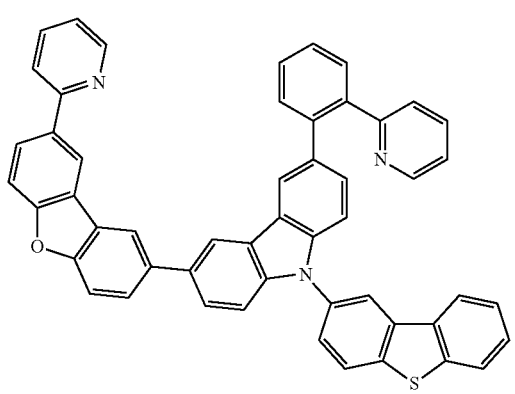
111
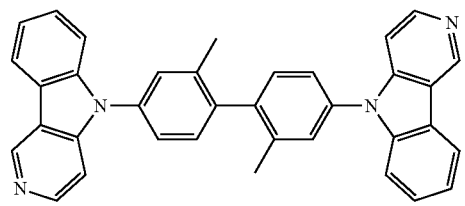
112
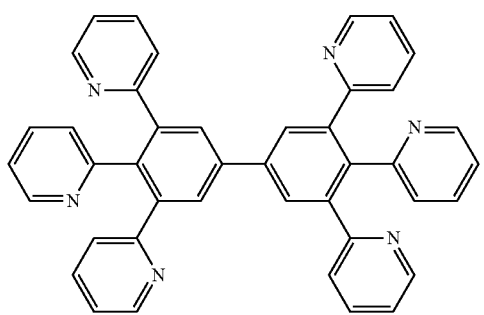
113
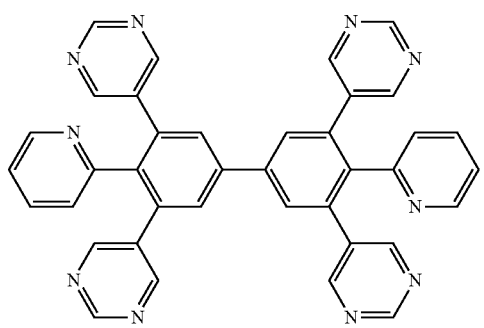
114
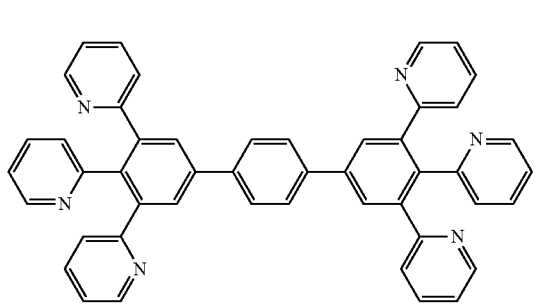
115
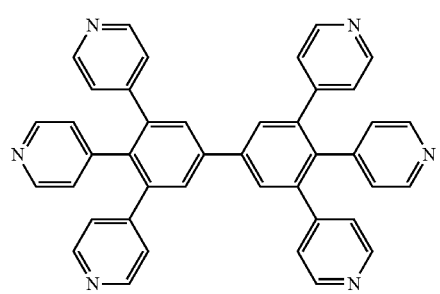
116

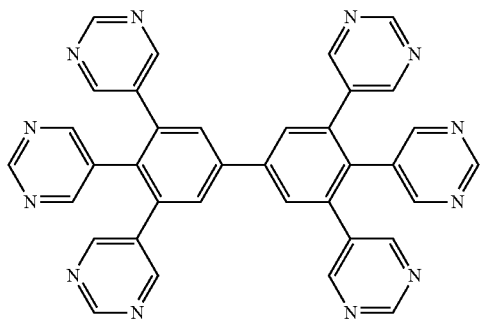

117

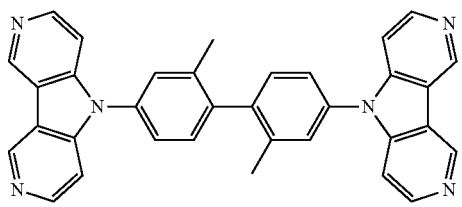

118

[Synthetic Example of Compound]

Hereinafter, as a synthetic example of a typical compound, a specific synthetic example of Compound 5 will be described, but the present invention is not limited thereto.

Synthesis of Compound 5

[Chem. 41]

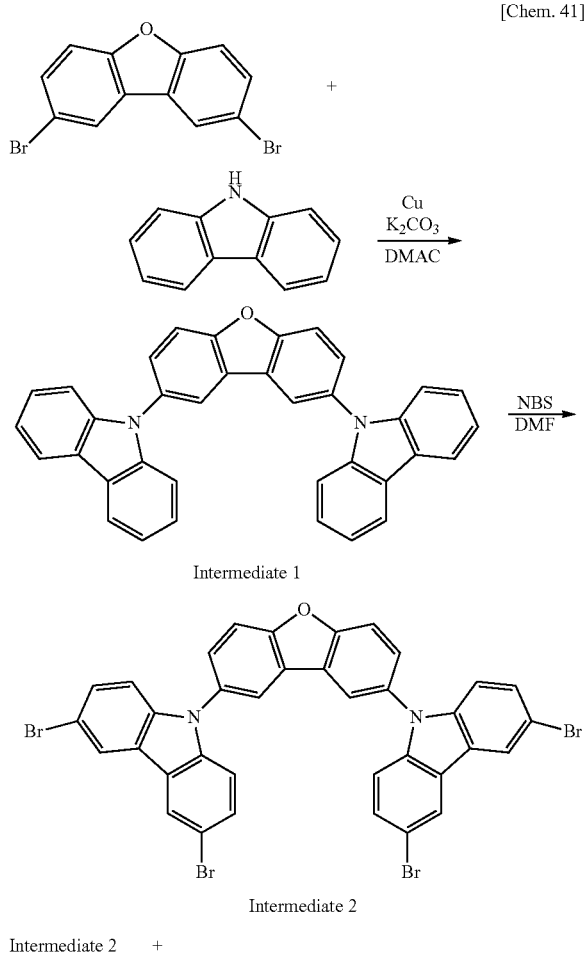

Intermediate 1

Intermediate 2

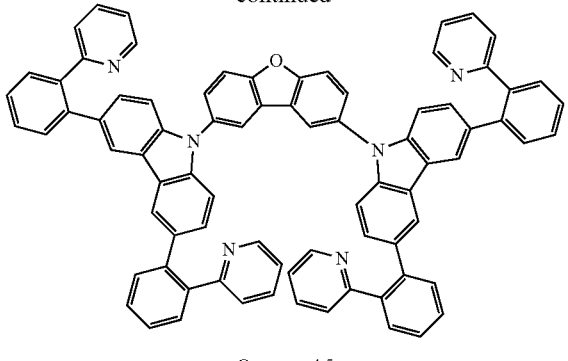

Compound 5

Process 1: (Synthesis of Intermediate 1)

Under nitrogen atmosphere, 2,8-dibromodibenzofuran (1.0 mole), of carbazole (2.0 moles), copper powder (3.0 moles), potassium carbonate (1.5 moles) were mixed in 300 ml of DMAc (dimethylacetamide) and then stirred for 24 hours at 130° C. After the reaction liquid thus obtained was cooled to room temperature, 1 L of toluene was added to the liquid, the resultant liquid was washed three times with distilled water, the solvent was distilled away from the washed layer under reduced pressure, and purification of the residue with silica gel flash chromatography (n-heptane: toluene=4:1 to 3:1) gave Intermediate 1 at a yield of 85%.

Process 2: (Synthesis of Intermediate 2)

At room temperature under atmospheric pressure, Intermediate 1 (0.5 mole) was dissolved into 100 ml of DMF (dimethylformamide), NBS (N-bromosuccinic acid imide) (2.0 moles) was added, and then stirred over one night at room temperature. The obtained precipitate was filtered and washed with methanol, with the result that Intermediate 2 was obtained at a yield of 92%.

Process 3: (Synthesis of Compound 5)

Under nitrogen atmosphere, Intermediate 2 (0.25 mole), 2-phenylpyridine (1.0 mole), ruthenium complex [($\eta_6$-$C_6H_6$)RuCl$_2$]$_2$ (0.05 mole), triphenylphosphine (0.2 mole), potassium carbonate (12 moles) were mixed in 3 L of NMP (N-methyl-2-pyrrolidone), and then stirred over one night at 140° C.

After the reaction liquid was cooled to room temperature, 5 L of dichloromethane was added, and then the liquid was filtered. The solvent was distilled away from the filtrate under reduced pressure (800 Pa, 80° C.), and the residue was purified with silica gel flash chromatography (CH2C12: Et3N=20:1 to 10:1).

After the solvent was distilled away under reduced pressure, the residue was again dissolved into dichloromethane and washed three times with water. After the substance obtained by the washing was dried with anhydrous magnesium sulfate, the solvent was distilled away under reduced pressure from the dried substance, with the result that Compound 5 was obtained at a yield of 68%.

[Method of Forming Nitrogen-Containing Layer]

In case where the nitrogen-containing layer 23 is formed on the base layer 11 as mentioned above, the formation methods thereof include a method using a wet process such as a coating method, an inkjet method or a dipping method, and a method using a dry process such as a vapor deposition method (resister heating, EB method and the like), a sputtering method or a CVD method, and the like. Among them, the vapor deposition method is preferably applied.

Particularly, in the case where the nitrogen-containing layer 23 is formed by using a plurality of compounds, a co-vapor deposition method may be employed in which a plurality of compounds is supplied at the same time from a plurality of vapor deposition sources. In case of using a high molecular weight compound, the coating method is preferably employed. In the case, a coating solution in which the compound is dissolved in a solvent is used. The solvent to dissolve the compound is not limited. In the case where the nitrogen-containing layer 23 is formed by using a plurality of compounds, a coating solution may be prepared by using a solvent which can dissolve such a plurality of compounds.

<3. Translucent electrode (third embodiment)>

Figure 3:
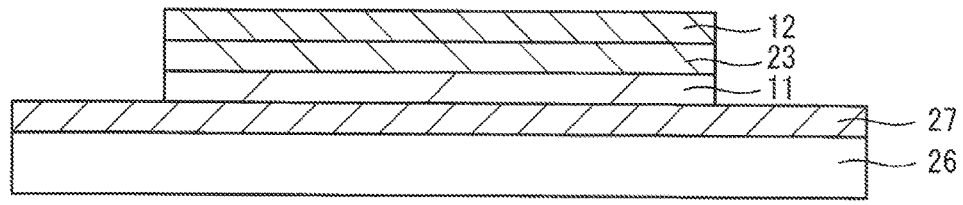
FIG. 3 is a drawing showing a schematic configuration of the translucent electrode in a third embodiment.

Next, a third embodiment of the translucent electrode will be explained. In FIG. 3, a schematic configuration view (cross-sectional view) in the third embodiment of the translucent electrode is shown. A translucent electrode 25 in the third embodiment shown in FIG. 3 is different only in being provided with a base material 26 and a barrier layer 27 from the translucent electrode 20 in the second embodiment shown in FIG. 2. Hereinafter, repeated detailed explanations of configuration components that are the same as those in the first embodiment and the second embodiment will be omitted, and the configuration of the translucent electrode 25 in the third embodiment will be explained.

As shown in FIG. 3, the translucent electrode 25 includes the base material 26 and the barrier layer 27 provided on the base material 26. Additionally, the translucent electrode 25 includes the base layer 11, the nitrogen-containing layer 23 and the electrically conductive layer 12, on the base material 26 provided with the barrier layer 27. The configurations of the base layer 11, the nitrogen-containing layer 23 and the electrically conductive layer 12 are the same as those in the second embodiment.

[Base Material]

The base material 26 applied to the translucent electrode 25 is not particularly limited to the kind of glass, plastic or the like. The base material is required to be transparent, as the translucent electrode 25. Examples of preferably used transparent base materials 26 include glass, quartz and a transparent resin film. A resin film capable of imparting flexibility to the translucent electrode 25 is particularly preferable.

Examples of the glass include silica glass, soda lime silica glass, lead glass, borosilicate glass, alkali-free glass and the like. From the viewpoint of close adhesive characteristics to an adjacent layer, durability and smoothness, a physical treatment such as polishing is given and a coating film made of an inorganic material or an organic material, or a hybrid coating film combining these coating films is formed, as necessary, on the surface of these glass materials. Furthermore, a material similar to the glass used as the base layer 11 described above may be used.

Examples of the resin films include polyesters such as polyethylene terephthalate (PET) and polyethylene naphthalate (PEN), polyethylene, polypropylene, cellulose esters such as cellophane, cellulose diacetate, cellulose triacetate (TAC), cellulose acetate butyrate, cellulose acetate propionate (CAP), cellulose acetate phthalate and cellulose nitrate or derivatives thereof, polyvinylidene chloride, polyvinyl alcohol, polyethylene vinyl alcohol, syndiotactic polystyrene, polycarbonate, norbornene resin, polymethylpentene, polyether ketone, polyimide, polyethersulfone (PES), polyphenylene sulfide, polysulfones, polyether imide, polyether ketone imide, polyamide, fluorine-containing resin, nylon, polymethyl methacrylate, acrylic or polyarylates, cycloolefin-based resins such as ARTON (trade name, manufactured by JSR) and APEL (trade name, manufactured by Mitsui Chemicals, Inc.), and the like.

[Barrier Layer]

The barrier layer 27 is preferably provided on the surface of the base material 26. In particular, when the base material 26 is made of a resin film, the barrier layer 27 made of an inorganic material or an organic material, or made of the combination of these coating films is preferably formed on the surface of the resin film. The coating film and barrier layer described above preferably have a water vapor transmission rate of 0.01 g/(m$^2$·24 hr) or less when measured in accordance with JIS-K-7129-1992 (temperature: 25±0.5° C., relative humidity: 90±2% RH). Furthermore, an oxygen transmission rate measured in accordance with JIS-K-7126-1987 is preferably $10^{-3}$ ml/(m$^2$·24 h·atm) or less and a water vapor transmission rate is preferably $10^{-5}$ g/(m$^2$·24 hr) or less.

A material having a function of suppressing the permeation of moisture, oxygen or the like, which causes the deterioration of the resin film is used as a material for forming the above-described barrier layer. For example, silicon oxide, silicon dioxide, silicon nitride or the like can be used. Furthermore, in order to improve the fragility of the film having barrier properties, it is more preferable to give a laminated structure of these inorganic layers and a layer made of an organic material (an organic layer). A laminating order of the inorganic layer and the organic layer is not particularly limited, and alternate lamination of both in a plurality of times is preferable.

A method for forming a film having barrier properties is not particularly limited, and for example, a vacuum vapor deposition method, a sputtering method, a reactive sputtering method, a molecular beam epitaxy method, a cluster ion beam method, an ion plating method, a plasma polymerization method, an atmospheric pressure plasma polymerization method, a plasma CVD method, a laser CVD method, a thermal CVD method, a coating method and the like can be used. In particular, the atmospheric pressure plasma polymerization method described in Japanese Patent Application Laid-open Publication No. 2004-68143 can be preferably used.

(Barrier Layer: Configuration)

The barrier layer 27 to be applied to the translucent electrode 25 is preferably constituted of an inorganic film having a distribution of refractive index in the thickness direction and having an extreme value of 1 or more in the refractive index distribution. The barrier layer 27 has a laminated structure based on a plurality of layers which is constituted of a material containing silicon, oxygen and carbon and which has different content ratios of silicon, oxygen and carbon.

Additionally, the barrier layer 27 has feature in a distribution curve showing the relationship between the distance from the surface of the barrier layer 27 (the interface with the base layer 11) in the film thickness direction and the ratio of the atom amount (an atom ratio) of respective elements (silicon, oxygen or carbon).

Note that the atom ratio of silicon, oxygen or carbon is represented by the ratio of silicon, oxygen or carbon to the total amount of respective elements of silicon, oxygen and carbon [(Si, O, C)/(Si+O+C)].

A silicon distribution curve, an oxygen distribution curve and a carbon distribution curve represent the atom ratio of silicon, the atom ratio of oxygen and the atom ratio of carbon at distances from the surface of the barrier layer 27, respectively. Furthermore, a distribution curve representing the relationship between the distance from the surface of the barrier layer 27 (the interface on the electrically conductive layer 12 side) in the thickness direction and the ratio between total atomic weight of oxygen and carbon (atom ratio) is defined as an oxygen carbon distribution curve.

In addition, the barrier layer 27 may further contain nitrogen in addition to silicon, oxygen and carbon. The refractive index of the barrier layer 27 can be controlled by containing nitrogen. For example, the refractive index of $SiO_2$ is 1.5, whereas the refractive index of SiN is approximately 1.8 to 2.0. Therefore, the refractive index of 1.6 to 1.8, which is a preferable value, can be attained by containing nitrogen in the barrier layer 27 and forming SiON in the barrier layer 27. In this way, the refractive index of the barrier layer 27 can be controlled by adjusting the content of nitrogen.

When the barrier layer 27 contains nitrogen, the distribution curve of each element (silicon, oxygen, carbon or nitrogen) constituting the barrier layer 27 is as follows.

In the case where nitrogen is contained in addition to silicon, oxygen and carbon, the atom ratio of the silicon, oxygen, carbon or nitrogen is represented by the ratio of the silicon, oxygen, carbon or nitrogen to the total amount of respective elements of silicon, oxygen, carbon and nitrogen [(Si, O, C, N)/(Si+O+C+N)].

The silicon distribution curve, the oxygen distribution curve, the carbon distribution curve and the nitrogen distribution curve represent the atom ratio of silicon, the atom ratio of oxygen, the atom ratio of carbon and the atom ratio of nitrogen at a distance from the surface of the barrier layer 27, respectively.

(Relationship Between Element Distribution Curve and Refractive Index Distribution)

The refractive index distribution in the barrier layer 27 can be controlled by the carbon amount and the oxygen amount in the thickness direction of the barrier layer 27.

Figure 4:
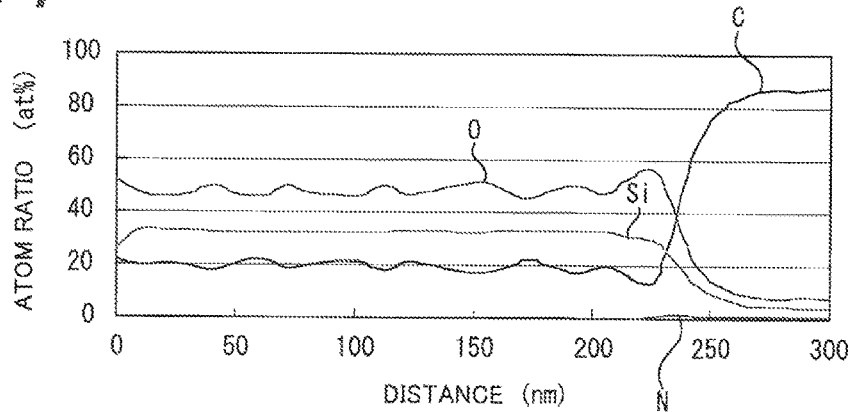
FIG. 4 is a drawing showing a silicon distribution curve, an oxygen distribution curve and a carbon distribution curve.
Figure 5:
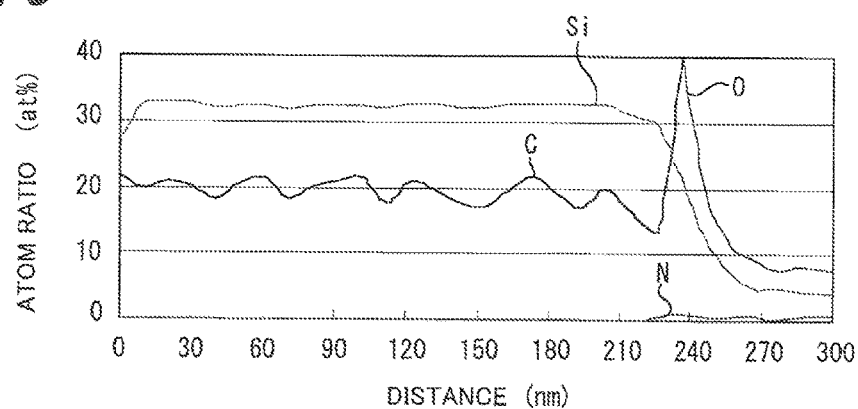
FIG. 5 is an extended drawing of the carbon distribution curve shown in FIG. 4.

In FIG. 4, examples of the silicon distribution curve, the oxygen distribution curve, the carbon distribution curve and the nitrogen distribution curve of the barrier layer 27 are shown. Additionally, in FIG. 5, the carbon distribution curve is shown on a larger scale among the silicon distribution curve, the oxygen distribution curve, the carbon distribution curve and the nitrogen distribution curve shown in FIG. 4. In FIG. 4 and FIG. 5, the horizontal axis represents the distance [nm] from the surface of the barrier layer 27 in the thickness direction. In addition, the vertical axis represents the atom ratio [at %] of each of silicon, oxygen, carbon or nitrogen to the total amount of each element of silicon, oxygen and carbon.

Note that details of a method for measuring the silicon distribution curve, the oxygen distribution curve, the carbon distribution curve and the nitrogen distribution curve will be described later.

As shown in FIG. 4, atom ratios of the silicon, oxygen, carbon and nitrogen change depending on the distance from the surface of the barrier layer 27. In particular, as to the oxygen and carbon, the variation of the atom ratio is large corresponding to the distance from the surface of the barrier layer 27, and each of the distribution curves has a plurality of extreme values. Furthermore, the oxygen distribution curve and the carbon distribution curve have a correlation, and the atom ratio of oxygen is small at distances where the atom ratio of carbon is large, and the atom ratio of oxygen is large at distances where the atom ratio of carbon is small.

Figure 6:
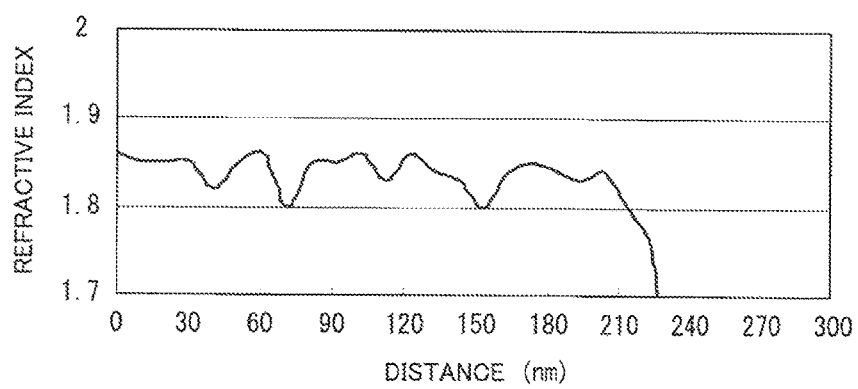
FIG. 6 is a drawing showing a refractive index distribution of the barrier layer.

In addition, in FIG. 6, the refractive index distribution curve of the barrier layer 27 is shown. In FIG. 6, the horizontal axis represents the distance [nm] from the surface of the barrier layer 27 in the thickness direction. The vertical axis represents the refractive index of the barrier layer 27. The refractive index of the barrier layer 27 shown in FIG. 6 is the distance from the surface of the barrier layer 27 in the thickness direction, and measured values of refractive indices of the barrier layer 27 for visible light in the thickness direction. The measurement of the refractive index distribution of the barrier layer 27 can be performed using a known method, for example, using a spectroscopic ellipsometer (ELC-300, manufactured by Jasco Corporation) etc.

As shown in FIG. 5 and FIG. 6, correlation exists between the atom ratio of the carbon and the refractive index of the barrier layer 27. Specifically, in the barrier layer 27, the refractive index of the barrier layer 27 also increases in positions where the atom ratio of carbon increases. In this way, the refractive index of the barrier layer 27 changes corresponding to the atom ratio of carbon. That is, in the barrier layer 27, the refractive index distribution curve of the barrier layer 27 can be controlled by adjusting the distribution of the atom ratio of carbon in the thickness direction.

Furthermore, since the correlation exists also between the atom ratio of carbon and the atom ratio of oxygen as described above, the refractive index distribution curve of the barrier layer 27 can be controlled by controlling the atom ratio and distribution curve of oxygen.

Reflection and interference generated at the interface of the base material 26 can be suppressed by providing the barrier layer 27 having the extreme value in the refractive index distribution. Therefore, the light transmitting the translucent electrode 25 is emitted without being affected by total reflection and interference, by the action of the barrier layer 27. Accordingly, the light quantity is not reduced and the extraction efficiency of the light from the translucent electrode 25 is enhanced.

Furthermore, when a metal transparent conductive layer made of silver or the like is used as the electrically conductive layer 12, the light transmitting the translucent electrode 25 receives reflection or interference in the electrically conductive layer 12 to tend to generate a problem of a large viewing angle dependency. This is considered that a specific wavelength region is reflected due to the aggregation of metal in the metal transparent conductive layer or in the metal transparent conductive layer or at the interface thereof to thereby interfere with the emission spectrum and the emission spectrum changes to thereby show the viewing angle dependency.

Consequently, the viewing angle dependency can be suppressed by adjusting the refractive index distribution of the barrier layer 27 so as not to interfere with a specific wavelength of emitted light. The refractive index distribution of the barrier layer 27 can be controlled by the atom ratio of carbon. Therefore, arbitrary optical properties can be imparted to the barrier layer 27 by controlling the distribution curve of carbon.

In the example, the barrier layer 27 has the extreme value of 1 or more in the refractive index distribution curve, and thus it is possible to control light spectrum and adjust a color region. Therefore, interference conditions of the translucent electrode 25 can be dispersed, and a configuration in which the interference at a specific wavelength is not generated can be attained. Accordingly, uniform light distribution properties of the translucent electrode 25 can be realized by controlling light distribution properties of light transmitting the translucent electrode 25 by the barrier layer 27, and by eliminating the viewing angle dependency of the emission spectrum.

(Conditions of Distribution Curves of Respective Elements)

In the barrier layer 27, the atom ratios of the silicon, oxygen and carbon, or distribution curves of respective elements preferably satisfy conditions of (i) to (iii) below.

(i) The atom ratio of silicon, the atom ratio of oxygen and the atom ratio of carbon satisfy a condition represented by a formula (1) below in regions of 90% or more of the thickness of the barrier layer 27.

(the atom ratio of oxygen)>(the atom ratio of silicon)>(the atom ratio of carbon)    (1)

Alternatively, the atom ratio of silicon, the atom ratio of oxygen and the atom ratio of carbon satisfy a condition represented by a formula (2) below in regions of 90% or more of the thickness of the barrier layer 27.

(the atom ratio of carbon)>(the atom ratio of silicon)>(theatom ratio of oxygen)    (2)

(ii) The carbon distribution curve has at least one maximum value and minimum value.

(iii) The absolute value of the difference between the largest value and the smallest value of the atom ratios of carbon in the carbon distribution curve is 5 at % or more.

The translucent electrode 25 preferably includes the barrier layer 27 satisfying at least one of the conditions (i) to (iii). In particular, the translucent electrode 25 preferably includes the barrier layer 27 satisfying all of the conditions (i) to (iii). In addition, two or more of the barrier layers 27 satisfying all of the conditions (i) to (iii) may be included. In the case where two or more of the barrier layers 27 are included, qualities of materials of a plurality of thin film layers may be the same or different. When two or more of the barrier layers 27 are included, the barrier layers 27 may be formed on one surface of the base material 26, or may be formed on both surfaces of the base material 26.

The refractive index of the barrier layer 27 can be controlled by the atom ratio of carbon or oxygen, as the above-described correlation shown in FIGS. 5 and 6. Therefore, according to the conditions (i) to (iii), the refractive index of the barrier layer 27 can be adjusted within a preferable range.

(Carbon Distribution Curve)

It is necessary that, the carbon distribution curve has at least one extreme value in the barrier layer 27. In the barrier layer 27, more preferably the carbon distribution curve has at least two extreme values, particularly preferably at least three extreme values. Furthermore, the carbon distribution curve has preferably as least one maximum value and one minimum value.

When the carbon distribution curve does not have the extreme value, obtained light distribution properties of the barrier layer 27 becomes insufficient. Therefore, the elimination of angle dependency of light from the translucent electrode 25 obtained through the electrically conductive layer 12 becomes difficult.

Furthermore, when the barrier layer 27 has three or more extreme values, in one extreme value of the carbon distribution curve and another extreme value adjacent to the extreme value, the difference in distances from the surface of the barrier layer 27 in the thickness direction is preferably 200 nm or less, more preferably 100 nm or less.

(Extreme Value)

In the barrier layer 27, the extreme value of the distribution curve is the maximum value or the minimum value of the atom ratio of an element relative to the distance from the surface of the barrier layer 27 in the thickness direction of the barrier layer 27, or the measured value corresponding to the value in the refractive index distribution curve.

In the barrier layer 27, the maximum value of the distribution curve of each element is a point at which the value of the atom ratio of an element changes from the decrease to the increase when the distance from the surface of the barrier layer 27 is changed. Additionally, the point is a point where the decrease in the value of the atom ratio of the element is 3 at % or more at a position where the change of 20 nm in the distance from the surface of the barrier layer 27 is further made from the point.

In the barrier layer 27, the minimum value of the distribution curve of each element is a point at which the value of the atom ratio of an element changes from the decrease to the increase when the distance from the surface of the barrier layer 27 is changed. Additionally, the point is a point where the increase in the value of the atom ratio of the element is 3 at % or more at a position where the change of 20 nm in the distance from the surface of the barrier layer 27 is further made from the point.

Furthermore, in the carbon distribution curve of the barrier layer 27, the absolute value of the difference between the largest value and the smallest value of the atom ratios of carbon is preferably 5 at % or more. In addition, in the barrier layer 27, the absolute value of the difference between the largest value and the smallest value of the atom ratios of carbon is more preferably 6 at % or more, further preferably 7 at % or more. When the difference between the largest value and the smallest value of the atom ratios of carbon is less than the above-described range, the difference in refractive indices in the refractive index distribution curve of the obtained barrier layer 27 becomes small, and light distribution properties becomes insufficient.

There is correlation between the carbon distribution quantity and the refractive index, and when the preferable absolute value between the largest value and the smallest value of carbon atoms is 7 at % or more, the absolute value of the obtained difference between the largest value and the smallest value of refractive indices becomes 0.2 or more.

(Oxygen Distribution Curve)

In the barrier layer 27, the oxygen distribution curve preferably has at least one extreme value. In particular, in the barrier layer 27, the oxygen distribution curve has more preferably at least two extreme values, further preferably at least three extreme values. Moreover, the oxygen distribution curve preferably has at least one maximum value and one minimum value.

When the oxygen distribution curve does not have the extreme value, obtained light distribution properties of the barrier layer 27 becomes insufficient. Therefore, the elimination of angle dependency of light from the translucent electrode 25 obtained through the electrically conductive layer 12 becomes difficult.

Furthermore, when the barrier layer 27 has three or more extreme values, in one extreme value of the oxygen distribution curve and another extreme value adjacent to the extreme value, the difference in distances from the surface of the barrier layer 27 in the thickness direction is preferably 200 nm or less, more preferably 100 nm or less.

In addition, in the oxygen distribution curve of the barrier layer 27, the absolute value of the difference between the largest value and the smallest value of the atom ratios of oxygen is preferably 5 at % or more. Additionally, in the barrier layer 27, the absolute value of the difference between the largest value and the smallest value of the atom ratios of oxygen is more preferably 6 at % or more, further preferably 7 at % or more. When the difference between the largest value and the smallest value of the atom ratios of oxygen is less than the above-described range, light distribution properties becomes insufficient from the obtained refractive index distribution curve of the barrier layer 27.

(Silicon Distribution Curve)

In the silicon distribution curve of the barrier layer 27, the absolute value of the difference between the largest value and the smallest value of the atom ratios of silicon is preferably less than 5 at %. Furthermore, in the barrier layer 27, the absolute value of the difference between the largest value and the smallest value of the atom ratios of silicon is more preferably less than 4 at %, further preferably less than 3 at %. When the difference between the largest value and the smallest value of the atom ratios of silicon is not less than the above-described range, light distribution properties becomes insufficient from the obtained refractive index distribution curve of the barrier layer 27.

(Total Amount of Oxygen and Carbon: Oxygen Carbon Distribution Curve)

In addition, in the barrier layer 27, the ratio of the total amount of the oxygen atom and carbon atom to the total amount of the silicon atom, oxygen atom and carbon atom is defined as an oxygen carbon distribution curve.

In the barrier layer 27, the absolute value of the difference between the largest value and the smallest value of the total atom ratios of oxygen and carbon in the oxygen carbon distribution curve is preferably less than 5 at %, more preferably less than 4 at %, and particularly preferably less than 3 at %.

When the difference between the largest value and the smallest value of the total atom ratios of oxygen and carbon is no less than the above-described range, light distribution properties becomes insufficient from the obtained refractive index distribution curve of the barrier layer 27.

(XPS Depth Profile)

The above-described silicon distribution curve, oxygen distribution curve, carbon distribution curve, oxygen carbon distribution curve and nitrogen distribution curve can be produced by an XPS depth profile measurement, in which, by simultaneously using the measurement of X-ray Photoelectron Spectroscopy (XPS) and ion sputtering of inert gas such as argon, surface composition analysis is sequentially performed while exposing the inside of a sample. Distribution curves obtained by the XPS depth profile measurement can be produced while setting, for example, the vertical axis as the atom ratio (unit: at %) of each element and the horizontal axis as etching time (sputtering time).

Note that, in a distribution curve of an element setting the horizontal axis as etching time, the etching time generally correlates with the distance from the surface of the barrier layer 27 in the thickness direction. Therefore, in performing the XPS depth profile measurement, the distance from the surface of the barrier layer 27 calculated from the relation between etching rate and the etching time can be adopted as "the distance from the surface of the barrier layer 27 in the thickness direction."

In the XPS depth profile measurement, preferably an inert gas ion sputtering method using argon ($Ar^+$) as an etching ion species is adopted and an etching speed (etching rate) is set to be 0.05 nm/sec (in terms of $SiO_2$ thermally oxidized film).

From the viewpoint that the barrier layer 27 is to be formed as a layer having uniform and excellent light distribution properties in the whole film face, preferably, the barrier layer 27 is substantially uniform in the film surface direction (the direction parallel to the surface of the barrier layer 27). The fact that the barrier layer 27 is substantially uniform in the film surface direction means that numbers of the extreme values of the distribution curves of an element in each of measurement positions are the same in any two positions of the film face of the barrier layer 27, and means that absolute values of differences between the largest value and the smallest value of the atom ratios of carbon in distribution curves are equal to each other or the difference between the largest value and the smallest value is 5 at % or less.

(Substantial Continuity)

In the barrier layer 27, preferably, the carbon distribution curve is substantially continuous. The fact that the carbon distribution curve is substantially continuous means that the carbon distribution curve does not include a part in which the atom ratio of carbon discontinuously changes. Specifically, the distance from the surface of the barrier layer 27 (x, unit: nm) calculated from the etching rate and the etching time and atom ratio of carbon (C, unit: at %) satisfy the condition represented by a mathematical formula (F1) below.

$$(dC/dx) \leq 0.5 \tag{F1}$$

(Silicon Atom Ratio, Oxygen Atom Ratio)

Furthermore, in the silicon distribution curve, the oxygen distribution curve and the carbon distribution curve, the atom ratio of the silicon, the atom ratio of the oxygen and the atom ratio of the carbon preferably satisfy the condition represented by the above-described formula (1) in regions of 90% or more of the thickness of the barrier layer 27. In this case, the atom ratio of the content of the silicon atom to the total amount of the silicon atom, the oxygen atom and the carbon atom in the barrier layer 27 is preferably 25 to 45 at %, more preferably 30 to 40 at %.

Additionally, the atom ratio of the content of the oxygen atom relative to the total amount of the silicon atom, the oxygen atom and the carbon atom in the barrier layer 27 is preferably 33 to 67 at %, more preferably 45 to 67 at %.

Moreover, the atom ratio of the content of the carbon atom relative to the total amount of the silicon atom, the oxygen atom and the carbon atom in the barrier layer 27 is preferably 3 to 33 at %, more preferably 3 to 25 at %.

(Thickness of Thin Film Layer)

The thickness of the barrier layer 27 is preferably within a range of 5 to 3000 nm, more preferably within a range of 10 to 2000 nm, and particularly preferably within a range of 100 to 1000 nm. When the thickness of the barrier layer 27 lies outside the range, light distribution properties of the barrier layer 27 become insufficient.

Furthermore, when forming a plurality of the barrier layer 27, the total thickness of the barrier layer 27 is within a range of 10 to 10000 nm, preferably in a range of 10 to 5000 nm, more preferably within a range of 100 to 3000 nm, and particularly preferably within a range of 200 to 2000 nm.

(Primer Layer)

A heat-sealable resin layer, an adhesive agent layer or the like may be provided between the barrier layer 27 and the base material 26. The primer coat layer can be formed using a known primer coat agent capable of enhancing the adhesiveness between the base material 26 and the barrier layer 27. Furthermore, the heat-sealable resin layer can be formed appropriately using a known heat-sealable resin. Moreover, the adhesive agent layer can be formed appropriately using a known adhesive agent, and a plurality of barrier layer 27 may be caused to adhere to such an adhesive agent layer.

(Method for Manufacturing Barrier Layer)

In the translucent electrode 25, the barrier layer 27 is preferably a layer formed by a plasma chemical vapor deposition method. The barrier layer 27 formed by a plasma chemical vapor deposition method is more preferably a layer formed by a plasma chemical vapor deposition method (plasma CVD) in which the base material 26 is disposed on a pair of film-forming rolls, and discharge is performed between the pair of film-forming rolls to thereby generate plasma. The plasma chemical vapor deposition method may be a plasma chemical vapor deposition method of a Penning discharge plasma system. In addition, when discharge is performed between the pair of film-forming rolls, preferably polarities of the pair of film-forming rolls are alternately reversed.

In generating plasma in the plasma chemical vapor deposition method, a plasma discharge in a space among a plurality of film-forming rolls is preferable is generated. In particular, plasma is more preferably generated by using a pair of film-forming rolls, disposing the base material 26 on each of the pair of film-forming rolls and performing discharge between the pair of film-forming rolls.

In this way, a film can be formed on the base material 26 existing on one film-forming roll by disposing the base material 26 on the pair of film-forming rolls and performing discharge between the film-forming rolls. At the same time, a film can also be formed on the base material 26 on another film-forming roll. Therefore, a film formation rate can be doubled and a thin film can be effectively manufactured. Furthermore, films of the same structure can be formed on each of the base materials 26 on the pair of film-forming rolls.

In addition, for the plasma chemical vapor deposition method, the use of a film-forming gas containing an organic silicon compound and oxygen is preferable. The content of oxygen in the film-forming gas is preferably not more than a theoretical oxygen amount required for completely oxidizing the total amount of the organic silicon compound in the film-forming gas.

The barrier layer 27 is preferably a layer formed by a continuous film formation process.

(Manufacturing Apparatus of Barrier Layer)

The barrier layer 27 is, as described above, preferably formed on the surface of the base material 26 by a roll-to-roll system from the viewpoint of productivity, as described above. An apparatus capable of manufacturing the barrier layer 27 by the plasma chemical vapor deposition method is, although not particularly limited, preferably an apparatus that includes at least a pair of film-forming rolls and a plasma power source, and that has a configuration capable of performing discharge between the film-forming rolls.

Figure 7:
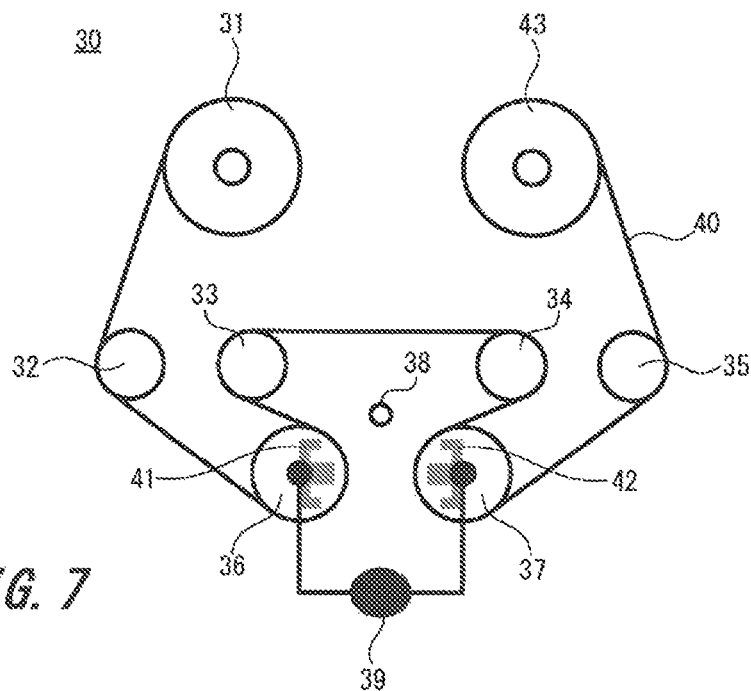
FIG. 7 is a drawing showing a configuration of a manufacturing apparatus of the barrier layer.

For example, when a manufacturing apparatus 30 shown in FIG. 7 is used, manufacturing by a roll-to-roll system while utilizing the plasma chemical vapor deposition method becomes possible. Hereinafter, a method for manufacturing the barrier layer 27 will be explained while referring to FIG. 7. Note that FIG. 7 is a schematic view showing an example of a manufacturing apparatus suitable for manufacturing the barrier layer 27.

The manufacturing apparatus 30 shown in FIG. 7 includes a feeding roll 31, conveyance rolls 32, 33, 34 and 35, film-forming rolls 36 and 37, a gas supply pipe 38, a power source for plasma generation 39, magnetic field-generating devices 41 and 42 installed inside the film-forming rolls 36 and 37, and a winding roll 43. In addition, in the manufacturing apparatus 30, at least the film-forming rolls 36 and 37, the gas supply pipe 38, the power source for plasma generation 39, and the magnetic field-generating devices 41 and 42 are disposed in a vacuum chamber not illustrated. Furthermore, in the manufacturing apparatus 30, the vacuum chamber is connected to a vacuum pump whose illustration is omitted, and the adjustment of pressure in the vacuum chamber is made possible by the vacuum pump.

In the manufacturing apparatus 30, so as to be able to cause the pair of film-forming rolls (the film-forming roll 36 and the film-forming roll 37) to function as a pair of counter electrodes, the respective film-forming rolls are connected respectively to the power source for plasma generation 39. Therefore, in the manufacturing apparatus 30, discharge in the space between the film-forming roll 36 and the film-forming roll 37 is possible by supplying electric power from the power source for plasma generation 39, and plasma can be generated in the space between the film-forming roll 36 and the film-forming roll 37. Note that, when the film-forming roll 36 and the film-forming roll 37 are to be utilized as electrodes, it is sufficient that the quality of the material or design of the film-forming roll 36 and the film-forming roll 37 is changed so that the film-forming roll 36 and the film-forming roll 37 may also be utilized as electrodes. Furthermore, in the manufacturing apparatus 30, preferably, the pair of film-forming rolls (film-forming rolls 36 and 37) are disposed so that center axes become approximately parallel on the same plane. In this way, the film formation rate can be doubled, and in addition, films of the same structure can be formed, by disposing the pair of film-forming rolls (film-forming rolls 36 and 37). Therefore, it becomes possible at least to double the extreme value in the carbon distribution curve. Additionally, according to the manufacturing apparatus 30, the formation of the barrier layer 27 on the surface of a film 40 by a CVD method is possible, and furthermore, film components can be deposited on the surface of the film 40 also on the film-forming roll 37 while depositing film components on the surface of the film 40 on the film-forming roll 36, and thus the barrier layer 27 can be effectively formed on the surface of the film 40.

In addition, magnetic field-generating devices 41 and 42, which are fixed so as not to rotate even when the film-forming roll rotates, are provided respectively inside the film-forming roll 36 and the film-forming roll 37.

Furthermore, a known roll can be used as the film-forming roll 36 and the film-forming roll 37. From the viewpoint of forming a thin film more effectively, the use of rolls having the same diameter as the film-forming rolls 36 and 37 is preferable. Diameters of the film-forming rolls 36 and 37 are preferably set within a range of 5 to 100 cm, from the viewpoint of discharge conditions, the space of the chamber and the like.

Moreover, in the manufacturing apparatus 30, the film 40 is disposed on the pair of film-forming rolls (the film-forming roll 36 and the film-forming roll 37) so that surfaces of the film 40 face each other. By disposing the film 40 in this way, it becomes possible to simultaneously form the barrier layer 27 on respective surfaces of the film 40 existing between the pair of film-forming rolls, in generating plasma by performing discharge between the film-forming roll 36 and the film-forming roll 37. Namely, according to the manufacturing apparatus 30, film components can be deposited on the surface of the film 40 on the film-forming roll 36 and furthermore, film components can be deposited on the film-forming roll 37, by a CVD method, and thus, an effective formation of the barrier layer 27 on the surface of the film 40 becomes possible.

Known rolls can be used as the feeding roll 31 and the conveyance rolls 32, 33, 34 and 35 for use in the manufacturing apparatus 30. Furthermore, it is sufficient that the winding roll 43 can wind the film 40 on which the barrier layer 27 has been formed, and no particular limitation is imposed on the winding roll 43, and also a known roll can be used as the winding roll 43.

Piping capable of supplying or exhausting raw material gas or the like at a prescribed speed can be used as the gas supply pipe 38. Furthermore, a power source in a known plasma generation apparatus can be used as the power source for plasma generation 39. The power source for plasma generation 39 supplies electric power to the film-forming rolls 36 and 37 connected thereto to thereby enable the utilization of the film-forming rolls 36 and 37 as counter electrodes for discharge. Since it becomes possible to more effectively implement plasma CVD as the power source for plasma generation 39, the utilization of an alternate current power source or the like capable of alternately reversing the polarity of the film-forming roll is preferable. Furthermore, since it becomes possible to more effectively implement plasma CVD, the use of the power source for plasma generation 39 that can set an applied electric power to be 100 W to 10 kW and an alternate current frequency to be 50 Hz to 500 kHz is more preferable. Moreover, a known magnetic field-generating device can be used as the magnetic field-generating devices 41 and 42. Furthermore, the base material 26 obtained by previously formed the barrier layer 27 can be used, in addition to the above-described base material 26 that can be applied to the translucent electrode 25, as the film 40. In this way, the thickness of the barrier layer 27 can be made larger by using the base material 26 obtained by previously formed the barrier layer 27, as the film 40.

As described above, the barrier layer 27 can be manufactured through the use of the manufacturing apparatus 30 shown in FIG. 7, by adjusting, for example, the kind of raw material gas, the electric power of an electrode drum of the plasma generation apparatus, the pressure in the vacuum chamber, the diameter of the film-forming roll and the conveyance speed of the film. Namely, the film-forming gas (raw material gas etc.) is decomposed by plasma and the barrier layer 27 is formed by a plasma CVD method on the surface of the film 40 on the film-forming roll 36 and on the surface of the film 40 on the film-forming roll 37, through the use of the manufacturing apparatus 30 shown in FIG. 7, by performing discharge between the pair of film-forming rolls (film-forming rolls 36 and 37) while supplying film-forming gas (raw material gas or the like) into the vacuum chamber. Note that, in film formation, the barrier layer 27 is formed on the surface of the film 40 by a continuous film formation process of a roll-to-roll system by conveying the film 40 through the use of the feeding roll 31, the film-forming roll 36 and the like, respectively.

(Raw Material Gas)

The raw material gas in the film-forming gas used for forming the barrier layer 27 can be appropriately selected and used, depending on the quality of the material of the barrier layer 27 to be formed. For example, an organic silicon compound containing silicon can be used as the raw material gas. Examples of the organic silicon compounds include hexamethyldisiloxane, 1,1,3,3-tetramethyldisiloxane, vinyltrimethylsilane, methyltrimethylsilane, hexamethyldisilane, methylsilane, dimethylsilane, trimethylsilane, diethylsilane, propylsilane, phenylsilane, vinyltriethoxysilane, vinyltrimethoxysilane, tetramethoxysilane, tetraethoxysilane, phenyltrimethoxysilane, methyltriethoxysilane, octamethylcyclotetrasiloxane, and the like. Among these organic silicon compounds, hexamethyldisiloxane or 1,1,3, 3-tetramethyldisiloxane is preferably used from the viewpoint of handling in the film formation, light distribution properties of the obtained barrier layer 27, and the like. In addition, these organic silicon compounds can be used alone or in combination of two or more kinds thereof.

Furthermore, a reaction gas may be used as the film-forming gas, in addition to the raw material gas. A gas that reacts with the raw material gas to thereby become an inorganic compound such as oxide, nitride or the like can be appropriately selected and used as the reaction gas. For example, oxygen, ozone can be used as the reaction gas for forming an oxide. For example, nitrogen, ammonia can be used as the reaction gas for forming a nitride. These gases can be used alone or in combination of two or more kinds, and for example, in order to form an oxynitride, a reaction gas for forming an oxide can be used in combination of a reaction gas for forming a nitride.

In order to supply the raw material gas into the vacuum chamber, a carrier gas may be used as the film-forming gas as necessary. Furthermore, in order to generate plasma discharge, a gas for discharge may be used as the film-forming gas as necessary. A known gas can be used as the carrier gas and the gas for discharge, and for example, an inert gas such as helium, argon, neon or xenon, or hydrogen can be used.

When the film-forming gas contains the raw material gas and the reaction gas, as to the ratio of the raw material gas and the reaction gas, preferably the ratio of the reaction gas is set to be not too excessive compared with the ratio of the amount of the reaction gas theoretically required for causing the raw material gas to completely react with the reaction gas. When the ratio of the reaction gas is set to be too excessive, light distribution properties of the barrier layer 27 cannot be obtained sufficiently. Furthermore, when the film-forming gas contains an organic silicon compound and oxygen, preferably the amount of the oxygen is not more than the theoretical amount required for completely oxidizing the total amount of the organic silicon compound in the film-forming gas.

Hereinafter, as an example, the case where hexamethyldisiloxane (organic silicon compound: HMDSO: $(CH_3)_6Si_2O$:) is used as a raw material gas and oxygen ($O_2$) is used as a reaction gas will be explained.

When causing a film-forming gas containing hexamethyldisiloxane as a raw material gas and oxygen as a reaction gas to react by plasma CVD to thereby produce a silicon-oxygen-based thin film, a reaction according to a reaction formula (1) below occurs by the film-forming gas, $$(CH_3)_6Si_2O + 12O_2 \rightarrow 6CO_2 + 9H_2O + 2SiO_2 \tag{1}$$

and silicon dioxide is generated. In the reaction, an oxygen amount necessary for completely oxidizing 1 mol of hexamethyldisiloxane is 12 mol. Consequently, when incorporating not less than 12 mol of oxygen relative to 1 mol of hexamethyldisiloxane in the film-forming gas and causes the gas to completely react, a uniform silicon dioxide film is formed. Therefore, an incomplete reaction is caused to be implemented by controlling the ratio of gas flow amount of the raw material to be a flow amount of not more than the raw material ratio of the complete reaction being the theoretical ratio. Namely, an oxygen amount is required to be less than 12 mol that is a stoichiometric ratio relative to 1 mol of hexamethyldisiloxane 1 mol.

Note that, in a reaction in an actual plasma CVD chamber, since hexamethyldisiloxane being the raw material and oxygen being the reaction gas are supplied from a gas supply part to a film formation region, actually the reaction cannot be completely advanced even when the molar amount (flow amount) of the oxygen being the reaction gas is a molar amount (flow amount) of 12 times the molar amount (flow amount) of hexamethyldisiloxane being the raw material. Namely, the reaction is considered to be completed for the first time when oxygen of an extremely excessive content is supplied as compared with the stoichiometric ratio. For example, in order to obtain silicon oxide by complete oxidization through CVD, there is a case where the molar amount (flow amount) of the oxygen is set to be approximately not less than 20 times the molar amount (flow amount) of hexamethyldisiloxane being the raw material.

Therefore, the molar amount (flow amount) of the oxygen relative to the molar amount (flow amount) of hexamethyldisiloxane being the raw material is preferably the amount of 12 times or less being the stoichiometric ratio (more preferably 10 times or less). Carbon atoms or hydrogen atoms of the hexamethyldisiloxane having been not completely oxidized are taken in the barrier layer 27 by incorporating the hexamethyldisiloxane and oxygen at the ratio, and thus the formation of the intended barrier layer 27 becomes possible.

Note that, when the molar amount (flow amount) of oxygen relative to the molar amount (flow amount) of hexamethyldisiloxane in a film-forming gas is too small, the transparency of the barrier layer 27 deteriorates since carbon atoms or hydrogen atoms not having been oxidized are excessively taken in the barrier layer 27. Therefore, hexamethyldisiloxane cannot be utilized for a flexible substrate for which transparency is required, such as the translucent electrode 25. From the viewpoint, the lower limit of the molar amount (flow amount) of the oxygen relative to the molar amount (flow amount) of the hexamethyldisiloxane in the film-forming gas is preferably set to be an amount more than 0.1 time the molar amount (flow amount) of the hexamethyldisiloxane, more preferably to be an amount more than 0.5 times.

(Vacuum Degree)

The pressure (vacuum degree) in the vacuum chamber can appropriately be adjusted in accordance depending on the kind of raw material gas or the like, but is set preferably to be within a range of 0.5 Pa to 100 Pa.

(Film-Forming Roll)

In the above-described plasma CVD method, electric power to be applied to an electrode drum connected to the power source for plasma generation 39 for performing discharge between the film-forming rolls 36 and 37 can appropriately be adjusted depending on the kind of the raw material gas, the pressure in the vacuum chamber or the like. For example, the electric power is preferably set to be within a range of 0.1 to 10 kW. An applied electric power of less than the lower limit tends to generate particles. On the other hand, an electric power exceeding the upper limit generates a large amount of heat in film formation to thereby raise the temperature at the base material surface in the film formation, and the base material 26 suffers heat damage to thereby generate a wrinkle in the film formation.

Note that, in the example, the electrode drum is installed on the film-forming rolls 36 and 37.

The conveyance speed (line speed) of the film 40 can appropriately be adjusted depending on the kind of the raw material gas, the pressure in the vacuum chamber or the like but is preferably set to be within a range of 0.25 to 100 m/min, more preferably to be within a range of 0.5 to 20 m/min. When the line speed is less than the lower limit, a wrinkle caused by heat tends to be generated in the film, whereas, when the line speed exceeds the upper limit, the thickness of the formed barrier layer 27 tends to become thin.

(Smoothing Layer)

A smoothing layer may be formed between the base material 26 and the barrier layer 27. The smoothing layer is provided for flattening a rough surface of the base material 26 on which a projection or the like exist, or for embedding and flattening irregularities or a pinhole generated in the barrier layer 27 by the projection existing on the base material 26. Such a smoothing layer is basically formed by curing a photosensitive resin.

Examples of the photosensitive resins used for forming the smoothing layer include a resin composition containing an acrylate compound having a radically reactive unsaturated compound, a resin composition containing an acrylate compound and a mercapto compound having a thiol group, a resin composition obtained by dissolving a polyfunctional acrylate monomer such as epoxy acrylate, urethane acrylate, polyester acrylate, polyether acrylate, polyethylene glycol acrylate or glycerol methacrylate, and the like. Furthermore, arbitrary mixture of these resin compositions may also be used, and no particular limitation is imposed only as long as the resin composition is a photosensitive resin containing a reactive monomer having one or more photopolymerizable unsaturated bonds in the molecule.

Examples of the reactive monomers having one or more photopolymerizable unsaturated bonds in the molecule include methyl acrylate, ethyl acrylate, n-propyl acrylate, isopropyl acrylate, n-butyl acrylate, isobutyl acrylate, tert-butyl acrylate, n-pentyl acrylate, n-hexyl acrylate, 2-ethyl hexyl acrylate, n-octyl acrylate, n-decyl acrylate, hydroxyethyl acrylate, hydroxypropyl acrylate, allyl acrylate, benzyl acrylate, butoxyethyl acrylate, butoxyethylene glycol acrylate, cyclohexyl acrylate, dicyclopentanyl acrylate, 2-ethyl hexyl acrylate, glycerol acrylate, glycidyl acrylate, 2-hydroxyethyl acrylate, 2-hydroxypropyl acrylate, isobonyl acrylate, isodexyl acrylate, isooctyl acrylate, lauryl acrylate, 2-methoxyethyl acrylate, methoxyethylene glycol acrylate, phenoxy ethyl acrylate, stearyl acrylate, ethylene glycol diacrylate, diethylene glycol diacrylate, 1,4-butanediol diacrylate, 1,5-pentanediol diacrylate, 1,6-hexanediol diacrylate, 1,3-propanediol acrylate, 1,4-cyclohexanediol diacrylate, 2,2-dimethylolpropane diacrylate, glycerol diacrylate, tripropylene glycol diacrylate, glycerol triacrylate, trimethylolpropane triacrylate, polyoxyethyl trimethylolpropane triacrylate, pentaerythritol triacrylate, pentaerythritol tetraacrylate, ethylene oxide-modified pentaerythritol triacrylate, ethylene oxide-modified pentaerythritol tetraacrylate, propyon oxide-modified pentaerythritol triacrylate, propyon oxide-modified pentaerythritol tetraacrylate, triethylene glycol diacrylate, polyoxypropyl trimethylolpropane triacrylate, butylene glycol diacrylate, 1,2,4-butanediol triacrylate, 2,2,4-trimethyl-1,3-pentanediol diacrylate, diallyl fumarate, 1,10-decanediol dimethyl acrylate, pentaerythritol hexaacrylate, those in which the above-describe acrylate is substituted by methacrylate, γ-methacryloxypropyl trimethoxysilane, 1-vinyl-2-pyrrolidone, and the like. The above-described reactive monomers can be used as one kind or as two or more kinds of mixture, or as a mixture with another compound.

The photosensitive resin composition contains a photopolymerization initiator.

Examples of the photopolymerization initiators include benzophenone, methyl o-benzoylbenzoate, 4,4-bis(dimethylamine)benzophenone, 4,4-bis(diethylamine)benzophenone, α-aminoacetophenone, 4,4-dichlorobenzophenone, 4-benzoyl-4-methyldiphenyl ketone, dibenzyl ketone, fluorenone, 2,2-diethoxyacetophenone, 2,2-dimethoxy-2-phenylacetophenone, 2-hydroxy-2-methylpropiophenone, p-tert-butyl-dichloroacetophenone, thioxanthone, 2-methylthioxanthone, 2-chlorothioxanthone, 2-isopropylthioxanthone, diethylthioxanthone, benzyldimethyl ketal, benzylmethoxyethyl acetal, benzoin methyl ether, benzoin butyl ether, anthraquinone, 2-tert-butyl-anthraquinone, 2-amyl-anthraquinone, β-chloro-anthraquinone, anthrone, benzanthrone, dibenzsuberon, methyleneanthrone, 4-azidobenzyl acetophenone, 2,6-bis(p-azidobenzylidene)cyclohexane, 2,6-bis(p-azidobenzylidene)-4-methylcyclohexanone, 2-phenyl-1,2-butazone-2-(o-methoxycarbonyl) oxime, 1-phenyl propanedione-2-(o-ethoxycarbonyl) oxime, 1,3-diphenylpropanetrione-2-(o-ethoxycarbonyl) oxime, 1-phenyl-3-ethoxypropanetrione-2-(o-benzoyl) oxime, Michler's ketone, 2-methyl [4-(methylthio)phenyl]-2-monopholino-1-propane, 2-benzyl-2-dimethylamino-1-(4-monopholinophenyl)-butanone-1, naphthalenesulfonyl chloride, quinolinesulfonyl chloride, n-phenylthioacridone, 4,4-azobisisobutyronitrile, diphenyl disulfide, benzothiazole disulfide, triphenyl phosphine, camphorquinone, carbon tetrabromide, tribromophenyl sulfone, benzoin peroxide, a combination of a photoreducable dye such as eosin or methylene blue and a reducing agent such as ascorbic acid or triethanolamine, etc., and these photopolymerization initiators can be used alone or in combination of two or more kinds thereof.

The smoothing layer is, although not particularly limited, preferably formed by a wet coating method such as a spin coating method, a spray method, a blade coating method or a dip method, or by a dry coating method such as a vapor deposition method.

In the formation of the smoothing layer, an additive such as an oxidation inhibitor, an ultraviolet ray absorber or a plasticizer can be added to the above-described photosensitive resin, as necessary. Furthermore, irrespective of the laminated position of the smoothing layer, in any of smoothing layers, a suitable resin or additive may be used for improving the film formation properties, preventing the generation of a pinhole in the film, and the like.

When the smoothing layer is formed using a coating liquid obtained by dissolving or dispersing the photosensitive resin in a solvent, examples of the solvents to be used can include alcohols such as methanol, ethanol, n-propanol, isopropanol, ethylene glycol and propylene glycol, terpenes such as α- and β-terpineol, ketones such as acetone, methyl ethyl ketone, cyclohexanone, N-methyl-2-pyrrolidone, diethylketone, 2-heptanone and 4-heptanone, aromatic hydrocarbons such as toluene, xylene and tetramethylbenzene, glycol ethers such a cellosolve, methyl cellosolve, ethyl cellosolve, carbitol, methyl carbitol, ethyl carbitol, butyl carbitol, propylene glycol monomethyl ether, propylene glycol monoethyl ether, dipropylene glycol monomethyl ether, dipropylene glycol monoethyl ether, triethylene glycol monomethyl ether and triethylene glycol monoethyl ether, acetic esters such as ethyl acetate, butyl acetate, cellosolve acetate, ethyl cellosolve acetate, butyl cellosolve acetate, carbitol acetate, ethyl carbitol acetate, butyl carbitol acetate, propylene glycol monomethyl ether acetate, propylene glycol monoethyl ether acetate, 2-methoxyethyl acetate, cyclohexyl acetate, 2-ethoxyethyl acetate and 3-methoxybutyl acetate, diethylene glycol dialkyl ether, dipropylene glycol dialkyl ether, ethyl 3-ethoxypropionate, methyl benzoate, N,N-dimethylacetamide, N,N-dimethylformamide, and the like.

The smoothness of the smoothing layer is preferably from 10 nm or more to 30 nm or less in the largest cross-section height Rt(p), according to the value expressed by the surface roughness prescribed in JIS B 0601. When the smoothness is smaller than 10 nm, in the step of coating a silicon compound by a coating system such as a wire bar or a wireless bar to be described later, coating properties may be deteriorated when the coating means comes into contact with the smoothing layer surface. In addition, when the smoothness is larger than 30 nm, it may become difficult to smoothen unevenness after coating the silicon compound.

The surface roughness is a roughness related to the amplitude of fine unevenness measured using AFM (an atomic force microscope). The surface roughness is calculated, after performing measurement many times within a zone of several tens μm by a detector having a sensing pin of a minimum tip radius of AFM, from the cross-section curve of the unevenness thus continuously measured.

(Additive to Smoothing Layer)

In the smoothing layer, an additive may be contained. As the additive contained in the smoothing layer, a reactive silica particle in which a photosensitive group having photopolymerization reactive properties is introduced on the surface of a photosensitive resin (hereinafter, also simply referred to as a "reactive silica particle") is preferable.

Here, the photosensitive group having photopolymerization properties can include a polymerizable unsaturated group represented by a (meth)acryloyloxy group, and the like. The photosensitive resin preferably contains a compound capable of a photopolymerization reaction with the photosensitive group introduced on the surface of the reactive silica particle, for example, an unsaturated organic compound having a polymerizable unsaturated group. Furthermore, the photosensitive resin may be mixed with a diluent solvent generally used for the reactive silica particle or the unsaturated organic compound having a polymerizable unsaturated group to thereby be caused to adjust a solid content.

Here, as to an average particle diameter of the reactive silica particle, the average particle diameter of 0.001 to 0.1 μm is preferable. By setting the average particle diameter within the range, a smoothing layer having both optical properties such as light distribution properties and hard coat properties is easily formed by using the silica particle in combination with a matting agent made of an inorganic particle having an average particle diameter of 1 to 10 μm to be described later.

Note that the average particle diameter is preferably set within a range of 0.001 to 0.01 μm in order to make the above-described effect more easily obtainable. In the smoothing layer, the inorganic particle as described above is preferably contained in an amount of 20% or more to 60% or less as a mass ratio. The close adhesiveness between the base material 26 and the barrier layer 27 is improved by the addition in an amount 20% or more. Furthermore, when the amount exceeds 60%, the film may be curved, cracks may be generated in performing a thermal treatment, or optical properties of the barrier layer 27 such as the transparency or refractive index may be affected.

Note that, in the example, as the reactive silica particle, polymerizable unsaturated group-modified hydrolyzable silane that generates a silyloxy group and is chemically bonded to the silica particle, by a hydrolysis reaction of a hydrolyzable silyl group can be used.

Examples of the hydrolyzable silyl groups include carboxylate silyl groups such as an alkoxysilyl group and an acetoxysilyl group, halogenated silyl groups such as a chlorosilyl group, an aminosilyl group, an oximesilyl group, a hydridosilyl group, and the like.

Examples of the polymerizable unsaturated groups include an acryloyloxy group, a methacryloyloxy group, a vinyl group, a propenyl group, a butadienyl group, a styryl group, an ethynyl group, a cinnamoyl group, a malate group, an acrylamide group, and the like.

The thickness of the smoothing layer is preferably 1 to 10 µm, more preferably 2 to 7 µm. The smoothness of the base material 26 having the smoothing layer becomes sufficient by setting the thickness to be not less than 1 µm. Additionally, it becomes possible to easily adjust the balance of optical properties, and to easily suppress curling when the smoothing layer is provided only on one surface of the base material 26, by setting the thickness to be 10 µm or less.

Furthermore, the smoothing layer may contain a matting agent as another additive. An inorganic particle having an average particle diameter of approximately 0.1 to 5 µm is preferable as the matting agent.

Silica, alumina, talc, clay, calcium carbonate, magnesium carbonate, barium sulfate, aluminum hydroxide, titanium dioxide, zirconium oxide and the like can be used as the inorganic particle, alone or in combination of two or more kinds thereof.

Here, the matting agent made of an inorganic particle is mixed at a ratio of 2 parts by mass or more, preferably 4 parts by mass or more, more preferably 6 parts by mass or more, and 20 parts by mass or less, preferably 18 parts by mass or less, more preferably 16 parts by mass or less, relative to 100 parts by mass of the solid content in the smoothing layer.

(Bleed Out-Preventing Layer)

A bleed out-preventing layer can be provided on the barrier layer 27. The bleed out-preventing layer is provided on the surface of the base material, opposite to the surface having the smoothing layer, in order to suppress a phenomenon in which an unreacted oligomer or the like moves from the inside of the base material 26 to the surface when heating the film-like base material 26 having the smoothing layer to thereby pollute the surface of the base material 26. The bleed out-preventing layer may have the basically same configuration as that of the smoothing layer as long as the layer has the function.

An unsaturated organic compound having a polymerizable unsaturated group can be used as the bleed out-preventing layer. A polyvalent unsaturated organic compound having two or more polymerizable unsaturated groups in the molecule, a monovalent unsaturated organic compound having one polymerizable unsaturated group in the molecule, or the like is preferably used as the unsaturated organic compound.

Here, examples of the polyvalent unsaturated organic compounds include ethylene glycol di(meth)acrylate, diethylene glycol di(meth)acrylate, glycerol di(meth)acrylate, glycerol tri(meth)acrylate, 1,4-butanediol di(meth)acrylate, 1,6-hexanediol di(meth)acrylate, neopentyl glycol di(meth) acrylate, trimethylolpropane tri(meth)acrylate, dicyclopentanyl di(meth)acrylate, pentaerythritol tri(meth)acrylate, pentaerythritol tetra(meth)acrylate, dipentaerythritol hexa (meth)acrylate, dipentaerythritol monohydroxy penta(meth) acrylate, ditrimethylolpropane tetra(meth)acrylate, diethylene glycol di(meth)acrylate, polyethylene glycol di(meth) acrylate, tripropylene glycol di(meth)acrylate, polypropylene glycol di(meth)acrylate, and the like.

Furthermore, examples of the monovalent unsaturated organic compounds include methyl (meth)acrylate, ethyl (meth)acrylate, propyl (meth)acrylate, butyl (meth)acrylate, 2-ethyl hexyl (meth)acrylate, isodecyl (meth)acrylate, lauryl (meth)acrylate, stearyl (meth)acrylate, allyl (meth)acrylate, cyclohexyl (meth)acrylate, methylcyclohexyl (meth)acrylate, isobornyl (meth)acrylate, 2-hydroxyethyl (meth)acrylate, 2-hydroxypropyl (meth)acrylate, glycerol (meth)acrylate, glycidyl (meth)acrylate, benzyl (meth)acrylate, 2-ethoxyethyl (meth)acrylate, 2-(2-ethoxyethoxy)ethyl (meth)acrylate, butoxyethyl (meth)acrylate, 2-methoxyethyl (meth)acrylate, methoxy diethylene glycol (meth)acrylate, methoxy triethylene glycol (meth)acrylate, methoxy polyethylene glycol (meth)acrylate, 2-methoxypropyl (meth) acrylate, methoxy dipropylene glycol (meth)acrylate, methoxy tripropylene glycol (meth)acrylate, methoxy polypropylene glycol (meth)acrylate, polyethylene glycol (meth) acrylate, polypropylene glycol (meth)acrylate, and the like.

Moreover, in the bleed out-preventing layer, a thermoplastic resin, a thermosetting resin, an ionizing radiation-curable resin, a photopolymerization initiator and the like may be incorporated.

Examples of the thermoplastic resins include cellulose derivatives such as acetyl cellulose, nitro cellulose, acetyl butyl cellulose, ethyl cellulose and methyl cellulose, vinyl-based resins such as vinyl acetate and copolymers thereof, vinyl chloride and copolymers thereof, and vinylidene chloride and copolymers thereof, acetal-based resins such as polyvinyl formal and polyvinyl butyral, acrylic resin such as acrylic resin and copolymers thereof and methacrylic resin and copolymers thereof, polystyrene resin, polyamide resin, linear polyester resin, polycarbonate resin, and the like.

Additionally, examples of the thermosetting resins include thermosetting urethane resin made of acrylic polyol and isocyanate prepolymer, phenol resin, urea-melamine resin, epoxy resin, unsaturated polyester resin, silicon resin, and the like.

In addition, the ionizing radiation-curable resin can be cured by irradiating an ionizing radiation-curable paint obtained by mixing one kind of, or two or more kinds of photopolymerizable prepolymers, photopolymerizable monomers or the like with ionizing radiation (ultraviolet rays or electron beams). Here, an acrylic prepolymer having two or more acryloyl groups in one molecule and forms a three dimensional net structure by cross-linking curing is particularly preferable as the photopolymerizable prepolymer. Urethane acrylate, polyester acrylate, epoxy acrylate, melamine acrylate and the like can be used as the acrylic prepolymer. Additionally, the above-described polyvalent unsaturated organic compound or the like can be used as the photopolymerizable monomer.

Furthermore, examples of the photopolymerization initiators include acetophenone, benzophenone, Michler's ketone, benzoin, benzyl methylketal, benzoin benzoate, hydroxycyclohexyl phenyl ketone, 2-methyl-1-(4-(methylthio)phenyl)-2-(4-morpholinyl)-1-propane, α-acyloxime ester, thioxanthones, and the like.

The bleed out-preventing layer can be formed by compounding the matting agent and anther necessary component, and then preparing a coating liquid with a diluent solvent as necessary, coating the coating liquid onto the base material surface by a conventionally known coating method, and irradiating the coating liquid with the ionizing radiation to thereby cure the same. Note that irradiation with ultraviolet rays in a wavelength region of 100 to 400 nm, preferably 200 to 400 nm emitted from an ultrahigh-pressure mercury lamp, a high-pressure mercury lamp, a low-pressure mercury lamp, a carbon arc, a metal halide lamp or the like are performed as the ionizing radiation. Alternatively, irradiation with electron beams in a wavelength region of 100 nm or less emitted from a scanning-type or a curtain-type electron beam accelerator is performed.

The thickness of the bleed out-preventing layer is preferably from 1 to 10 μm, particularly preferably from 2 to 7 μm. By setting it to be not less than 1 μm, sufficient heat resistance can be secured. Additionally, it becomes possible to easily adjust the balance of optical properties, and to easily suppress curling when the smoothing layer is provided only on one surface of the base material 26, by setting the thickness to be 10 μm or less.

[Uses of Translucent Electrode]

The transparent electrode having each of the above-described configurations can be used for various electronic devices. Examples of the electronic device include an organic electroluminescent element, an LED (light-emitting Diode), a liquid crystal element, an organic photoelectric conversion element, a touch panel, and the like. The above-described translucent electrode can be used as an electrode member that requires light transmission property, in the electronic device.

Hereinafter, as one intended use, there will be explained embodiments of the organic electroluminescent element in which the translucent electrode is used as an anode and a cathode and embodiments in which the translucent electrode is applied to a translucent electrode of an organic photoelectric conversion element.

<4. Organic Electroluminescent Element (Fourth Embodiment: Bottom Emission Type)>

[Configuration of Organic Electroluminescent Element]

Figure 8:
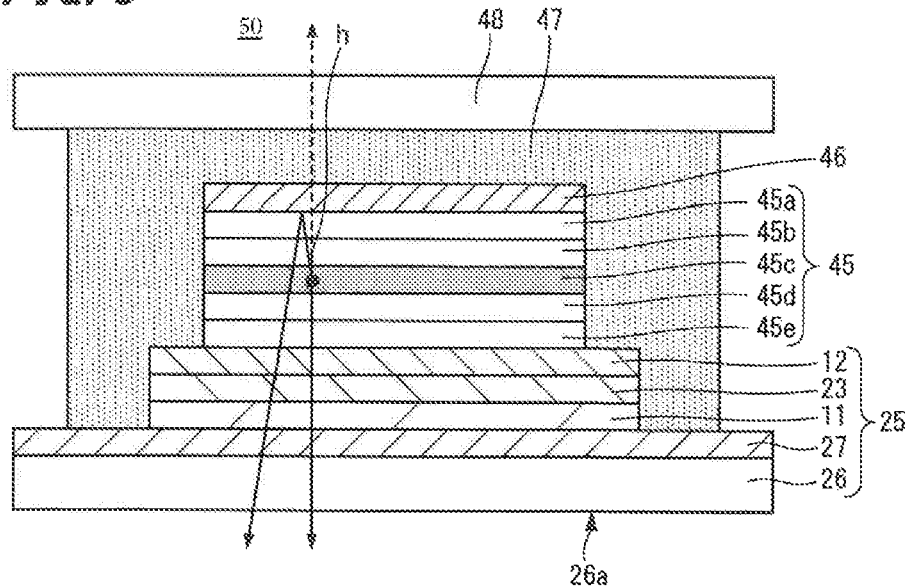
FIG. 8 is a drawing showing a schematic configuration of the organic electroluminescent element in a fourth embodiment.

Next, a fourth embodiment of the present invention will be explained. In the fourth embodiment, an organic electroluminescent element using the translucent electrode 25 in the third embodiment will be explained as an example of electronic devices. In FIG. 8, a schematic configuration of the organic electroluminescent element in the present embodiment is shown. Hereinafter, the configuration of the organic electroluminescent element will be explained based on the drawing.

An organic electroluminescent element 50 shown in FIG. 8 has a configuration in which a light-emitting functional layer 45 and a counter electrode 46 serving as a cathode are laminated on the translucent electrode 25, and furthermore, are solid-sealed by a resin layer 47 and a sealing member 48. Among these, the translucent electrode 25 used as an anode has the same configuration as that in the third embodiment. Therefore, the organic electroluminescent element 50 is constituted as a bottom emission type that extracts emitted light (hereinafter, described as emitted light h) at least from the base material 26 side.

Furthermore, the overall layer structure of the organic electroluminescent element 50 is not limited to the above, but may have a general layer structure. Here, the translucent electrode 25 is disposed on an anode (that is, a positive electrode) side and mainly the electrically conductive layer 12 functions as the anode, whereas the counter electrode 46 functions as a cathode (that is, a negative electrode).

In this case, for example, the light-emitting functional layer 45 has an exemplified configuration in which [positive hole injection layer 45a/positive hole transport layer 45b/light-emitting layer 45c/electron transport layer 45d/electron injection layer 45e] are laminated in this order in the upper part of the translucent electrode 25 being the anode. Among them, it is essential to have a light-emitting layer 45c constituted using at least organic material. The positive hole injection layer 45a and the positive hole transport layer 45b may be provided as a positive transport/injection layer having positive hole transport property and positive hole injection property. The electron transport layer 45d and the electron injection layer 45e may be provided as one layer having electron transport property and electron injection property. In addition, among the light-emitting functional layers 45, for example, the electron injection layer 45e may be constituted by an inorganic material.

In addition, in the light-emitting functional layer 45, a positive hole blocking layer, an electron blocking layer and the like also other than these layers may be laminated on a necessary portion, as necessary. Furthermore, the light-emitting layer 45c may have light-emitting layers of each color corresponding to the respective range of wavelength, and a light-emitting layer unit may be formed by laminating the light-emitting layers via an intermediate layer having non-light-emitting property. The intermediate layer may function as the positive hole blocking layer and the electron blocking layer. Moreover, the counter electrode 46 being an anode may have a laminated structure as necessary. In these configurations, only the portion in which the light-emitting functional layer 45 is sandwiched between the translucent electrode 25 and the counter electrode 46 serves as the light-emitting region in the organic electroluminescent element 50.

Furthermore, the organic electroluminescent element 50 is solid-sealed by the sticking of sealing member 48 on one surface of the translucent electrode 25 via the light-emitting functional layer 45 and the resin layer 47 covering the counter electrode 46. In the solid sealing of the organic electroluminescent element 50, an uncured resin material is coated on a plurality of positons of the sticking surface of the sealing member 48 or on a plurality of positons of any one of the base material 26 and the counter electrode 46 of the translucent electrode 25, and by sandwiching the resin material between the base material 26 and the sealing member 48, they are pressed each other in a heated state and are united.

(Smoothing of Electrically Conductive Layer)

In the organic electroluminescent element 50 of the above-described configuration, the smooth surface of the base layer 11 is transferred to the electrically conductive layer 12 formed on the base layer 11, due to the pressure added in the solid sealing. Therefore the surface of the electrically conductive layer 12 can be smoothened to Ra 2, as is the case for the surface of the base layer 11. Hereinafter, the smoothing will be explained.

Since the Ag layer constituting the electrically conductive layer 12 is thin and soft, the Ag layer has properties of being easily deformed by stress. Additionally, since the Ag layer is soft and easily deformed, the stress given to the whole element in solid sealing tends to concentrate on the Ag layer. Furthermore, the Ag layer is more easily deformed due to heating in the solid sealing. In contrast to this, the base layer 11 is not deformed by the stress in solid sealing because of having a surface of high elastic modulus, and thus maintains the smoothness at the time of the formation (Ra≤2). Therefore, the Ag layer deformed by stress is formed in the lower part of the electrically conductive layer 12 and is deformed so as to conform to the surface shape of the base layer 11. As the result, the shape of the smooth face of the surface of the base layer 11 is transferred to the electrically conductive layer 12, and the surface shape of the electrically conductive layer 12 can be smoothened in the same way as that of the base layer 11.

In addition, also when the nitrogen-containing layer 23 is sandwiched between the base layer 11 and the electrically conductive layer 12, the smoothing of the electrically conductive layer 12 is possible by the solid sealing. In this case, both the surface of the nitrogen-containing layer 23 and the surface of the electrically conductive layer 12 are smoothened. The nitrogen-containing layer 23 may be formed by an application method as described above. When the nitrogen-containing layer 23 is formed by an application method, a surface having smoothness of approximately the same level as that of the base layer 11 can be formed. Therefore, also when an electrically conductive layer made of Ag is formed on the nitrogen-containing layer 23, the smoothing of the surface of the electrically conductive layer 12 becomes possible by the solid sealing.

Hereinafter, the details of the main layers for constituting the above organic electroluminescent element 50 will be explained in order of the translucent electrode 25, the counter electrode 46, the light-emitting layer 45c of the light-emitting functional layer 45, other layers of the light-emitting functional layer 45, the sealing member 48 and the resin layer 47.

[Translucent Electrode (Anode Side)]

The translucent electrode 25 is the translucent electrode in the above-described third embodiment, and has a configuration in which the barrier layer 27, the base layer 11, the nitrogen-containing layer 23 and the electrically conductive layer 12 are formed in this order from the base material 26 side. Here, in particular, the electrically conductive layer 12 constituting the translucent electrode 25 serves as a substantial anode.

[Counter Electrode (Cathode)]

The counter electrode 46 is an electrode layer having a function as a cathode for supplying electrons to the light-emitting functional layer 45, and a metal, an alloy, an organic or inorganic electric conductive compound, and a mixture thereof are used for the counter electrode. Examples include gold, aluminum, silver, magnesium, lithium, a mixture of magnesium/copper, a mixture of magnesium/silver, a mixture of magnesium/aluminum, a mixture of magnesium/indium, indium, a mixture of lithium/aluminum, a rare-earth metal, an oxide semiconductor such as ITO, ZnO, $TiO_2$ or $SnO_2$.

The counter electrode 46 can be formed by such a method as vapor evaporation or sputtering of these conductive materials. In addition, the sheet resistance of the counter electrode 46 is preferably several hundreds of Ω/sq. or less. The thickness is generally selected within the range of 5 nm to 5 μm, preferably within the range of 5 nm to 200 nm.

When the organic electroluminescent element 50 is a top-and-bottom emission type in which emitted light h can also be extracted from the counter electrode 46 side, the counter electrode 46 may be constituted by selecting an electrically conductive material having a good light transmission property among the above-described electrically conductive materials.

[Light-Emitting Layer]

The light-emitting layer 45c used in the organic electroluminescent element of the present embodiment contains a phosphorescence-emitting compound as a light-emitting material.

The light-emitting layer 45c of the present invention is a layer which emits light through recombination of electrons injected from an electrode or an electron transport layer 45d and positive holes injected from the positive hole transport layer 45b. A portion that emits light may be either the inside of the light-emitting layer 45c or an interface between the light-emitting layer 45c and its adjacent layer.

The configuration of the light-emitting layer 45c is not particularly limited as long as the light-emitting material contained therein satisfies a light emission requirement. In addition, there may be a plurality of light-emitting layers having the same emission spectrum and/or emission maximum wavelength. In the case, it is preferable that non-luminescent intermediate layers (not shown) are present between the respective light-emitting layers 45c.

The total thickness of the light-emitting layers 45c is preferably within a range of 1 to 100 nm and, more preferably within a range of 1 to 30 nm from the viewpoint of obtaining a lower driving voltage. Note that the total thickness of the light-emitting layers 45c is a thickness including the thickness of the intermediate layers when the non-luminescent intermediate layers are present between the light-emitting layers 45c.

In the case of the light-emitting layer 45c constituted by lamination of a plurality of layers, it is preferable to adjust the thickness of individual light-emitting layer to be within a range of 1 to 50 nm and it is more preferable to adjust the thickness thereof to be within a range of 1 to 20 nm. When the plurality of the laminated light-emitting layers corresponds to the emitted color of blue, green and red, respectively, the relationship between the respective thickness of the light-emitting layers of blue, green and red is not particularly limited.

The above light-emitting layer 45c can be formed by a well-known thin film forming method such as a vacuum vapor deposition method, a spin coating method, a casting method, an LB method or an ink-jet method of a light-emitting material and a host compound, which are mentioned below.

In addition, in the light-emitting layer 45c, a plurality of light-emitting materials may be mixed. Furthermore, a fluorescence-emitting material and a fluorescence-emitting material (also referred to as fluorescence-emitting dopant, fluorescence-emitting compound) may be mixed in the same light-emitting layer 45c.

It is preferable that the light-emitting layer 45c is constituted so as to contain a host compound (also referred to as emitting host) and a light-emitting material (also referred to as light-emitting dopant compound, a guest compound), and emit light through the light-emitting material.

(Host Compound)

The host compound contained in the light-emitting layer 45c is preferably a compound having a phosphorescence quantum yield in phosphorescence emission of less than 0.1 at room temperature (25° C.). The host compound more preferably has a phosphorescent quantum yield of less than 0.01. Furthermore, among the compounds contained in the light-emitting layer 45c, a volume ratio in the layer of 50% or more is preferable.

A well-known host compound may be used as the host compound, alone or in combination of a plurality of kinds. The use of a plurality of host compounds makes it possible to adjust transfer of charges, and to increase an efficiency of the organic electroluminescent element 50. Furthermore, the use of a plurality of light-emitting materials mentioned below makes it possible to mix different colors of light to be emitted, and to thereby produce any luminous color.

The host compound to be used may be a well-known low molecular weight compound, a high molecular compound having a repeating unit or a low-molecular-weight compound having a polymerizable group such as a vinyl group or an epoxy group (evaporation-polymerizable light emission host) may be used.

The well-known host compound is preferably a compound preventing a light emission wavelength from becoming longer and having a high Tg (glass transition temperature), while having a positive hole transport ability and an electron transport ability. The glass transition temperature Tg herein is a value measured using DSC (Differential Scanning Colorimetry) in accordance with JIS-K-7121.

Hereinafter, specific examples of the host compounds (H1 to H79) applicable to the organic electroluminescent element are represented, and host compounds applicable to the organic electroluminescent element are not limited thereto.

The host compound H68 to H79, x and y represent ratio of random copolymer. The ratio may be set to, for example, x:y=1:10.

[Chem. 42]

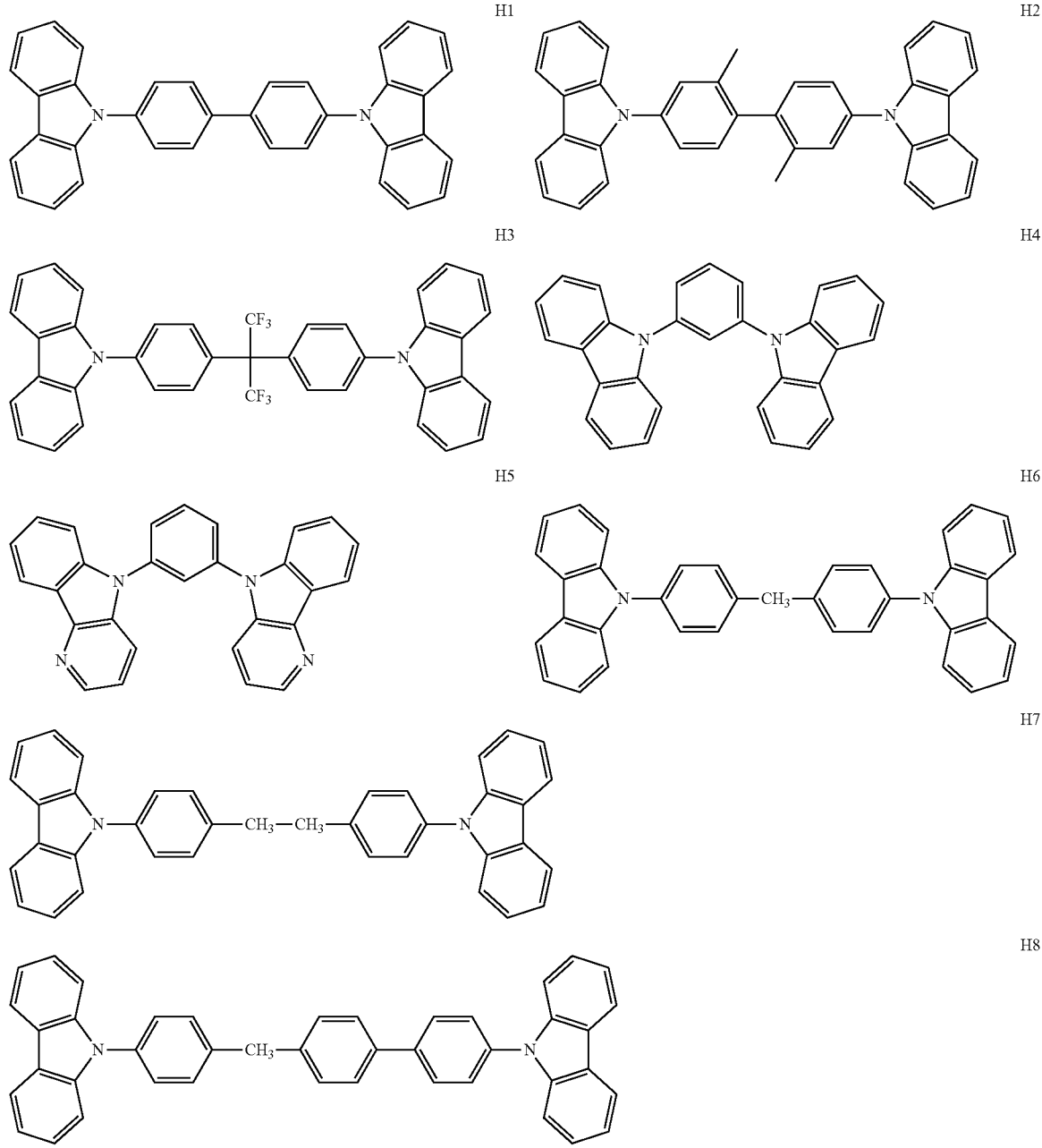

-continued
H9
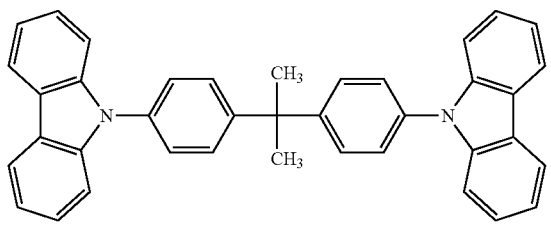
[Chem. 43]
H10
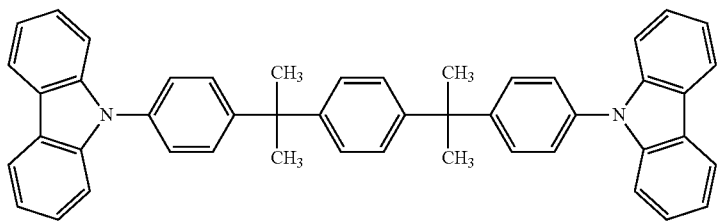
H11
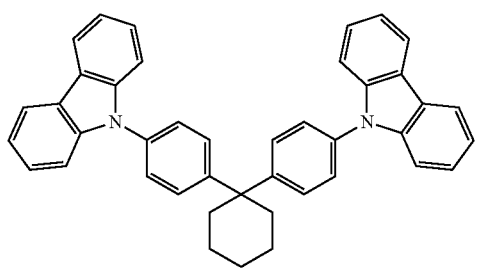
H12
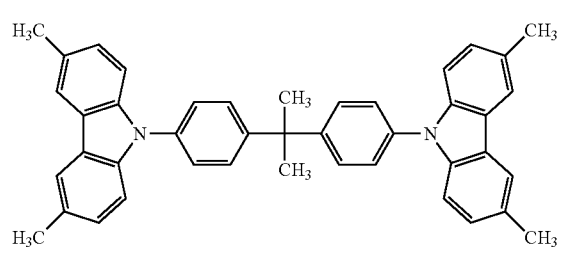
H13
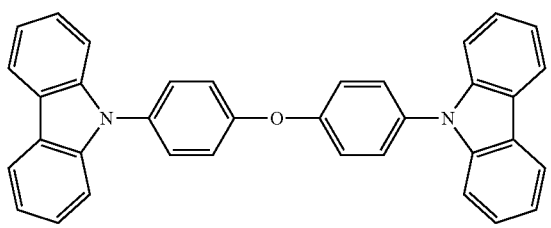
H14
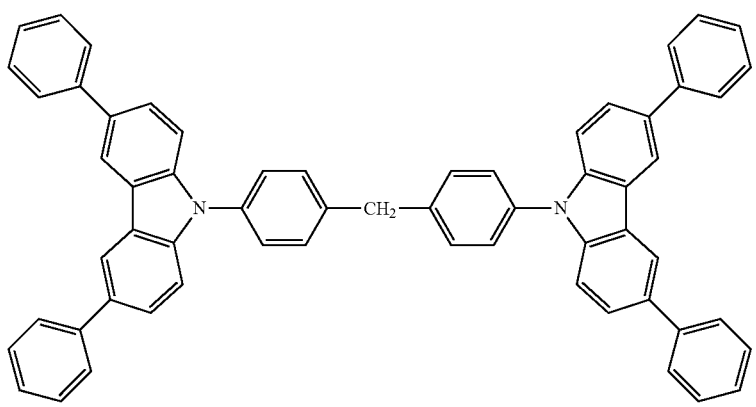

-continued
[Chem. 44]
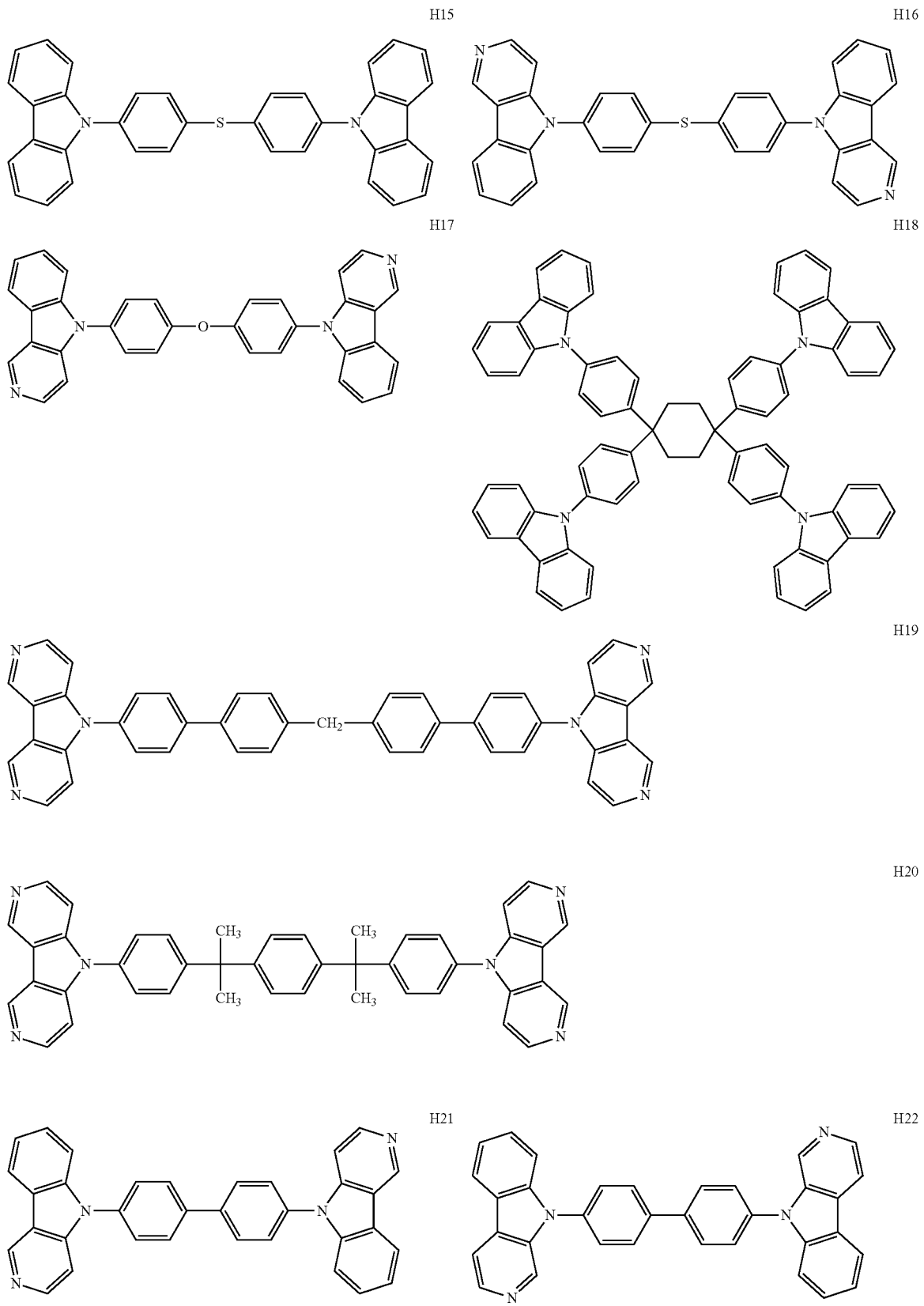

-continued
[Chem. 45]
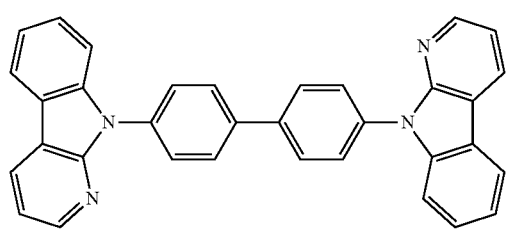
H23
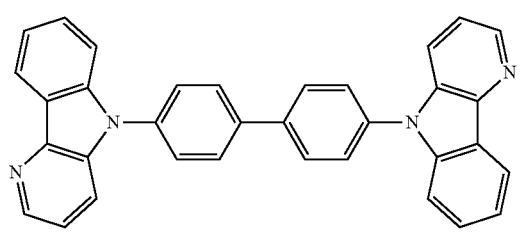
H24
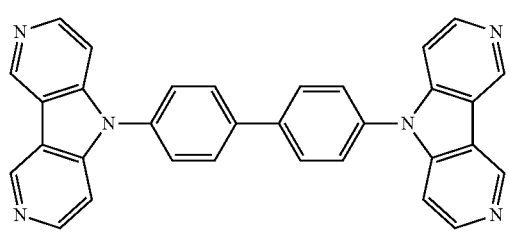
H25
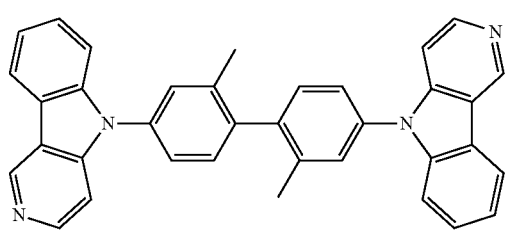
H26
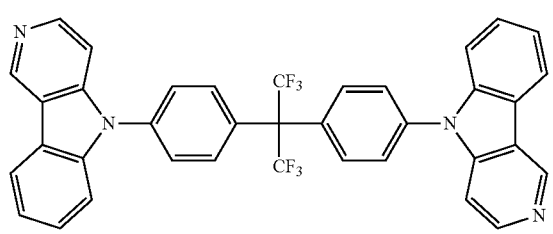
H27
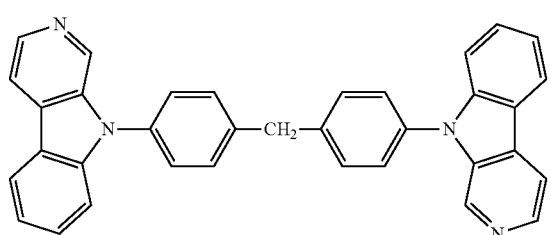
H28
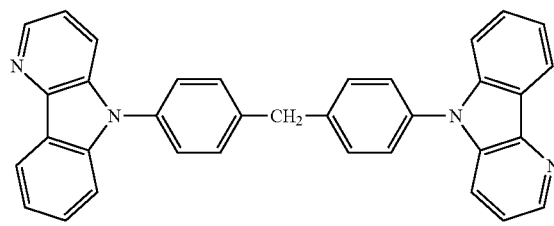
H29
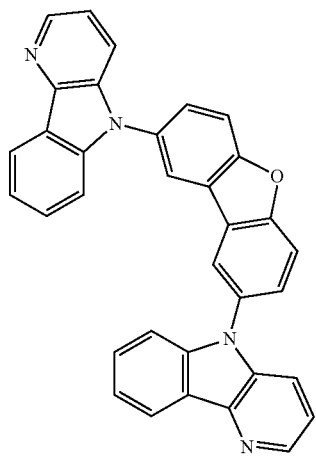
H30

[Chem. 46]
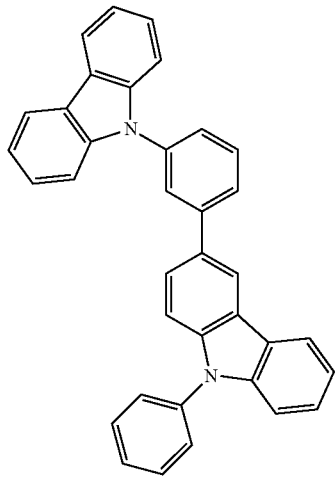
H31
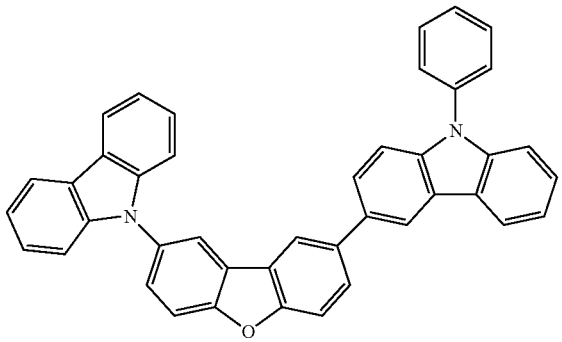
H32
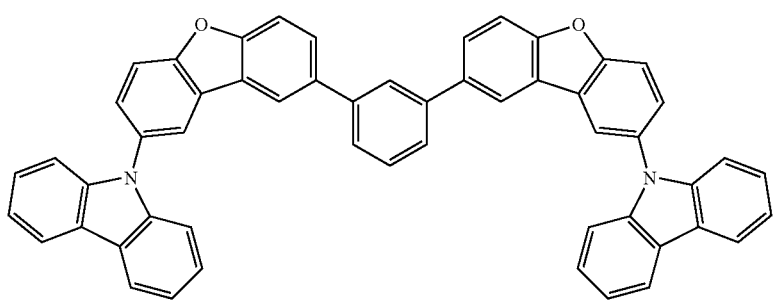
H33
[Chem. 47]
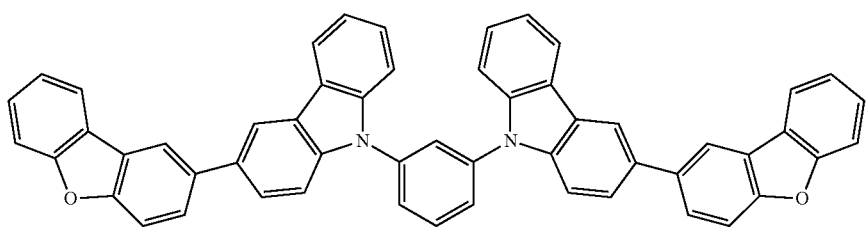
H34
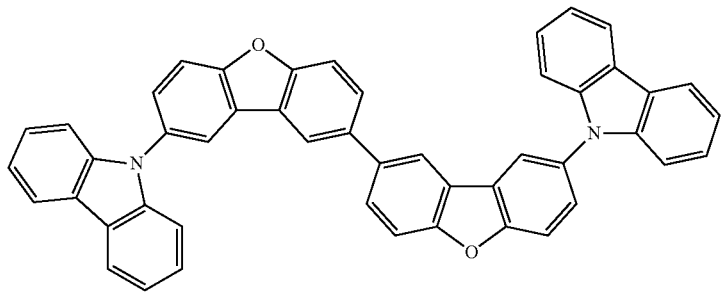
H35

-continued
H36
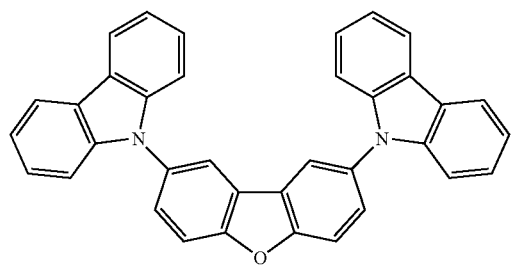
H37
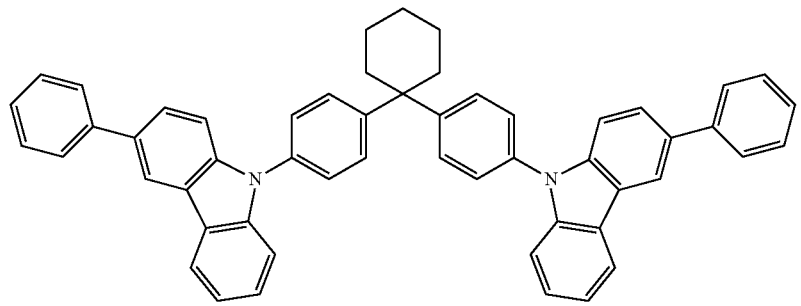
H38
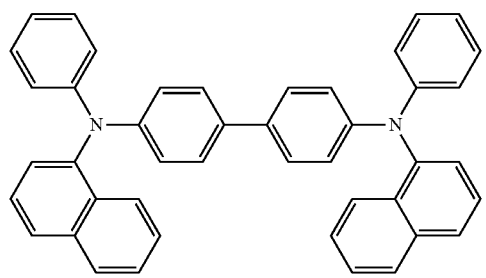
H39
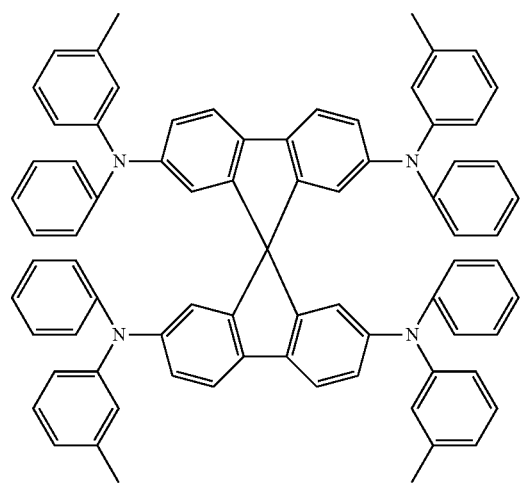
[Chem. 48]
H40
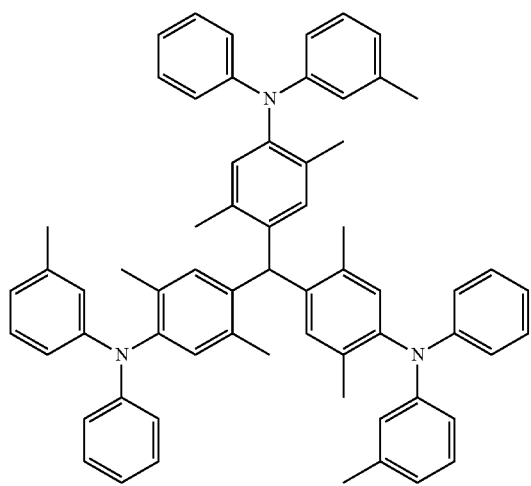
H41
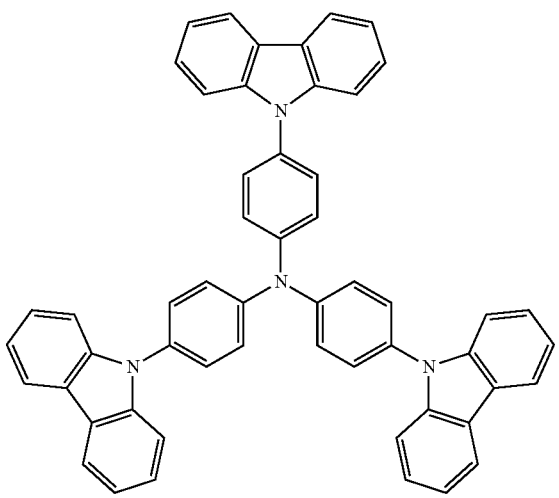

-continued
H42 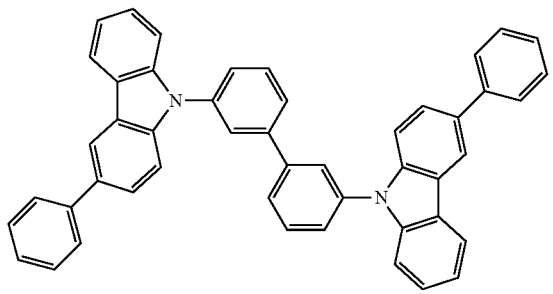 H43 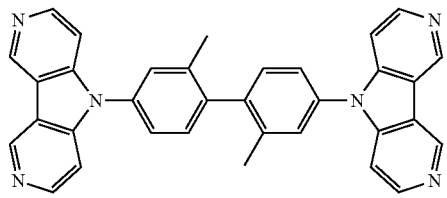
H44 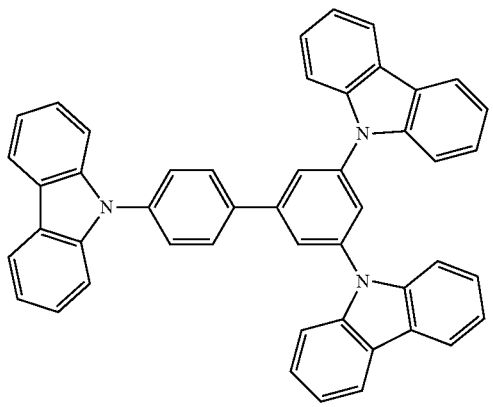 H45 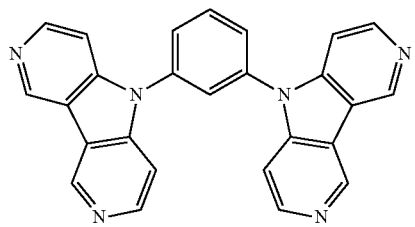
H46 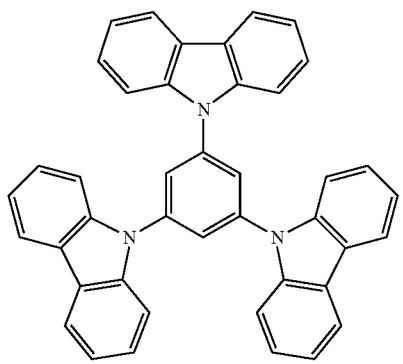 H47 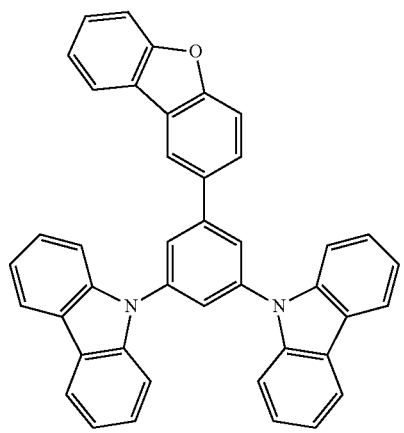
[Chem. 49]
H48 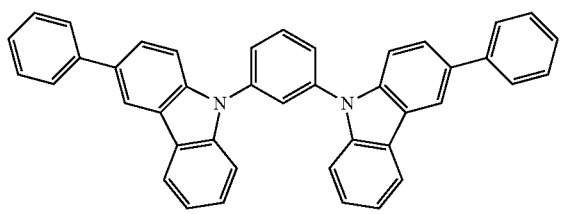 H49 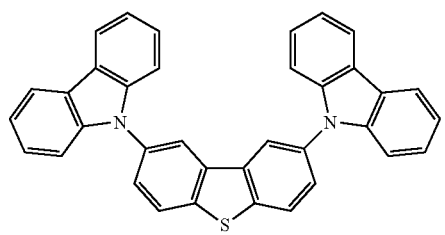

-continued
H50
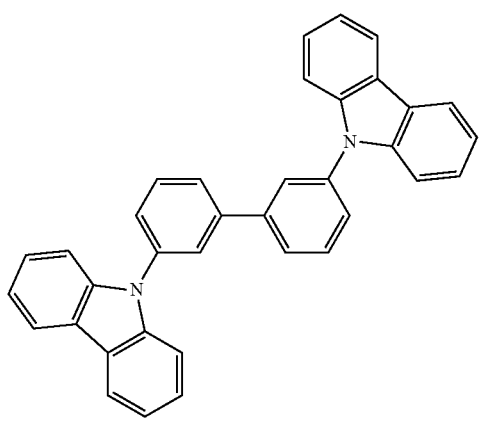
H51
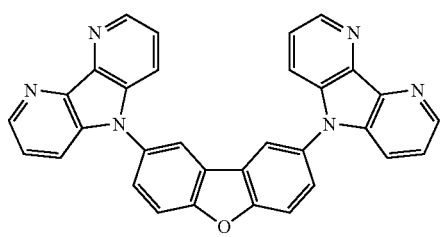
H52
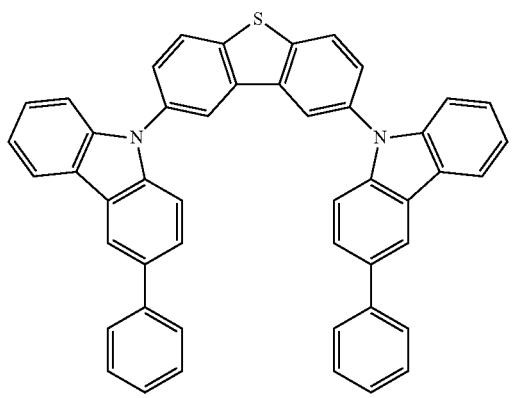
H53
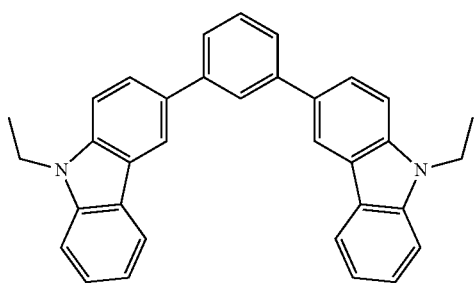
H54
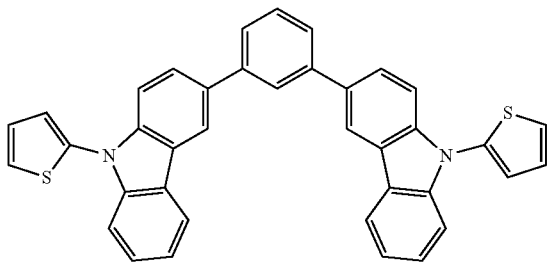
H55
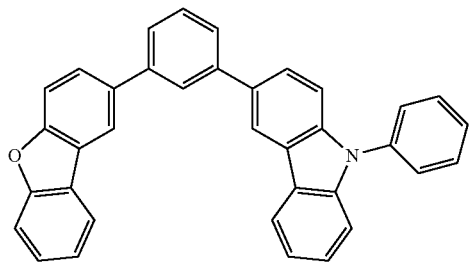
[Chem. 50]
H56
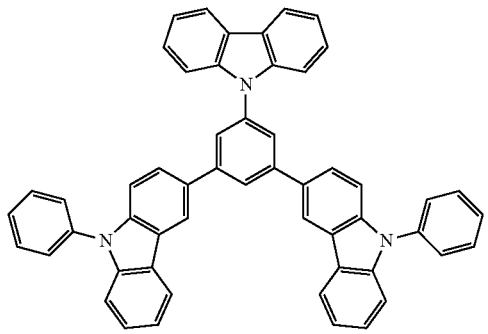
H57
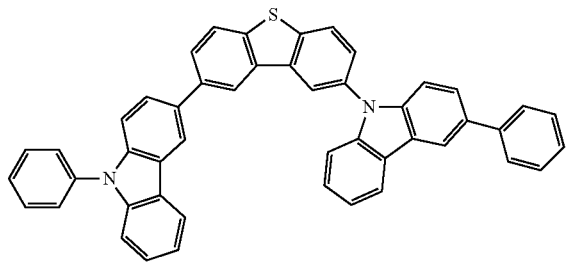

-continued
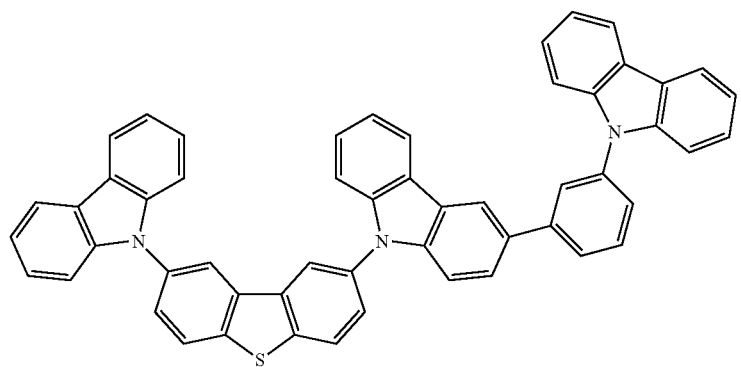
H58
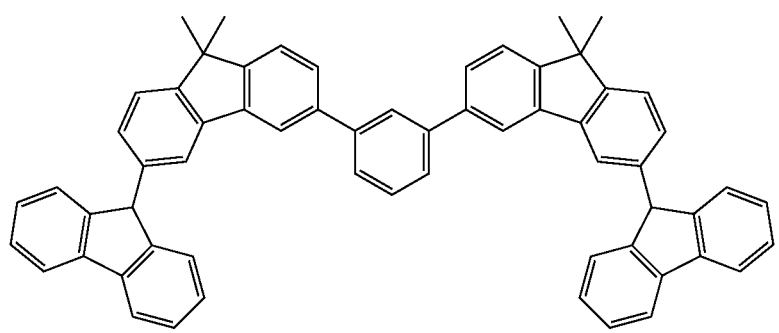
H59
[Chem. 51]
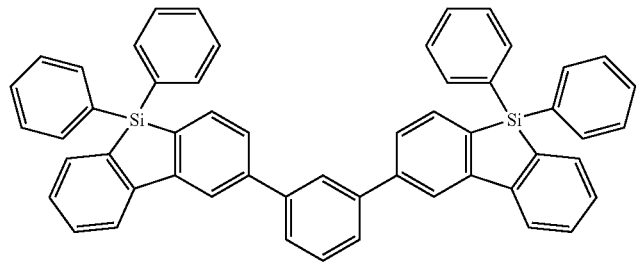
H60
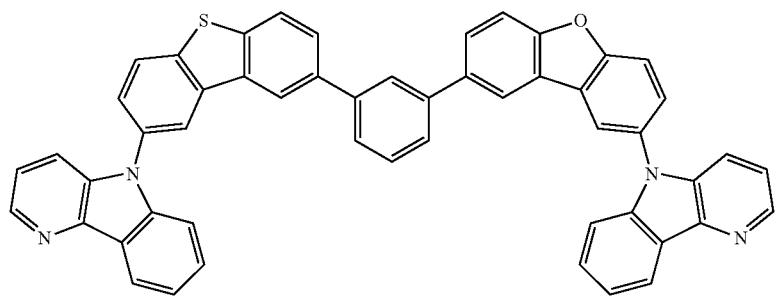
H61
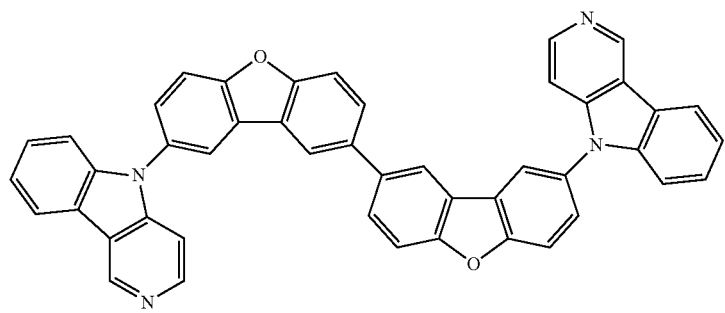
H62

-continued
H63
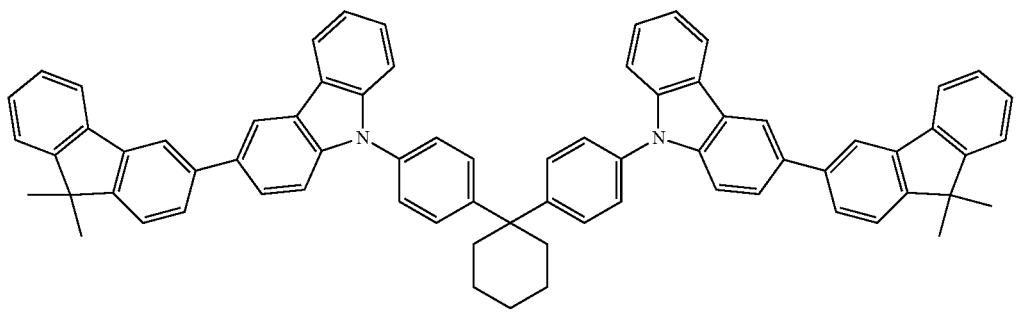
H64
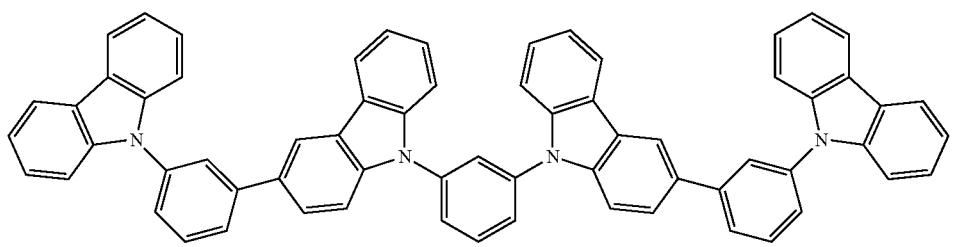
[Chem. 52]
H65
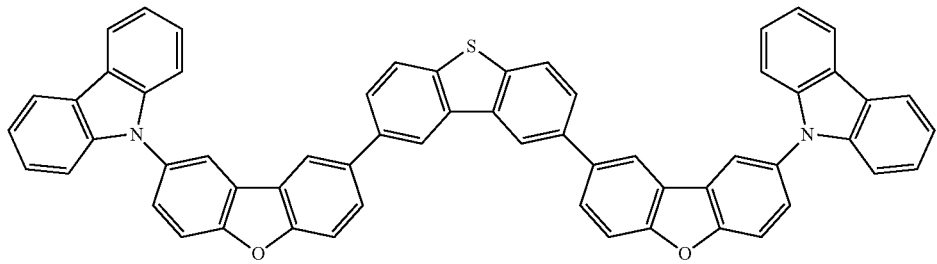
H66
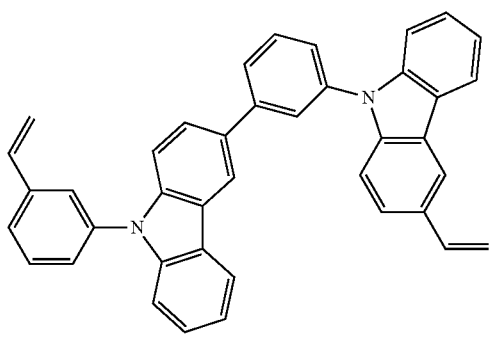
H67
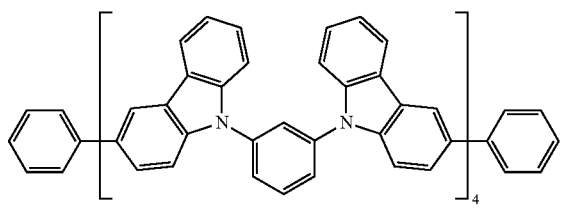

[Chem. 53]
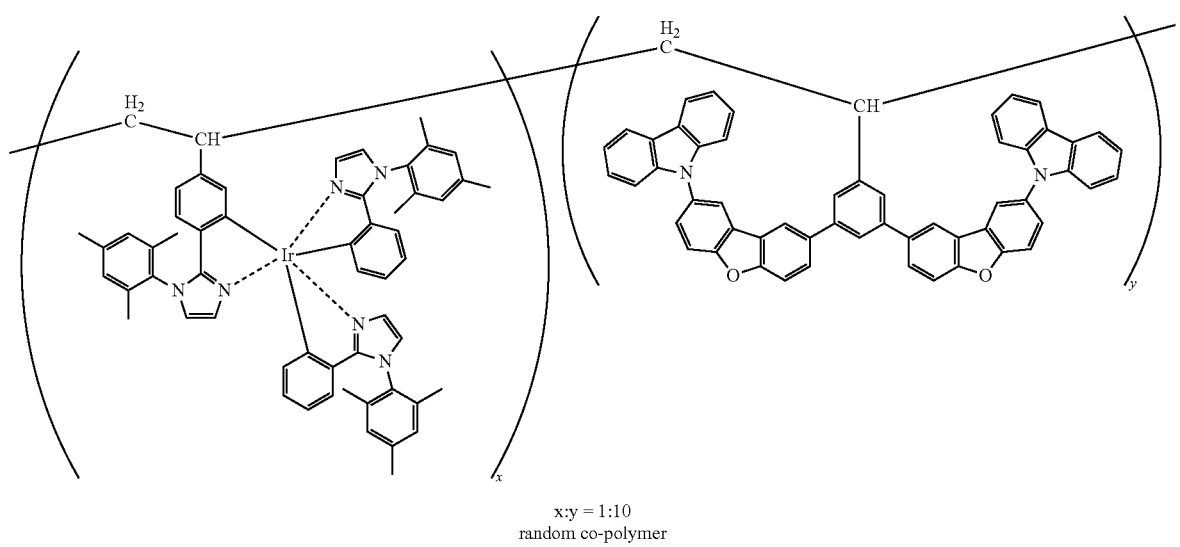
H68
x:y = 1:10
random co-polymer
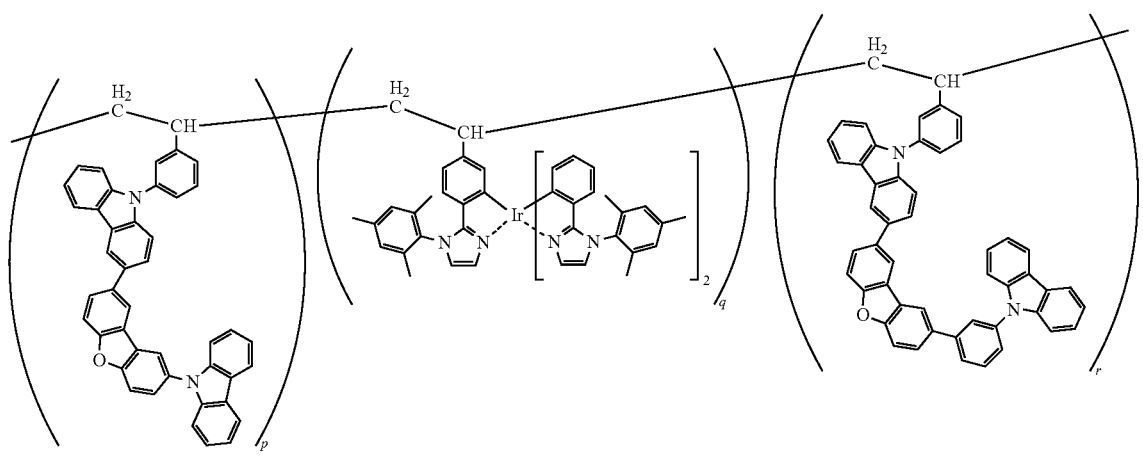
H69
[Chem. 55]
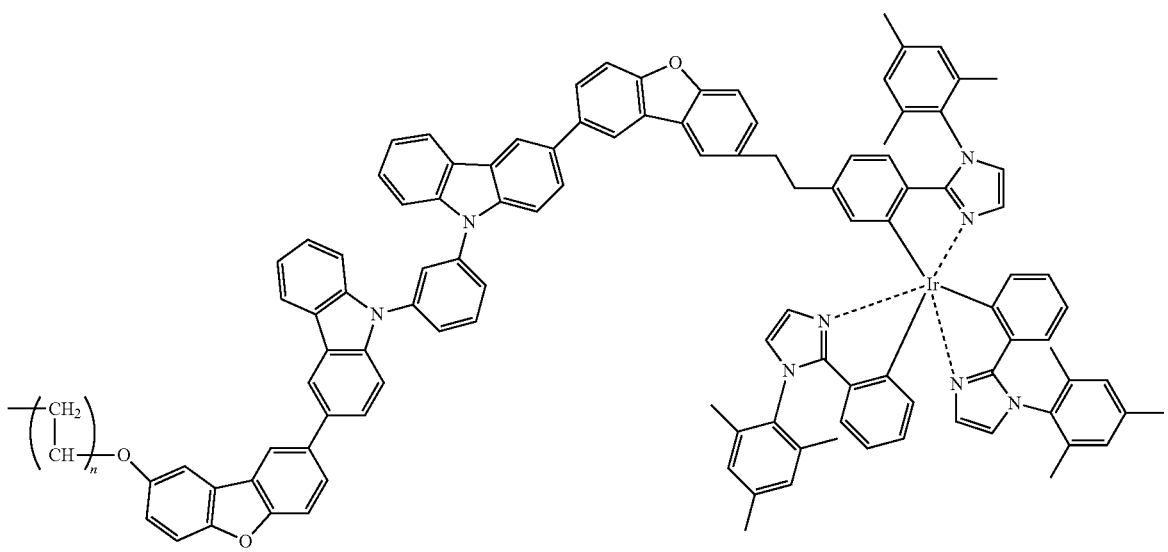
H70

H71
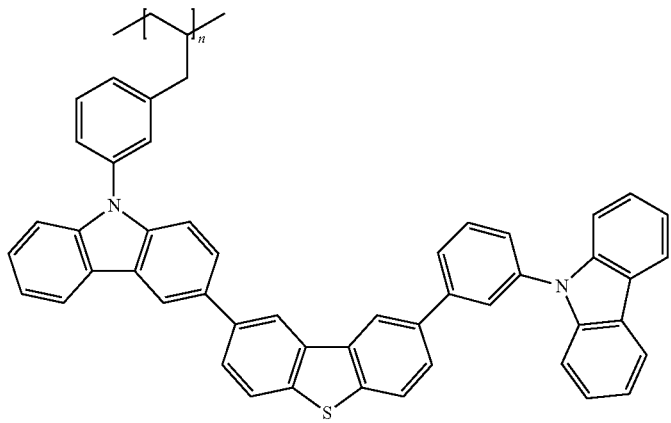
H72
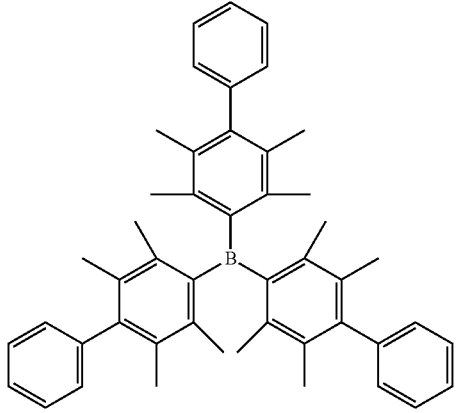
H73
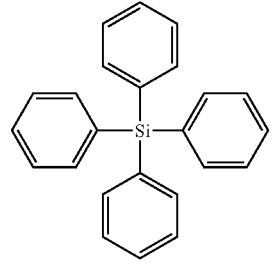
H74
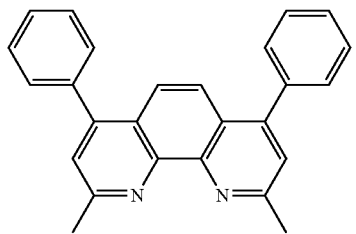
H75
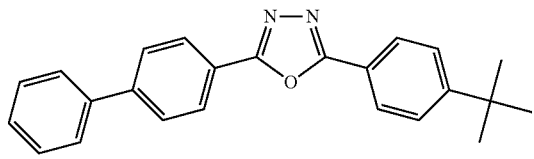
H76
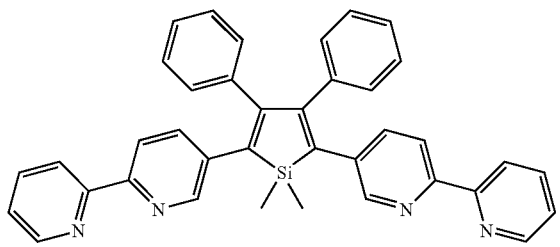
H77
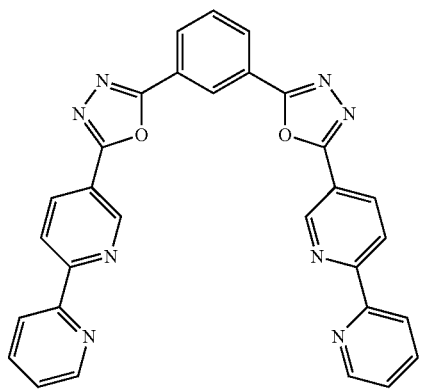

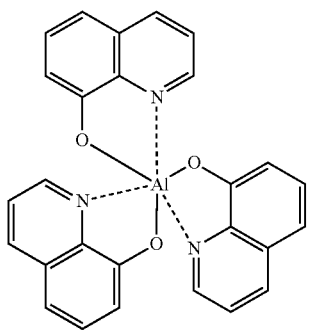

H78

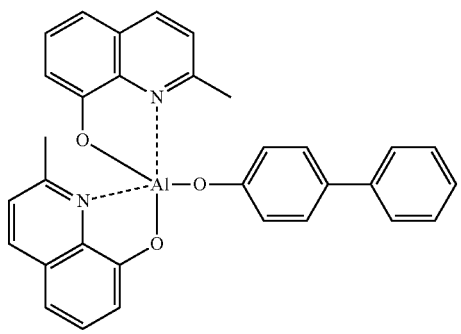

H79

Specific examples of the well-known host compound are compounds described in the following documents; for example, Japanese Patent Application Laid-Open Publication Nos.

2001-257076, 2002-308855, 2001-313179, 2002-319491, 2001-357977, 2002-334786, 2002-8860, 2002-334787, 2002-15871, 2002-334788, 2002-43056, 2002-334789, 2002-75645, 2002-338579, 2002-105445, 2002-343568, 2002-141173, 2002-352957, 2002-203683, 2002-363227, 2002-231453, 2003-3165, 2002-234888, 2003-27048, 2002-255934, 2002-260861, 2002-280183, 2002-299060, 2002-302516, 2002-305083, 2002-305084 and 2002-308837.

(Light-Emitting Material)

Te light-emitting material that can be used in the organic electroluminescent element of the present embodiment includes a phosphorescence-emitting compound (also referred to as a phosphorescent compound or a phosphorescence-emitting material).

The phosphorescence-emitting compound is defined as a compound in which light emission from an excited triplet state is observed, and, specifically, a compound which emits phosphorescence at room temperature (25° C.) and a phosphorescence quantum yield at 25° C. is 0.01 or more, and preferable phosphorescence quantum yield is 0.1 or more.

The phosphorescence quantum yield can be measured by a method described on page 398 of Bunko II of Dai 4 Han Jikken Kagaku Koza 7 (Spectroscopy II of Lecture of Experimental Chemistry vol. 7,4th edition) (1992, published by Maruzen Co., Ltd.). The phosphorescence quantum yield in a solution can be measured by using various solvents, and when the phosphorescence-emitting compound used in the example, it is sufficient that the above-described phosphorescence quantum yield (0.01 or more) is achieved in any of arbitrary solvents.

There are two kinds of principles regarding light emission of the phosphorescence-emitting compound. One is an energy transfer type, wherein carriers recombine on a host compound which transfers the carriers so as to produce an excited state of the host compound, this energy is transferred to a phosphorescence-emitting compound, and then light emission from the phosphorescence-emitting compound is carried out. The other is a carrier trap-type, in which a phosphorescence-emitting compound serves as a carrier trap, carriers recombine on the phosphorescence-emitting compound, and then light emission from the phosphorescence-emitting compound is carried out. In either case, the excited state energy of the phosphorescence-emitting compound is required to be lower than that of the host compound.

The phosphorescence-emitting compound can be suitably selected and used from the well-known phosphorescence-emitting compounds used for light-emitting layers of organic electroluminescent elements, preferably a complex-based compound containing metal of the groups 8 to 10 in the element periodic table, and more preferably an iridium compound, an osmium compound, a platinum compound (a platinum complex-based compound) or a rare earth complex, and most preferably an iridium compound.

In the organic electroluminescent element of the present embodiment, at least one light-emitting layer 45c may contain two or more kinds of light-emitting compounds, and a ratio of concentration of the phosphorescence-emitting compound in the light-emitting layer 45c may vary in the direction of thickness of the light-emitting layer 45c.

An amount of the phosphorescence-emitting compound is preferably 0.1% by volume or more and 30% by volume or less to the total volume of the light-emitting layer 45c.

(Compound Represented by the General Formula (7))

The compound contained in the light-emitting layer 45c (phosphorescence-emitting compound) is preferably a compound represented by the following general formula (7).

In a preferable aspect, the phosphorescence-emitting compound (also referred to as a phosphorescence-emitting metal complex) represented by the general formula (7) is contained in the light-emitting layer 45c of the organic electroluminescent element 50 of the present invention as a light-emitting dopant, and may be contained in a light-emitting functional layer in the layer other than the light-emitting layer 45c.

[Chem. 57]

General formula (7)

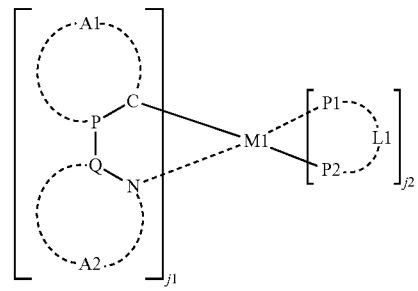

In the general formula (7), P and Q each represent a carbon atom or a nitrogen atom, A1 represents an atom group which forms an aromatic hydrocarbon ring or an aromatic heterocyclic ring with P—C. A2 represents an atom group which forms an aromatic heterocyclic ring with Q-N. P1-L1-P2 represents a bidentate ligand, P1 and P2 each independently represent carbon atom, nitrogen atom or oxygen atom. L1 represents an atom group which forms a bidentate ligand with P1 and P2. j1 represents an integer of 1 to 3, j2 represents an integer of 0 to 2, but the sum of j1 and j2 is 2 or 3. M1 represents a transition metal element of the groups 8 to 10 in the element periodic table.

In addition, examples of the aromatic hydrocarbon ring which is formed by A1 with P—C in the general formula (7) include benzene ring, biphenyl ring, naphthalene ring, azulene ring, anthracene ring, phenanthrene ring, pyrene ring, chrysene ring, naphthacene ring, triphenylene ring, o-terphenyl ring, m-terphenyl ring, p-terphenyl ring, acenaphthene ring, coronene ring, fluorene ring, fluoranthrene ring, naphthacene ring, pentacene ring, perylene ring, pentaphene ring, picene ring, pyrene ring, pyranthrene ring, anthranthrene ring, and the like.

These rings may have a substituent which is exemplified as R11, R12 in general formula (1).

Examples of the aromatic heterocyclic ring which is formed by A1 with P—C in the general formula (7) include furan ring, thiophene ring, oxazole ring, pyrrole ring, pyridine ring, pyridazine ring, pyrimidine ring, pyrazine ring, triazine ring, benzimidazole ring, oxadiazole ring, triazole ring, imidazole ring, pyrazole ring, triazole ring, indole ring, benzimidazole ring, benzothiazole ring, benzoxazole ring, quinoxaline ring, quinazoline ring, phthalazine ring, carbazole ring, azacarbazole ring, and the like.

Here, the azacarbazole ring indicates a ring formed in a state where one or more carbon atoms of benzene ring constituting the carbazole ring described above is substituted by nitrogen atom.

These rings may further have a substituent which is exemplified as R11, R12 in general formula (1).

Examples of the aromatic heterocyclic ring which is formed by A2 with Q-N in the general formula (7) include oxazole ring, oxadiazole ring, oxatriazole ring, isoxazole ring, tetrazole ring, thiadiazole ring, thiatriazole ring, isothiazole ring, pyrrole ring, pyridine ring, pyridazine ring, pyrimidine ring, pyrazine ring, triazine ring, imidazole ring, pyrazole ring, triazole ring, and the like.

These rings may have a substituent which is exemplified as R11, R12 in general formula (1).

Examples of the bidentate ligand represented by P1-L1-P2 include phenylpyridine, phenylpyrazole, phenylimidazole, phenyltriazole, phenyltetrazole, pyrazabole, acetylacetone, picolinic acid, and the like.

In the general formula (7), j1 represents an integer of 1 to 3, and j2 represents an integer of 0 to 2, but the sum of j1 and j2 is 2 or 3. Among them, j2 is preferably 0.

In the general formula (7), M1 represents a transition metal element (simply referred to as a transition metal) of the groups 8 to 10 in the element periodic table. Among them, M1 is preferably iridium.

(Compound Represented by the General Formula (8))

Among the compounds represented by the general formula (7), the compound represented by the general formula (8) is preferable.

[Chem. 58]

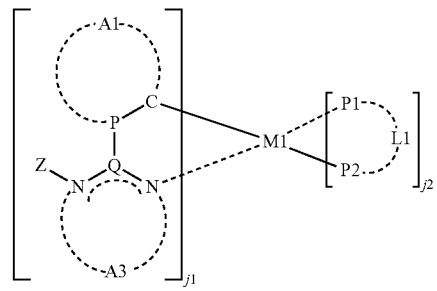

General formula (8)

In the above general formula (8), Z represents a hydrocarbon ring group or a heterocyclic ring group. P and Q each represent carbon atom or nitrogen atom, A1 represents an atom group which forms an aromatic hydrocarbon ring or an aromatic heterocyclic ring with P—C. A3 represents —C(R01)=C(R02)-, —N=C(R02)-, —C(R01)=N— or —N=N—, and R01 and R02 each represent hydrogen atom or a substituent. P1-L1-P2 represents a bidentate ligand, P1 and P2 each independently represent carbon atom, nitrogen atom or oxygen atom. L1 represents an atom group which forms the bidentate ligand with P1 and P2. j1 represents an integer of 1 to 3, j2 represents an integer of 0 to 2, but the sum of j1 and j2 is 2 or 3. M1 represents a transition metal element of the groups 8 to 10 in the element periodic table.

Examples of the hydrocarbon ring group represented by Z in the general formula (8) include a non-aromatic hydrocarbon ring group and an aromatic hydrocarbon ring group. Examples of the non-aromatic hydrocarbon ring group include cyclopropyl group, cyclopentyl group, cyclohexyl group, and the like. These groups may be a non-substituted group, or may have a substituent which is exemplified as R11, R12 in general formula (1). Preferably, the group represented by Z is an aromatic hydrocarbon ring group or an aromatic heterocyclic group.

Examples of the aromatic hydrocarbon ring group (also referred to as an aromatic hydrocarbon group, an aryl group or the like) include phenyl group, p-chlorophenyl group, mesityl group, tolyl group, xylyl group, naphthyl group, anthryl group, azulenyl group, acenaphthenyl group, fluorenyl group, phenanthryl group, indenyl group, pyrenyl group, biphenyl group, and the like.

These groups may be a non-substituted group, or may have a substituent which is exemplified as R11, R12 in general formula (1).

Examples of the heterocyclic ring group represented by Z in the general formula (8) include a non-aromatic heterocyclic ring group and an aromatic heterocyclic ring group. Examples of the non-aromatic heterocyclic ring group include a group derived from epoxy ring, aziridine ring, thiirane ring, oxetane ring, azetidine ring, thietane ring, tetrahydrofuran ring, dioxorane ring, pyrrolidine ring, pyrazolidine ring, imidazolidine ring, oxazolidine ring, tetrahydrothiophene ring, sulforane ring, thiazolidine ring, ∈-caprolactone ring, ∈-caprolactam ring, piperidine ring, hexahydropyridazine ring, hexahydropyrimidine ring, piperazine ring, morpholine ring, tetrahydropyrane ring, 1,3-dioxane ring, 1,4-dioxane ring, trioxane ring, tetrahydrothiopyrane ring, thiomorpholine ring, thiomorpholine-1,1-dioxide ring, pyranose ring, diazabicyclo[2,2,2]-octane ring, and the like.

These groups may be a non-substituted group, or may have a substituent which is exemplified as R11, R12 in general formula (1).

Examples of the aromatic heterocyclic ring group include pyridyl group, pyrimidinyl group, furyl group, pyrrolyl group, imidazolyl group, benzimidazolyl group, pyrrazolyl group, pyradinyl group, triazolyl group (for example, 1,2,4-triazole-1-yl group or 1,2,3-triazole-1-yl group and the like), oxazolyl group, benzoxazolyl group, triazolyl group, isooxazolyl group, isothiazolyl group, furazanyl group, thienyl group, quinolyl group, benzofuryl group, dibenzofuryl group, benzothienyl group, dibenzothienyl group, indolyl group, carbazolyl group, carbolinyl group, diazacarbazolyl group (indicating a ring formed in a state where one of carbon atoms constituting carboline ring of carbolinyl group is substituted by nitrogen atom), quinoxalinyl group, pyridazinyl group, triazinyl group, quinazolinyl group, phthalazinyl group, and the like.

These groups may be a non-substituted group, or may have a substituent which is exemplified as R11, R12 in general formula (1).

Examples of the aromatic hydrocarbon ring which is formed by A1 with P—C in the general formula (8) include benzene ring, biphenyl ring, naphthalene ring, azulene ring, anthracene ring, phenanthrene ring, pyrene ring, chrysene ring, naphthacene ring, triphenylene ring, o-terphenyl ring, m-terphenyl ring, p-terphenyl ring, acenaphthene ring, coronene ring, fluorene ring, fluoranthrene ring, naphthacene ring, pentacene ring, perylene ring, pentaphene ring, picene ring, pyrene ring, pyranthrene ring, anthranthrene ring, and the like.

Furthermore, these rings may have a substituent which is exemplified as R11, R12 in general formula (1).

Examples of the aromatic heterocyclic ring which is formed by A1 with P—C in the general formula (8) include furan ring, thiophene ring, oxazole ring, pyrrole ring, pyridine ring, pyridazine ring, pyrimidine ring, pyrazine ring, triazine ring, benzimidazole ring, oxadiazole ring, triazole ring, imidazole ring, pyrazole ring, triazole ring, indole ring, benzimidazole ring, benzothiazole ring, benzoxazole ring, quinoxaline ring, quinazoline ring, phthalazine ring, carbazole ring, carboline ring, azacarbazole ring, and the like.

Here, the azacarbazole ring indicates a ring formed in a state where one or more carbon atoms of benzene ring constituting the carbazole ring described above is substituted by nitrogen atom.

Furthermore, these rings may have a substituent which is exemplified as R11, R12 in general formula (1).

A substituent each represented by R01 and R02 in —C(R01)=C(R02)-, —N=C(R02)- and —C(R01)=N— which are represented by A3 in the general formula (8) has the same meaning as the substituent which is exemplified as R11, R12 in general formula (1).

In the general formula (8), examples of the bidentate ligand represented by P1-L1-P2 include phenylpyridine, phenylpyrazole, phenylimidazole, phenyltriazole, phenyltetrazole, pyrazabole, acetylacetone, picolinic acid, and the like.

j1 represents an integer of 1 to 3, and j2 represents an integer of 0 to 2, but the sum of j1 and j2 is 2 or 3. Particularly, j2 is preferably 0.

In the general formula (8), the transition metal element (simply referred to as a transition metal) of the groups 8 to 10 in the element periodic table represented by M1 has the same meaning as the transition metal element of the groups 8 to 10 in the element periodic table represented by M1 in the general formula (7).

(Compound Represented by the General Formula (9))

The following compound represented by the general formula (9) is shown as one of preferable aspects represented by the general formula (8).

[Chem. 59]

General formula (9)

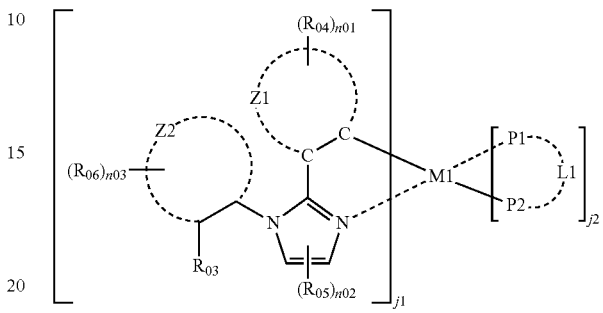

In the above general formula (9), $R_{03}$ represents a substituent, $R_{04}$ represents hydrogen atom or a substituent, a plurality of $R_{04}$s may bond to each other to form a ring. n01 represents an integer of 1 to 4. $R_{05}$ represents hydrogen atom or a substituent, a plurality of $R_{05}$s may bond to each other to form a ring. n02 represents an integer of 1 to 2. R06 represents hydrogen atom or a substituent, and may bond to each other to form a ring. n03 represents an integer of 1 to 4. Z1 represents an atom group which is necessary to form a six-membered aromatic hydrocarbon ring together with C—C, or a five- or six-membered aromatic heterocyclic ring. Z2 represents a hydrocarbon ring group or a heterocyclic ring group. P1-L1-P2 represents a bidentate ligand, P1 and P2 each independently represent carbon atom, nitrogen atom or oxygen atom. L1 represents an atom group which forms the bidentate ligand with P1 and P2. j1 represents an integer of 1 to 3, j2 represents an integer of 0 to 2, but the sum of j1 and j2 is 2 or 3. M1 represents a transition metal element of the groups 8 to 10 in the element periodic table. $R_{03}$ and $R_{06}$, $R_{04}$ and $R_{06}$, and $R_{05}$ and $R_{06}$ may bond to each other to form a ring.

The substituent each represented by $R_{03}$, $R_{04}$, $R_{05}$, $R_{06}$ in the general formula (9) may have a substituent which is exemplified as R11, R12 in general formula (1).

In the general formula (9), examples of the six-membered aromatic hydrocarbon ring which is formed by Z1 with C—C include benzene ring, and the like.

These rings may have a substituent which is exemplified as R11, R12 in general formula (1).

Examples of the five-membered or six-membered aromatic heterocyclic ring which is formed by Z1 together with C—C in the general formula (9) include oxazole ring, oxadiazole ring, oxatriazole ring, isoxazole ring, tetrazole ring, thiadiazole ring, thiatriazole ring, isothiazole ring, thiophene ring, furan ring, pyrrole ring, pyridine ring, pyridazine ring, pyrimidine ring, pyrazine ring, triazine ring, imidazole ring, pyrazole ring, triazole ring, and the like.

These rings may have a substituent which is exemplified as R11, R12 in general formula (1).

Examples of the hydrocarbon ring group represented by Z2 in the general formula (9) include a non-aromatic hydrocarbon ring group and an aromatic hydrocarbon ring group. Examples of the non-aromatic hydrocarbon ring group include cyclopropyl group, cyclopentyl group, cyclohexyl group, and the like. These groups may be a non-substituted group, or may have a substituent which is exemplified as R11, R12 in general formula Examples of the aromatic hydrocarbon ring group (also referred to as an aromatic hydrocarbon group, an aryl group or the like) include phenyl group, p-chlorophenyl group, mesityl group, tolyl group, xylyl group, naphthyl group, anthryl group, azulenyl group, acenaphthenyl group, fluorenyl group, phenanthryl group, indenyl group, pyrenyl group, biphenyl group, and the like. These groups may be a non-substituted group, or may have a substituent which is exemplified as R11, R12 in general formula (1).

Examples of the heterocyclic ring group represented by Z2 in the general formula (9) include a non-aromatic heterocyclic ring group and an aromatic heterocyclic ring group. Examples of the non-aromatic heterocyclic ring group include a group derived from epoxy ring, aziridine ring, thiirane ring, oxetane ring, azetidine ring, thietane ring, tetrahydrofuran ring, dioxorane ring, pyrrolidine ring, pyrazolidine ring, imidazolidine ring, oxazolidine ring, tetrahydrothiophene ring, sulforane ring, thiazolidine ring, ε-caprolactone ring, ε-caprolactam ring, piperidine ring, hexahydropyridazine ring, hexahydropyrimidine ring, piperazine ring, morpholine ring, tetrahydropyrane ring, 1,3-dioxane ring, 1,4-dioxane ring, trioxane ring, tetrahydrothiopyrane ring, thiomorpholine ring, thiomorpholine-1,1-dioxide ring, pyranose ring, diazabicyclo[2,2,2]-octane ring, and the like. These groups may be a non-substituted group, or may have a substituent which is exemplified as R11, R12 in general formula (1).

Examples of the aromatic heterocyclic ring group include pyridyl group, pyrimidinyl group, furyl group, pyrrolyl group, imidazolyl group, benzimidazolyl group, pyrrazolyl group, pyradinyl group, triazolyl group (for example, 1,2,4-triazole-1-yl group or 1,2,3-triazole-1-yl group and the like), oxazolyl group, benzoxazolyl group, triazolyl group, isooxazolyl group, isothiazolyl group, furazanyl group, thienyl group, quinolyl group, benzofuryl group, dibenzofuryl group, benzothienyl group, dibenzothienyl group, indolyl group, carbazolyl group, carbolinyl group, diazacarbazolyl group (indicating a ring formed in a state where one of carbon atoms constituting carboline ring of carbolinyl group is substituted by nitrogen atom), quinoxalinyl group, pyridazinyl group, triazinyl group, quinazolinyl group, phthalazinyl group, and the like.

These groups may be a non-substituted group, or may have a substituent which is further exemplified as R11, R12 in general formula (1).

In the general formula (9), a group formed by Z1 and Z2 is preferably benzene ring.

In the general formula (9), the bidentate ligand represented by P1-L1-P2 has the same meaning as the bidentate ligand represented by P1-L1-P2 in the general formula (7).

In the general formula (9), the transition metal element of the groups 8 to 10 in the element periodic table represented by M1 has the same meaning as the transition metal element of the groups 8 to 10 in the element periodic table represented by M1 in the general formula (7).

The phosphorescence-emitting compound can be suitably selected and used from the well-known phosphorescence-emitting compounds used for light-emitting layers 45c of organic electroluminescent elements 50.

The phosphorescence-emitting compound to be applied to the organic electroluminescent element of the present embodiment is preferably a complex-based compound containing metal of the groups 8 to 10 in the element periodic table, and more preferably an iridium compound, an osmium compound, a platinum compound (a platinum complex-based compound) or a rare earth complex, and most preferably an iridium compound.

Hereinafter, the specific examples of the phosphorescence-emitting compound (Pt-1 to Pt-3, A-1, and Ir-1 to Ir-50) will be indicated. Note that the phosphorescence-emitting compound to be applied to the organic electroluminescent element of the present embodiment is not limited thereto. In the compounds, m and n represent the number of repeating unit.

[Chem. 60]

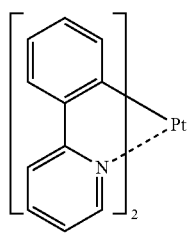

Pt-1

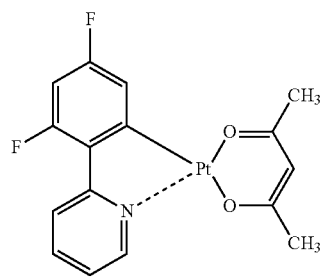

Pt-2

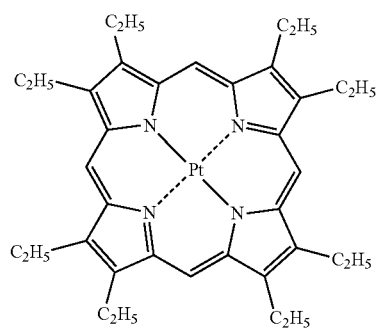

Pt-3

-continued
A-1
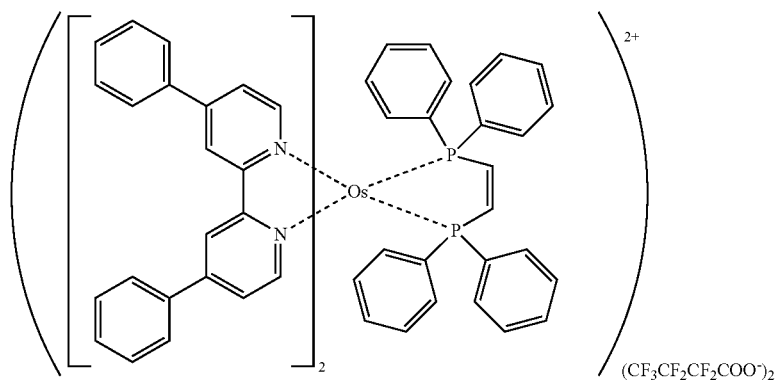
[Chem. 61]
Ir-1
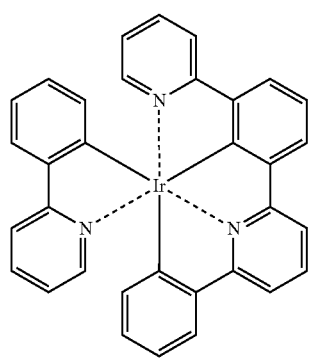
Ir-2
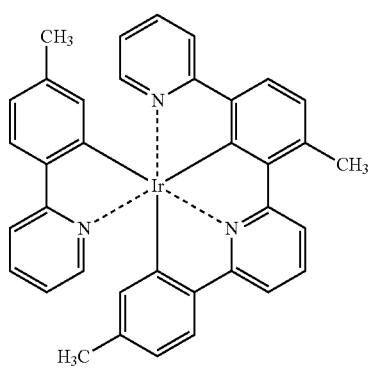
Ir-3
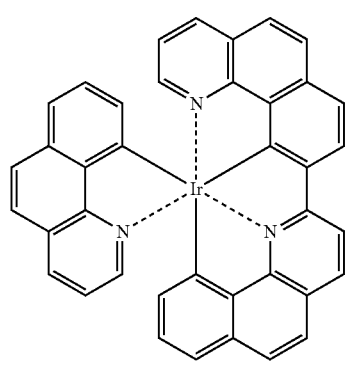
Ir-4
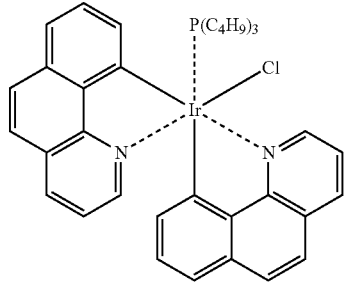
Ir-5
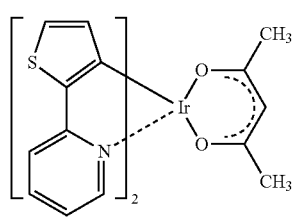
Ir-6
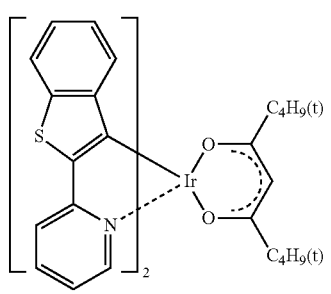

-continued
Ir-7
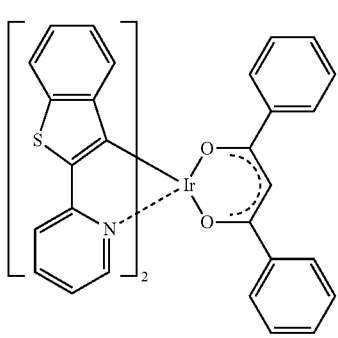
Ir-8
Ir-9
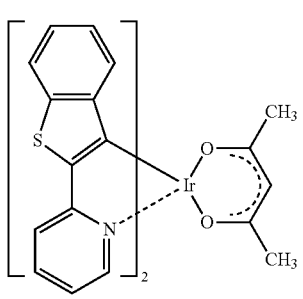
Ir-10
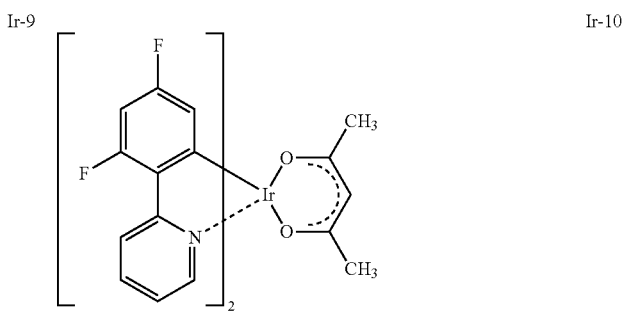
Ir-11
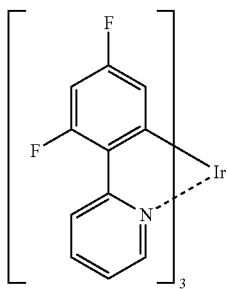
Ir-12
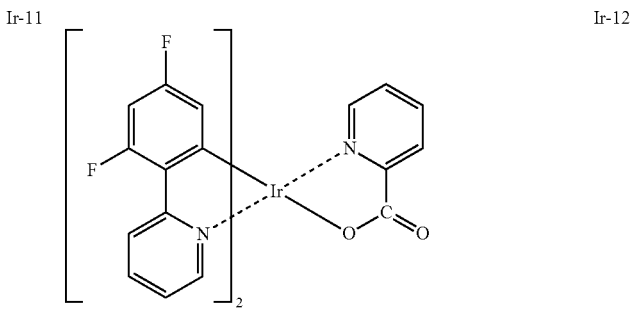
Ir-13
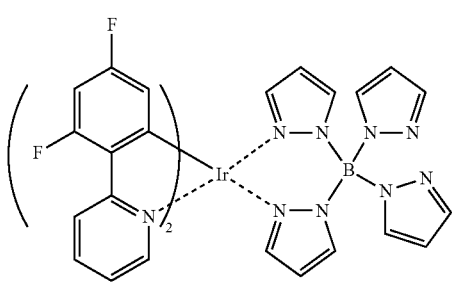
Ir-14
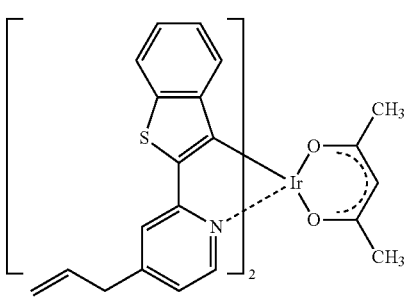
Ir-15
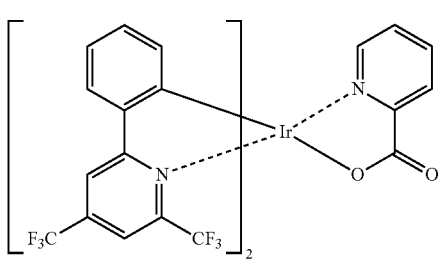
Ir-16
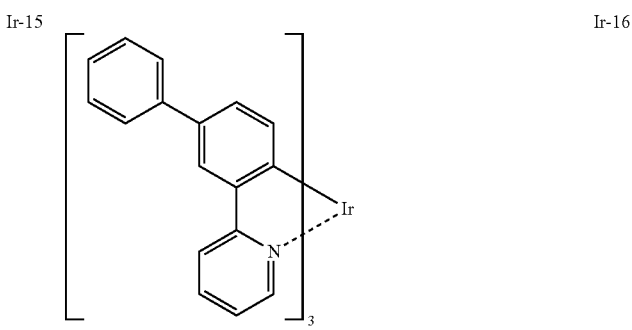

-continued
Ir-17
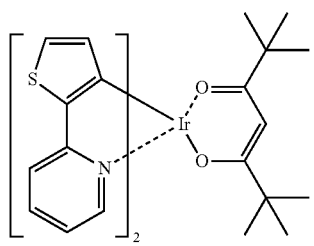
Ir-18
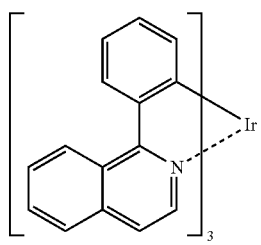
Ir-19
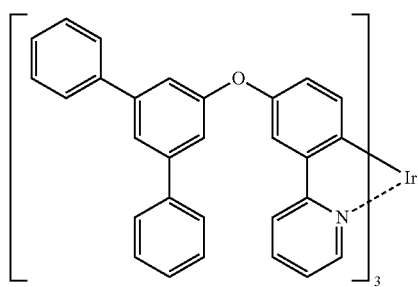
Ir-20
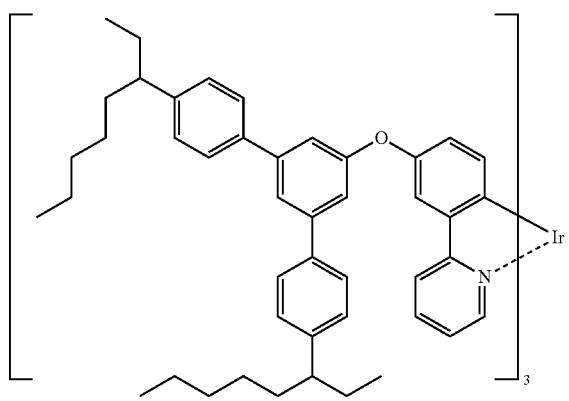
Ir-21
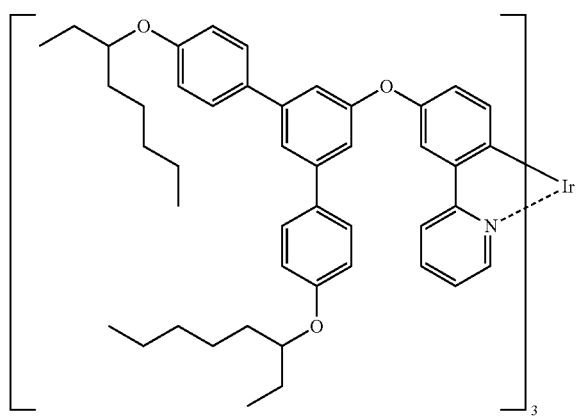
[Chem. 64]
Ir-22
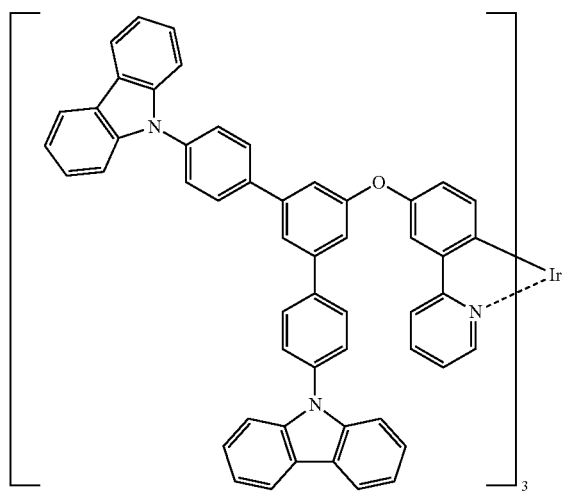
Ir-23
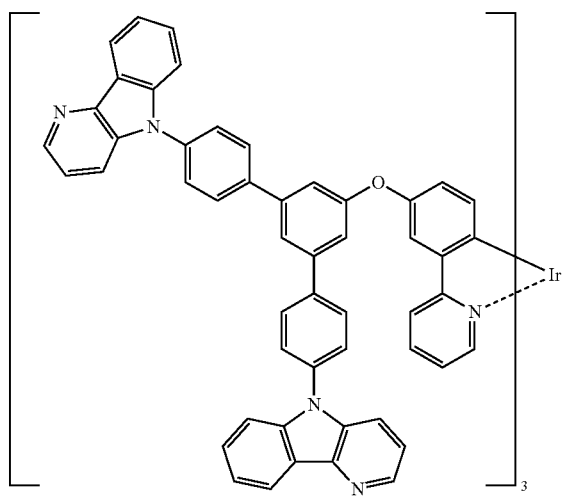

-continued
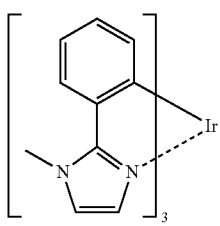
Ir-24
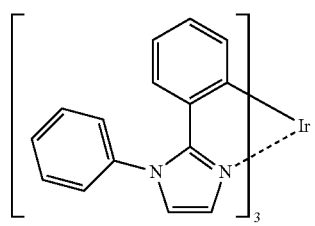
Ir-25
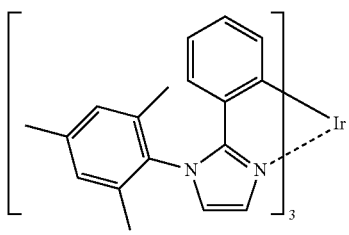
Ir-26
[Chem. 65]
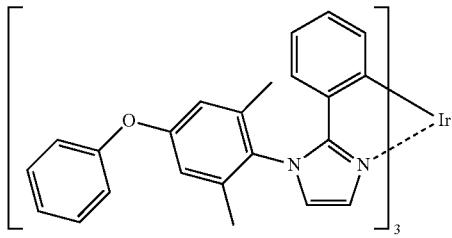
Ir-27
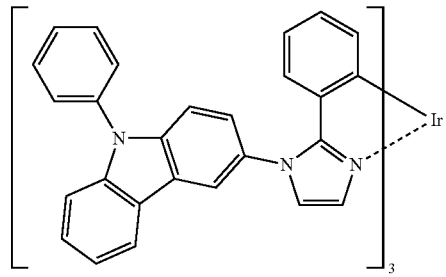
Ir-28
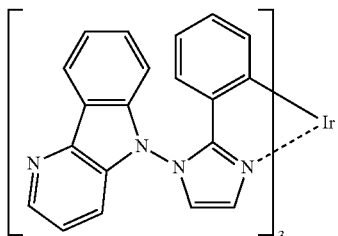
Ir-29
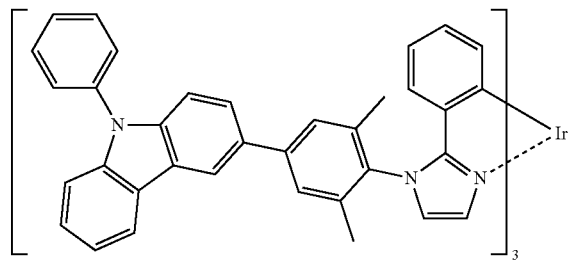
Ir-30
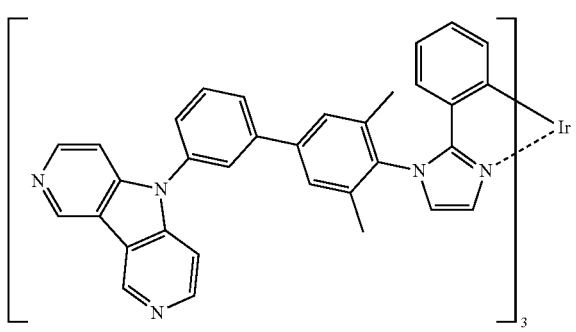
Ir-31

-continued
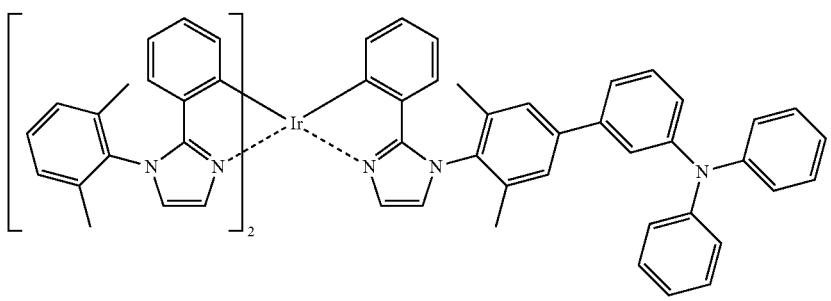
Ir-32
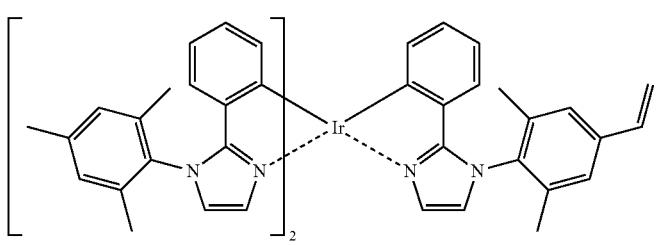
Ir-33
[Chem. 66]
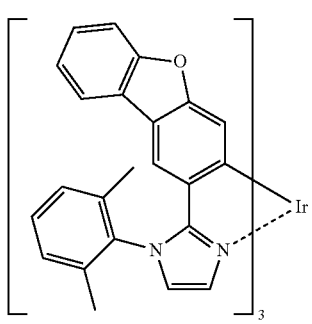
Ir-34
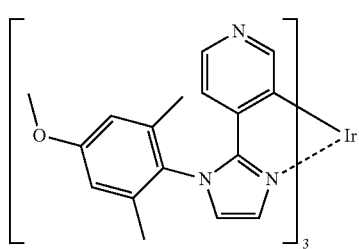
Ir-35
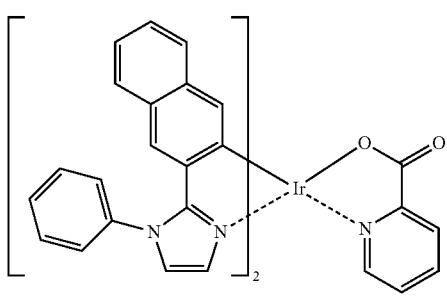
Ir-36
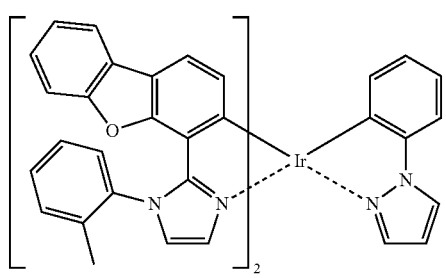
Ir-37
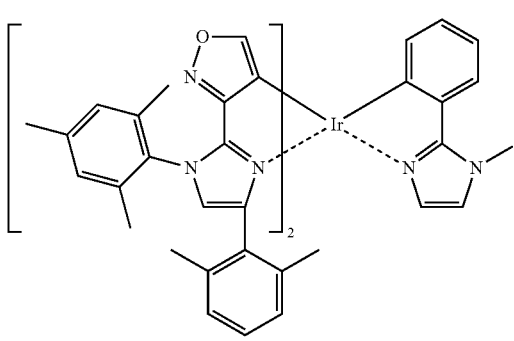
Ir-38
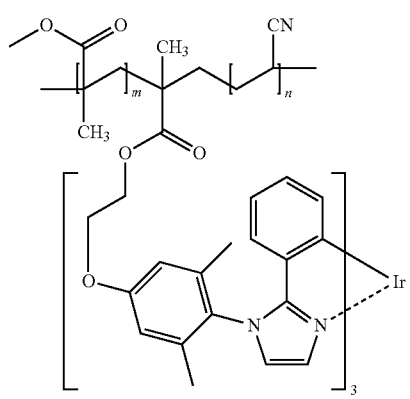
Ir-39

[Chem. 67]
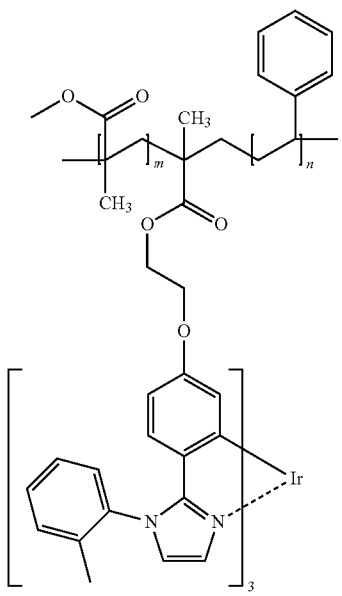
Ir-40
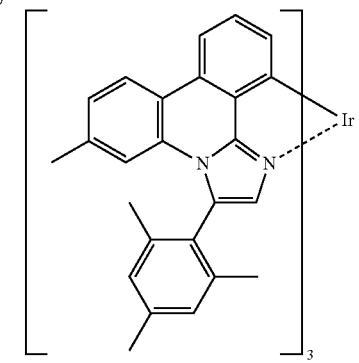
Ir-41
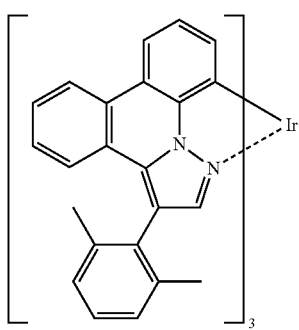
Ir-42
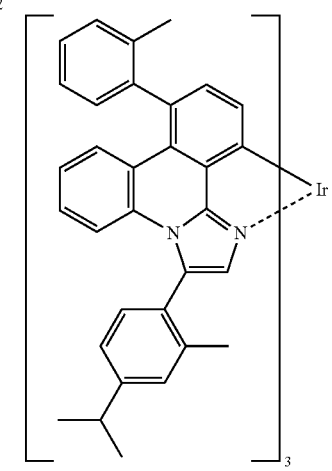
Ir-43
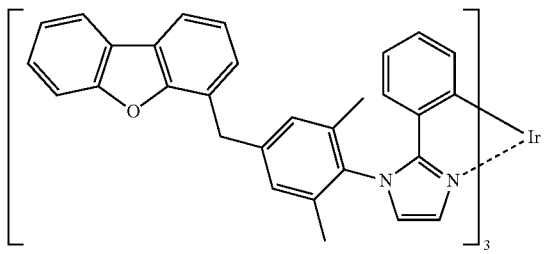
Ir-44
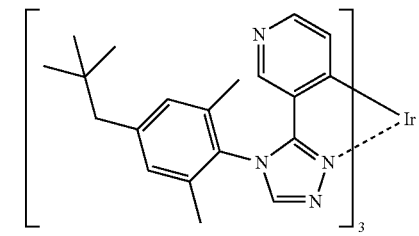
Ir-45
[Chem. 68]
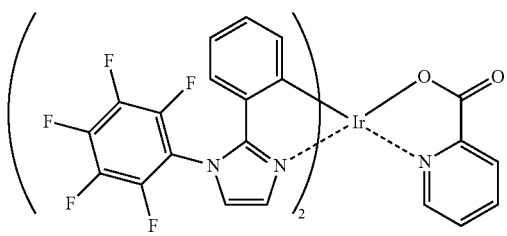
Ir-46
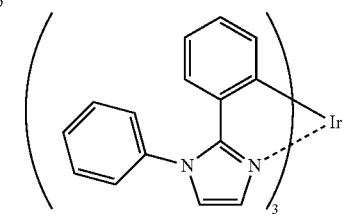
Ir-47

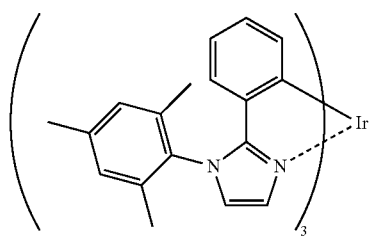

Ir-48

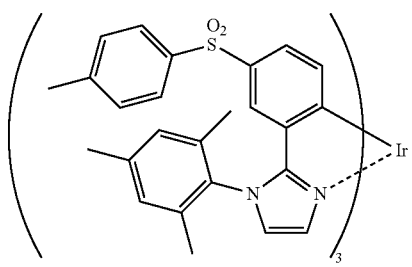

Ir-49

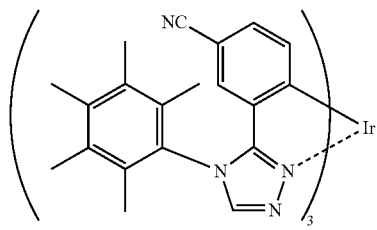

Ir-50

The above-described phosphorescence-emitting compounds (also referred to as phosphorescence-emitting metal complexes and the like) can be synthesized by employing methods described in documents such as Organic Letters, vol. 3, No. 16, pp. 2579-2581 (2001); Inorganic Chemistry, vol. 30, No. 8, pp. 1685-1687 (1991); J. Am. Chem. Soc., vol. 123, p. 4304 (2001); Inorganic Chemistry, vol. 40, No. 7, pp. 1704-1711 (2001); Inorganic Chemistry, vol. 41, No. 12, pp. 3055-3066 (2002); New Journal of Chemistry, vol. 26, p. 1171 (2002); and European Journal of Organic Chemistry, vol. 4, pp. 695-709 (2004); and reference documents described in these documents.

(Fluorescence-Emitting Material)

Examples of the fluorescence-emitting material include a coumarin-based coloring matter, a pyran-based coloring matter, a cyanine-based coloring matter, a croconium-based coloring matter, a squarylium-based coloring matter, an oxobenzanthracene-based coloring matter, a fluorescein-based coloring matter, a rhodamine-based coloring matter, a pyrylium-based coloring matter, a perylene-based coloring matter, a stilbene-based coloring matter, a polythiophene-based coloring matter, or a rare earth complex-based fluorescent material or the like.

[Injection Layer: Positive Hole Injection Layer, Electron Injection Layer]

The injection layer is a layer disposed between an electrode and the light-emitting layer 45c in order to decrease a driving voltage and to enhance luminance of light emitted, which is detailed in Part 2, Chapter 2 "Denkyoku Zairyo" (pp. 123-166) of "Yuki EL Soshi To Sono Kogyoka Saizensen (Nov. 30, 1998, published by N. T. S Co., Ltd.)", and examples thereof include a positive hole injection layer 45a and an electron injection layer 45e.

The injection layer can be provided as necessary. The positive hole injection layer 45a is disposed between an anode and the light-emitting layer 45c or the positive transport layer 45b, and the electron injection layer 45e is disposed between a cathode and the light-emitting layer 45c or the electron transport layer 45d.

The positive hole injection layer 45a is also detailed in documents such as Japanese Patent Application Laid-Open Publication Nos. 9-45479, 9-260062 and 8-288069, and examples include a phthalocyanine layer represented by copper phthalocyanine, an oxide layer represented by vanadium oxide, an amorphous carbon layer, a polymer layer employing a conductive polymer such as polyaniline (emeraldine) or polythiophene, and the like.

The electron injection layer 45e is also detailed in documents such as Japanese Patent Application Laid-Open Publication Nos. 6-325871, 9-17574 and 10-74586 and examples include: a metal layer represented by strontium or aluminum, an alkali metal halide layer represented by potassium fluoride, an alkali earth metal compound layer represented by magnesium fluoride, an oxide layer represented by molybdenum oxide, and the like. It is preferable that the electron injection layer 45e is a very thin film, and the thickness thereof is within a range of 1 nm to 10 μm although it depends on the material thereof.

[Positive Hole Transport Layer]

The positive hole transport layer 45b is formed of a positive hole transport material having a function of transporting positive holes, and a positive hole injection layer 45a and an electron blocking layer are also included in the positive hole transport layer 45b in the broad sense of the word. The positive hole transport layer 45b can be provided as a single layer or as a plurality of layers.

The positive hole transport material is a material having an injection capability or transport capability of positive holes, and barrier property against electrons and either an organic substance or an inorganic substance may be used. Examples include a triazole derivative, an oxadiazole derivative, an imidazole derivative, a polyarylalkane derivative, a pyrazoline derivative and a pyrazolone derivative, a phenylenediamine derivative, an arylamine derivative, an amino-substituted chalcone derivative, an oxazole derivative, a styrylanthracene derivative, a fluorenone derivative, a hydrazone derivative, a stilbene derivative, a silazane derivative, an aniline-based copolymer, and a conductive high molecular oligomer, particularly, a thiophene oligomer and the like.

Those described above can be used as the positive hole transport material. However, it is preferable to use a porphyrin compound, an aromatic tertiary amine compound and a styrylamine compound, particularly, an aromatic tertiary amine compound.

Typical examples of the aromatic tertiary amine compound and the styrylamine compound include N,N,N',N'-tetraphenyl-4,4'-diaminophenyl; N,N'-diphenyl-N,N'-bis(3-methylphenyl)-[1,1'-biphenyl]-4,4'-diamine (TPD); 2,2-bis(4-di-p-tolylaminophenyl)propane; 1,1-bis(4-di-p-tolylaminophenyl)cyclohexane; N,N, N',N'-tetra-p-tolyl-4,4'-diaminobiphenyl; 1,1-bis(4-di-p-tolylaminophenyl)-4-phenylcyclohexane; bis(4-dimethylamino-2-metyl)phenylmethane; bis(4-di-p-tolylaminophenyl)phenylmethane; N,N'-diphenyl-N,N'-di(4-methoxyphenyl)-4,4'-diaminobiphenyl N,N,N',N'-tetraphenyl-4,4'-diaminodiphenylether; 4,4'-bis(diphenylamino)quadriphenyl; N,N,N-tri(p-tolyl)amine; 4-(di-p-tolylamino)-4'-[4-(di-p-tolylamino) styryl] stilbene; 4-N, N-diphenylamino-(2-diphenylvinyl)benzene; 3-methoxy-4'-N,N-diphenylaminostilbene; N-phenylcarbazole; those having two condensed aromatic rings in a molecule described in U.S. Pat. No. 5,061,569, for instance, 4,4'-bis[N-(1-naphthyl)-N-phenylamino]biphenyl (NPD), 4,4',4"-tris[N-(3-methylphenyl)-N-phenylamino]triphenylamine (MTDATA) in which three triphenylamine units are bonded in a star burst form described in Japanese Patent Application Laid-Open Publication No. 04-308688 and the like.

Furthermore, polymer materials in which these materials are introduced into a polymer chain or constitute a main chain of a polymer can also be used. In addition, inorganic compounds such as a p-type-Si and a p-type-SiC can also be used as the positive hole injection material and the positive hole transport material.

Moreover, it is also possible to use so-called p-type positive hole transport materials described in documents such as Japanese Patent Application Laid-Open Publication No. 11-251067 and Applied Physics Letters 80 (2002), p. 139 by J. Huang et. al. It is preferable to use these materials in view of being able to obtain a light-emitting element having high efficiency.

The positive hole transport layer 45*b* can be formed by making the above-described positive hole transport material a thin film by a well-known method such as the vacuum vapor deposition method, the spin coating method, the casting method, the printing method including the ink-jet method or the LB method. The thickness of the positive hole transport layer 45*b* is not particularly limited, but the thickness is generally within a range about of 5 nm to 5 μm, preferably within a range of 5 nm to 200 nm. This positive hole transport layer 45*b* may have a single layer structure constituted of one or two or more of the above-described materials.

Furthermore, it is possible to enhance the p property by doping the material of the positive hole transport layer 45*b* with impurities. Examples include those described in documents such as Japanese Patent Application Laid-Open Publication Nos. 04-297076, 2000-196140, 2001-102175 and J. Appl. Phys., 95, 5773 (2004).

As described above, it is preferable that enhancement of a high p property of the positive hole transport layer 45*b* makes it possible to produce an element which consumes lower electric power.

[Electron Transport Layer]

The electron transport layer 45*d* is formed of a material having a function of transporting electrons, and, in a broad sense, the electron injection layer 45*e* and a positive hole blocking layer (not shown) are included in the electron transport layer 45*d*. The electron transport layer 45*d* can be provided as a single layer or a laminated layer of a plurality of layers.

In the electron transport layer 45*d* having a single layer structure and the electron transport layer 45*d* having a laminated layer structure, the electron transport material constituting a layer provided adjacent to the light-emitting layer 45*c* has a function of transporting electrons injected from the cathode to the light-emitting layer 45*c*. The material described above can be optionally selected and used from well-known compounds. Examples include a nitro-substituted fluorene derivative, a diphenylquinone derivative, a thiopyrandioxide derivative, carbodiimide, a fluorenylidenemethane derivative, anthraquinonedimethane, an anthrone derivative, and an oxadiazole derivative and the like. Furthermore, in the above-described oxadiazole derivative, a thiadiazole derivative which is formed by substituting the oxygen atom of the above oxadiazole ring by a sulfur atom, and a quinoxaline derivative having a quinoxaline ring which is well-known as an electron withdrawing group can be used as the material of the electron transport layer 45*d*. Moreover, polymer materials in which these materials are introduced into a polymer chain or constitute a main chain of a polymer can also be used.

Additionally, metal complexes of an 8-quinolinol derivative such as: tris(8-quinolinol)aluminum (Alq3), tris(5,7-dichloro-8-quinolinol)aluminum, tris(5,7-dibromo-8-quinolinol)aluminum, tris(2-methyl-8-quinolinol)aluminum, tris(5-methyl-8-quinolinol)aluminum and bis(8-quinolinol)zinc (Znq), and metal complexes in which the central metal of the these metal complexes is substituted by In, Mg, Cu, Ca, Sn, Ga or Pb can also be used as the material of the electron transport layer 45*d*.

Furthermore, a metal-free or metalphthalocyanine and those in which the terminals thereof are substituted by an alkyl group, a sulfonic acid group or the like can be preferably used as the material of the electron transport layer 45*d*. Moreover, the distyrylpyrazine derivative mentioned as an example of the material of the light-emitting layer 45*c* can also be used as the material of the electron transport layer 45*d*. As same as the positive hole injection layer 45*a* and the positive hole transfer layer 45*b*, inorganic semiconductors such as an n type-Si and an n type-SiC can also be used as the material of the electron transport layer 45*d*.

The electron transport layer 45*d* can be formed by thinning the above-described electron transport material by a well-known method such as the vacuum vapor deposition method, the spin coating method, the casting method, the printing method including the ink-jet method or the LB method. The thickness of the electron transport layer 45*d* is not particularly limited, but the thickness is generally within a range of 5 nm to 5 μm, preferably within a range of 5 nm to 200 nm. This electron transport layer 45*d* may have a single layer structure constituted of one or two or more of the above-described materials.

Furthermore, it is possible to enhance the n property by doping the material of the electron transport layer 45*d* with impurities. Examples thereof include those described in documents such as Japanese Patent Application Laid-Open Publication Nos. 04-297076, 10-270172, 2000-196140 and 2001-102175 and J. Appl. Phys., 95, 5773 (2004). Moreover, it is preferable to introduce potassium or a potassium compound into the electron transport layer 45*d*. Examples of the potassium compound that can be used include, for example, potassium fluoride, and the like. As described above, by enhancement of an n property of the electron transport layer 45*d*, an element which consumes lower electric power can be produced.

In addition, the compound represented by the general formula (10) can be preferably used as the material of the electron transport layer 45d (electron transport compound).

(Ar1)n1-Y1    General formula (10)

In the general formula (10), n1 represents an integer of 1 or more, Y1 represents a substituent when n1 is 1, and represents a bond or an n1-valent linking group when n1 is 2 or more. Ar1 represents a group represented by the following general formula (A), and a plurality of Ar1s is identical or different when n1 is 2 or more. However, the compound represented by the general formula (10) described above has in a molecule at least two condensed aromatic heterocyclic rings obtained by condensing three or more rings.

In the general formula (10), an example of the substituent represented by Y1 has the same meaning as the substituent exemplified as R11, R12 of the general formula (1) which is shown as the compound constituting the nitrogen-containing layer 23 of the translucent electrode 25.

Examples of an n1-valent linking group represented by Y1 in the general formula (10) include a divalent linking group, a trivalent linking group and a tetravalent linking group, and the like.

Examples of the divalent linking group represented by Y1 in the general formula (10) include: an alkylene group (for example, ethylene group, trimethylene group, tetramethylene group, propylene group, ethylethylene group, pentamethylene group, hexamethylene group, 2,2,4-trimethylhexamethylene group, heptamethylene group, octamethylene group, nonamethylene group, decamethylene group, undecamethylene group, dodecamethylene group, a cyclohexylene group (for example, 1,6-cyclohexanediyl group and the like) and a cyclopenthylene group (for example, 1,5-cyclopentanediyl group and the like)), an alkenylene group (for example, vinylene group, propenylene group, butenylene group, pentenylene group, 1-methylvinylene group, 1-methylpropenylene group, 2-methylpropenylene group, 1-methylpentenylene group, 3-methylpentenylene group, 1-ethylvinylene group, 1-ethylpropenylene group, 1-ethylbutenylene group, 3-ethylbutenylene group and the like), an alkynylene group (for example, ethynylene group, 1-propynylene group, 1-butynylene group, 1-pentynylene group, 1-hexynylene group, 2-butynylene group, 2-pentynylene group, 1-methylethynylene group, 3-methyl-1-propynylene group, 3-methyl-1-butynylene group and the like), an arylene group (for example, o-phenylene group, p-phenylene group, naphthalenediyl group, anthracenediyl group, naphthacenediyl group, pyrenediyl group, naphthylnaphthalenediyl group, a biphenyldiyl group (for example, [1,1'-biphenyl]-4,4'-diyl group, 3,3'-biphenyldiyl group, 3,6-biphenyldiyl group and the like), terphenyldiyl group, quaterphenyldiyl group, quinquephenyldiyl group, sexiphenyldiyl group, septiphenyldiyl group, octiphenyldiyl group, nobiphenyldiyl group, deciphenyldiyl group and the like), a heteroarylene group (for example, a divalent group derived from a group consisting of carbazole group, carboline ring, diazacarbazole ring (also referred to as monoazacarboline group, exhibiting a ring structure obtained by substituting one carbon atom constituting the carboline ring, with a nitrogen atom), triazole ring, pyrrole ring, pyridine ring, pyrazine ring, quinoxaline ring, thiophene ring, oxadiazole ring, dibenzofuran ring, dibenzothiophene ring, indole ring and the like), a chalcogen atom such as oxygen or sulfur, a group or the like derived from a condensed aromatic heterocyclic ring obtained by condensing three or more rings (here, the condensed aromatic heterocyclic ring formed by condensing three or more rings preferably contains a hetero atom selected from N, O and S as an element constituting a condensed ring, for example, acridine ring, benzoquinoline ring, carbazole ring, phenazine ring, phenanthridine ring, phenanthroline ring, carboline ring, cycladine ring, quindoline ring, thebenidine ring, quinindoline ring, triphenodithiazine ring, triphenodioxazine ring, phenanthrazine ring, anthrazine ring, perimizine ring, diazacarbazole ring (exhibiting a ring obtained by substituting optional one of carbon atoms constituting the carboline ring, with a nitrogen atom), phenanthroline ring, dibenzofuran ring, dibenzothiophene ring, naphthofuran ring, naphthothiophene ring, benzodifuran ring, benzodithiophene ring, naphthodifuran ring, naphthodithiophene ring, anthrafuran ring, anthradifuran ring, anthrathiophene ring, anthradithiophene ring, thianthrene ring, phenoxathiin ring, thiophanthrene ring (naphthothiophene ring) and the like).

Examples of the trivalent linking group represented by Y1 in the general formula (10) include ethanetriyl group, propanetriyl group, butanetriyl group, pentanetriyl group, hexanetriyl group, heptanetriyl group, octanetriyl group, nonanetriyl group, decanetriyl group, undecanetriyl group, dodecanetriyl group, cyclohexanetriyl group, cyclopentantriyl group, benzenetriyl group, naphthalenetriyl group, pyridinetriyl group, carbazoletriyl group, and the like.

The tetravalent linking group represented by Y1 in the general formula (10) is a group having a combining group added to the above-mentioned trivalent linking group. Examples include propandiylidene group, 1,3-propandiyl-2-ylidene group, butanediylidene group, pentanediylidene group, hexanediylidene group, heptanediylidene group, octanediylidene group, nonanediylidene group, decanediylidene group, undecanediylidene group, dodecanediylidene group, cyclohexanediylidene group, cyclopentanediylidene group, benzenetetrayl group, naphthalenetetrayl group, pyridinetetrayl group, carbazoletetrayl group, and the like.

Note that each of the above-described divalent, trivalent and tetravalent linking groups may further have a substituent exemplified as R11 and R12 of the general formula (1).

As the preferable aspect of the compound represented by the general formula (10), it is preferable that Y1 represent a group which is derived from a condensed aromatic heterocyclic ring formed by condensing three or more rings. Examples of the condensed aromatic heterocyclic ring formed by condensing three or more rings preferably include dibenzofuran ring or dibenzothiophene ring. In addition, preferably n1 is 2 or more.

Furthermore, the compound represented by the general formula (10) has, in the molecule, at least two condensed aromatic heterocyclic rings formed by condensing three or more rings, described above.

Moreover, when Y1 represents an n1-valent linking group, Y1 is preferably non-conjugated in order to keep the triplet excitation energy of the compound represented by the general formula (10) high, and is preferably constituted of aromatic rings (aromatic hydrocarbon ring+aromatic heterocyclic ring) from the viewpoint of improving Tg (also referred to as glass transition point, or glass transition temperature).

Here, the "non-conjugated" means a case where a linking group cannot be expressed by repetition of a single bond (single bond) and a double bond, or a case where a conjugation of aromatic rings constituting a linking group is sterically broken. [Group represented by the general formula (A)]

Ar1 in the general formula (10) represents the group represented by the general formula (A) below.

[Chem. 69]

General formula (A)

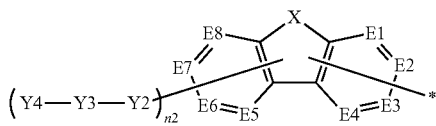

where X represents —N(R)—, —O—, —S— or —Si(R)(R')—, E1 to E8 each represent —C(R1)= or —N=, R, R' and R1 each represent hydrogen atom, a substituent or a linking moiety with Y1. * represents a linking moiety with Y1. Y2 represents simply a bond or a divalent linking group. Y3 and Y4 each represent a group derived from a five-membered or six-membered aromatic ring, and at least one represents a group derived from an aromatic heterocyclic ring containing a nitrogen atom as a ring constituent atom. n2 represents an integer of 1 to 4.

Here, in —N(R)— or —Si(R) (R')—represented by X of the general formula (A), and further in —C(R1)=represented by E1 to E8, a substituent represented by each of R, R' and R1 has the same meaning as the substituent represented by R11, R12 of the general formula (1).

In addition, a divalent linking group represented by Y2 in the general formula (A) has the same meaning as the divalent linking group represented by Y1 in the general formula (10).

Furthermore, examples of a five-membered or six-membered aromatic ring which is used for the formation of a group derived from a five-membered or six-membered aromatic ring represented by each of Y3 and Y4 in the general formula (A) include benzene ring, oxazole ring, thiophene ring, furan ring, pyrrole ring, pyridine ring, pyridazine ring, pyrimidine ring, pyrazine ring, diazine ring, triazine ring, imidazole ring, isoxazole ring, pyrazole ring, triazole ring, and the like.

Moreover, at least one of the groups derived from five-membered or six-membered aromatic rings each represented by Y3 and Y4 represents a group derived from the aromatic heterocyclic ring containing a nitrogen atom as a ring constituent atom, and examples of the aromatic heterocyclic ring containing a nitrogen atom as a ring constituent atom include oxazole ring, pyrrole ring, pyridine ring, pyridazine ring, pyrimidine ring, pyrazine ring, diazine ring, triazine ring, imidazole ring, isoxazole ring, pyrazole ring, triazole ring, and the like.

(Preferred Aspect of the Group Represented by Y3)

In the general formula (A), the group represented by Y3 is preferably a group derived from the above-described six-membered aromatic ring, and is more preferably a group derived from a benzene ring.

(Preferred Aspect of the Group Represented by Y4)

In the general formula (A), the group represented by Y4 is preferably a group derived from the above-described six-membered aromatic ring, is more preferably a group derived from the aromatic heterocyclic ring containing nitrogen atom as a ring constituent atom, and is particularly preferably a group derived from a pyridine ring.

(Preferred Aspect of the Group Represented by the General Formula (A))

The preferable aspect of the group represented by the general formula (A) includes a group represented by any of the general formulae (A-1), (A-2), (A-3) or (A-4).

[Chem. 70]

General formula (A-1)

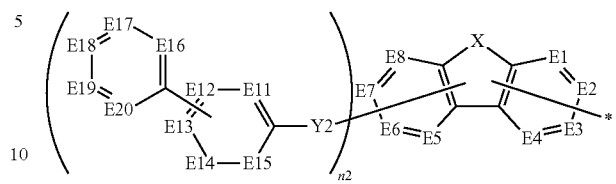

In the general formula (A-1), X represents —N(R)—, —O—, —S— or —Si(R) (R')—, E1 to E8 each represent —C(R1)= or —N=, and R, R' and R1 each represent hydrogen atom, a substituent or a linking moiety with Y1. Y2 represents simply a bond or a divalent linking group. E11 to E20 each represent —C(R2)= or —N=, and at least one represents —N=. R2 represents hydrogen atom, a substituent or a linking moiety. However, at least one of E11 and E12 represents —C(R2)=, and R2 represents a linking moiety. n2 represents an integer of 1 to 4. The symbol * represents a linking moiety with Y1 in the general formula (10).

[Chem. 71]

General formula (A-2)

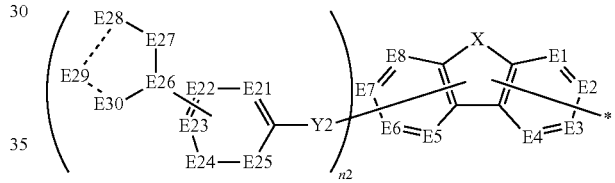

In the general formula (A-2), X represents —N(R)—, —O—, —S— or —Si(R) (R')—, E1 to E8 each represent —C(R1)= or —N=, and R, R' and R1 each represent a hydrogen atom, a substituent or a linking moiety with Y1. Y2 represents simply a bond or a divalent linking group. E21 to E25 each represent —C(R2)= or —N=, E26 to E30 each represent —C(R2)=, —N=, —O—, —S— or —Si(R3) (R4)-, and at least one of E21 to E30 represents —N=. R2 represents hydrogen atom, a substituent or a linking moiety, and R3 and R4 each represent hydrogen atom or a substituent. However, at least one of E21 or E22 represents —C(R2)= and R2 represents a linking moiety. n2 represents an integer of 1 to 4. * represents a linking moiety with Y1 in the general formula (10).

[Chem. 72]

General formula (A-3)

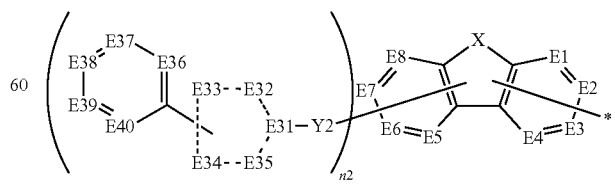

In the general formula (A-3), X represents —N(R)—, —O—, —S— or —Si(R) (R')—, E1 to E8 each represent —C(R1)═ or —N═, and R, R' and R1 each represent hydrogen atom, a substituent or a linking moiety with Y1. Y2 represents simply a bond or a divalent linking group. E31 to E35 each represent —C(R2)═, —N═, —O—, —S— or —Si(R3) (R4)-, and E36 to E40 each represent —C(R2)═ or —N═, and at least one of E31 to E40 represents —N═. R2 represents hydrogen atom, a substituent or a linking moiety, and R3 and R4 each represent hydrogen atom or a substituent. However, at least one of E32 or E33 represents —C(R2)═ and R2 represents a linking moiety. n2 represents an integer of 1 to 4. * represents a linking moiety with Y1 in the general formula (10).

[Chem.73]

General formula (A-4)

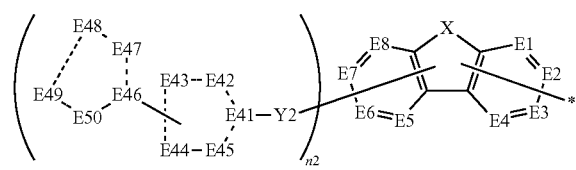

In the general formula (A-4), X represents —N(R)—, —O—, —S— or —Si(R) (R')—, E1 to E8 each represent —C(R1)═ or —N═, and R, R' and R1 each represent hydrogen atom, a substituent or a linking moiety with Y1. Y2 represents simply a bond or a divalent linking group. E41 to E50 each represent —C(R2)═, —N═, —O—, —S— or —Si(R3) (R4)-, and at least one represents —N═. R2 represents hydrogen atom, a substituent or a linking moiety, and R3 and R4 each represent hydrogen atom or a substituent. However, at least one of E42 or E43 represents —C(R2)═ and R2 represents a linking moiety. n2 represents an integer of 1 to 4. * represents a linking moiety with Y1 in the general formula (10).

Hereinafter, the group represented by any of the general formulae (A-1) to (A-4) will be explained.

In —N(R)— or —Si(R) (R')—represented by X in any of the group represented by the general formulae (A-1) to (A-4), and further in —C(R1)═represented by E1 to E8, a substituent represented by each of R, R' and R1 has the same meaning as the substituent represented by R11, R12 of the general formula (1).

In any of the group represented by the general formulae (A-1) to (A-4), the divalent linking group represented by Y2 has the same meaning as the divalent linking group represented by Y1 of the general formula (10).

The substituent represented by R2 in —C(R2)═represented by each of E11 to E20 in the general formula (A-1), each of E21 to E30 in the general formula (A-2), each of E31 to E40 in the general formula (A-3) and each of E41 to E50 in the general formula (A-4) has the same meaning as the substituent represented by R11, R12 of the general formula (1).

Next, further preferable aspects of the compound represented by the general formula (10) according to the present invention will be explained.

[Compound Represented by the General Formula (11)]

According to the present invention, among the compounds represented by the above-described general formula (10), the compound represented by the following general formula (11) is preferable. The general formula (11) includes the general formula (2) representing the compound constituting the nitrogen-containing layer 23 of the translucent electrode 25. Hereinafter, the compound represented by the general formula (11) will be explained.

[Chem. 74]

General formula (11)

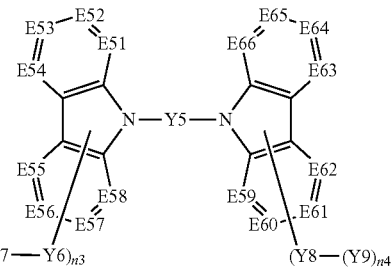

In the general formula (11), Y5 represents a divalent linking group formed of an arylene group, a heteroarylene group or a combination thereof. E51 to E66 each represent —C(R3)═ or —N═, and R3 represents hydrogen atom or a substituent. Y6 to Y9 each represent a group derived from an aromatic hydrocarbon ring or a group derived from an aromatic heterocyclic ring, and at least one of Y6 or Y7 and at least one of Y8 or Y9 each represent a group derived from an aromatic heterocyclic ring containing N atom. n3 and n4 each represent an integer of 0 to 4, but n3+n4 is an integer of 2 or more.

Y5 in the general formula (11) has the same meaning as Y21 in the general formula (2).

Each of E51 to E66 in the general formula (11) has the same meaning as E201 to E216 in the general formula (2), and when R3 of —C(R3)═represented by each of E51 to E66 is a substituent, as examples of the substituent, one exemplified as R11, R12 of the general formula (1) is applied in the same way.

In the general formula (11), it is preferable that as groups represented by each of E51 to E66, six or more among E51 to E58 and six or more among E59 to E66 each represent —C(R3)═.

In the general formula (11), examples of the aromatic hydrocarbon ring which is used for the formation of a group derived from the aromatic hydrocarbon ring represented by each of Y6 to Y9 include benzene ring, biphenyl ring, naphthalene ring, azulene ring, anthracene ring, phenanthrene ring, pyrene ring, chrysene ring, naphthacene ring, triphenylene ring, o-terphenyl ring, m-terphenyl ring, p-terphenyl ring, acenaphthene ring, coronene ring, fluorene ring, fluoranthrene ring, naphthacene ring, pentacene ring, perylene ring, pentaphene ring, picene ring, pyrene ring, pyranthrene ring, anthranthrene ring and the like.

Furthermore, the aromatic hydrocarbon ring described above may also have a substituent represented by R11, R12 of the general formula (1).

In the general formula (11), examples of the aromatic heterocyclic ring used for the formation of a group derived from the aromatic heterocyclic ring represented by each of Y6 to Y9 include furan ring, thiophene ring, oxazole ring, pyrrole ring, pyridine ring, pyridazine ring, pyrimidine ring, pyrazine ring, triazine ring, benzimidazole ring, oxadiazole ring, triazole ring, imidazole ring, pyrazole ring, triazole ring, indole ring, indazole ring, benzimidazole ring, benzothiazole ring, benzoxazole ring, quinoxaline ring, quinazoline ring, cinnoline ring, quinoline ring, isoquinoline ring, phthalazine ring, naphthylidine ring, carbazole ring, carboline ring, diazacarbazole ring (represents a ring obtained by further substituting one of carbon atoms constituting the carboline ring by a nitrogen atom), and the like.

Moreover, the aromatic hydrocarbon ring described above may have the substituent exemplified as R11, R12 of the general formula (1).

In the general formula (11), examples of the aromatic heterocyclic ring containing N atom which is used for the formation of a group derived from the aromatic heterocyclic ring containing N atom represented by at least one of Y6 or Y7 and at least one of Y8 or Y9 include oxazole ring, pyrrole ring, pyridine ring, pyridazine ring, pyrimidine ring, pyrazine ring, triazine ring, benzimidazole ring, oxadiazole ring, triazole ring, imidazole ring, pyrazole ring, triazole ring, indole ring, indazole ring, benzimidazole ring, benzothiazole ring, benzoxazole ring, quinoxaline ring, quinazoline ring, cinnoline ring, quinoline ring, isoquinoline ring, phthalazine ring, naphthylidine ring, carbazole ring, carboline ring, diazacarbazole ring (represents a ring obtained by further substituting one of carbon atoms constituting the carboline ring by a nitrogen atom), and the like.

In the general formula (11), it is preferable that the group each represented by Y7, Y9 is represented by a group derived from each pyridine ring.

In addition, in the general formula (11), it is preferable that the group each represented by Y6 and Y8 is represented by a group derived from each benzene ring.

More preferable aspect among the compounds represented by the general formula (11) as explained above includes the compound represented by the general formula (2) exemplified as the compounds constituting the nitrogen-containing layer 23 of the translucent electrode 25.

Examples of the compound represented by each of the above general formulae (10), (11) or the general formula (2) include the above-described compounds (1 to 118).

[Blocking Layer: Positive Hole Blocking Layer, Electron Blocking Layer]

The blocking layer is provided as necessary in addition to the basic constituent layers of thin organic compound films described above. Examples thereof include a positive hole blocking layer described in documents such as Japanese Patent Application Laid-Open Publication Nos. 11-204258, 11-204359, and p. 237 of "Yuki EL Soshi To Sono Kogyoka Saizensen (Organic EL Element and Front of Industrialization thereof) (Nov. 30, 1998, published by N. T. S Co., Ltd.)", and the like.

The positive hole blocking layer has a function of the electron transport layer 45d in a broad sense. The positive hole blocking layer is formed of a positive hole blocking material having a remarkably small capability to transport positive holes while having a function of transporting electrons and can increase recombination probability of electrons and positive holes by blocking positive holes while transporting electrons. Furthermore, as necessary, the configuration of an electron transport layer 45d described below can be used as the positive hole blocking layer. It is preferable that the positive hole blocking layer is provided adjacent to the light-emitting layer 45c.

On the other hand, the electron blocking layer has a function as the positive hole transport layer 45b in a broad sense. The electron blocking layer is formed of a material having a very little capability to transport electrons while having a function of transporting positive holes, and can increase the recombination probability of electrons and positive holes by blocking electrons while transporting positive holes. Furthermore, as necessary, the configuration of a positive hole transport layer 45b described below can be applied to the electron blocking layer. The thickness of the positive hole blocking layer according to the present invention is preferably 3 to 100 nm, more preferably 5 to 30 nm.

[Sealing Member]

A sealing member 48 is a material for covering the organic electroluminescent element 50, and a plate-like (film-like) sealing member 48 is fixed to a substrate 26 side by a resin layer 47. The sealing member 48 is provided in a state of covering at least the light-emitting functional layer 45 and in a state where of exposing the terminal portions (not shown) of translucent electrode 25 and the counter electrode 46. In addition, the sealing member 48 may be constituted so that an electrode is provided on the sealing member 48 and the electrode is electrically conducted with the terminal portions of translucent electrode 25 and the counter electrode 46 of the organic electroluminescent element 50.

Specific examples of the plate-like (film-like) sealing member 48 include a glass substrate, a polymer substrate, and the sealing member 48 may be used by making these substrate materials into thinner-type films. Examples of glass substrate can include particularly soda lime glass, barium strontium-containing glass, lead glass, alminosilicate glass, borosilicate glass, barium borosilicate glass, quartz and the like. In addition, examples of the polymer substrate can include polycarbonate, acryl, polyethylene terephthalate, polyethersulfide, polysulfone and the like.

Among them, from the viewpoint of thinning the element, the polymer substrate in the form of a thin film is preferably used as the sealing member 48.

Furthermore, the polymer substrate in the form of a thin film preferably has an oxygen transmittance measured in accordance with the method of JIS-K-7126-1987 of $1 \times 10^{-3}$ ml/(m$^2$·24 hr·atm) or less and a water vapor transmittance ($25 \pm 0.5°$ C., relative humidity ($90 \pm 2$) % RH) measured in accordance with the method of JIS-K-7129-1992 of $1 \times 10^{-3}$ g/(m$^2$·24 hr) or less.

Moreover, the above substrate material may also be processed into the form of a recessed plate to thereby be used as the sealing member 48. In this case, processing such as sandblast processing or chemical etching processing is performed on the substrate member to thereby form recessed portions.

Furthermore, not limited to the form, a metal material may be used. Examples of the metal materials include one or more metals or alloys selected from the group consisting of stainless steel, iron, copper, aluminum, magnesium, nickel, zinc, chromium, titanium, molybdenum, silicon, germanium and tantalum. By using such a metal material for the sealing member 48 in a thin type film shape, the whole light-emitting panel provided with the organic electroluminescent element can be made thin.

[Resin Layer]

The resin layer 47 for fixing the sealing member 48 to the substrate 26 side is also used as a sealant for sealing the organic electroluminescent element 50 sandwiched between the sealing member 48 and the substrate 26. The resin layer 47 has been formed by coating an uncured resin material onto the sticking surface of the sealing member 48 or of the base material 26 while dispersing the resin in a plurality of portions and by curing the resin material after pressurizing the sealing member 48 and base material 26 each other via these resin materials.

Here, the resin material is coated in a bead shape at prescribed intervals, and a route for air release is formed between respective beads. Consequently, the mixing of air bubbles into the resin layer 47 after the sticking can be prevented by comparatively simple coating of the resin material. Note that the "bead" means the resin material coated in a continuous line shape, and in explanation below, the resin material coated in a line shape will be described as the "bead."

The bead made of the resin material is formed preferably in a dome shape of making approximately a point contact at the time of an initial contact with the other sticking surface, in the cross-section in the direction of approximately orthogonal to the extending direction. Because of this shape, the contact area of the resin material with the sticking surface can be made small at the time of the initial contact immediately after the contact of the resin material with the sticking surface, and the mixing of the air into the resin layer 47 can be made difficult. Additionally, it becomes possible to let the air out of the path between the beads without fail by applying pressure to the outer surface of at least one member of the sealing member 48 and the base material 26 disposed facing each other via the resin material and by moving the pressurized part in the extending direction of the bead.

A photocurable resin is preferably used as the resin layer 47. Examples of the photocurable resin include photo-radical polymerizable resins containing various (meth)acrylates such as polyester (meth)acrylate, polyether (meth) acrylate, epoxy (meth)acrylate or polyurethane (meth) acrylate as the principal component, photo-cationic polymerizable resins containing such resin as epoxy or vinyl ether as the principal component, and thiol-ene-added type resins. Among these photocurable resins, epoxy resin-based photo-cationic polymerizable resins that exhibit a low contraction percentage of the cured material, discharge a little outgas and are excellent in long-term reliability are preferable.

In addition, a heat and chemical curing type (a two-pack mixing-type) resin such as epoxy-based resins can be used as the resin layer 47. In addition, hot-melt type polyamide, polyester and polyolefine can be used. Additionally, ultra-violet ray curing-type epoxy resins of a cationic curing-type can be used.

Note that the organic material constituting the organic electroluminescent element 50 may be deteriorated by a thermal treatment. Therefore, the use of a resin material that can be caused to adhere and be cured at from room temperature to 80° C. is preferable.

<Effects of Organic Electroluminescent Element>

The above-described organic electroluminescent element 50 has the configuration in which the translucent electrode 25 of the above-described embodiment having both electrical conductivity and light transmission property is used as the canode, and the light-emitting functional layer 45 and the counter electrode 46 serving as the cathode are provided in this order in the upper part thereof. Accordingly, while a light emission with a high luminance of the organic electroluminescent element 50 can be implemented by applying a sufficient voltage between the translucent electrode 25 and the counter electrode 46, it is possible to achieve a high luminance by enhancing an extraction efficiency of the emitted light h from the translucent electrode 25 side.

Furthermore, the organic electroluminescent element 50 has the base layer 11 having the surface that has a high surface elastic modulus and is excellent in smoothness, and the electrically conductive layer 12 is formed on the base layer 11. Therefore, the flattened surface shape of the base layer 11 can be transferred to the surface of the electrically conductive layer 12 by the pressure in the solid sealing. Accordingly, the electrode projection is flattened by the heating and pressurization upon the solid sealing, with the result that leak characteristics of the organic electroluminescent element 50 are improved.

<5. Organic Electroluminescent Element (Fifth Embodiment; Reverse Laminate Configuration)>

[Configuration of Organic Electroluminescent Element]

Figure 9:
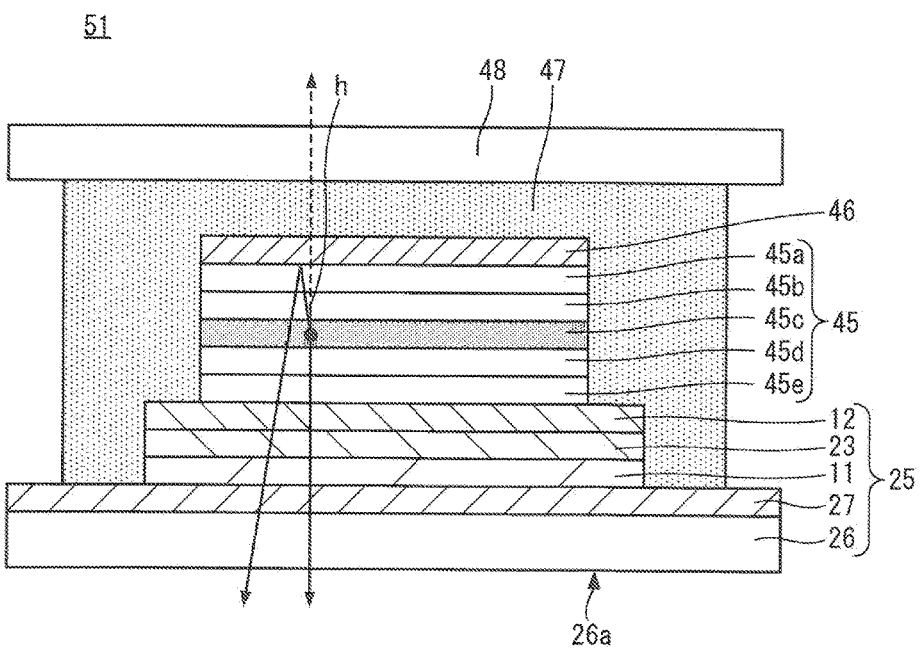
FIG. 9 is a drawing showing a schematic configuration of the organic electroluminescent element in a fifth embodiment.

Next, a fifth embodiment of the present invention will be explained. As to the fifth embodiment, an organic electroluminescent element using the translucent electrode of the third embodiment will be explained as an example of electronic devices. In FIG. 9, a schematic configuration of the organic electroluminescent element of the present embodiment is shown. Hereinafter, the configuration of the organic electroluminescent element will be explained based on the drawing.

An organic electroluminescent element 51 of a second example shown in FIG. 9 is provided with the cathode (the translucent electrode 25), the light-emitting functional layer 45 and the anode (the counter electrode 46) in this order from base material 26 side, and is different only in that the laminating order is reverse from the organic electroluminescent element 50 of the fourth embodiment explained above using FIG. 8. Hereinafter, repeated detailed explanations about configuration components that are the same as those of the organic electroluminescent element 50 in the fourth embodiment will be omitted, and configurations characteristic of the organic electroluminescent element 51 in the fifth embodiment will be explained.

In the organic electroluminescent element 51 shown in FIG. 9, the light-emitting functional layer 45 and the counter electrode 46 serving as the anode are laminated on the translucent electrode 25 serving as the cathode in this order, and furthermore, the solid sealing is performed by the resin layer 47 and the sealing member 48. Among these, the characteristic is the use of the above-described translucent electrode 25 of the present embodiment described above, as the electrical conductive layer on a light extraction surface 26a side. Accordingly, the organic electroluminescent element 51 is constituted as the bottom emission type that extracts an emitted light h at least from the side of the base material 26.

The whole layer structure of the organic electroluminescent element 51 is not limited in the same way as that in the organic electroluminescent element in the fourth embodiment, and a general layer structure may be used. The organic electroluminescent element 51 in the fifth embodiment has a configuration in which electron injection layer 45e/electron transport layer 45d/light-emitting layer 45c/positive hole transport layer 45b/positive hole injection layer 45a are provided in this order in the upper part of the translucent electrode 25 serving as the cathode, and has a configuration in which the counter electrode 46 serving as the anode is laminated in the upper part thereof.

Note that various configurations are employed, as necessary, as the light-emitting functional layer 45, in the same way as that explained in the fourth embodiment, and the positive hole blocking layer and the electron blocking layer whose drawings are omitted may be provided. In the above-described configurations, in the same way as in the fourth embodiment, only the portion sandwiched between the translucent electrode 25 and the counter electrode 46 also serves as the light-emitting region in the organic electroluminescent element 51.

Furthermore, for the counter electrode 46 provided as the anode in the upper part of the light-emitting functional layer 45, the same metal, alloy, organic or inorganic conductive compound or mixture thereof as that of the anode in the first example is used.

Furthermore, in the organic electroluminescent element 51 of the above-described configuration, too, in the same way as in the fourth embodiment, the smooth surface of base layer 11 is transferred to the electrically conductive layer 12 formed on the base layer 11 by the pressure applied upon the solid sealing. Therefore, the surface of the electrically conductive layer 12 can be smoothened to be Ra ≤2 as is the case for the surface of the base layer 11.

[Effects of Organic Electroluminescent Element]

The above-described organic electroluminescent element 51 has a configuration in which the translucent electrode 25 having both electrical conductivity and light transmission property is used as a cathode, and the light-emitting functional layer 45 and the counter electrode 46 serving as the anode are provided in the upper portion thereof. Accordingly, in the same way as in the first embodiment, while a light emission with a high luminance of the organic electroluminescent element 51 can be realized by applying a sufficient voltage between the translucent electrode 25 and the counter electrode 46, it is possible to achieve a high luminance by enhancing an extraction efficiency of the emitted light h from the translucent electrode 25.

Furthermore, the organic electroluminescent element 51 has the base layer 11 having the surface that has a high surface elastic modulus and is excellent in smoothness, and the electrically conductive layer 12 is formed on the base layer 11. Therefore, by the pressure in the solid sealing, the flattened surface shape of the base layer 11 can be transferred to the surface of the electrically conductive layer 12. Accordingly, by the heating and pressurization in the solid sealing, the electrode projection is flattened to thereby improve leak characteristics of the organic electroluminescent element 51.

Note that, in the above-described embodiment, the configuration in which the translucent electrode made of the base material, the barrier layer, the base layer, the nitrogen-containing layer and the electrically conductive layer is applied to an organic electroluminescent element of a bottom emission type, is explained, but organic electroluminescent elements to which the translucent electrode is applied is not limited to the bottom emission type, and for example, the electrode may also be applied to a configuration of a top emission type in which light is extracted from the counter electrodes side and to a configuration of a double-side light emission type in which light is extracted from the both sides. When the organic electroluminescent element is of the top emission type, there may be adopted a configuration in which a transparent material is used for the counter electrode and an opaque base material having reflection properties is used in place of the base material of the translucent electrode and the emitted light h is reflected from the substrate to be extracted from the counter electrode side. Furthermore, when the organic electroluminescent element is of a double-side light emission type, there may be adopted a configuration in which transparent material is used for the counter electrode in the same way as in the translucent electrode to thereby extract the emitted light h from both side.

Furthermore, also in organic electroluminescent elements of the top emission type and the double-side light emission type, there can be constituted each of the configuration as the organic electroluminescent element in the fourth embodiment, in which the translucent electrode is set to be the anode and the configuration as the organic electroluminescent element in the fifth embodiment, in which the translucent electrode is set to be the cathode.

[Uses of Organic Electroluminescent Element]

The organic electroluminescent elements having the above-described various configurations are surface emitting elements, and thus are usable for light-emitting sources of various types. Examples include a lighting device such as a home lighting device or a car lighting device, a backlight for a timepiece or a liquid crystal, a signboard for advertisement, a light source for a signal, a light source for an optical storage medium, a light source for an electrophotographic copier, a light source for an optical communication processor, a light source for an optical sensor, and the like. In addition, the uses are not limited to these light-emitting sources, but can also include other light sources.

Particularly, the element can be effectively used as a backlight for a liquid crystal display device which is combined with a color filter and as a light source for lighting.

Furthermore, the organic electroluminescent element in each of the present embodiment examples may be used as a kind of lamp such as a lighting device or an exposure light source, or may be used as a projection device of an image projecting type, or a display of a type by which a still image or moving image is visually recognized directly. In this case, a light-emitting surface area may be enlarged by so-called tiling in which light-emitting panels provided with the organic electroluminescent element are combined flatly in response to the recent increasing in size of a lighting device and a display device.

When using the organic electroluminescent element as a display device for reproducing a moving image, a driving system is either a simple matrix (passive matrix) system or active matrix system. In addition, when using two or more kinds of the organic electroluminescent element according having a different emission color, it is possible to produce a color or full color display device.

<6. Lighting Device (Sixth Embodiment)>

[Lighting Device-1]

A sixth embodiment of the present invention will be explained. In the sixth embodiment, a lighting device using each of the above-described embodiments will be explained as an example of electronic devices.

An organic electroluminescent element used in the lighting device of the present embodiment may be designed so as to impart a resonator structure to the each organic electroluminescent element of the above-described configuration. The objects of using the organic electroluminescent element having the resonator structure include a light source for an optical storage medium, a light source for an electrophotographic copier, a light source for an optical communication processor, a light source for an optical sensor, and the like, but is not limited thereto. Alternatively, the organic electroluminescent element may be used for the above-described purpose by oscillating laser beam.

Note that the material used for the organic electroluminescent element can be applied to an organic electroluminescent element which emits a substantial white light (also referred to as white organic electroluminescent element). For example, the simultaneous emission of a plurality of luminescent colors from a plurality of light-emitting materials can also give a white color emission by color mixing. Examples of the combination of a plurality of luminescent colors may include a combination containing three maximum emission wavelengths of three primary colors of red, green and blue, or a combination containing two maximum emission wavelengths which are in a complementary color relationship such as blue and yellow, bluish green and orange, or the like.

Furthermore, combinations of light-emitting materials for obtaining a plurality of luminescent colors may be a combination of a plurality of light-emitting materials which emit a plurality of phosphorescence or fluorescence, or a combination of a light-emitting material which emit a plurality of phosphorescence or fluorescence and a material of coloring matter which emits an excitation light from a light-emitting material. In the white color organic electroluminescent element, a plurality of light-emitting dopants may be combined.

The white color organic electroluminescent element has a configuration different from the configuration of obtaining a white color emission by arranging, in parallel, organic electroluminescent elements each of which emits an individual color light, in an array form, and the organic electroluminescent element itself can emit a white color light. Therefore, it is not necessary to use a mask for forming most of layers constituting the element. Thus, for example, the electrode layer can be formed all over by a vapor deposition method, a casting method, a spin coating method, an ink-jet method, a printing method, and the like, which enhances productivity.

Furthermore, the light-emitting material used for the light-emitting layers of the white color organic electroluminescent element is not particularly limited, and for example, as to a backlight in a liquid crystal display element, whitening is performed by selection and combination of arbitrary materials from among the metal complexes described in the embodiments of the above-described organic electroluminescent element or well-known light-emitting materials so as to be suited to a wavelength range corresponding to a CF (color filter) properties.

By using the white color organic electroluminescent element explained above, it is possible to produce a lighting device which emits substantial white light.

[Lighting Device-2]

Furthermore, in the lighting device, it is also possible to make the area of the light emission surface large, for example, by the use of a plurality of organic electroluminescent elements. In this case, the light-emitting area can be enlarged by arranging (namely, tiling), on a support substrate, a plurality of light-emitting panels provided with the organic electroluminescent elements on a transparent substrate. The support substrate may also double as a sealing member, and the light-emitting panels are tiled in a state where the organic electroluminescent elements are sandwiched between the support substrate and a transparent electrode of the light-emitting panel. The organic electroluminescent element may be solid-sealed by filling a resin material between the support substrate and the transparent electrode. Note that terminals of the translucent electrode and the counter electrode are exposed around the light-emitting panel.

In the lighting device having such a configuration, a non-light-emitting region is generated between the light-emitting panels since the center region of the light-emitting panel serves as the light-emitting region. Therefore, in order to increase an amount of light to be extracted from the non-light-emitting region, a light extraction member may be provided in the non-light-emitting region of the light extraction surface. A light condensing sheet or a light diffusing sheet can be used for the light extraction member.

<7. Organic Photoelectric Conversion Element (Seventh Embodiment)>

Next, a seventh embodiment of the present invention will be explained. In the seventh embodiment, as an example of electronic devices, an organic photoelectric conversion element using the translucent electrode 25 in the third embodiment will be explained. In FIG. 10, a schematic configuration view of the organic photoelectric conversion element in the present embodiment is shown. Hereinafter, the configuration of the organic photoelectric conversion element will be explained based on the drawing.

An organic photoelectric conversion element 60 shown in FIG. 10 uses a compound semiconductor-based material of a chalcopyrite structure as a photoelectric conversion material, and is provided with the translucent electrode 25 explained using FIG. 3. The organic photoelectric conversion element 60 has such a configuration that a photoelectric conversion layer of a chalcopyrite structure, a buffer layer 62, a semi-insulating layer 63 and a back electrode 64 are disposed in this order on the translucent electrode 25 including the base material 26, and further are solid-sealed by a resin layer 66 and a sealing member 67.

In this way, the organic photoelectric conversion element 60 is solid-sealed by the lamination of the sealing member 67 via the resin layer 66 covering from on the barrier layer 27 of the translucent electrode 25 to the back electrode 64. In the solid sealing of the organic photoelectric conversion element 60, an uncured resin material is coated on the lamination surface of the sealing member 67 or on either one of the base material 26 of the translucent electrode 25 or the back electrode 64, and the base material 26 and the sealing member 67 are pressurized each other, while sandwiching the resin material, in a heated sate to be united. In the organic photoelectric conversion element 60 of the configuration as described above, the translucent electrode 25 side relative to the photoelectric conversion layer 61 serves as a receiving surface of the sunlight H. Note that, in the organic photoelectric conversion element 60 of the present embodiment, a substantial cell part is the laminated part from the electrically conductive layer 12 of the translucent electrode 25 to the back electrode 64.

(Smoothing of Electrically Conductive Layer)

The organic photoelectric conversion element 60 of the above-described configuration is characterized in that the electrically conductive layer 12 containing Ag as the principal component is provided on the smooth face side of the elastic modulus of 20 GPa or more and Ra≤2 of the base layer 11, and that the translucent electrode 25 is solid-sealed by the resin layer 66 and the sealing member 67.

In the organic photoelectric conversion element 60, the smooth surface of the base layer 11 is transferred to the electrically conductive layer 12 formed on the base layer 11 by the pressure applied upon the solid sealing. Therefore, the surface of the electrically conductive layer 12 can be smoothened to Ra≤2 in the same way as the surface of the base layer 11. The smoothing of the electrically conductive layer 12 is performed by the same phenomenon as that of the organic electroluminescent element in the fourth embodiment. Therefore, detailed explanation of the smoothing of the electrically conductive layer 12 is omitted.

Next, based on FIG. 10, configurations of respective layers constituting the organic photoelectric conversion element 60 in the present embodiment will be explained in order from the translucent electrode 25 side.

[Translucent Electrode] The translucent electrode 25 is equal to the translucent electrode 25 in the third embodiment and has a configuration in which the barrier layer 27, the base layer 11, the nitrogen-containing layer 23 and the electrically conductive layer 12 are formed in this order from the base material 26 side. In the translucent electrode 25, in particular the electrically conductive layer 12 is used as one electrode out of a pair of electrodes constituting the organic photoelectric conversion element 60. The translucent electrode 25 is used, for example, as a negative electrode.

[Photoelectric Conversion Layer]

The photoelectric conversion layer 61 is a semiconductor thin film constituted of a compound semiconductor material of a chalcopyrite structure (a chalcopyrite-based material), and is a so-called CIS-based photoelectric conversion layer. The chalcopyrite-based material is constituted containing a Group Ib element (Cu, Ag, Au), a Group IIIb element (B, Al, Ga, In, Tl) and a Group VIb element (S, Se, Te, Po) and, for example, contains $Cu(In_{1-x}Ga_x)(Se_yS_{1-y})_2[0 \leq x \leq 1, 0 \leq y \leq 1]$ as the principal component. Here, in the case where gallium (Ga) and sulfur (S) are not in the state of a solid solution (x=y=0), the photoelectric conversion layer 61 becomes a semiconductor thin film made of $CuInSe_2$.

Such photoelectric conversion layer 61 has a thickness of 0.5 to 5 µm preferably, and of 1 to 2 µm more preferably.

[Buffer Layer]

The buffer layer 62 is a layer for achieving an electric junction of the photoelectric conversion layer 61. Such buffer layer 62 is constituted using a compound semiconductor of Group II-VI such as CdS, ZnS or ZnO, or a mixed crystal thereof, or an In-based compound semiconductor such as $In_2O_3$, $In_2S_3$ or In(OH). Such buffer layer 62 has a thickness of 20 nm to 150 nm, preferably around 50 nm. Note that such buffer layer 62 may be provided as necessary, but the formation of the buffer layer 62 makes the improvement of an open circuit voltage and the photoelectric conversion efficiency possible, and thus the formation of the buffer layer 62 tends to easily give an organic photoelectric conversion element of a high efficiency.

[Semi-Insulating Layer]

The semi-insulating layer 63 is a high-resistivity layer of an n type, and is also referred to as a high-resistance n type layer. The semi-insulating layer 63 is a layer for reducing a leak current between the photoelectric conversion layer 61 and the back electrode 64. Such semi-insulating layer 63 is constituted using ZnO:B containing ZnO and boron (B), ZnO:Al containing aluminum (Al), or the like. Note that, such semi-insulating layer 63 may be provided with the buffer layer 62 as necessary, or only one of the buffer layer 62 and the semi-insulating layer 63 may be sufficient. Furthermore, in the case where the formation of both is not required, they may not be provided. The formation of the buffer layer 62 and the semi-insulating layer 63 being an n type high-resistivity layer makes the improvement of an open circuit voltage and the photoelectric conversion efficiency possible, and thus the formation of the buffer layer 62 and the semi-insulating layer 63 tends to easily give an organic photoelectric conversion element of a high efficiency.

[Back Electrode]

The back electrode 64 is the other side electrode out of a pair of electrodes constituting the organic photoelectric conversion element 60 and is used, for example, as a positive electrode. The back electrode 64 is constituted of a metal of a high melting point having resistance for heating in film formation of the photoelectric conversion layer 61. Furthermore, the back electrode 64 is constituted of a conductive material having corrosion resistance to selenium (Se) constituting the photoelectric conversion layer 61. Examples of the materials constituting this kind of back electrode 64 include molybdenum (Mo), titanium (Ti) and chromium (Cr).

[Grid Electrode]

For the back electrode 64 of the translucent electrode 25, a grid electrode 65 is provided, as necessary. The grid electrode 65 is an electrode as a terminal for receiving a current/voltage from the back electrode 64 and leading it out with low resistance to an outside circuit. This kind of grid electrode 65 is assumed to be formed from a material with good conductivity such as aluminum.

[Resin Layer and Sealing Member]

The resin layer 66 for fixing the sealing member 67 on the base material 26 side is used as a sealing agent for sealing the organic photoelectric conversion element 60 sandwiched between the sealing member 67 and the base material 26. The resin layer 66 is formed by coating an uncured resin material on the surface to be laminated of the sealing member 67 or the base material 26 in a dispersed state in a plurality of positions, and pressurizing the sealing member 67 and the base material 26 each other via these resin materials and, after that, curing the resin material.

The sealing member 67 is a member that covers the organic photoelectric conversion element 60, and the plate-like (film-like) sealing member 67 is fixed on the base material 26 side by the resin layer 66. The sealing member 67 is provided in a state of covering at least from the electrically conductive layer 12 being the substantial cell part to the back electrode 64, and is provided in a state of exposing terminal parts (illustration is omitted) of the electrically conductive layer 12 and the back electrode 64.

The configurations of the resin layer 66 and the sealing member 67 are the same as the configurations of the resin layer and the sealing member of the organic electroluminescent element in the fourth embodiment. Furthermore, consequently, the solid sealing of the organic photoelectric conversion element 60 using the resin layer 66 and the sealing member 67 can also be performed in the same way as the solid sealing of the organic electroluminescent element in the fourth embodiment. Accordingly, detailed explanations about the solid sealing of the resin layer 66 and the sealing member 67, and the organic photoelectric conversion element are omitted.

[Other Layers]

In addition to above-described respective layers, the organic photoelectric conversion element 60 of the present embodiment may be further provided with other members (other layers) in order to improve the photoelectric conversion efficiency or to improve the lifetime of the element. Examples of the other members include a hole injection layer, an electron injection layer, an exciton blocking layer, a UV absorbing layer, a light reflecting layer, a wavelength conversion layer and the like. The hole injection layer is disposed between the photoelectric conversion layer 61 and the back electrode 64. The electron injection layer is disposed between the photoelectric conversion layer 61 and the translucent electrode 25. The exciton blocking layer is disposed between the photoelectric conversion layer 61 and the back electrode 64, or between the photoelectric conversion layer 61 and the translucent electrode 25. The UV absorbing layer is disposed in the outermost layer on the outer side rather than the base material 26 in order to suppress the deterioration of the flexible substrate caused by the sunlight. The wavelength conversion layer is also disposed, in the same way, in the outermost layer on the outer side rather than the base material 26. Furthermore, a layer of a metal oxide may be laminated adjacent to the negative electrode on the photoelectric conversion layer 61 side (here, for example, the translucent electrode 25).

Moreover, the organic photoelectric conversion element 60 of the present embodiment may have various optical function layers on the light reception surface of the base material 26 being the light reception side for the sunlight H, for the purpose of more effectively receiving the sunlight H. For example, a light-collecting layer such as a micro lens array or a light-diffusing layer that can scatter light reflected from the translucent electrode 25 and cause the same to enter again the photoelectric conversion layer 61 are used as the optical function layer.

When providing the micro lens array as the light-collecting layer, such a configuration may also be possible as enhancing the reception amount of the sunlight H from a specific direction or as reducing, reversely, the incidence angle dependency of the sunlight H, by combining the array further with a light-collecting sheet.

As an example of the micro lens array, a configuration, in which a quadrangular pyramid having a side of 30 μm and the vertex angle of 90 degrees are arranged two-dimensionally, is exemplified. The side is preferably 10 to 100 μm. When the side is smaller than this, the effect of diffraction is generated to give color, and when it is too large, the thickness becomes too large, which are not preferable.

Examples of the light-diffusing layers can include various kinds of antiglare layers, layers obtained by dispersing nano particles, nano wires or the like of a metal or various kinds of inorganic particles in a colorless and transparent polymer, etc.

[Effect of Organic Photoelectric Conversion Element 60]

In the organic photoelectric conversion element 60 as explained above, by being provided with the translucent electrode 25 having both the conductivity and light permeability, the improvement of the extraction efficiency of the charges converted by the photoelectric conversion layer 61 via the translucent electrode 25 can be achieved, while securing the reception efficiency of the sunlight H in the photoelectric conversion layer 61 via the translucent electrode 25. As the result, the improvement of the photoelectric conversion efficiency in the organic photoelectric conversion element 60 having the photoelectric conversion layer 61 of the chalcopyrite structure becomes possible.

Furthermore, the organic photoelectric conversion element 60 has the base layer 11 having the surface having a high surface elastic modulus and excellent smoothness, and the electrically conductive layer 12 is formed on the base layer 11. Therefore, by the pressure upon the solid sealing, the flattened surface shape of the base layer 11 can be transferred to the surface of the electrically conductive layer 12. Accordingly, the electrode projection is flattened and leak characteristics of the organic photoelectric conversion element 60 are improved by the heating and pressurization in the solid sealing.

Note that the organic photoelectric conversion element 60 may also be formed into the organic photoelectric conversion element 60 of a both-face light-receiving type by selecting a material substrate having light permeability as the base material 26 and using a transparent conductive film such as ITO as the back electrode 64. The organic photoelectric conversion element of the both-face light-receiving type can produce electric power by receiving light from any side of both faces and thus, when it is disposed, for example, for a part of a fence of stairs or the like, the production of electric power becomes possible in both before noon and afternoon to thereby make it possible to increase the total production amount of electric power as the result. Furthermore, since this kind of organic photoelectric conversion element of the double-side light emission type makes see-through possible, both lighting and electric power production may be satisfied by employing an organic photoelectric conversion element of a see-through type as a part of a lighting window, and the organic photoelectric conversion element of the double-side light emission type is an organic photoelectric conversion element for which various use applications may be considered.

EXAMPLE 1

Hereinafter, the present invention will be explained more specifically based on Examples, but the present invention shall not be restricted to following Examples.

[Production of Organic Electroluminescent Element of Bottom Emission Type]

Respective translucent electrodes of samples 101 to 110 were produced so that the area of a conductive region became 5 cm×5 cm. In Table 2 below, configurations of respective layers in respective translucent electrodes of samples 101 to 110 are shown.

[Production Procedure of Organic Electroluminescent Element of Sample 101]

In the production of the sample 101, first, a nitrogen-containing layer made of a compound No. 10 shown in Table 1 was formed on a base material made of a transparent alkali-free glass, and, in the upper part of the nitrogen-containing layer, an electrically conductive layer made of silver was formed at a thickness of 10 nm to produce a translucent electrode. Furthermore, a light-emitting functional layer and a counter electrode were formed on the translucent electrode, and then solid sealing was performed with a sealing member to thereby produce an organic electroluminescent element of the sample 101.

(Formation of Nitrogen-Containing Layer and Electrically Conductive Layer)

First, a base material made of a transparent alkali-free glass was fixed to a base material holder of a commercially available vacuum evaporator, the compound No. 10 was placed in a resistance heating boat made of tantalum, and these base material holder and heating boat were attached to the inside of a first vacuum tank of the vacuum evaporator. Furthermore, silver (Ag) was placed in a resistance heating boat made of tungsten, which was attached to the inside of a second vacuum tank of the vacuum evaporator.

Next, the pressure of the first vacuum tank was reduced to $4 \times 10^{-4}$ Pa, and after that, the heating boat containing the compound No. 10 was heated by applying an electric current, and a nitrogen-containing layer was provided on the base material at a vapor deposition rate of 0.1 nm/sec to 0.2 nm/sec at a thickness of 10 nm.

Subsequently, the base material on which layers up to the nitrogen-containing layer had been formed was transferred to the second vacuum tank in a vacuum atmosphere, and after reducing a pressure of the second vacuum tank to $4 \times 10^{-4}$ Pa, the heating boat containing silver was heated by applying an electric current. Consequently, there was formed an electrically conductive layer composed of silver having a film thickness of 10 nm at a vapor deposition rate of 0.1 nm/sec to 0.2 nm/sec.

(Light-Emitting Functional Layer-Counter Electrode)

Continuously, using a commercially available vacuum evaporator, the vacuum degree was reduced to $1 \times 10^{-4}$ Pa and, after that, while moving the base material, a compound HT-1 was evaporated at a vapor deposition rate of 0.1 nm/sec to provide a positive hole transport layer (HTL) of 20 nm.

Next, a compound A-3 (a blue fluorescent dopant), a compound A-1 (a green fluorescent dopant), a compound A-2 (a red fluorescent dopant) and a compound H-1 (a host compound) were co-evaporated so as to give a thickness of 70 nm, while changing the vapor deposition rate of the compound A-3 according to positions so as to become linearly from 35 wt % to 5 wt % relative to the film thickness, keeping a constant vapor deposition rate of 0.0002 nm/sec for the compound A-1 and compound A-2 so that each gave a concentration of 0.2 wt % without dependency on the thickness, and changing the vapor deposition rate of the compound H-1 according to positions so as to become from 64.6 wt % to 94.6 wt %, to thereby formed a light-emitting layer.

After that, a compound ET-1 was evaporated to give a thickness of 30 nm and to form an electron transport layer, and furthermore potassium fluoride (KF) was formed at a thickness of 2 nm. Furthermore, aluminum was evaporated to give a thickness of 110 nm and to form a counter electrode.

Note that the compound HT-1, compounds A-1 to 3, compound H-1 and compound ET-1 are compounds shown below.

[Chem. 75]

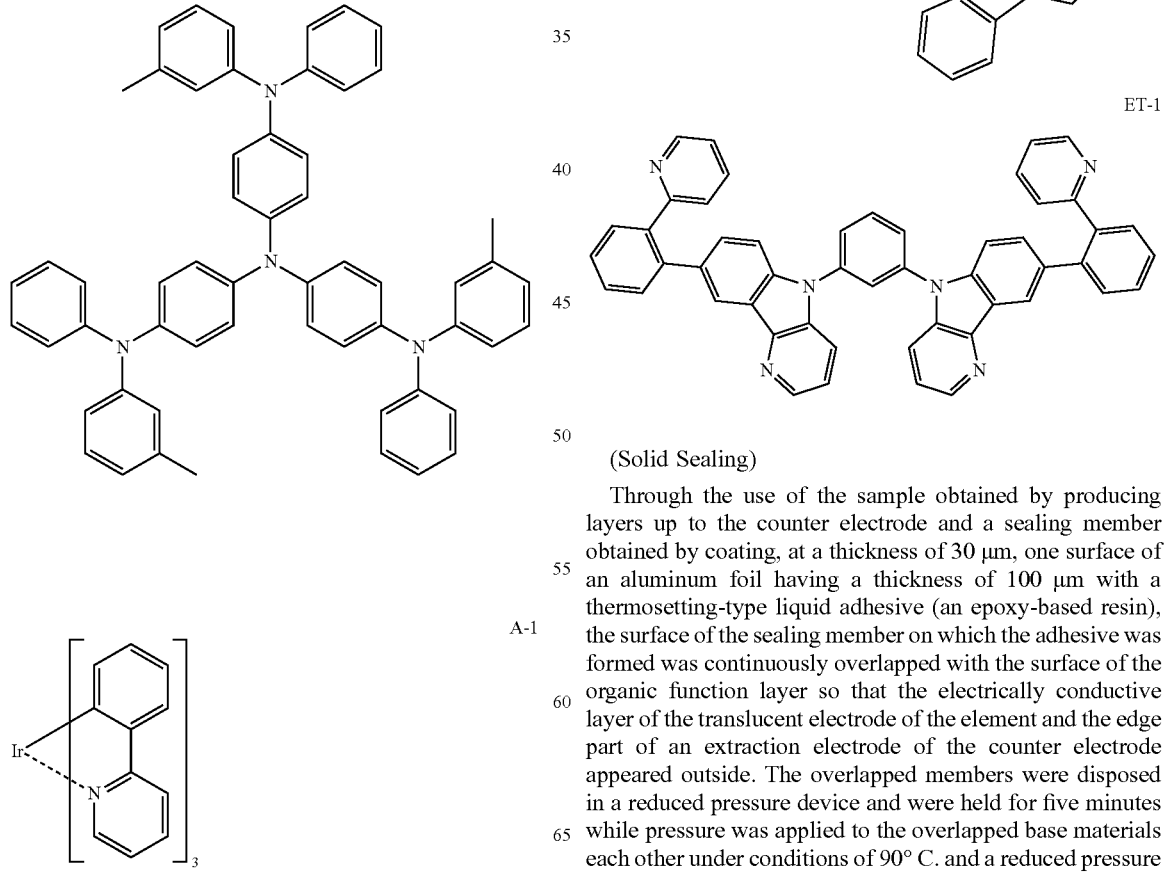

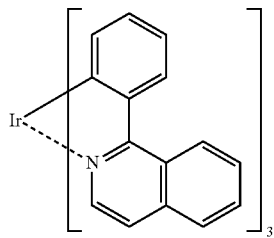

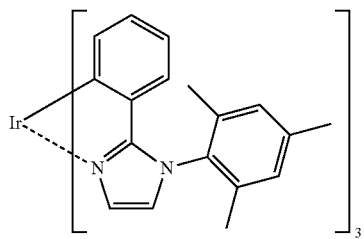

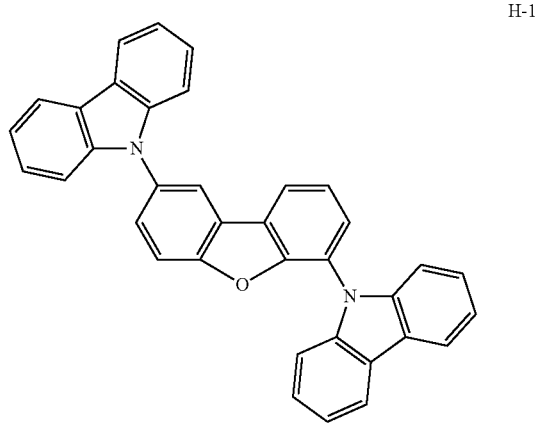

(Solid Sealing)

Through the use of the sample obtained by producing layers up to the counter electrode and a sealing member obtained by coating, at a thickness of 30 μm, one surface of an aluminum foil having a thickness of 100 μm with a thermosetting-type liquid adhesive (an epoxy-based resin), the surface of the sealing member on which the adhesive was formed was continuously overlapped with the surface of the organic function layer so that the electrically conductive layer of the translucent electrode of the element and the edge part of an extraction electrode of the counter electrode appeared outside. The overlapped members were disposed in a reduced pressure device and were held for five minutes while pressure was applied to the overlapped base materials each other under conditions of 90° C. and a reduced pressure of 0.1 MPa. Subsequently, the overlapped members were returned to the atmospheric pressure circumstance and were further heated at 90° C. for 30 minutes, with the result that the adhesive was cured.

The above-described sealing process was performed under the atmospheric pressure and under a nitrogen atmosphere of a moisture content of 1 ppm or less, in accordance with JIS B 9920, under conditions of measured cleanness of class 100, a dew-point temperature of −80° C. or less, an oxygen concentration of 0.8 ppm or less and atmospheric pressure. Note that descriptions related to the formation of the positive electrode, an extraction wiring from the negative electrode, and the like are omitted.

According to the above-described process, the organic electroluminescent element of the sample 101 was produced. [Production Procedure of Organic Electroluminescent Element of Sample 102]

In the production of the sample 102, first, a base layer made of a polysilazane-modified layer was formed on a base material made of a transparent alkali-free glass, and a nitrogen-containing layer made of a compound No. 10 shown in Table 1 was formed on the base layer, and an electrically conductive layer made of silver was formed in the upper part of the nitrogen-containing layer, with the result that a translucent electrode was produced. Furthermore, a light-emitting functional layer and a counter electrode were formed on the translucent electrode, and then solid sealing was performed using a sealing member, with the result that the sample 102 was produced.

(Formation of Base Layer)

First, a 10 mass % dibutyl ether solution of perhydropolysilazane (AQUAMICANN120-10, a catalyst-free type, manufactured by AZ ELECTRONIC MATERIALS) was produced as a coating liquid for a polysilazane layer.

Next, the coating liquid for a polysilazane layer was coated, using a wireless bar, onto a base material made of a transparent alkali-free glass so as to give an average film thickness of 300 nm after drying, the resultant substance was treated and dried for 1 minute under an atmosphere of temperature of 85° C. and humidity of 55% RH, and furthermore was held under an atmosphere of temperature of 25° C. and humidity of 10% RH (dew-point temperature −8° C.) for 10 minutes, with the result that a polysilazane layer was formed by a dehumidifying treatment.

Next, the formed polysilazane layer was subjected to a modification treatment by placing the base material on an ultraviolet ray apparatus described below.

Ultraviolet ray irradiation apparatus: excimer irradiation apparatus MODEL: MECL-M-1-200, manufactured by M.D.COM, inc.

Irradiation wavelength: 172 nm
Lamp filler gas: Xe

The base material obtained by forming the polysilazane layer, fixed on a movable stage was subjected to a modification treatment under conditions described below, with the result that a gas barrier layer was formed.

Excimer lamp light intensity: 130 mW/cm$^2$ (172 nm)
Distance between the sample and the light source: 1 mm
Stage heating temperature: 70° C.
Oxygen concentration in the irradiation apparatus: 1.0%
Excimer lamp irradiation time: 5 seconds The base layer made of a polysilazane-modified layer was formed on the base material under above-described conditions.

Furthermore, in the same procedure as that for the sample 101, the nitrogen-containing layer, the electrically conductive layer, the light-emitting functional layer and the counter electrode were formed on the base layer, the solid sealing was performed using a sealing member, with the result that the organic electroluminescent element of the sample 102 was produced.

[Production Procedure of Organic Electroluminescent Element of Sample 103]

In the same procedure as that for the sample 102 except for replacing a material used as the base material with a biaxially stretched polyethylene naphthalate film (a PEN film, thickness: 100 μm, width: 350 mm, trade name "Teonex Q65FA," manufactured by Teijin DuPont Films Japan Limited), the organic electroluminescent element of the sample 103 was produced.

[Production Procedure of Organic Electroluminescent Element of Sample 104]

In the production of the sample 104, first, the barrier layer was formed on the base material of a biaxially stretched polyethylene naphthalate film, the base layer made of a polysilazane-modified layer, and the nitrogen-containing layer made of the compound No. 10 shown in Table 1 and the electrically conductive layer made of silver were formed on the barrier layer, with the result that the translucent electrode was produced. Furthermore, the light-emitting functional layer and the counter electrode were formed on the translucent electrode, and then solid sealing was performed using a sealing member, with the result that the organic electroluminescent element of the sample 104 was produced.

(Formation of Barrier Layer)

The base material was mounted on a manufacturing apparatus of the barrier layer shown in FIG. 7, and the barrier layer was produced on the base material at a thickness of 300 nm under film formation conditions (plasma CVD conditions) described below.

Supply amount of raw material gas (HMDSO): 50 sccm (Standard Cubic Centimeter per Minute)
Supply amount of oxygen gas ($O_2$): 500 sccm
Vacuum degree in vacuum chamber: 3 Pa
Applied electric power from power source for plasma generation: 1.2 kW
Frequency of power source for plasma generation: 80 kHz
Film conveyance speed: 0.5 m/min Furthermore, in the same procedure as that for the sample 102, the base layer, the nitrogen-containing layer, the electrically conductive layer, the light-emitting functional layer and the counter electrode were formed on the barrier layer, and solid sealing was performed using a sealing member, with the result that the organic electroluminescent element of the sample 104 was produced.

[Production Procedure of Organic Electroluminescent Element of Sample 105]

In the same procedure as that for the sample 104 except for replacing the material of the nitrogen-containing layer with L-1795 shown below, the organic electroluminescent element of the sample 105 was produced.

(Formation of Nitrogen-Containing Layer-Containing Layer)

First, in the same procedure as that for the sample 104, the barrier layer was formed on a base material made of a biaxially stretched polyethylene naphthalate film, and the base layer made of the polysilazane-modified layer was formed on the barrier layer.

Next, the base material on which the base layer was formed was fixed to a base material holder of a commercially available vacuum evaporator, L-1795 was placed in a resistance heating boat made of tantalum, and these base material holder and heating boat was attached to the inside of the first vacuum tank of the vacuum evaporator. Furthermore, silver (Ag) was placed in a resistance heating boat made of tungsten and was attached to the inside of the second vacuum tank of the vacuum evaporator.

Subsequently, the pressure of the first vacuum tank was reduced to $4\times10^{-4}$ Pa, and after that, the heating boat containing L-1795 was heated by applying an electric current, and a nitrogen-containing layer was provided on the base material at a vapor deposition rate of 0.1 nm/sec to 0.2 nm/sec at a thickness of 10 nm.

Then, the base material on which layers up to the nitrogen-containing layer had been formed was transferred to the second vacuum tank in a vacuum atmosphere, and after reducing a pressure of the second vacuum tank to $4\times10{-4}$ Pa, the heating boat containing silver was heated by applying an electric current. Consequently, there was formed an electrically conductive layer composed of silver having a film thickness of 10 nm at a vapor deposition rate of 0.1 nm/sec to 0.2 nm/sec.

[Chem. 76]

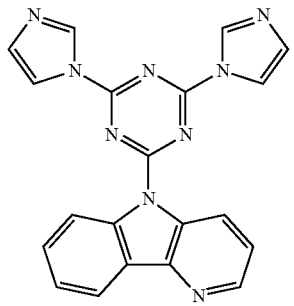

L-1795

Furthermore, in the same procedure as that for the sample 104, the base layer, the nitrogen-containing layer, the electrically conductive layer, the light-emitting functional layer and the counter electrode were formed on the electrically conductive layer, and solid sealing was performed using a sealing member, with the result that the organic electroluminescent element of the sample 105 was produced.

[Production Procedure of Organic Electroluminescent Element of Sample 106]

An ITO electrode was formed, at a thickness of 100 nm, on a base material made of a transparent alkali-free glass, by a sputtering film formation, with the result that the electrically conductive layer was formed. Furthermore, in the same procedure as that for the sample 101, the light-emitting functional layer and the counter electrode were formed on the ITO electrode, and solid sealing was performed using a sealing member, with the result that the organic electroluminescent element of the sample 106 was produced.

[Production Procedure of Organic Electroluminescent Element of Sample 107]

In the production of the sample 107, first, a base layer made of a polysilazane-unmodified layer was formed on a base material made of a transparent alkali-free glass, a nitrogen-containing layer made of a compound No. 10 shown in Table 1 was formed on the base layer, and an electrically conductive layer made of silver was formed in the upper part of the nitrogen-containing layer, with the result that a translucent electrode was produced. Furthermore, on the translucent electrode, a light-emitting functional layer and a counter electrode were formed and, after that, the solid sealing was performed with a sealing member, with the result that the organic electroluminescent element of the sample 107 was produced.

(Formation of Base Layer)

In the process for forming the base layer (polysilazane-modified layer) of the sample 102, in the same procedure except for not having been subjected to the modification treatment by the excimer lamp irradiation, a base layer made of a polysilazane-unmodified layer was formed.

Under the above-described conditions, the base layer made of the polysilazane-unmodified layer was formed on the base material.

Furthermore, in the same procedure as that for the sample 102, the nitrogen-containing layer, the electrically conductive layer, the light-emitting functional layer and the counter electrode were formed on the base layer, and solid sealing was performed using a sealing member, with the result that the organic electroluminescent element of the sample 107 was produced.

[Production Procedure of Organic Electroluminescent Element of Sample 108]

In the production of the sample 108, first, a barrier layer was formed on a base material of a biaxially stretched polyethylene naphthalate film, and a nitrogen-containing layer made of the compound No. 10 shown in Table 1 and an electrically conductive layer made of silver were formed on the barrier layer, with the result that a translucent electrode was produced. Furthermore, the light-emitting functional layer and the counter electrode were formed on the translucent electrode, and then the solid sealing was performed using a sealing member, with the result that the organic electroluminescent element of the sample 108 was produced.

The barrier layer was formed in the same procedure as that for the sample 104 on the base material made of a biaxially stretched polyethylene naphthalate film. Moreover, in the same procedure as that for the sample 104, the nitrogen-containing layer, the electrically conductive layer, the light-emitting functional layer and the counter electrode were formed on the barrier layer, and solid sealing was performed using a sealing member, with the result that the organic electroluminescent element of the sample 108 was produced.

[Production Procedure of Organic Electroluminescent Element of Sample 109]

In the production of the sample 109, first, a base layer made of an organic/inorganic hybrid polymer was formed on a base material of a biaxially stretched polyethylene naphthalate film, and a nitrogen-containing layer made of the compound No. 10 shown in Table 1 and an electrically conductive layer made of silver were formed on the base layer, with the result that a translucent electrode was produced. Furthermore, the light-emitting functional layer and the counter electrode were formed on the translucent electrode, and then the solid sealing was performed using a sealing member, with the result that the organic electroluminescent element of the sample 109 was produced.

(Formation of Base Layer)

An UV-curable-type organic/inorganic hybrid hard coat material OPSTAR 27501 (manufactured by JSR) was coated onto an easy-adhesive face of the base material by using a wire bar so as to give a thickness of 4 μm after drying. After the drying at 80° C. for 3 minutes, irradiation of 1.0 J/cm$^2$ was performed with a high-pressure mercury vapor lamp under the air atmosphere and the resultant substance was cured, with the result that a base layer was formed.

Furthermore, in the same procedure as that for the sample 102, the nitrogen-containing layer, the electrically conductive layer, the light-emitting functional layer and the counter electrode were formed on the base layer, and solid sealing was performed using a sealing member, with the result that the organic electroluminescent element of the sample 109 was produced.

[Production Procedure of Organic Electroluminescent Element of Sample 110]

In the same procedure as that for the sample 102, the base layer made of a polysilazane-modified layer was formed on a base material made of a transparent alkali-free glass, and the ITO electrode was formed, at a thickness of 100 nm, on the base layer by a sputtering film formation, with the result that an electrically conductive layer was formed. After that, the ITO electrode was polished to be smoothened. Moreover, in the same procedure as that for the sample 102, the light-emitting functional layer and the counter electrode were formed on the ITO electrode, and solid sealing was performed using a sealing member, with the result that the organic electroluminescent element of the sample 110 was produced.

[Evaluation of Organic Electroluminescent Elements]

(Surface Roughness: Surface Smoothness)

Surface roughness Ra was calculated from a cross-section curve of unevenness continuously measured with a detector having a sensing pin having a minimum tip radius by using an atomic force microscope (AFM) DI3100 manufactured by Digital Instruments, and was obtained from the average roughness related to the amplitude of fine unevenness, after performing the measurement many times within a zone of 30 µm in the measurement direction with a sensing pin having a minimum tip radius.

(Elastic Modulus: Nano Indentation)

As to the elastic modulus of the base layer, after application of a load to the base layer by pressing an indenter of a trigonal pyramid having a tip radius of approximately 0.1 to 1 µm with an ultra-minute weight through the use of a nano indenter manufactured by MTS System (Nano Indenter TMXP/DCM), the load was removed by returning the indenter, an obtained load -displacement curve was drawn, and the elastic modulus (Reduced modulus) was measured from a load weight and thrust depth obtained from the load-displacement curve.

(Emission Efficiency)

Front luminance and angle dependency of luminance of respective samples constituting respective lighting devices were measured through the use of a spectral radiance meter CS-1000 (manufactured by Konica Minolta Sensing), and an electric power efficiency at the front luminance of 1000 cd/m$^2$ was obtained. Note that the evaluation of the electric power efficiency was indicated as a relative value while setting the electric power efficiency of the organic electroluminescent element of the sample 101 as 100. The larger the numerical value is, the more excellent electric power efficiency the sample 101 has.

(Leak Characteristics)

In each of the samples, leak characteristics in respective states before the solid sealing and after the solid sealing were measured. As to the leak characteristics, flowing current values by the forward voltage or backward voltage thereof were measured three times at room temperatures and under a condition of 500 µA/cm$^2$, and a rectification ratio was calculated from the average value thereof. The higher rectification ratio is, the more excellent leak characteristics are.

(Flexibility)

Among the samples, bent-resistance characteristics (flexibility) of the sample 103, the sample 104 and samples 108 to 110 using the resin base material were checked. The flexibility was evaluated as follows: under room temperature, respective samples were bent 200 times so that the curvature of bent diameter of 30 mm φ was applied to each of the light emission surface and the sealed face and the number of dark spots at the bent portion was evaluated. In the evaluation of the number of dark spots (DS), in a state where the sample was caused to emit light so as to give 300 cd/m$^2$ under room temperature, the picture of the sample was taken with a microscope (MS-804, manufactured by MORITEX Corporation, lens: MP-ZE25-200). The taken image was observed with eyes and the number of dark spots was counted. A smaller number of the generations represents a more excellent bent-resistance characteristics.

(Storage Stability)

After performing a thermal treatment under an environment of 85° C., 85% RH for 500 hours, in the state where the sample was caused to emit light so as to give 300 cd/m$^2$ under room temperature, the picture of the sample was taken with a microscope (MS-804, manufactured by MORITEX Corporation, lens: MP-ZE25-200). The taken image was observed with eyes and the number of dark spots (DS) was counted. A smaller number of the generations represents a more excellent storage stability.

Respective evaluation results of the organic electroluminescent elements of the samples 101 to 110 are shown in Table 2.

TABLE 2

| SAMPLE No. | BASE MATERIAL | ELECTRICALLY CONDUCTIVE LAYER | NITROGEN-CONTAINING LAYER | BASE LAYER | BARRIER LAYER | ELASTIC MODULUS (GPa) | SMOOTHNESS (Ra) |
|---|---|---|---|---|---|---|---|
| 101 | GLASS | Ag | No. 10 | GLASS BASE MATERIAL | — | >20 | <2 |
| 102 | GLASS | Ag | No. 10 | POLYSILAZANE-MODIFIED LAYER | — | >20 | <2 |
| 103 | PEN | Ag | No. 10 | POLYSILAZANE-MODIFIED LAYER | — | >20 | <2 |
| 104 | PEN | Ag | No. 10 | POLYSILAZANE-MODIFIED LAYER | PRESENT | >20 | <2 |
| 105 | PEN | Ag | L-1795 | POLYSILAZANE-MODIFIED LAYER | PRESENT | >20 | <2 |
| 106 | GLASS | ITO | — | GLASS BASE MATERIAL | — | >20 | <2 |
| 107 | GLASS | Ag | No. 10 | POLYSILAZANE-MODIFIED LAYER | — | <10 | <2 |
| 108 | PEN | Ag | No. 10 | BARRIER LAYER | PRESENT | <10 | >2 |
| 109 | PEN | Ag | No. 10 | HYBRID LAYER | — | <10 | <2 |

TABLE 2-continued

| | | | | | | | |
|---|---|---|---|---|---|---|---|
| 110 | PEN | ITO | — | POLYSILAZANE-MODIFIED LAYER | — | >20 | <2 |

| SAMPLE No. | EMISSION EFFICIENCY (FRONT LUMINANCE) | LEAK CHARACTERISTICS (RECTIFICATION RATIO) BEFORE SEALING | LEAK CHARACTERISTICS (RECTIFICATION RATIO) AFTER SEALING | FLEXIBILITY (DS NUMBER AFTER BENDING) | STORAGE STABILITY (AFTER THERMO TEST) | |
|---|---|---|---|---|---|---|
| 101 | 100 | 1000 | 8000 | — | 4 | PRESENT INVENTION |
| 102 | 102 | 3000 | 9500 | — | 2 | PRESENT INVENTION |
| 103 | 125 | 2000 | 10000 | 1 | 2 | PRESENT INVENTION |
| 104 | 127 | 2500 | 10000 | 0 | 0 | PRESENT INVENTION |
| 105 | 130 | 3000 | 10000 | 0 | 0 | PRESENT INVENTION |
| 106 | 95 | 800 | 500 | — | 9 | COMPARATIVE EXAMPLE |
| 107 | 92 | 3000 | 300 | — | 15 | COMPARATIVE EXAMPLE |
| 108 | 93 | 900 | 50 | 10 | 30 | COMPARATIVE EXAMPLE |
| 109 | 90 | 1000 | 10 | 25 | 15 | COMPARATIVE EXAMPLE |
| 110 | 82 | 800 | 20 | 15 | 25 | COMPARATIVE EXAMPLE |

As shown in Table 2, in the samples 101 to 105 each having an elastic modulus of the base layer of not less than 20 GPa and surface roughness (Ra) of 2 or less, the leak characteristics before the solid sealing are from 1000 to 3000, but the leak characteristics after the solid sealing are improved to from 8000 to 10000. From this, by the fact that the elastic modulus of the base layer is not less than 20 GPa and the surface roughness (Ra) is 2 or less, it is known that the electrically conductive layer provided on the base layer is smoothened by the pressurization/thermal treatment upon the solid sealing.

Furthermore, for the samples 101 to 105, good results were also obtained for the emission efficiency. Furthermore, such results that the storage stability is also improved along with the improvement of the leak characteristics are obtained.

In contrast, in samples 107 and 109 each having an elastic modulus of the base layer of approximately 10 GPa and the sample 108 for which no base layer is provided, the leak characteristics after the solid sealing deteriorate as compared with those before the solid sealing. It is so considered that the smoothness of the electrically conductive layer deteriorated in the pressurization/thermal treatment upon the solid sealing, and that the leak characteristics deteriorated by the influence of the unevenness of the electrically conductive layer.

Furthermore, in the sample 106 using the ITO electrode, although the glass base material having the elastic modulus of not less than 20 GPa and the surface roughness (Ra) of 2 or less is used as the base layer, the leak characteristics after the solid sealing deteriorate as compared with those before the solid sealing.

In the same way, in the sample 110 that uses the ITO electrode, although the ITO electrode layer has been smoothened by polishing and, furthermore, the polysilazane-modified layer having the elastic modulus of not less than 20 GPa and the surface roughness (Ra) of 2 or less has been formed as the base layer, the leak characteristics after the solid sealing deteriorate as compared with those before the solid sealing.

From these results, it is known that, by setting the elastic modulus and the smoothness of the base layer to be high and, furthermore, setting the electrically conductive layer that is to be formed on the base layer to have Ag as the principal component, the surface of the electrically conductive layer becomes smooth upon the solid sealing to thereby improve the leak characteristics.

In contrast, it is known that, when the elastic modulus and the smoothness of the base layer are low, the leak characteristics lower caused by the deterioration in the shape of the electrically conductive layer due to the solid sealing. Furthermore, it is known that the polishing of the ITO electrode does not give sufficient smoothness to the electrically conductive layer. Furthermore, when the ITO electrode is used, the effect of smoothing of the electrically conductive layer upon the solid sealing cannot be obtained. This is considered to be caused from that the ITO electrode has such a large thickness as 100 nm and that the ITO electrode does not have flexibility such as a Ag layer not to cause the deformation due to the pressurization upon the solid sealing to be generated sufficiently.

EXAMPLE 2

[Production of Organic Photoelectric Conversion Element]

A sample 201 and a sample 202 of organic photoelectric conversion elements provided with the same translucent electrodes as the translucent electrode of sample 103 and sample 110 produced in Example 1 were produced. Hereinafter, a production procedure of an organic photoelectric conversion element will be explained.

[Production Procedure of Organic Electroluminescent Element of Sample 201]

A positive hole transport layer, a photoelectric conversion layer, an electron transport layer and a back electrode were formed on the translucent electrode of the sample 103 obtained by forming layers up to the base layer, the nitrogen-containing layer and the electrically conductive layer on a polyethylene naphthalate film (a PEN film), and solid sealing was performed using a sealing member, with the result that the organic photoelectric conversion element of the sample 201 was produced.

(Production of Positive Hole Transport Layer)

First, an isopropanol solution containing PEDOT-PSS (CLEVIOS (registered trade mark) P VP AI 4083, manufactured by Healios, electric conductivity: $1\times10^{-3}$ S/cm) made of conductive polymer and a polyanion in 2.0 mass % was prepared. Next, the solution was applied onto the translucent electrode of the sample 103 obtained by forming layers up to the electrically conductive layer, so as to give a dry thickness of about 30 nm by using a blade coater whose substrate was temperature-controlled at 65° C. Subsequently, a thermal treatment with hot air of 120° C. for 20 seconds was performed to thereby forma coated film of the solution on the translucent electrode of the sample 103. Furthermore, the translucent electrode obtained by forming the coated film was taken in a glove box and was subjected to a thermal treatment at 120° C. for 3 minutes under a nitrogen atmosphere, with the result that a positive hole transport layer was formed.

(Formation of Photoelectric Conversion Layer)

Next, an organic photoelectric conversion material composition solution, in which 0.8 mass % of KP115 described below being a p-type organic semiconductor material and 1.6 mass % of PC61BM (nanom spectra E100H, manufactured by Frontier Carbon Corporation) being an n type organic semiconductor material were mixed in o-dichlorobenzene, was prepared. The solution was stirred (for 60 minutes) while being heated at 100° C. with a hot plate to be completely dissolved. After that, the solution was applied so as to give a dry thickness of about 170 nm by using a blade coater whose substrate was temperature-controlled at 80° C. and dried for 2 minutes, with the result that a photoelectric conversion layer was produced on the above-described positive hole transport layer.

(P-Type Semiconductor Layer: KP115)

As to KP115 used for the photoelectric conversion layer, compound KP115 shown below was synthesized by referring to Appl. Phys. Lett. Vol. 98, p. 043301 that is a Non-patent Literature. Note that the number-average molecular weight of KP115 was 43000.

[Chem. 77]

KP115

(Formation of Electron Transport Layer)

Next, a solution was prepared by dissolving a compound C described below in hexafluoroisopropanol so as to give 0.02 mass %. The solution was coated on a translucent electrode obtained by forming layers up to the photoelectric conversion layer, and was dried so as to give a dry thickness of about 5 nm by using a blade coater whose substrate was temperature-controlled at 65° C. Subsequently, a thermal treatment was performed with hot air at 100° C. for two minutes, with the result that an electron transport layer was formed on the photoelectric conversion layer.

(Electron Transport Layer Material: Synthesis of Compound C)

A compound C used for the electron transport layer was synthesized by a method described below.

A compound B below was synthesized by referring to Adv. Mater. 2007, 19, 2010 that is Non-patent Literature. The weight-average molecular weight of the compound B was 4400.

The compound B of 1.0 g and 3,3'-iminobis(N, N-dimethylpropylamine) manufactured by Aldrich of 9.0 g were dissolved in tetrahydrofuran of 100 ml and N, N-dimethylformamide of 100 ml, which was stirred at room temperature for 48 hours. After the completion of the reaction, the solvents were distilled off under a reduced pressure and reprecipitation was performed using water, with the result that a compound C of 1.3 g (yield: 90%) was obtained. The structure of the obtained compound C was identified by $^1$H-NMR. The result is shown below. $^1$H-NMR: 7.6 to 8.0 ppm (br), 2.88 ppm (br), 2.18 ppm (m), 2.08 ppm (s), 1.50 ppm (m), 1.05 ppm (br).

[Chem. 78]

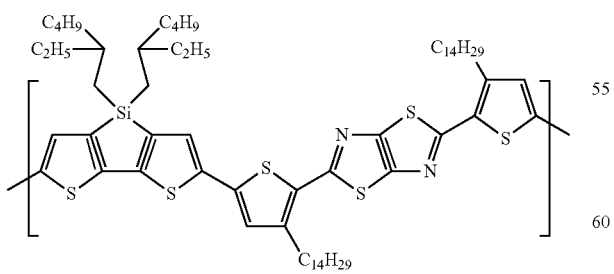

(Formation of Back Electrode)

Next, the above-described sample obtained by forming layers up to the electron transport layer was placed on a vacuum tank of a vacuum evaporator so that a shadow mask of a 10 mm width and the electrically conductive layer of the translucent electrode were orthogonal to each other. Furthermore, silver (Ag) was placed in a resistance heating boat made of tungsten, which was attached to the inside of the vacuum tank.

Then, the pressure of the vacuum tank was reduced to $4 \times 10^{-4}$ Pa, and after that, the resistance heating boat was heated by applying an electric current, and a back electrode made of silver of 100 nm in thickness was formed on the electron transport layer at a vapor deposition rate of 2 nm/sec.

(Solid Sealing)

Through the use of the sample obtained by producing layers up to the back electrode and a sealing member obtained by coating, at a thickness of 30 μm, one surface of an aluminum foil having a thickness of 100 μm with a thermosetting-type liquid adhesive (an epoxy-based resin), the adhesive agent face of the sealing member was continuously overlapped with the surface of the organic function layer so that the end parts of extraction electrodes of a first electrode and a second electrode of the element appeared outside and adhesion was performed by a dry laminate method.

The above-described sealing process was performed under the atmospheric pressure and under a nitrogen atmosphere of a moisture content of 1 ppm or less, in accordance with JIS B 9920, under conditions of measured cleanness of class 100, a dew-point temperature of −80° C. or less, an oxygen concentration of 0.8 ppm or less and atmospheric pressure. Note that descriptions related to the formation of the positive electrode, an extraction wiring from the negative electrode, and the like are omitted.

According to the above-described process, the organic photoelectric conversion element of the sample 201 was produced.

[Production Procedure of Organic Electroluminescent Element of Sample 202]

In the same procedure as that for the sample 201 except for replacing the translucent electrode to be used with that of the sample 110 in Example 1, a solar cell of the sample 202 was produced.

[Evaluation of Organic Photoelectric Conversion Element]

(Evaluation of Photoelectric Conversion Effect)

While irradiating the photoelectric conversion element thus produced with light having an intensity of 100 mW/cm² emitted from a solar simulator (AM 1.5 G filter), with a mask having an effective area of 1 cm² overlapped on a light-receiving part, a short-circuit current density $J_{sc}$ [mA/cm²], an open circuit voltage $V_{oc}$ [V] and a fill factor FF [%] were measured in four light-receiving parts formed on the element respectively and an average value was obtained. Furthermore, the open circuit voltage Voc and fill factor FF, according to a formula (3) below, photoelectric conversion efficiency η [%] was obtained from the obtained short-circuit current density Jsc. Here, a larger numeral of the photoelectric conversion efficiency η [%] represents better energy conversion efficiency (photoelectric conversion efficiency).

$$\eta[\%] = J_{sc} [mA/cm^2] \times V_{oc}[V] \times FF[\%] / \text{incident light intensity } [mW/cm^2] \quad (3)$$

(Evaluation of Durability of Photoelectric Conversion Efficiency)

The sample of the organic photoelectric conversion element, for which the photoelectric conversion efficiency had been evaluated, was heated to 80° C. with resistance connected between the positive electrode and the negative electrode and was exposed continuously with light of intensity of 100 mW/cm² from a solar simulator (AM 1.5 G filter) for 1000 hours, which was then cooled to room temperature and, in the same way as the evaluation of the above-described photoelectric conversion efficiency, the photoelectric conversion efficiency η[%] was obtained for each of four light-receiving parts formed on the organic photoelectric conversion element according to the formula (3). Next, according to a formula (4) below, relative efficiencies of the conversion efficiencies [%] were calculated and an average value was obtained, which was determined to be a measure of the durability of the photoelectric conversion efficiency.

Relative efficiency of conversion efficiency [%]=
[(Conversion efficiency after exposure)/(Conversion efficiency before exposure)]×100 (4)

Here, a higher relative efficiency of the conversion efficiency [%] represents a more excellent durability of the energy conversion efficiency (durability of photoelectric conversion efficiency). The time period when a lowering rate of the relative efficiency became 80% was defined as LT80 and the durability of the element was evaluated.

Respective evaluation results of the organic photoelectric conversion elements of the sample 201 and the sample 202 are shown in Table 3.

TABLE 3

| SAMPLE No. | CHARACTERISTICS OF PHOTOELECTRIC CONVERSION ELEMENT | | |
|---|---|---|---|
| | CONVERSION EFFICIENCY | LT80 | |
| 201 | 3.10% | 320 Hr | PRESENT INVENTION |
| 202 | 1.60% | 100 Hr | COMPARATIVE EXAMPLE |

As shown in Table 3, the organic photoelectric conversion element of the sample 201 using the translucent electrode of the sample 103 gave better results for both the conversion efficiency and the LT80, as compared with the organic photoelectric conversion element of the sample 202 using the translucent electrode of the sample 110.

The translucent electrode of the sample 103 used for the sample 201 has an elastic modulus of the base layer of 20 GPa or more and a surface roughness (Ra) of 2 or less. Therefore, it is known that, also in forming the organic photoelectric conversion element, the electrically conductive layer formed on the base layer is smoothened by the pressurization/thermal treatment in the solid sealing.

Furthermore, it is known that, in the sample 202, the electrically conductive layer does not have sufficient smoothness although the ITO electrode layer is smoothened by polishing. Moreover, it is known that the ITO electrode is not smoothened even by the pressurization/thermal treatment in the solid sealing, although the polysilazane-modified layer having an elastic modulus of 20 GPa or more and a surface roughness (Ra) of 2 or less is formed as the base layer.

As described above, it is known that, by using, as the organic photoelectric conversion element, a translucent electrode which has a high elastic modulus and smoothness of the base layer, and furthermore, in which the electrically conductive layer formed on the base layer contains Ag as the principal component, the surface of the electrically conductive layer is smoothened in the solid sealing, with the result that properties of the organic photoelectric conversion element are enhanced.

Note that the present invention is not to be limited to the configurations explained in the above-described embodiment examples, and various modifications and changes are possible within the scope not departing from the configurations of the present invention.

REFERENCE SIGNS LIST

10, 20 and 25: translucent electrode, 11: base layer, 12: electrically conductive layer, 23: nitrogen-containing layer, 26: base material, 26a: light extraction surface, 27: barrier layer, 30: manufacturing apparatus, 31: feeding roll, 32, 33, 34 and 35: conveyance roll, 36 and 37: film-forming roll, 38: gas supply pipe, 39: power source for plasma generation, 40: film, 41: magnetic field-generating device, 43: winding roll, 45: light-emitting functional layer, 45a: hole injection layer, 45b: positive hole transport layer, 45c: light-emitting layer, 45d: electron transport layer, 45e: electron injection layer, 46: counter electrode, 47 and 66: resin layer, 48 and 67: sealing member, 50 and 51: organic electroluminescent element, 60: organic photoelectric conversion element, 61: photoelectric conversion layer, 62: buffer layer, 63: semi-insulating layer, 64: back electrode, 65: grid electrode

The invention claimed is:

1. A translucent electrode, comprising:
   a base layer with a surface having a surface roughness (Ra) of 2 nm or less and an elastic modulus of 20 GPa or more; and
   an electrically conductive layer that is provided on the surface side of the base layer and contains silver as a principal component,
   wherein a nitrogen-containing layer that is constituted using a compound containing a nitrogen atom and having an effective unshared electron pair content ratio [n/M] of $2.0 \times 10^{-3} \le$ [n/M] when denoting, by n, a number of unshared electron pairs that do not participate in aromaticity and that is not coordinated to a metal among unshared electron pairs of the nitrogen atom and molecular weight by M, is provided adjacent to the electrically conductive layer.

2. The translucent electrode according to claim 1, wherein the base layer is a polysilazane-modified layer.

3. The translucent electrode according to claim 1, comprising a base material and a barrier layer that is provided on the base material and has at least one or more extreme values in a refractive index distribution in a thickness direction, wherein the base layer is provided on the barrier layer.

4. An electronic device having the translucent electrode according to claim 1.

5. The electronic device according to claim 4, further comprising a photoelectric conversion layer.

6. The electronic device according to claim 4, comprising a light-emitting layer constituted of an organic material.

7. The translucent electrode according to claim 1, wherein the electrically conductive layer consists of silver.

8. The translucent electrode according to claim 1, wherein the electrically conductive layer has a thickness of 4 to 12 nm.

* * * * *